US008852832B2

(12) United States Patent
Arayama et al.

(10) Patent No.: US 8,852,832 B2
(45) Date of Patent: Oct. 7, 2014

(54) RADIATION-SENSITIVE COLORED COMPOSITION, COLOR FILTER AND METHOD FOR PRODUCING THE SAME, SOLID STATE IMAGE DEVICE, AND LIQUID CRYSTAL DISPLAY APPARATUS

(75) Inventors: Kyouhei Arayama, Haibara-gun (JP); Hiroaki Idei, Haibara-gun (JP); Yushi Kaneko, Haibara-gun (JP); Junichi Itou, Haibara-gun (JP); Yousuke Murakami, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 185 days.

(21) Appl. No.: 13/369,078

(22) Filed: Feb. 8, 2012

(65) Prior Publication Data

US 2012/0202145 A1 Aug. 9, 2012

(30) Foreign Application Priority Data

Feb. 9, 2011 (JP) .............................. P2011-026255
Dec. 28, 2011 (JP) .............................. P2011-289469

(51) Int. Cl.

| | |
|---|---|
| ***G03F 1/00*** | (2012.01) |
| ***G03F 7/00*** | (2006.01) |
| ***G03F 7/105*** | (2006.01) |
| ***G03F 7/027*** | (2006.01) |
| *G02B 5/22* | (2006.01) |
| *G03F 7/031* | (2006.01) |
| *G03F 7/029* | (2006.01) |

(52) U.S. Cl.
CPC .............. *G03F 7/0007* (2013.01); *G03F 7/105* (2013.01); *G02B 5/223* (2013.01); *G03F 7/031* (2013.01); *G03F 7/027* (2013.01); *G03F 7/029* (2013.01)
USPC .......... 430/7; 430/270.1; 430/285.1; 252/586

(58) Field of Classification Search
USPC ................. 430/7, 270.1, 281.1, 283.1, 285.1; 252/586
See application file for complete search history.

(56) References Cited

U.S. PATENT DOCUMENTS

| | | | | |
|---|---|---|---|---|
| 6,509,125 | B1 | 1/2003 | Ito et al. | |
| 7,622,521 | B2 | 11/2009 | Seto | |
| 2007/0072955 | A1 * | 3/2007 | Fujimori et al. | 522/71 |
| 2007/0117031 | A1 | 5/2007 | Mizukawa et al. | |
| 2008/0076044 | A1 | 3/2008 | Mizukawa et al. | |

(Continued)

FOREIGN PATENT DOCUMENTS

| | | | |
|---|---|---|---|
| JP | 1994-75375 | A | 3/1994 |
| JP | 2000095805 | A | 4/2000 |

(Continued)

OTHER PUBLICATIONS

Notice of Reasons for Rejection, dated Jan. 8, 2013, issued in corresponding JP Application No. 2011-289469, 12 pages in English and Japanese.

*Primary Examiner* — Stewart Fraser
(74) *Attorney, Agent, or Firm* — Sughrue Mion, PLLC

(57) ABSTRACT

Provided is a radiation-sensitive colored composition which exhibits excellent developability, has excellent heat resistance and solvent resistance, and is capable of forming a colored pattern with less color transfer and color unevenness. The radiation-sensitive colored composition includes a colorant multimer (A), a polymerizable compound (B), a photopolymerization initiator (C), and an organic solvent (D), wherein the content of an inorganic metal salt (X) including no colorant skeleton is 0.1% by mass or less with respect to a dye solid contents.

29 Claims, No Drawings

(56) References Cited

U.S. PATENT DOCUMENTS

| | | | | |
|---|---|---|---|---|
| 2009/0053626 | A1* | 2/2009 | Takakuwa et al. | 430/7 |
| 2010/0104958 | A1 | 4/2010 | Jeong et al. | |
| 2010/0230647 | A1* | 9/2010 | Mizukawa et al. | 252/582 |

FOREIGN PATENT DOCUMENTS

| | | | |
|---|---|---|---|
| JP | 2001-166124 | A | 6/2001 |
| JP | 2004292507 | A | 10/2004 |
| JP | 3736221 | B2 | 1/2006 |
| JP | 2007-94188 | A | 4/2007 |
| JP | 2007-138051 | A | 6/2007 |
| JP | 2007-139906 | A | 6/2007 |
| JP | 2008292970 | A | 12/2008 |
| JP | 2009031713 | A | 2/2009 |
| JP | 2010102343 | A | 5/2010 |

* cited by examiner

RADIATION-SENSITIVE COLORED COMPOSITION, COLOR FILTER AND METHOD FOR PRODUCING THE SAME, SOLID STATE IMAGE DEVICE, AND LIQUID CRYSTAL DISPLAY APPARATUS

BACKGROUND OF THE INVENTION

1. Field of the Invention

The present invention relates to a radiation-sensitive colored composition which is preferable for the production of a color filter used for a liquid crystal display apparatus, a solid state image device, or the like; a color filter and a method for producing the same; and a solid state image device and a liquid crystal display apparatus, each of which includes the color filter.

2. Description of the Related Art

As one of the methods for producing a color filter used for a liquid crystal display apparatus, a solid state image device, or the like, a pigment dispersion method may be exemplified. This pigment dispersion method is a method in which a color filter is produced by a photolithographic method from a radiation-sensitive colored composition formed by dispersing a pigment in any one of various curable compositions. Specifically, the radiation-sensitive colored composition is coated on a substrate by using a spin coater, a roll coater, or the like, then dried to form a coating film, and thereafter, the coating film is pattern-exposed and developed to obtain colored pixels. This procedure is repeated by the number of desired colors to prepare a color filter.

With this method, the color filter is stable with respect to light or heat due to the use of the pigment and a positional accuracy is sufficiently secured by performing patterning by a photolithographic method. Therefore, this method has widely been used as a method which is preferable for producing a color filter for a color display, or the like.

On the other hand, the color filter for the solid state image device such as a CCD and the like has been required to be preciser in recent years. Although the color filters tend to have a smaller pattern size with higher precision, it is thought that it is difficult to provide a smaller pattern size and further improved resolution in the pigment dispersion method that has been conventionally used. One of the reasons for this is that coarse particles generated by aggregation of the pigment particles are one of the causes of occurrence of color unevenness in the fine pattern.

Therefore, for example, suppressing or preventing the display failure of a liquid crystal display by reducing the content of free copper contained in the pigment among the ionic impurities contained in the pigment in order to provide a color filter having excellent display performance has been investigated (see, for example, JP2001-166124A).

However, in recent years, there has been a situation in which the pigment dispersion method that has been hitherto used for general purposes is not necessarily suitable for applications requiring fine patterns, for examples, for a solid state image device.

Under these circumstances, using a dye as a colorant in order to accomplish high precision has been conventionally investigated (see, for example, JP1994-75375A). However, a dye in the molecular dispersion state has a problem that it is inferior to a pigment in terms of the preservation stability of a resist liquid, light resistance, heat resistance, solvent resistance, or the like. With respect to such a problem, improving the preservation stability of a resist liquid or light resistance has been investigated (see, for example, JP2007-94188A).

As an alternative method, a method for polymerization of a dye has been proposed (see, for example, JP2007-138051A, JP2007-139906A, and JP3736221B). However, it is hard to say that this method can fully solve the problems regarding solvent resistance, color transfer, developability, and the like, and in addition, there are some cases where polymerization of a dye causes deterioration of the color unevenness, which thus needs to be further improved.

SUMMARY OF THE INVENTION

The present invention has been made taking into consideration the above-described problems, and it has an object to solve the following problems.

That is, it is an object of the present invention to provide a radiation-sensitive colored composition which exhibits excellent developability, has excellent heat resistance and solvent resistance, and is capable of forming a colored pattern with less color transfer and color unevenness. It is another object of the present invention to provide a color filter which has excellent heat resistance and solvent resistance and has a colored pattern having less color transfer and color unevenness, a method for preparing the color filter, and a solid state image device and a liquid crystal display apparatus, each of which includes the color filter.

That is, the radiation-sensitive colored composition of the present invention obtained by solving the above-described problems includes a colorant multimer (A), a polymerizable compound (B), a photopolymerization initiator (C), and an organic solvent (D), wherein the content of an inorganic metal salt (X) including no colorant skeleton is 0.1% by mass or less with respect to a dye solid contents.

Furthermore, in the present specification, the dye solid contents refer to a total amount of the solid contents of the colorant multimer (A) in the composition and the solid contents of the dye components other than the colorant multimer (A), which may be added, if necessary.

In the present specification, in a preferable embodiment, the colorant multimer (A) is a colorant multimer which has a partial structure derived from a colorant selected from a dipyrromethene colorant, an azo colorant, a xanthene colorant, a squalirium colorant, and a phthalocyanine colorant; in particular, the colorant multimer (A) is a colorant multimer which has a partial structure derived from a colorant selected from a dipyrromethene colorant, an azo colorant, and a phthalocyanine colorant; the colorant multimer (A) is a colorant multimer which has an alkali-soluble group; the colorant multimer (A) is a colorant multimer which has a polymerizable group; or the dipyrromethene colorant is a dipyrromethene colorant represented by the following general formula (8).

(8)

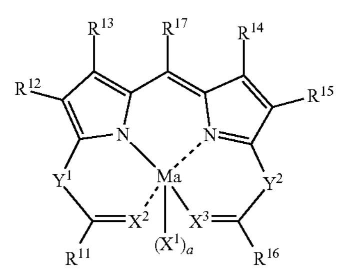

[in the general formula (8), $R^{12}$ to $R^{15}$ each independently represent a hydrogen atom or a monovalent substituent; $R^{17}$ represents a hydrogen atom, a halogen atom, an alkyl group, an aryl group, or a heterocyclic group; Ma represents a metal or a metal compound; $X^2$ and $X^3$ each independently represent NR (wherein R represents a hydrogen atom, an alkyl group, an alkenyl group, an aryl group, a heterocyclic group, an acyl group, an alkylsulfonyl group, or an arylsulfonyl group), a nitrogen atom, an oxygen atom, or a sulfur atom; $Y^1$ and $Y^2$ each independently represent $NR^c$ (wherein $R^c$ represents a hydrogen atom, an alkyl group, an alkenyl group, an aryl group, a heterocyclic group, an acyl group, an alkylsulfonyl group, or an arylsulfonyl group), a nitrogen atom or a carbon atom; $R^{11}$ and $R^{16}$ each independently represent an alkyl group, an alkenyl group, an aryl group, a heterocyclic group, an alkoxy group, an aryloxy group, an alkylamino group, an arylamino group, or a heterocyclic amino group; $R^{11}$ and Y' may be bonded to each other to form a 5-, 6-, or 7-membered ring, and $R^{16}$ and $Y^2$ may be bonded to each other to form a 5-, 6-, or 7-membered ring; $X^1$ represents a group that can be bonded to Ma; and a represents 0, 1, or 2.]

In the present invention, in a preferable embodiment, the content of the inorganic metal salt (X) is 0.01% by mass or less with respect to the dye solid contents; the inorganic metal salt (X) is a multivalent metal salt; or in particular, the inorganic metal salt (X) is a zinc salt.

In another preferable embodiment, the radiation-sensitive colored composition of the present invention further includes a binder resin (E), wherein the binder resin (E) is an alkali-soluble binder; or the radiation-sensitive colored composition further includes a colorant other than the colorant multimer (A), and in particular, the colorant other than the colorant multimer (A) is C. I. Pigment Blue 15:6.

The present invention also encompasses a colored cured film obtained by curing the above-described radiation-sensitive colored composition, and a color filter including the colored cured film.

The present invention also encompasses a pattern forming method including a radiation-sensitive colored composition layer-forming step in which a radiation-sensitive colored composition is applied onto a substrate to form a radiation-sensitive colored composition layer, an exposure step in which the radiation-sensitive colored composition layer is exposed in pattern, and a colored pattern-forming step in which the radiation-sensitive colored composition layer after the exposure is developed to form a colored pattern; and a method for producing a color filter including a radiation-sensitive colored composition layer-forming step in which a radiation-sensitive colored composition is applied onto a substrate to form a radiation-sensitive colored composition layer, an exposure step in which the radiation-sensitive colored composition layer is exposed in pattern, and a colored pattern-forming step in which the radiation-sensitive colored composition layer after the exposure is developed to form a colored pattern.

The present invention also encompasses a solid state image device which includes the color filter or a color filter prepared by the method for producing the color filter, or a liquid crystal display apparatus which includes the color filter or a color filter prepared by the method for producing the color filter.

The present invention is particularly effective for forming a color filter for a solid state image device, in which a pixel pattern is formed in the form of a thin film (for example, a film having a thickness of 1 μm or less), and a high precision with a micro-size of 2 μm or less (the side length of the pixel pattern viewed in the direction normal to the substrate is, for example, 0.5 μm to 2.0 μm) is required, and thus, a rectangular cross-sectional profile is required.

According to the present invention, a radiation-sensitive colored composition which exhibits excellent developability, has excellent heat resistance and solvent resistance, and is capable of forming a colored pattern with less color transfer and color unevenness; a color filter which has excellent heat resistance and solvent resistance and has a colored pattern having less color transfer and color unevenness; a method for preparing the color filter; and a solid state image device and liquid crystal display apparatus, each of which includes the color filter can be provided.

DESCRIPTION OF THE PREFERRED EMBODIMENTS

Hereinbelow, the radiation-sensitive colored composition, the color filter and the method for producing the color filter, the solid state image device, and the liquid crystal display apparatus of the present invention will be described in detail. The description of the constitutional requirements as described below will be provided with respect to the representative embodiments of the present invention, but the present invention is not intended to be limited to such embodiments.

Furthermore, in the present specification, the description of "xx to yy" represents a numerical range including xx and yy.

Furthermore, in the present specification, the "(meth)acrylate" represents both or either of acrylate and methacrylate; the "(meth)acryl" represents both or either of acryl and methacryl; and the "(meth)acryloyl" represents both or either of acryloyl and methacryloyl.

The monomer in the present specification, which is distinguished from the oligomer and the polymer, refers to a compound having a weight average molecular weight of 2,000 or less.

In the present specification, the polymerizable compound refers to a compound having a polymerizable functional group, and may be either a monomer or a polymer. The polymerizable functional group refers to a group involving in the polymerization reaction.

Furthermore, regarding the expression of a group (atomic group) in the present specification, the expression not referring to being substituted and unsubstituted includes having a substituent as well as having no substituent. For example, the "alkyl group" includes an alkyl group having a substituent (substituted alkyl group) as well as an alkyl group having no substituent (unsubstituted alkyl group).

In the present specification, the term "step" includes any one of steps in which a desired action of the step is accomplished even though not distinctive from other steps, in addition to independent steps.

In the present invention, the "radiation" is intended to include visible light, ultraviolet rays, far ultraviolet rays, electron beams, X-rays, and the like.

The present invention relates to a radiation-sensitive colored composition including a colorant multimer (A), a polymerizable compound (B), a photopolymerization initiator (C), and an organic solvent (D), in which the content of an inorganic metal salt (X) including no colorant skeleton is 0.1% by mass or less with respect to a dye solid contents.

The radiation-sensitive colored composition of the present invention includes a colorant multimer (A), a polymerizable compound (B), a photopolymerization initiator (C), and an organic solvent (D), in which the content of the inorganic metal salt (X) including no colorant skeleton is 0.1% by mass or less with respect to the dye solid contents. It is thought that with this compositional constitution, the composition of the present invention has a colorant multimer with reduced motility due to thermal energy as compared with colorant monomers in the molecular dispersion state, and as a result, the color transfer is decreased. Further, since the aggregation of the colorant multimer derived from an inorganic metal salt is suppressed, the composition of the present invention has less color unevenness and exhibits excellent developability. In this regard, it becomes possible for the radiation-sensitive colored composition of the present invention to provide a color filter having high color purity and excellent pattern forming properties.

In particular, a specific structure of the colorant multimer (A) makes it possible to provide the composition of the present invention with a good hue and a high extinction coefficient, and excellent fastness such as solvent solubility, heat resistance, light resistance, and the like.

Furthermore, in a radiation-sensitive colored composition including a colorant multimer having a dipyrromethene metal complex as a constitutional unit, in particular, a colorant multimer having a dipyrromethene compound having a polymerizable group introduced thereinto as a constitutional unit, the colorant multimer functions as a polymerization component, and as a result, it becomes possible to provide a colored cured film having high solvent resistance and reduced color transfer.

In addition, by introducing the dipyrromethene metal complex or dipyrromethene compound having a polymerizable group introduced, and by introducing an alkali-soluble group, if necessary, a radiation-sensitive colored composition which is capable of providing a colored cured film having excellent pattern forming properties (low dependency on the concentration of the alkali developing liquid) can be obtained.

Hereinbelow, the radiation-sensitive colored composition, the color filter, the method for producing the same, the solid state image device, and the liquid crystal display apparatus of the present invention will be described in detail. The description of the constitutional requirements as described below is shown with respect to the representative embodiments of the present invention, but the present invention is not intended to be limited to the embodiments.

<<Radiation-Sensitive Colored Composition>>

The radiation-sensitive colored composition of the present invention includes a colorant multimer, a polymerizable composition, a photopolymerization initiator, and an organic solvent, and if necessary, other components.

<Colorant Multimer (A)>

The colorant multimer (A) used for the radiation-sensitive colored composition of the present invention is a colorant multimer which has a partial structure derived from a colorant, and includes structures of a dimer, a trimer, a polymer, and the like.

(Partial Structure Derived from Colorant)

The partial structure derived from a colorant, which is contained in the colorant multimer used for the radiation-sensitive colored composition of the present invention (which may be referred to as the "colorant structure" in some cases) is not particularly limited, and any one of various colorant structures including known colorant structures can be used. Examples of the known colorant structure include colorant structures derived from azo colorants, azomethine colorants (indoaniline colorants, indophenol colorants, and the like), dipyrromethene colorants, quinone-based colorants (benzoquinone colorants, naphthoquinone colorants, anthraquinone colorants, anthrapyridone colorants, and the like), carbonium colorants (diphenylmethane colorants, triphenylmethane colorants, xanthene colorants, acridine colorants, and the like), quinonimine colorants (oxazine colorants, thiazine colorants, and the like), azine colorants, polymethine colorants (oxonol colorants, merocyanine colorants, allylidene colorants, styryl colorants, and cyanine colorants, and among the cyanine colorants, squalirium colorants, croconium colorants, and the like), quinophthalone colorants, phthalocyanine colorants, subphthalocyanine colorants, perinone colorants, indigo colorants, thioindigo colorants, quinoline colorants, nitrocolorants, nitroso colorants, metal complex colorants, and the like. Among these colorant structures, from the viewpoints of the color characteristics, colorant structures derived from the colorant selected from azo colorants, dipyrromethene colorants, carbonium colorants (among these, xanthene colorants), polymethine colorants (among these, squalirium colorants), and phthalocyanine colorants are preferable; colorant structures derived from the colorant selected from dipyrromethene colorants, azo colorants, and phthalocyanine colorants are more preferable; colorant structures derived from the colorant selected from dipyrromethene colorants and phthalocyanine colorants are still more preferable; and colorant structures derived from a dipyrromethene colorant (which may be hereinafter referred to as the "dipyrromethene compound" in some cases) are particularly preferable. The specific colorant compounds which are capable of forming a colorant structure are described in "New Edition of Dye Handbook" (edited by Organic Synthetic Chemistry Society; Maruzen, 1970), "Color Index" (The Society of Dyers and colourists), "Colorant Handbook" (edited by Okawara; Kodansha, 1986), or the like.

Hereinbelow, a particularly preferable colorant structure (colorant compound) which is capable of forming a partial structure derived from a colorant, which is contained in the colorant multimer (A), will be described in detail.

<Dipyrromethene Compound>

As the colorant structure used for the radiation-sensitive colored composition of the present invention, a dipyrromethene metal complex compound that can be obtained from a dipyrromethene compound, a dipyrromethene compound, and a metal or metal compound is preferable.

As the dipyrromethene metal complex compound, a dipyrromethene metal complex compound that can be obtained from a dipyrromethene compound represented by the following general formula (M) and a metal or metal compound, and a tautomer thereof are preferable, and among these, in a preferable embodiment, a colorant structure derived from a dipyrromethene metal complex compound represented by the following general formula (7) or a dipyrromethene metal complex compound represented by the following general formula (8) may be exemplified, and the colorant structure represented by the following general formula (8) is most preferable.

[Dipyrromethene Metal Complex Compound that can be Obtained from Dipyrromethene Compound Represented by General Formula (M) and Metal or Metal Compound, and Tautomer Thereof]

One of preferable embodiments of the colorant structure of the present invention is a colorant structure that has, as a colorant moiety, a complex (which is hereinafter suitably referred to as a "specific complex"), in which a compound (dipyrromethene compound) represented by the following general formula (M) or a tautomer thereof is coordinated to a metal or metal compound.

Furthermore, in the present invention, a compound having a dipyrromethene structure is referred to as a dipyrromethene compound, and a complex in which the compound having a dipyrromethene structure is coordinated to a metal or metal compound is referred to as a dipyrromethene metal complex compound.

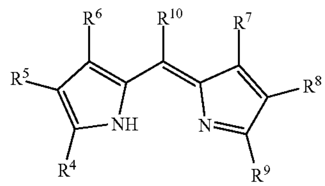

(M)

In the general formula (M), $R^4$ to $R^{10}$ each independently represent a hydrogen atom or a monovalent substituent, provided that $R^4$ and $R^9$ are not bonded to each other to form a ring.

The position at which the dipyrromethene metal complex compound represented by the general formula (M) is introduced into a structural unit represented by the general formula (A) to the general formula (C), a multimer represented by the general formula (D), or a monomer represented by the general formula (1), as described later, is not particularly limited, but from the viewpoint of synthetic suitability, introduction at any one position of $R^4$ to $R^9$ is preferable; introduction at any one position of $R^4$, $R^6$, $R^7$, and $R^9$ is more preferable; and introduction at any one position of $R^4$ and $R^9$ is still more preferable.

Examples of the monovalent substituent when $R^4$ to $R^9$ in the general formula (M) each represent a monovalent substituent include a substituent group (which will be hereinafter also referred to as a "substituent group A"), such as a halogen atom, an alkyl group, a cycloalkyl group, an alkenyl group, a cycloalkenyl group, an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an amino group (including an alkylamino group and an anilino group), an acylamino group, an aminocarbonylamino group, an alkoxycarbonylamino group, an aryloxycarbonylamino group, a sulfamoylamino group, an alkyl or arylsulfonylamino group, a mercapto group, an alkylthio group, an arylthio group, a heterocyclic thio group, a sulfamoyl group, a sulfo group, an alkyl or arylsulfinyl group, an alkyl or arylsulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, a silyl group, and the like. These will be described in detail.

Specific examples of the substituent group A include halogen atoms (such as a fluorine atom, a chlorine atom, a bromine atom, and an iodine atom), alkyl groups (preferably linear, branched, or cyclic alkyl groups having 1 to 48 carbon atoms, and more preferably linear, branched, or cyclic alkyl groups having 1 to 24 carbon atoms, for example, a methyl group, an ethyl group, a propyl group, an n-propyl group, an isopropyl group, a butyl group, a t-butyl group, a pentyl group, a hexyl group, a heptyl group, an octyl group, an n-octyl group, a 2-chloroethyl group, a 2-cyanoethyl group, a 2-ethylhexyl group, a dodecyl group, a hexadecyl group, a cyclopropyl group, a cyclopentyl group, a cyclohexyl group, a cyclopentyl group, a 1-norbornyl group, and a 1-adamantyl group), alkenyl groups (preferably linear, branched, or cyclic alkenyl groups having 2 to 48 carbon atoms, and more preferably linear, branched, or cyclic alkenyl groups having 2 to 18 carbon atoms, for example, a vinyl group, an allyl group, a 3-buten-1-yl group, a furenyl group, a geranyl group, an oleyl group, a 2-cyclopenten-1-yl group, a 2-cyclohexen-1-yl group, a bicycloalkenyl group (such as bicyclo[2,2,1]hept-2-en-1-yl and bicyclo[2,2,2]oct-2-en-4-yl groups), and a tricycloalkenyl group), alkynyl groups (preferably substituted or unsubstituted alkynyl groups having 2 to 30 carbon atoms, for example, an ethynyl group, a propargyl group, and a trimethylsilylethynyl group), aryl groups (preferably aryl groups having 6 to 48 carbon atoms, and more preferably aryl groups having 6 to 24 carbon atoms, for example, a phenyl group, a p-tolyl group, a naphthyl group, an m-chlorophenyl group, and an o-hexadecanoylaminophenyl group), heterocyclic groups (preferably heterocyclic groups having 1 to 32 carbon atoms, and more preferably heterocyclic groups having 1 to 18 carbon atoms, for example, a 2-thienyl group, a 4-pyridyl group, a 2-furyl group, a 2-pyrimidinyl group, a 1-pyridyl group, a 2-benzothiazolyl group, a 1-imidazolyl group, a 1-pyrazolyl group, and a benzotriazol-1-yl group), silyl groups (preferably silyl groups having 3 to 38 carbon atoms, and more preferably silyl groups having 3 to 18 carbon atoms, for example, a trimethylsilyl group, a triethylsilyl group, a tributylsilyl group, a t-butyldimethylsilyl group, and a t-hexyldimethylsilyl group), hydroxyl groups, cyano groups, nitro groups, alkoxy groups (preferably alkoxy groups having 1 to 48 carbon atoms, and more preferably alkoxy groups having 1 to 24 carbon atoms, for example, a methoxy group, an ethoxy group, a 1-butoxy group, a 2-butoxy group, an isopropoxy group, a t-butoxy group, an n-octyloxy group, a 2-methoxyethoxy group, and a dodecyloxy group, and preferably cycloalkyloxy groups having 1 to 48 carbon atoms, and more preferably cycloalkyloxy groups having 1 to 24 carbon atoms, for example, a cyclopentyloxy group and a cyclohexyloxy group), aryloxy groups (preferably aryloxy groups having 6 to 48 carbon atoms, and more preferably aryloxy groups having 6 to 24 carbon atoms, for example, a phenoxy group, a 1-naphthoxy group, a 2-methylphenoxy group, a 2,4-di-t-amylphenoxy group, a 4-t-butylphenoxy group, a 3-nitrophenoxy group, a 2-tetradecanoylaminophenoxy group), heterocyclic oxy groups (preferably heterocyclic oxy groups having 1 to 32 carbon atoms, and more preferably heterocyclic oxy groups having 1 to 18 carbon atoms, for example, a 1-phenyltetrazol-5-oxy group and a 2-tetrahydropyranyloxy group), silyloxy groups (preferably silyloxy groups having 1 to 32 carbon atoms, and more preferably silyloxy groups having 1 to 18 carbon atoms, for example, a trimethylsilyloxy group, a t-butyldimethylsilyloxy group, and a diphenylmethylsilyloxy group), acyloxy groups (preferably acyloxy groups having 2 to 48 carbon atoms, and more preferably acyloxy groups having 2 to 24 carbon atoms, for example, an acetoxy group, a pivaloyloxy group, a benzoyloxy group, a dodecanoyloxy group, a formyloxy group, an acetyloxy group, a stearoyloxy group, and a p-methoxyphenylcarbonyloxy group), alkoxycarbonyloxy groups (preferably alkoxycarbonyloxy groups having 2 to 48 carbon atoms, and more preferably alkoxycarbonyloxy groups having 2 to 24 carbon atoms, for example, a methoxycarbonyloxy group, an ethoxycarbonyloxy group, a t-butoxycarbonyloxy group, an n-octylcarbonyloxy group, and a cyclohexyloxycarbonyloxy group), aryloxycarbonyloxy groups (preferably aryloxycarbonyloxy groups having 7 to 32 carbon atoms, and more preferably aryloxycarbonyloxy groups having 7 to 24 carbon atoms, for example, a phenoxycarbonyloxy group, a p-methoxyphenoxycarbonyloxy group, and a p-n-hexadecyloxyphenoxycarbonyloxy group), carbamoyloxy groups (preferably carbamoyloxy groups having 1 to 48 carbon atoms, and more preferably carbamoyloxy groups having 1 to 24 carbon atoms, for example, an N,N-dimethylcarbamoyloxy group, an N-butylcarbamoyloxy group, an N-phenylcarbamoyloxy group, an N-ethyl-N-phenylcarbamoyloxy group, an N,N-diethylcarbamoyloxy group, a morpholinecarbonyloxy group, an N,N-di-n-octylaminocarbonyloxy group, and an N-n-octylcarbamoyloxy group), sulfamoyloxy groups (preferably sulfamoyloxy groups having 1 to 32 carbon atoms, and more preferably sulfamoyloxy groups having 1 to 24 carbon atoms, for example, an N,N-diethylsulfamoyloxy group and an N-propylsulfamoyloxy group), alkylsulfonyloxy groups (preferably alkylsulfonyloxy groups having 1 to 38 carbon atoms, and more preferably alkylsulfonyloxy groups having 1 to 24 carbon atoms, for example, a methylsulfonyloxy group, a hexadecylsulfonyloxy group, and a cyclohexylsulfonyloxy group), arylsulfonyloxy groups (preferably arylsulfonyloxy groups having 6 to 32 carbon atoms, and more preferably arylsulfonyloxy groups having 6 to 24 carbon atoms, for example, a phenylsulfonyloxy group), acyl groups (preferably acyl groups having 1 to 48 carbon atoms, and more preferably acyl groups having 1 to 24 carbon atoms, for example, a formyl group, an acetyl group, a pivaloyl group, a benzoyl group, a tetradecanoyl group, a cyclohexanoyl group, a 2-chloroacetyl group, a stearoyl group, and a p-n-octyloxyphenylcarbonyl group), alkoxycarbonyl groups (preferably alkoxycarbonyl groups having 2 to 48 carbon atoms, and more preferably alkoxycarbonyl groups having 2 to 24 carbon atoms, for example, a methoxycarbonyl group, an ethoxycarbonyl group, an octadecyloxycarbonyl group, a t-butoxycarbonyl group, a cyclohexyloxycarbonyl group, and a 2,6-di-tert-butyl-4-methylcyclohexyloxycarbonyl group), aryloxycarbonyl groups (preferably aryloxycarbonyl groups having 7 to 32 carbon atoms, and more preferably aryloxycarbonyl groups having 7 to 24 carbon atoms, for example, a phenoxycarbonyl group, an o-chlorophenoxycarbonyl group, an m-nitrophenoxycarbonyl group, and a p-t-butylphenoxycarbonyl group), carbamoyl groups (preferably carbamoyl groups having 1 to 48 carbon atoms, and more preferably carbamoyl groups having 1 to 24 carbon atoms, for example, a carbamoyl group, an N-methylcarbamoyl group, an N,N-dimethylcarbamoyl group, an N,N-diethylcarbamoyl group, an N-ethyl-N-octylcarbamoyl group, an N,N-dibutylcarbamoyl group, an N-propylcarbamoyl group, an N-phenylcarbamoyl group, an N-methyl-N-phenylcarbamoyl group, an N,N-dicyclohexylcarbamoyl group, an N,N-di-n-octylcarbamoyl group, and an N-(methylsulfonyl)carbamoyl group), amino groups (preferably amino groups having 32 or less carbon atoms, and more preferably amino groups having 24 or less carbon atoms, for example, an amino group, a methylamino group, an N,N-dibutylamino group, a tetradecylamino group, a 2-ethylhexylamino group, a cyclohexylamino group, a dimethylamino group, an anilino group, an N-methylanilino group, a diphenylamino group, and an N-1,3,5-triazin-2-ylamino group), acylamino groups (preferably formylamino groups, substituted or unsubstituted alkylcarbonylamino group having 1 to 30 carbon atoms, and substituted or unsubstituted arylcarbonylamino groups having 6 to 30 carbon atoms, for example, formylamino, acetylamino, pivaloylamino, lauroylamino, benzoylamino, and 3,4,5-tri-n-octyloxyphenylcarbonylamino), aminocarbonylamino groups (preferably substituted or unsubstituted aminocarbonylamino groups having 1 to 30 carbon atoms, for example, carbamoylamino, N,N-dimethylaminocarbonylamino, N,N-diethylaminocarbonylamino, and morpholinecarbonylamino), anilino groups (preferably anilino groups having 6 to 32 carbon atoms, and more preferably anilino groups having 6 to 24 carbon atoms, for example, an anilino group and an N-methylanilino group), heterocyclic amino groups (preferably heterocyclic amino groups having 1 to 32 carbon atoms, and more preferably heterocyclic amino groups having 1 to 18 carbon atoms, for example, a 4-pyridylamino group), carbonamide groups (preferably carbonamide groups having 2 to 48 carbon atoms, and more preferably carbonamide groups having 2 to 24 carbon atoms, for example, an acetamide group, a benzamide group, a tetradecaneamide group, a pivaloylamide group, and a cyclohexanamide group), ureido groups (preferably ureido groups having 1 to 32 carbon atoms, and more preferably ureido groups having 1 to 24 carbon atoms, for example, a ureido group, an N,N-dimethylureido group, and an N-phenylureido group), imide groups (preferably imide groups having 36 or less carbon atoms, and more preferably imide groups having 24 or less carbon atoms, for example, an N-succinimide group and an N-phthalimide group), alkoxycarbonylamino groups (preferably alkoxycarbonylamino groups having 2 to 48 carbon atoms, and more preferably alkoxycarbonylamino groups having 2 to 24 carbon atoms, for example, a methoxycarbonylamino group, an ethoxycarbonylamino group, a t-butoxycarbonylamino group, an octadecyloxycarbonylamino group, a cyclohexyloxycarbonylamino group, and an N-methylmethoxycarbonylamino group), aryloxycarbonylamino groups (preferably aryloxycarbonylamino groups having 7 to 32 carbon atoms, and more preferably aryloxycarbonylamino groups having 7 to 24 carbon atoms, for example, a phenoxycarbonylamino group, a p-chlorophenoxycarbonylamino group, an m-n-octyloxyphenoxycarbonylamino group), sulfonamide groups (preferably sulfonamide groups having 1 to 48 carbon atoms, and more preferably sulfonamide groups having 1 to 24 carbon atoms, for example, a methane sulfonamide group, a butanesulfonamide group, a benzene sulfonamide group, a hexadecanesulfoneamide group, and a cyclohexane sulfonamide group), sulfamoylamino groups (preferably sulfamoylamino groups having 1 to 48 carbon atoms, and more preferably sulfamoylamino groups having 1 to 24 carbon atoms, for example, an N,N-dipropylsulfamoylamino group, an N-ethyl-N-dodecylsulfamoylamino group, a sulfamoylamino group, an N,N-dimethylaminosulfonylamino group, and an N-n-octylaminosulfonylamino group), alkyl or arylsulfonylamino groups (preferably substituted or unsubstituted alkylsulfonylamino group having 1 to 30 carbon atoms and substituted or unsubstituted arylsulfonylamino groups having 6 to 30 carbon atoms, for example, methylsulfonylamino, butylsulfonylamino, phenylsulfonylamino, 2,3,5-trichlorophenylsulfonylamino, and p-methylphenylsulfonylamino), mercapto groups, azo groups (preferbly azo groups having 1 to 32 carbon atoms, and more preferably azo groups having 1 to 24 carbon atoms, for example, a phenylazo group, a 3-pyrazolylazo group, a p-chlorophenylazo group, and a 5-ethylthio-1,3,4-thiadiazol-2-ylazo group), alkylthio groups (preferably alkylthio groups having 1 to 48 carbon atoms, and more preferably alkylthio groups having 1 to 24 carbon atoms, for example, a methylthio group, an ethylthio group, an octylthio group, a cyclohexylthio group, an n-hexadecylthio group), arylthio groups (preferably arylthio groups having 6 to 48 carbon atoms, and more preferably arylthio groups having 6 to 24 carbon atoms, for example, a phenylthio group, a p-chlorophenylthio group, and an m-methoxyphenylthio group), heterocyclic thio groups (preferably heterocyclic thio groups having 1 to 32 carbon atoms, and more preferably heterocyclic thio groups having 1 to 18 carbon atoms, for example, a 2-benzothiazolylthio group, a 2-pyridylthio group, and a 1-phenyltetrazolylthio group), alkylsulfinyl groups (preferably alkylsulfinyl groups having 1 to 32 carbon atoms, and more preferably alkylsulfinyl groups having 1 to 24 carbon atoms, for example, a methylsulfinyl group, an ethylsulfinyl group, and a dodecanesulfinyl group), arylsulfinyl groups (preferably arylsulfinyl groups having 6 to 32 carbon atoms, and more preferably arylsulfinyl groups having 6 to 24 carbon atoms, for example, a phenylsulfinyl group, a p-methylphenylsulfinyl group), alkylsulfonyl groups (preferably alkylsulfonyl groups having 1 to 48 carbon atoms, and more preferably alkylsulfonyl groups having 1 to 24 carbon atoms, for example, a methylsulfonyl group, an ethylsulfonyl group, a propylsulfonyl group, a butylsulfonyl group, an isopropylsulfonyl group, a 2-ethylhexylsulfonyl group, a hexadecylsulfonyl group, an octylsulfonyl group, and a cyclohexylsulfonyl group), arylsulfonyl groups (preferably arylsulfonyl groups having 6 to 48 carbon atoms, and more preferably arylsulfonyl groups having 6 to 24 carbon atoms, for example, a phenylsulfonyl group, a 1-naphthylsulfonyl group, and a p-methylphenylsulfonyl group), sulfamoyl groups (preferably sulfamoyl groups having 32 or less carbon atoms, and more preferably sulfamoyl groups having 24 or less carbon atoms, for example, a sulfamoyl group, an N,N-dipropylsulfamoyl group, an N-ethyl-N-dodecylsulfamoyl group, an N-ethyl-N-phenylsulfamoyl group, an N-cyclohexylsulfamoyl group, an N-ethylsulfamoyl group, an N-(3-dodecyloxy propyl)sulfamoyl group, an N,N-dimethylsulfamoyl group, an N-acetylsulfamoyl group, an N-benzoylsulfamoyl group, and an N—(N'-phenylcarbamoyl)sulfamoyl group), a sulfo group, phosphonyl groups (preferably phosphonyl groups having 1 to 32 carbon atoms, and more preferably phosphonyl groups having 1 to 24 carbon atoms, for example, a phenoxyphosphonyl group, an octyloxyphosphonyl group, and a phenylphosphonyl group), phosphinoylamino groups (preferably phosphinoylamino groups having 1 to 32 carbon atoms, and more preferably phosphinoylamino groups having 1 to 24 carbon atoms, for example, a diethoxyphosphinoylamino group and a dioctyloxyphosphinoylamino group), phosphino groups (preferably substituted or unsubstituted phosphino groups having 2 to 30 carbon atoms, for example, dimethylphosphino, diphenylphosphino, and methylphenoxyphosphino), phosphinyl groups (preferably substituted or unsubstituted phosphinyl groups having 2 to 30 carbon atoms, for example, phosphinyl, dioctyloxyphosphinyl, and diethoxyphosphinyl), phosphinyloxy groups (preferably substituted or unsubstituted phosphinyloxy groups having 2 to 30 carbon atoms, for example, diphenoxyphosphinyloxy and dioctyloxyphosphinyloxy), phosphinylamino groups (preferably substituted or unsubstituted phosphinylamino groups having 2 to 30 carbon atoms, for example, dimethoxyphosphinylamino and dimethylaminophosphinylamino), and silyl groups (preferably substituted or unsubstituted silyl groups having 3 to 30 carbon atoms, for example, trimethylsilyl, t-butyldimethylsilyl, and phenyldimethylsilyl).

In the case where the monovalent substituent represented by $R^4$ to $R^9$ in the general formula (M) is a group that may further be substituted, the monovalent substituent may further be substituted with any of the substituents mentioned in the substituent group A, and when the monovalent substituent has two or more substituents, these substituents may be the same as or different from each other.

$R^4$ and $R^5$, $R^5$ and $R^6$, $R^7$ and $R^8$, and $R^8$ and $R^9$ in the general formula (M) may be each independently bonded to each other to form a 5-, 6-, or 7-membered saturated ring or unsaturated ring, provided that $R^4$ and $R^9$ are not bonded to each other to form a ring. In the case where the 5-, 6-, or 7-membered ring thus formed is a group that may further be substituted, the ring may further be substituted with any of the substituents mentioned in the substituent group A, and when the monovalent substituent has two or more substituents, these substituents may be the same as or different from each other.

In the case where $R^4$ and $R^5$, $R^5$ and $R^6$, $R^7$ and $R^8$, and $R^8$ and $R^9$ in the general formula (M) may be each independently bonded to each other to form a 5-, 6-, or 7-membered saturated ring or unsaturated ring having no substituent, examples of the 5-, 6-, or 7-membered saturated ring or unsaturated ring having no substituent include a pyrrole ring, a furan ring, a thiophene ring, a pyrazole ring, an imidazole ring, a triazole ring, an oxazole ring, a thiazole ring, a pyrrolidine ring, a piperidine ring, a cyclopentene ring, a cyclohexene ring, a benzene ring, a pyridine ring, a pyridine ring, and a pyridazine ring, and preferably a benzene ring and a pyridine ring.

$R^{10}$ in the general formula (M) preferably represents a hydrogen atom, a halogen atom, an alkyl group, an aryl group or a heterocyclic group. Each of the hydrogen atom, the halogen atom, the alkyl group, the aryl group, and the heterocyclic group has the same definition as the hydrogen atom, the halogen atom, the alkyl group, the aryl group, and the heterocyclic group in the substituent, and has the same preferable definitions as the hydrogen atom, the halogen atom, the alkyl group, the aryl group and the heterocyclic group in any of the substituents mentioned in the substituent group A, and a preferable range thereof is also the same.

When $R^{10}$ represents an alkyl group, an aryl group, or a heterocyclic group, and the alkyl group, aryl group, or heterocyclic group is a group that may further be substituted, the monovalent substituent may further be substituted with any of the substituents mentioned in the substituent group A, and when the monovalent substituent has two or more substituents, these substituents may be the same as or different from each other.

~Metal or Metal Compound~

The specific complex in the present invention is a complex in which the compound represented by the general formula (M) or a tautomer thereof is coordinated to a metal atom or metal compound.

Herein, the metal atom or metal compound may be any metal atom or metal compound as long as it may form a complex, and examples thereof include bivalent metal atoms, bivalent metal oxides, bivalent metal hydroxides, and bivalent metal chlorides. Specific examples of the metal atom or metal compound include Zn, Mg, Si, Sn, Rh, Pt, Pd, Mo, Mn, Pb, Cu, Ni, Co, Fe, and the like as well as metal chlorides such as $AlCl_3$, $InCl_3$, $FeCl_2$, $TiCl_2$, $SnCl_2$, $SiCl_2$, $GeCl_2$, and the like, metal oxides such as TiO, VO, and the like; and metal hydroxides such as $Si(OH)_2$ and the like.

Among these, Fe, Zn, Mg, Si, Pt, Pd, Mo, Mn, Cu, Ni, Co, TiO, or VO is preferable; Zn, Mg, Si, Pt, Pd, Cu, Ni, Co, or VO is more preferable; and Zn is most preferable, from the viewpoints of stability, spectral characteristics, heat resistance, light resistance, production suitability, and the like of the complex.

A preferable embodiment of the specific complex including the compound represented by the general formula (M) and the metal atom or the metal compound is described below.

Namely, in the general formula (M), it is preferable that $R^4$ and $R^9$ each independently represent a hydrogen atom, an alkyl group, an alkenyl group, an aryl group, a heterocyclic group, a silyl group, a hydroxyl group, a cyano group, an alkoxy group, an aryloxy group, a heterocyclic oxy group, an acyl group, an alkoxycarbonyl group, a carbamoyl group, an amino group, an anilino group, a heterocyclic amino group, a carbonamido group, a ureido group, an imido group, an alkoxycarbonylamino group, an aryloxycarbonylamino group, a sulfonamido group, an azo group, an alkylthio group, an arylthio group, a heterocyclic thio group, an alkylsulfonyl group, an arylsulfonyl group, or a phosphinoylamino group; $R^5$ and $R^8$ each independently represent a hydrogen atom, a halogen atom, an alkyl group, an alkenyl group, an aryl group, a heterocyclic group, a hydroxyl group, a cyano group, a nitro group, an alkoxy group, an aryloxy group, a heterocyclic oxy group, an acyl group, an alkoxycarbonyl group, an aryloxycarbonyl group, a carbamoyl group, an imido group, an alkoxycarbonylamino group, a sulfonamido group, an azo group, an alkylthio group, an arylthio group, a heterocyclic thio group, an alkylsulfonyl group, an arylsulfonyl group, or a sulfamoyl group; $R^6$ and $R^7$ each independently represent a hydrogen atom, a halogen atom, an alkyl group, an alkenyl group, an aryl group, a heterocyclic group, a silyl group, a hydroxyl group, a cyano group, an alkoxy group, an aryloxy group, a heterocyclic oxy group, an acyl group, an alkoxycarbonyl group, a carbamoyl group, an anilino group, a carbonamido group, a ureido group, an imido group, an alkoxycarbonylamino group, a sulfonamido group, an azo group, an alkylthio group, an arylthio group, a heterocyclic thio group, an alkylsulfonyl group, an arylsulfonyl group, a sulfamoyl group, or a phosphinoylamino group; $R^{10}$ represents a hydrogen atom, a halogen atom, an alkyl group, an aryl group, or a heterocyclic group; and the metal atom or the metal compound is Zn, Mg, Si, Pt, Pd, Mo, Mn, Cu, Ni, Co, TiO, or VO.

In a preferable range of the specific complex in the present invention, $R^4$ and $R^9$ each independently represent a hydrogen atom, an alkyl group, an alkenyl group, an aryl group, a heterocyclic group, a silyl group, a hydroxyl group, a cyano group, an alkoxy group, an aryloxy group, a heterocyclic oxy group, an acyl group, an alkoxycarbonyl group, a carbamoyl group, an amino group, an anilino group, a heterocyclic amino group, a carbonamide group, a ureido group, an imide group, an alkoxycarbonylamino group, an aryloxycarbonylamino group, a sulfonamide group, an azo group, an alkylthio group, an arylthio group, a heterocyclic thio group, an alkylsulfonyl group, an arylsulfonyl group, or a phosphinoylamino group; $R^5$ and $R^8$ each independently represent a hydrogen atom, a halogen atom, an alkyl group, an alkenyl group, an aryl group, a heterocyclic group, a hydroxyl group, a cyano group, a nitro group, an alkoxy group, an aryloxy group, a heterocyclic oxy group, an acyl group, an alkoxycarbonyl group, an aryloxycarbonyl group, a carbamoyl group, an imide group, an alkoxycarbonylamino group, a sulfonamide group, an azo group, an alkylthio group, an arylthio group, a heterocyclic thio group, an alkylsulfonyl group, an arylsulfonyl group, or a sulfamoyl group; $R^6$ and $R^7$ each independently represent a hydrogen atom, a halogen atom, an alkyl group, an alkenyl group, an aryl group, a heterocyclic group, a silyl group, a hydroxyl group, a cyano group, an alkoxy group, an aryloxy group, a heterocyclic oxy group, an acyl group, an alkoxycarbonyl group, a carbamoyl group, an anilino group, a carbonamide group, a ureido group, an imide group, an alkoxycarbonylamino group, a sulfonamide group, an azo group, an alkylthio group, an arylthio group, a heterocyclic thio group, an alkylsulfonyl group, an arylsulfonyl group, a sulfamoyl group, or a phosphinoylamino group; $R^{10}$ represents a hydrogen atom, a halogen atom, an alkyl group, an aryl group, or a heterocyclic group; and the metal or metal compound is Zn, Mg, Si, Pt, Pd, Mo, Mn, Cu, Ni, Co, TiO, or VO.

In a particularly preferable range of the specific complex in the present invention, in the general formula (M), $R^4$ and $R^9$ each independently represent a hydrogen atom, an alkyl group, an aryl group, a heterocyclic group, an amino group, a heterocyclic amino group, a carbonamide group, a ureido group, an imide group, an alkoxycarbonylamino group, a sulfonamide group, an azo group, an alkylsulfonyl group, an arylsulfonyl group, or a phosphinoylamino group; $R^5$ and $R^8$ each independently represent an alkyl group, an aryl group, a heterocyclic group, a cyano group, an acyl group, an alkoxycarbonyl group, a carbamoyl group, an alkylsulfonyl group, or an arylsulfonyl group; $R^6$ and $R^7$ each independently represent a hydrogen atom, an alkyl group, an aryl group, or a heterocyclic group; $R^{10}$ represents a hydrogen atom, an alkyl group, an aryl group, or a heterocyclic group; and the metal or metal compound is Zn, Cu, Co, or VO.

In addition, the particularly preferable embodiment also includes an embodiment involving a compound represented by the general formula (7) or the general formula (8) as described in detail below.

[Dipyrromethene Metal Complex Compound Represented by General Formula (7)]

One of the embodiments of the colorant structure of the present invention is a dipyrromethene metal complex compound represented by the following general formula (7).

(7)

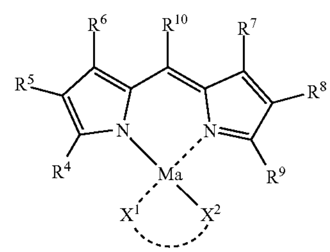

In the general formula (7), $R^4$ to $R^9$ each independently represent a hydrogen atom or a monovalent substituent; $R^{10}$ represents a hydrogen atom, a halogen atom, an alkyl group, an aryl group, or a heterocyclic group; Ma represents a metal atom or metal compound; $X^1$ represents a group that can be bonded to Ma; $X^2$ represents a group that neutralizes the charge of Ma; and $X^1$ and $X^2$ may be bonded to each other to form a 5-, 6-, or 7-membered ring together with Ma, provided that $R^4$ and $R^9$ are not bonded to each other to form a ring.

Furthermore, examples of the dipyrromethene metal complex represented by the general formula (7) include tautomers thereof.

When the dipyrromethene metal complex compound represented by the general formula (7) is introduced into the structural units represented by the general formula (A) to the general formula (C), the multimer represented by the general formula (D) or the monomer represented by the general formula (1), the position to be introduced is not particularly limited, but is preferably any one of $R^4$ to $R^9$, more preferably any one of $R^4$, $R^6$, $R^7$, and $R^9$, and still more preferably one of $R^4$ and $R^9$, in view of the synthetic compatibility.

Examples of the method of introducing an alkali-soluble group into the colorant multimer of the present invention include a method in which the alkali-soluble group is introduced into one, or two or more substituents of $R^4$ to $R^{10}$, and X', and $X^2$ of the dipyrromethene metal complex compound represented by the general formula (7). The alkali-soluble group is preferably introduced into any one of $R^4$ to $R^9$ and $X^1$, more preferably any one of $R^4$, $R^6$, $R^7$, and $R^9$, and still more preferably one of $R^4$ or $R^9$.

The dipyrromethene metal complex compound represented by the general formula (7) may have a functional group in addition to the alkali-soluble group, unless the effect of the present invention is impaired.

$R^4$ to $R^9$ in the general formula (7) have the same definitions as $R^4$ to $R^9$ in the general formula (M), and a preferable embodiment thereof is also the same.

In the general formula (7), Ma represents a metal atom or a metal compound. The metal atom or the metal compound may be any metal atom or metal compound as long as the metal atom or metal compound can form a complex, and examples thereof include a divalent metal atom, a divalent metal oxide, a divalent metal hydroxide, and a divalent metal chloride.

Examples thereof include Zn, Mg, Si, Sn, Rh, Pt, Pd, Mo, Mn, Pb, Cu, Ni, Co, Fe, and the like, metal chlorides such as $AlCl_3$, $InCl_3$, $FeCl_2$, $TiCl_2$, $SnCl_2$, $SiCl_2$, $GeCl_2$, and the like, metal oxides such as TiO, VO, and the like, and metal hydroxide such as $Si(OH)_2$ and the like.

Among these, Fe, Zn, Mg, Si, Pt, Pd, Mo, Mn, Cu, Ni, Co, TiO, and VO are preferable; Zn, Mg, Si, Pt, Pd, Cu, Ni, Co, and VO are more preferable; Zn, Cu, Co, and VO are still more preferable; and Zn is most preferable, from the viewpoints of the stability of the complex, spectral characteristics, heat resistance, light resistance, production, and the like.

Furthermore, in the general formula (7), $R^{10}$ represents a hydrogen atom, a halogen atom, an alkyl group, an aryl group, or a heterocyclic group, and preferably a hydrogen atom.

In the general formula (7), $X^1$ may be any group as long as it can be bonded to Ma, and specific examples thereof include water, alcohols (such as methanol, ethanol, and propanol) and the like, and groups derived from the compounds described in "Metal Chelates" ([1] Takeichi Sakaguchi and Kyohei Ueno (1995 Nankodo), [2] "Metal Chelates" (1996), [3] "Metal Chelates" (1997), and the like). Among these, in view of production, water, carboxylic acid compounds, and alcohols are preferable, and water and carboxylic acid compounds are more preferable.

In the general formula (7), examples of "the group that neutralizes the charge of Ma" represented by $X^2$ include a halogen atom, a hydroxyl group, a carboxyl group, a phosphoric acid group, a sulfonic acid group, and the like, and among these, in view of production, a halogen atom, a hydroxyl group, a carboxyl group and a sulfonic acid group are preferable, and a hydroxyl group and a carboxyl group are more preferable.

$X^1$ and $X^2$ in the general formula (7) may be bonded to each other to form a 5-, 6-, or 7-membered ring together with Ma. The 5-, 6-, or 7-membered ring to be formed may be a saturated or unsaturated ring. The 5-, 6-, or 7-membered ring may be formed from only carbon atoms and hydrogen atoms, or may be a heterocycle having at least one atom selected from a nitrogen atom, an oxygen atom, or/and a sulfur atom.

In the preferable embodiment of the compound represented by the general formula (7), $R^4$ to $R^9$ each independently have the same preferable definitions as $R^4$ to $R^9$ in the general formula (M); $R^{10}$ has the same preferable definition as $R^{10}$ in the general formula (M); Ma is Zn, Cu, Co, or VO; $X^1$ represents water or a carboxylic acid compound; $X^2$ represents a hydroxyl group or a carboxyl group; and $X^1$ and $X^2$ may be bonded to each other to form a 5- or 6-membered ring.

[Dipyrromethene Metal Complex Represented by General Formula (8)]

One of the colorant structures used for the radiation-sensitive colored composition of the present invention is a dipyrromethene metal complex compound represented by the following general formula (8).

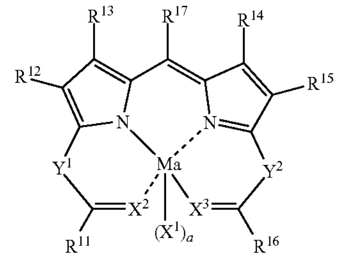

(8)

In the general formula (8), $R^{11}$ and $R^{16}$ each independently represent an alkyl group, an alkenyl group, an aryl group, a heterocyclic group, an alkoxy group, an aryloxy group, an alkylamino group, an arylamino group, or a heterocyclic amino group; $R^{12}$ to $R^{15}$ each independently represent a hydrogen atom or a monovalent substituent; $R^{17}$ represents a hydrogen atom, a halogen atom, an alkyl group, an aryl group, or a heterocyclic group; Ma represents a metal atom or metal compound; $X^2$ and $X^3$ each independently represent NR (wherein R represents a hydrogen atom, an alkyl group, an alkenyl group, an aryl group, a heterocyclic group, an acyl group, an alkylsulfonyl group, or an arylsulfonyl group), a nitrogen atom, an oxygen atom, or a sulfur atom; $Y^1$ and $Y^2$ each independently represent $NR^c$ (wherein $R^c$ represents a hydrogen atom, an alkyl group, an alkenyl group, an aryl group, a heterocyclic group, an acyl group, an alkylsulfonyl group, or an arylsulfonyl group), a nitrogen atom or a carbon atom; $R^{11}$ and $Y^1$ may be bonded to each other to form a 5-, 6-, or 7-membered ring; $R^{16}$ and $Y^2$ may be bonded to each other to form a 5-, 6-, or 7-membered ring; $X^1$ represents a group that can be bonded to Ma; and a represents 0, 1, or 2.

Further, the dipyrromethene metal complex compound represented by the general formula (8) also includes a tautomer thereof.

The position of the structural units represented by the general formula (A) to the general formula (C), the multimer represented by the general formula (D), or the monomer represented by the general formula (1), into which the dipyrromethene metal complex compound represented by the general formula (8) is introduced, is not particularly limited as long as the effect of the present invention is not impaired, but is preferably any one of $R^{11}$ to $R^{17}$, $X^1$, and $Y^1$ to $Y^2$. In view of the synthetic compatibility, the dipyrromethene metal complex compound is preferably introduced into any one of $R^{11}$ to $R^{16}$ and $X^1$, more preferably any one of $R^{11}$, $R^{13}$, $R^{14}$, and $R^{16}$, and still more preferably one of $R^{11}$ and $R^{16}$.

When the colorant monomer or structural unit having an alkali-soluble group is used, examples of the method of introducing an alkali-soluble group into the colorant multimer of the present invention includes a method in which the alkali-soluble group can be introduced into one, or two more of the substituents of $R^{11}$ to $R^{17}$, $X^1$, and $Y^1$ to $Y^2$ of the dipyrromethene metal complex compound represented by the general formula (8). The alkali-soluble group is preferably introduced into any one of $R^{11}$ to $R^{16}$, and $X^1$, more preferably any one of $R^{11}$, $R^{13}$, $R^{14}$, and $R^{16}$, and still more preferably one of $R^{11}$ and $R^{16}$.

The dipyrromethene metal complex compound represented by the general formula (8) may have a functional group in addition to the alkali-soluble group unless the effect of the present invention is impaired.

In the general formula (8), $R^{12}$ to $R^{15}$ have the same definitions as $R^5$ to $R^8$ in the general formula (M), respectively, and a preferable embodiment thereof is also the same. $R^{17}$ has the same definition as $R^{10}$ of in the general formula (M), and a preferable embodiment thereof is also the same. Ma has the same definition as Ma in the general formula (7), and a preferable embodiment thereof is also the same.

More specifically, regarding $R^{12}$ to $R^{15}$ in the general formula (8), it is preferable that $R^{12}$ and $R^{15}$ each independently represent an alkoxycarbonyl group, an aryloxycarbonyl group, a carbamoyl group, an alkylsulfonyl group, an arylsulfonyl group, a nitrile group, an imido group, or a carbamoyl sulfonyl group; it is more preferable that $R^{12}$ and $R^{15}$ each independently represent an alkoxycarbonyl group, an aryloxycarbonyl group, a carbamoyl group, an alkylsulfonyl group, a nitrile group, an imido group, or a carbamoyl sulfonyl group; it is still more preferable that $R^{12}$ and $R^{15}$ each independently represent an alkoxycarbonyl group, an aryloxycarbonyl group, a carbamoyl group, a nitrile group, an imido group, or a carbamoyl sulfonyl group; and it is particularly preferable that $R^{12}$ and $R^{15}$ each independently represent an alkoxycarbonyl group, an aryloxycarbonyl group, or a carbamoyl group.

In the general formula (8), it is preferable that $R^{13}$ and $R^{14}$ each independently represent a substituted or unsubstituted alkyl group, a substituted or unsubstituted aryl group or a substituted or unsubstituted heterocyclic group; and it is more preferable that $R^{13}$ and $R^{14}$ each independently represent a substituted or unsubstituted alkyl group or a substituted or unsubstituted aryl group. Herein, specific examples of the more preferable alkyl, aryl, and heterocyclic groups include the specific examples for $R^6$ and $R^7$ in the general formula (M).

In the general formula (6), $R^{11}$ and $R^{16}$ each independently represent alkyl groups (preferably linear, branched, or cyclic alkyl groups having 1 to 36 carbon atoms, and more preferably linear, branched, or cyclic alkyl groups having 1 to 12 carbon atoms, such as a methyl group, an ethyl group, a propyl group, an isopropyl group, a butyl group, an isobutyl group, a t-butyl group, a hexyl group, a 2-ethylhexyl group, a dodecyl group, a cyclopropyl group, a cyclopentyl group, a cyclohexyl group, and a 1-adamantyl group), alkenyl groups (preferably alkenyl groups having 2 to 24 carbon atoms, and more preferably alkenyl groups having 2 to 12 carbon atoms, for example, a vinyl group, an allyl group, and a 3-buten-1-yl group), aryl groups (preferably aryl groups having 6 to 36 carbon atoms, and more preferably aryl groups having 6 to 18 carbon atoms, for example, a phenyl group, and a naphthyl group), heterocyclic groups (preferably heterocyclic groups having 1 to 24 carbon atoms, and more preferably heterocyclic groups having 1 to 12 carbon atoms, for example, a 2-thienyl group, a 4-pyridyl group, a 2-furyl group, a 2-pyrimidinyl group, a 2-pyridyl group, a 2-benzothiazolyl group, a 1-imidazolyl group, a 1-pyrazolyl group, and a benzotriazol-1-yl group), alkoxy groups (preferably alkoxy groups having 1 to 36 carbon atoms, and more preferably alkoxy groups having 1 to 18 carbon atoms, for example, a methoxy group, an ethoxy group, a propyloxy group, a butoxy group, a hexyloxy group, a 2-ethylhexyloxy group, a dodecyloxy group, and a cyclohexyloxy group), aryloxy groups (preferably aryloxy groups having 6 to 24 carbon atoms, and more preferably aryloxy groups having 1 to 18 carbon atoms, for example, a phenoxy group, and a naphthyloxy group), alkylamino groups (preferably alkylamino groups having 1 to 36 carbon atoms, and more preferably alkylamino groups having 1 to 18 carbon atoms, for example, a methylamino group, an ethylamino group, a propylamine group, a butylamino group, a hexylamino group, a 2-ethylhexylamino group, an isopropylamino group, a t-butylamino group, a t-octylamino group, a cyclohexylamino group, an N,N-diethylamino group, an N,N-dipropylamino group, an N,N-dibutylamino group, and an N-methyl-N-ethylamino group), arylamino groups (preferably arylamino groups having 6 to 36 carbon atoms, and more preferably arylamino groups having 6 to 18 carbon atoms, for example, a phenylamino group, a naphthylamino group, an N,N-diphenylamino group, and an N-ethyl-N-phenylamino group), or heterocyclic amino groups (preferably heterocyclic amino groups having 1 to 24 carbon atoms, and more preferably heterocyclic amino groups having 1 to 12 carbon atoms, for example, a 2-aminopyrrole group, a 3-aminopyrazole group, a 2-aminopyridine group, and a 3-aminopyridine group).

In the general formula (8), it is preferable that $R^{11}$ and $R^{16}$ each independently represent an alkyl group, an alkenyl group, an aryl group, a heterocyclic group, an alkylamino group, an arylamino group or a heterocyclic amino group; it is more preferable that $R^{11}$ and $R^{16}$ each independently represent an alkyl group, an alkenyl group, an aryl group, or a heterocyclic group; it is still more preferable that $R^{11}$ and $R^{16}$ eachindependently represent an alkyl group, an alkenyl group, or an aryl group; and it is particularly preferable that $R^{11}$ and $R^{16}$ each independently represent an alkyl group.

In the general formula (8), when the alkyl group, an alkenyl group, an aryl group, a heterocyclic group, an alkoxy group, an aryloxy group, an alkylamino group, an arylamino group or heterocyclic amino group of $R^{11}$ and $R^{16}$ is a group that may further be substituted, it may be substituted with any of the substituents mentioned as the substituent of $R^1$ of the general formula (1) described below, and when it is substituted with two or more substituents, the substituents may be the same as or different from each other.

In the general formula (6), $X^2$ and $X^3$ each independently represent NR, a nitrogen atom, an oxygen atom or a sulfur atom, wherein R represents a hydrogen atom, alkyl groups (preferably linear, branched, or cyclic alkyl groups having 1 to 36 carbon atoms, and more preferably linear, branched, or cyclic alkyl groups having 1 to 12 carbon atoms, for example, a methyl group, an ethyl group, a propyl group, an isopropyl group, a butyl group, an isobutyl group, a t-butyl group, a hexyl group, a 2-ethylhexyl group, a dodecyl group, a cyclopropyl group, a cyclopentyl group, a cyclohexyl group, and a 1-adamantyl group), alkenyl groups (preferably alkenyl groups having 2 to 24 carbon atoms, and more preferably alkenyl groups having 2 to 12 carbon atoms, for example, a vinyl group, an allyl group, and a 3-buten-1-yl group), aryl groups (preferably aryl groups having 6 to 36 carbon atoms, and more preferably aryl groups having 6 to 18 carbon atoms, for example, a phenyl group, and a naphthyl group), heterocyclic groups (preferably heterocyclic groups having 1 to 24 carbon atoms, and more preferably heterocyclic groups having 1 to 12 carbon atoms, for example, a 2-thienyl group, a 4-pyridyl group, a 2-furyl group, a 2-pyrimidinyl group, a 1-pyridyl group, a 2-benzothiazolyl group, a 1-imidazolyl group, a 1-pyrazolyl group, and a benzotriazol-1-yl group), acyl groups (preferably acyl groups having 1 to 24 carbon atoms, and more preferably acyl groups having 2 to 18 carbon atoms, for example, an acetyl group, a pivaloyl group, a 2-ethylhexyl group, a benzoyl group, and a cyclohexanoyl group), alkylsulfonyl groups (preferably alkylsulfonyl groups having 1 to 24 carbon atoms, and more preferably alkylsulfonyl groups having 1 to 18 carbon atoms, for example, a methylsulfonyl group, an ethylsulfonyl group, an isopropylsulfonyl group, and a cyclohexylsulfonyl group), or an arylsulfonyl groups (preferably arylsulfonyl groups having 6 to 24 carbon atoms, and more preferably arylsulfonyl groups having 6 to 18 carbon atoms, for example, a phenylsulfonyl group and a naphthylsulfonyl group).

In the general formula (8), $Y^1$ and $Y^2$ each independently represent $NR^c$, a nitrogen atom, a carbon atom; and Rc has the same definition as R in $X^2$ and $X^3$ above, and preferable embodiments thereof are also the same.

In the general formula (8), $R^{11}$ and $Y^1$ may be bonded to each other to form, with a carbon atom, a 5-membered ring (such as a cyclopentane ring, a pyrrolidine ring, a tetrahydrofuran, a dioxolane ring, a tetrahydrothiophene ring, a pyrrole ring, a furan ring, a thiophene ring, an indole ring, a benzofuran ring, and a benzothiophene ring), a 6-membered ring (such as a cyclohexane ring, a piperidine ring, a piperazine ring, a morpholine ring, a tetrahydropyran ring, a dioxane ring, a pentamethylenesulfide ring, a dithiane ring, a benzene ring, a piperidine ring, a piperazine ring, a pyridazine ring, a quinoline ring, and a quinazoline ring), or a 7-membered ring (such as a cycloheptane ring and a hexamethyleneimine ring).

In the general formula (8), $R^{16}$ and $Y^2$ may be bonded to each other to form, with a carbon atom, a 5-membered ring (such as a cyclopentane ring, a pyrrolidine ring, a tetrahydrofuran ring, a dioxolane ring, a tetrahydrothiophene ring, a pyrrole ring, a furan ring, a thiophene ring, an indole ring, a benzofuran ring, and a benzothiophene ring), a 6-membered ring (such as a cyclohexane ring, a piperidine ring, a piperazine ring, a morpholine ring, a tetrahydropyran ring, a dioxane ring, a pentamethylenesulfide ring, a dithiane ring, a benzene ring, a piperidine ring, a piperazine ring, a pyridazine ring, a quinoline ring, and a quinazoline ring), or a 7-membered ring (such as a cycloheptane ring and a hexamethyleneimine ring).

In the general formula (8), when the 5-, 6-, or 7-membered ring formed by the linking of $R^{11}$ and $Y^1$, and $R^{16}$ and $Y^2$ is a ring that may further be substituted, it may be substituted with any of the substituents mentioned as the substituent of $R^1$ of Formula (1) described below, and when it is substituted with two or more substituents, the substituents may be the same as or different from each other.

In the general formula (8), $R^{11}$ and $R^{16}$ each independently represent a monovalent substituent which preferably has an "−Es' value" as a steric parameter of 1.5 or more, more preferably 2.0 or more, still more preferably 3.5 or more, and particularly preferably 5.0 or more.

Herein, the steric parameter, "−Es' value" is a parameter indicating the steric bulkiness of the substituent, and the "−Es' value" as shown in documents (J. A. Macphee, et al., Tetrahedron, Vol. 34, pp. 3553 to 3562, edited by Toshio Fujita, Special Edition for Chemistry 107 Structure-Activity Relationship and Drag Design, published on Feb. 20, 1986 (Kagaku Dojin)) is used herein.

In the general formula (8), $X^1$ represents a group that can be bonded to Ma, and specific examples thereof include the same groups as $X^1$ in the general formula (7), and a preferable embodiment thereof is also the same; and a represents 0, 1, or 2.

A preferable embodiment of the compound represented by the general formula (8) is as follows. In a preferable embodiment, $R^{12}$ to $R^{15}$ eachindependently have the same preferable definitions as $R^5$ to $R^8$ in the general formula (M), respectively; $R^{17}$ has the same preferable definition as $R^{10}$ in the general formula (M); Ma represents Zn, Cu, Co, or VO; $X^2$ represents NR (wherein R represents a hydrogen atom or an alkyl group), a nitrogen atom or an oxygen atom; $X^3$ represents NR (wherein R represents a hydrogen atom or an alkyl group) or an oxygen atom; $Y^1$ represents $NR^C$ (wherein $R^C$ represents a hydrogen atom or an alkyl group), a nitrogen atom or a carbon atom; $Y^2$ represents a nitrogen atom or a carbon atom; $R^{11}$ and $R^{16}$ each independently represent an alkyl group, an aryl group, a heterocyclic group, an alkoxy group or an alkylamino group; $X^1$ represents a group that binds via an oxygen atom; and a represents 0 or 1. $R^{11}$ and $Y^1$ may be bonded to each other to form a 5- or 6-membered ring; and $R^{16}$ and $Y^2$ may be bonded to each other to form a 5- or 6-membered ring.

In a more preferable embodiment, $R^{12}$ to $R^{15}$ each independently have the same preferable definitions as $R^5$ to $R^8$ in the general formula (8), respectively; $R^{17}$ has the same preferable definition as $R^{10}$ in the general formula (M); Ma represents Zn; $X^2$ and $X^3$ represents an oxygen atom; $Y^1$ represents NH; $Y^2$ represents a nitrogen atom; $R^{11}$ and $R^{16}$ each independently represent an alkyl group, an aryl group, a heterocyclic group, an alkoxy group or an alkylamino group; $X^1$ represents a group that binds via an oxygen atom; and a represents 0 or 1. $R^{11}$ and $Y^1$ may be bonded to each other to form a 5- or 6-membered ring; and $R^{16}$ and $Y^2$ may be bonded to each other to form a 5- or 6-membered ring.

It is preferable that the molar extinction coefficient of the dipyrromethene metal complex compounds represented by the general formula (7) and the general formula (8) be as high as possible in view of color fastness thickness. Further, the maximum absorption wavelength λmax is preferably from 520 nm to 580 nm, and more preferably from 530 nm to 570 nm, from the viewpoint of improvement of the color purity. When the Xmax is within the above-described range, a color filter with favorable color reproducibility can be obtained when employed in a radiation-sensitive colored composition or the like. The absorbance of the colorant multimer of the present invention at the maximal absorption wavelength (Xmax) is preferably 1,000 times or more the absorbance at 450 nm, more preferably 10,000 or more times the absorbance at 450 nm, and still more preferably 100,000 or more times the absorbance at 450 nm. When the absorbance is within the above-described range, a color filter with higher transmittance can be obtained when the colorant multimer of the present invention is employed in a radiation-sensitive colored composition or the like, particularly in the preparation of a blue color filter. Further, the maximal absorption wavelength and the molar extinction coefficient are measured by means of a spectrophotometer Carry5 (manufactured by Varian Inc.)

It is preferable that the melting point of the dipyrromethene metal complex compounds represented by the general formula (7) and the general formula (8) be not too high in view of solubility.

The dipyrromethene metal complex compounds represented by the general formula (7) and the general formula (8) may be synthesized by the methods described in U.S. Pat. Nos. 4,774,339 and 5,433,896, JP2001-240761A and JP2002-155052A, JP3614586B, Aust. J. Chem, 1965, 11, 1835-1845, J. H. Boger et al., Heteroatom Chemistry, Vol. 1, No. 5, 389 (1990), and the like. Specifically, the method described in paragraphs [0131] to [0157] of JP2008-292970A may be employed.

Specific examples of the dipyrromethene colorant are shown below, but the present invention is not limited thereto.

(PM-1)
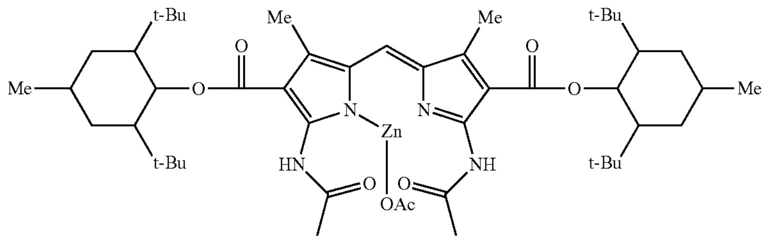
(PM-2)
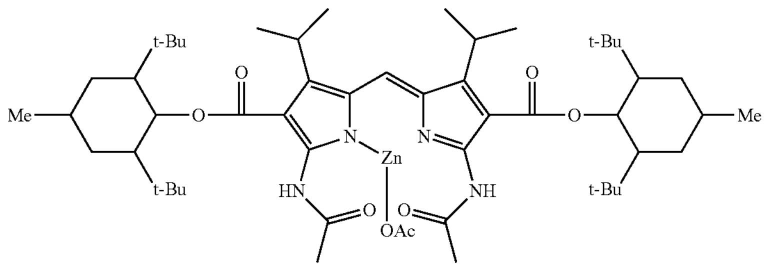
(PM-3)
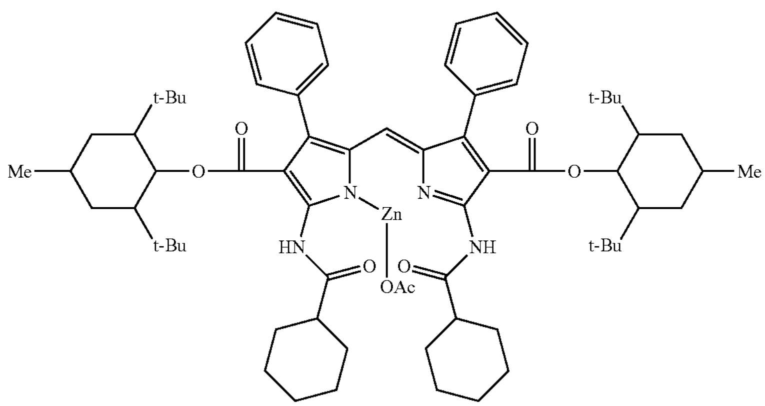
(PM-4)
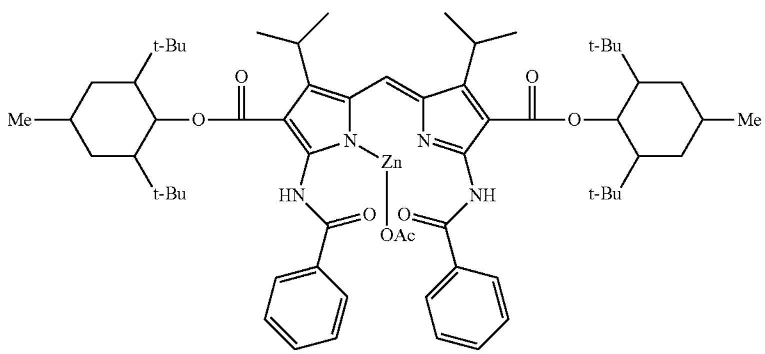
(PM-5)
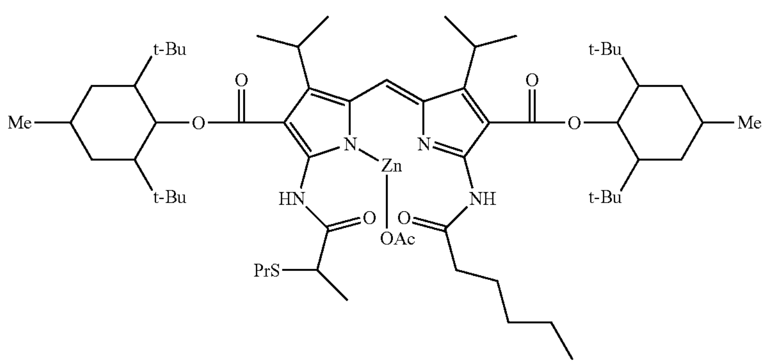

-continued
(PM-6)
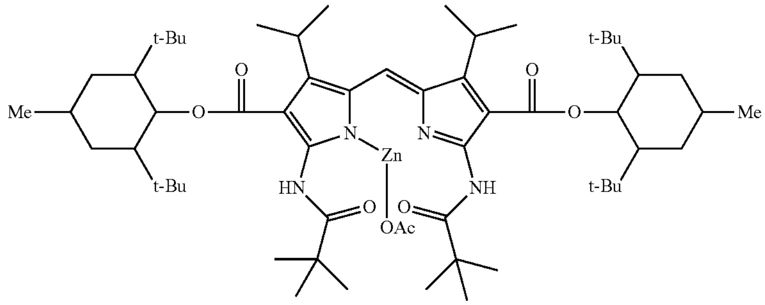
(PM-7)
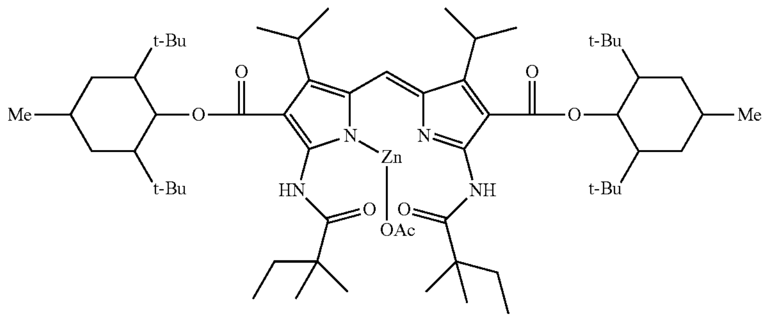
(PM-8)
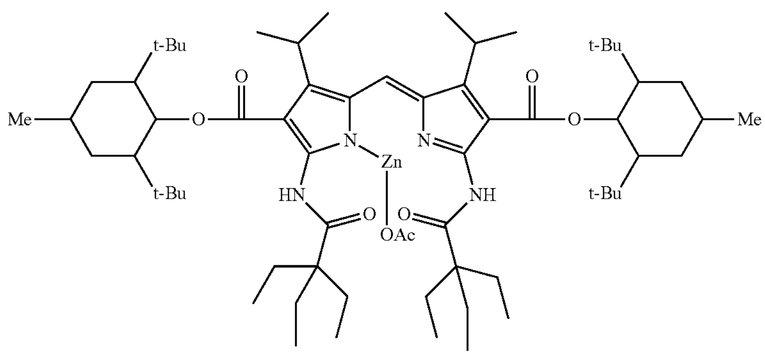
(PM-9)
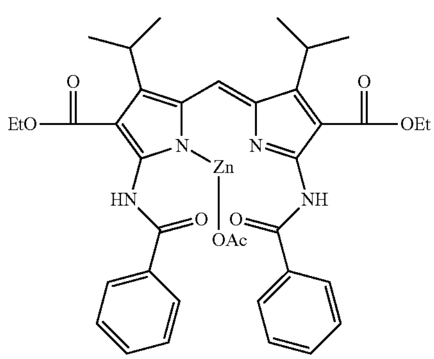
(PM-10)
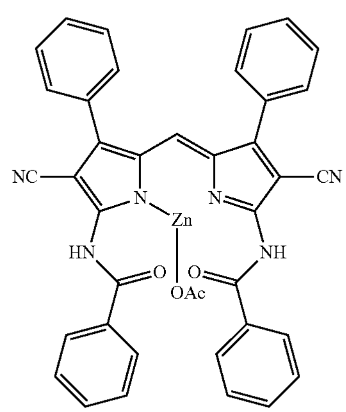

-continued
(PM-11)
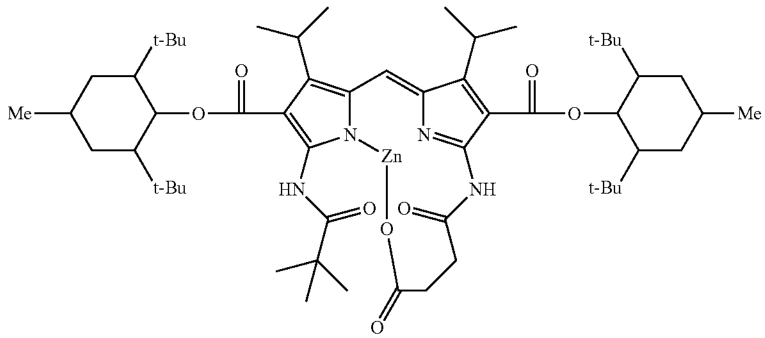
(PM-12)
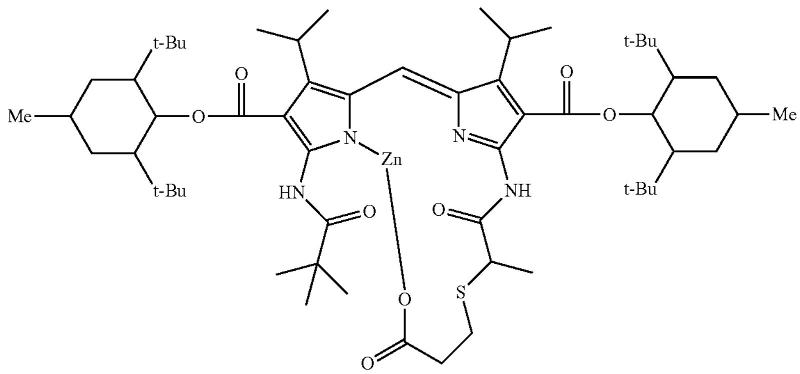
(PM-13)
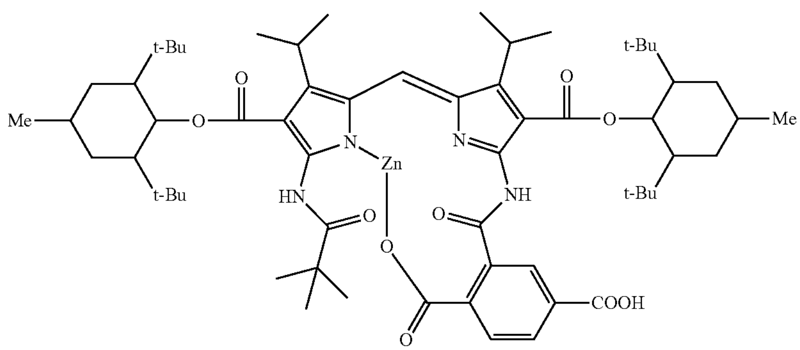
(PM-14)
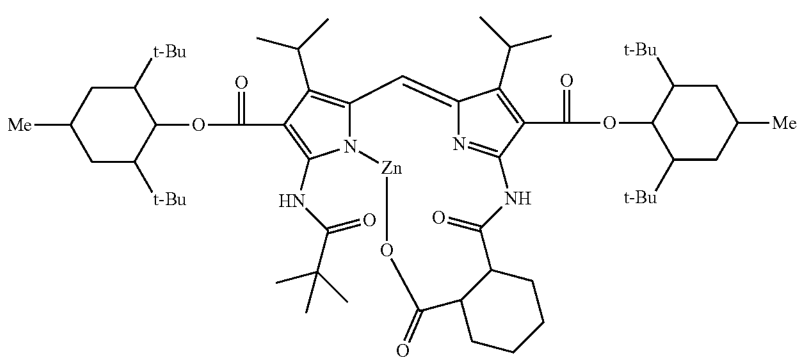

-continued
(PM-15)
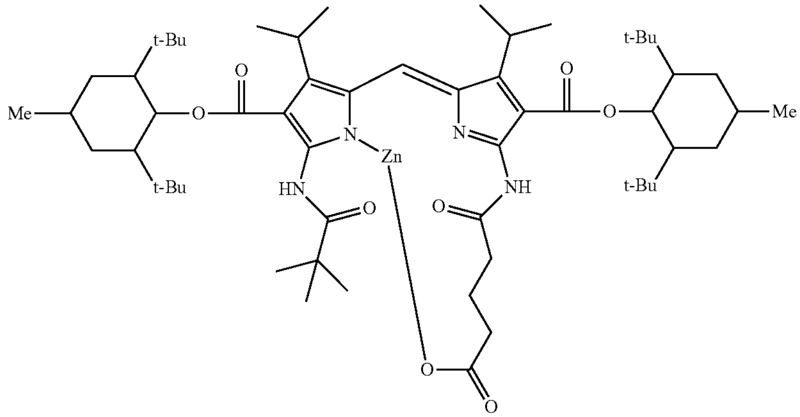
(PM-16)
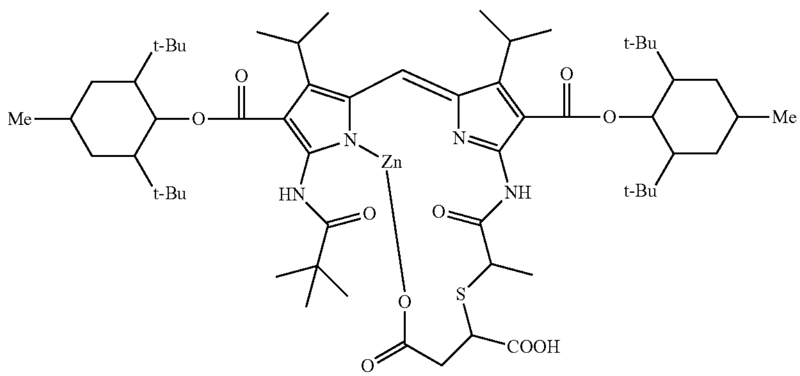
(PM-17)
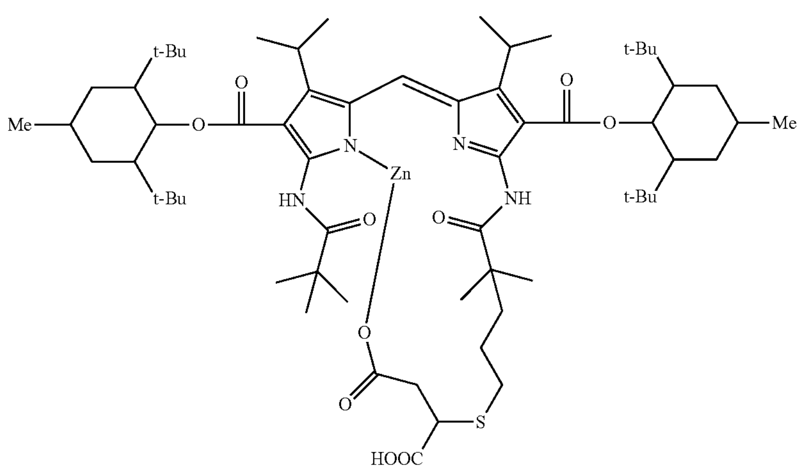

-continued
(PM-18)
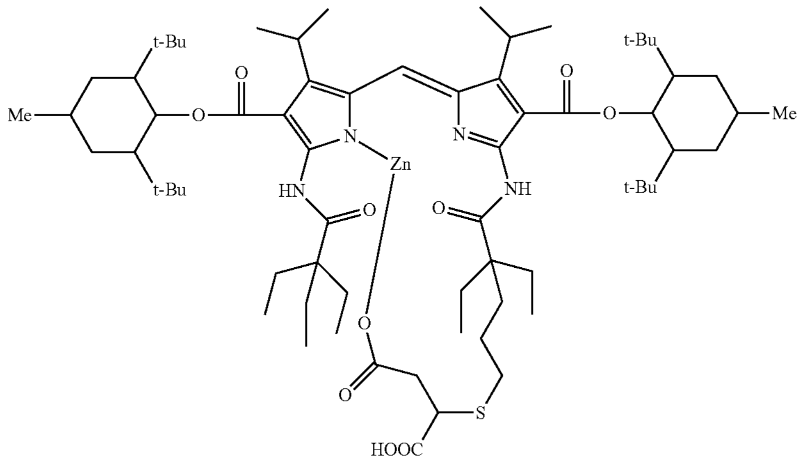
(PM-19)
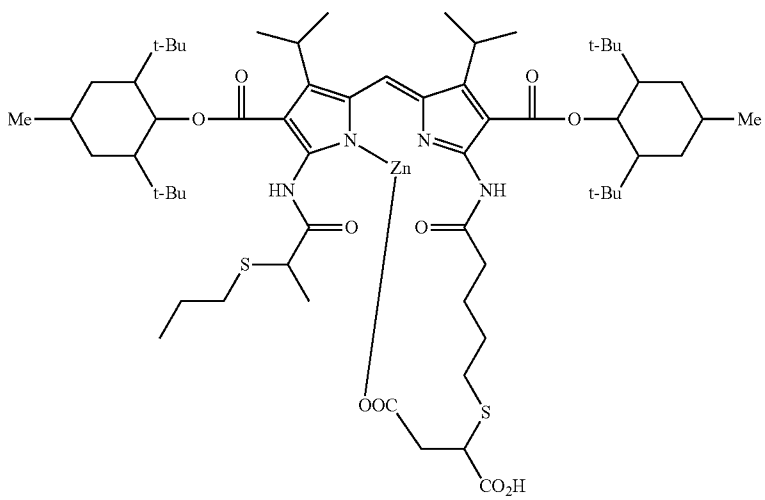
(PM-20)
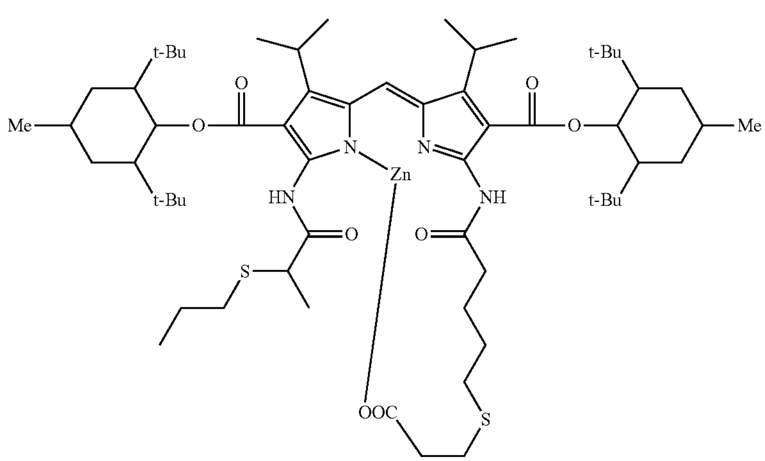

-continued (PM-21)

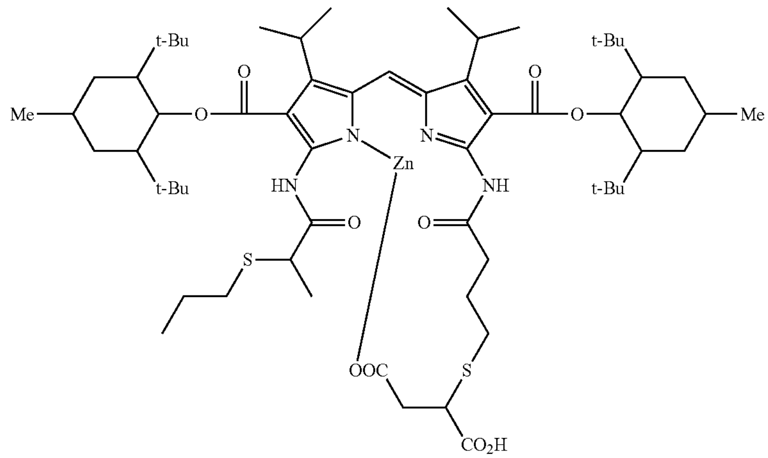

(PM-22)

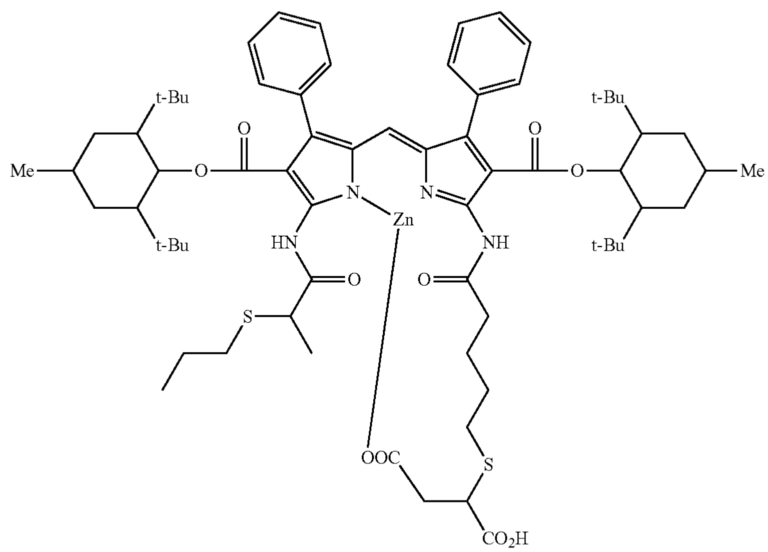

Among the specific examples, (PM-8), and (PM-11) to (PM-22) are particularly preferable; (PM-8), and (PM-16) to (PM-22) are still more preferable, and (PM-8) and (PM-18) are most preferable, from the viewpoints of color characteristics, developability, and heat resistance.

<Azo Colorant>

One of the embodiments of the colorant multimer (A) according to the present invention is a colorant multimer which has a partial structure derived from an azo colorant (azo compound) as a partial structure of a colorant moiety. The azo compound in the present invention totally refers to a compound having a colorant moiety containing an N═N group in the molecule.

As the azo colorant, one that is suitably selected from known azo colorants (such as substituted azobenzene (specific examples thereof include (AZ-4) to (AZ-6) as described later, and the like)) can be employed.

As a magenta colorant and a yellow colorant among the azo colorants, known azo colorants may be employed, and among them, azo colorants represented by the following general formula (E), the general formula (F), the general formula (H), the general formula (I-1), the general formula (I-2), and the general formula (V) are particularly preferable.

—Magenta Colorant—

An azo colorant represented by the following general formula (E) is preferably used as a magenta colorant used for a red color resist or an ink jet ink.

General Formula (E)

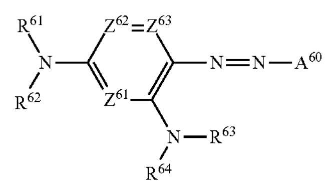

In the general formula (E), $R^{61}$ to $R^{64}$ each independently represent a hydrogen atom, an alkyl group, an alkenyl group, an aryl group, a heterocyclic group, an acyl group, an alkoxycarbonyl group, an aryloxycarbonyl group, a carbamoyl group, an alkylsulfonyl group, or an arylsulfonyl group; $A^{60}$ represents an aryl group or an aromatic heterocyclic group; $Z^{61}$ to $Z^{63}$ each independently represent —C($R^{65}$)═ or —N═; and $R^{65}$ represents a hydrogen atom or a monovalent substituent.

Each of the substituents of the general formula (E) will be described in detail.

In the general formula (E), $R^{61}$ to $R^{64}$ each independently represent a hydrogen atom or alkyl groups (preferably linear, branched, or cyclic alkyl groups having 1 to 36 carbon atoms, and more preferably linear, branched, or cyclic alkyl groups having 1 to 12 carbon atoms, for example, cyclopropyl, cyclopentyl, cyclohexyl, and 1-adamantyl), alkenyl groups (preferably alkenyl groups having 2 to 24 carbon atoms, and more preferably alkenyl groups having 2 to 12 carbon atoms, for example, vinyl, allyl, and 3-buten-1-yl), aryl groups (preferably aryl groups having 6 to 36 carbon atoms, and more preferably aryl groups having 6 to 18 carbon atoms, for example, phenyl and naphthyl), heterocyclic groups (preferably heterocyclic groups having 1 to 24 carbon atoms, and more preferably heterocyclic groups having 1 to 12 carbon atoms, for example, 2-thienyl, 4-pyridyl, 2-furyl, 2-pyrimidinyl, 1-pyridyl, 2-benzothiazolyl, 1-imidazolyl, 1-pyrazolyl, and benzotriazol-1-yl), acyl groups (preferably acyl groups having 1 to 24 carbon atoms, and more preferably acyl groups having 2 to 18 carbon atoms, for example, acetyl, pivaloyl, 2-ethylhexyl, benzoyl, cyclohexanoyl), alkoxycarbonyl groups (preferably alkoxycarbonyl groups having 1 to 10 carbon atoms, and more preferably alkoxycarbonyl groups having 1 to 6 carbon atoms, for example, methoxycarbonyl and ethoxycarbonyl), aryloxycarbonyl groups (preferably aryloxycarbonyl groups having 6 to 15 carbon atoms, and more preferably aryloxycarbonyl groups having 6 to 10 carbon atoms, for example, phenoxycarbonyl), carbamoyl groups (preferably carbamoyl groups having 1 to 8 carbon atoms, and more preferably carbamoyl groups having 2 to 6 carbon atoms, for example, dimethylcarbamoyl), alkylsulfonyl groups (preferably alkylsulfonyl groups having 1 to 24 carbon atoms, and more preferably alkylsulfonyl groups having 1 to 18 carbon atoms, for example, methylsulfonyl, ethylsulfonyl, isopropylsulfonyl, and cyclohexylsulfonyl), or arylsulfonyl groups (preferably arylsulfonyl groups having 6 to 24 carbon atoms, and more preferably arylsulfonyl groups having 6 to 18 carbon atoms, for example, phenylsulfonyl and naphthylsulfonyl).

In the general formula (E), it is preferable that $R^{61}$ and $R^{63}$ each independently represent an alkyl group, an alkenyl group, an aryl group, or a heterocyclic group; and it is preferable that $R^{62}$ and $R^{64}$ each independently represent a hydrogen atom or an alkyl group.

In the general formula (E), when $R^{61}$ to $R^{64}$ are each a group that may be substituted, it may be substituted with, for example, any of the substituents mentioned as $R^{12}$ to $R^{15}$ in the general formula (8). In the case where $R^{61}$ to $R^{64}$ are substituted with two or more substituents, the substituents may be the same as or different from each other.

In the general formula (E), $R^{61}$ and $R^{62}$, $R^{61}$ and $R^{65}$ (when $Z^{61}$ or $Z^{62}$ is —C($R^{65}$)═), $R^{63}$ and $R^{64}$, and $R^{63}$ and $R^{65}$ (when $Z^{61}$ is —C($R^{65}$)═) may be bonded to each other to form a 5- or 6-membered ring.

In the general formula (E), $Z^{61}$ to $Z^{63}$ each independently represent —C($R^{65}$)═ or —N═, $R^{65}$ represents a hydrogen atom or a monovalent substituent. Examples of the substituent of $R^{65}$ include the substituents mentioned as $R^{12}$ to $R^{15}$ in the general formula (8). When the substituent of $R^{65}$ is a group which may further be substituted, it may be substituted with, for example, any of the substituents mentioned as $R^{12}$ to $R^{15}$ in the general formula (8). When the substituent of $R^{65}$ is substituted with two or more substituents, the substituents may be the same as or different from each other.

In the general formula (E), for $Z^{61}$ to $Z^{63}$, it is preferable that $Z^{61}$— be N═; $Z^{62}$ be —C($R^{65}$)═ or —N═; and $Z^{63}$ be —C($R^{65}$)═. It be more preferable that $Z^{61}$ be —N═; and $Z^{62}$ and $Z^{63}$ be —C($R^{65}$)═.

In the general formula (E), $A^{60}$ represents an aryl group or an aromatic heterocyclic group. The aryl group and the aromatic heterocyclic group of $A^{60}$ may further have, for example, any of the substituents mentioned as $R^{12}$ to $R^{15}$ in the general formula (8). When the aryl group and the aromatic heterocyclic group are substituted with two or more substituents, the substituents may be the same as or different from each other.

In the general formula (E), $A^{60}$ preferably represents an aromatic heterocyclic group, and more preferable examples thereof include an imidazole ring, a pyrazole ring, a triazole ring, a thiazole ring, an oxazole ring, a 1,2,4-thiadiazole ring, a 1,3,4-thiadiazole ring, a pyridine ring, a pyrimidine ring, a pyrazine ring, a benzopyrazole ring, a benzothiazole ring, and the like.

In the general formula (E), the position to which a polymerizable group relating to multimerization (relating to the formation of the colorant multimer) is introduced is not particularly limited, but is preferably any one or two or more of $R^{61}$, $R^{62}$ and $A^{60}$, and more preferably $R^{61}$ and/or $A^{60}$, in view of synthetic suitability.

The azo colorant represented by the general formula (E) is preferably an azo colorant represented by the following general formula (E').

General Formula (E')

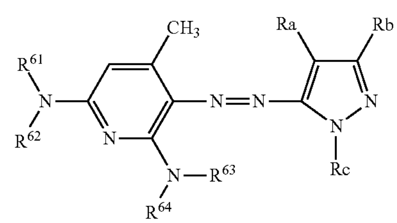

In the general formula (E'), $R^{61}$ to $R^{64}$ each have the same definitions as $R^1$ to $R^4$ in the general formula (E), and have the same preferable definitions as $R^1$ to $R^4$ in the general formula (E). In the general formula (E'), Ra represents an electron withdrawing group having a Hammett substituent constant, a σρ value, of 0.2 or more; Rb represents a hydrogen atom or a substituent group; and Rc represents an alkyl group, an alkenyl group, an aryl group, a heterocyclic group, an acyl group, an alkoxycarbonyl group, a carbamoyl group, an alkylsulfonyl group, or an arylsulfonyl group.

In the general formula (E'), examples of the substituent of Rb include substituents such as those represented by $R^{12}$ to $R^{15}$ in the general formula (8).

An azo colorant represented by the following general formula (F) is also preferably used as a magenta colorant used for a red color resist or an ink jet ink.

General Formula (F)

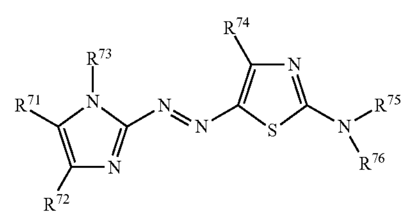

In the general formula (F), $R^{71}$ to $R^{76}$ each independently represent a hydrogen atom or a monovalent substituent. $R^{71}$ and $R^{72}$, and $R^{75}$ and $R^{76}$ may be independently bonded to each other to form a ring.

Each of the substituents of the general formula (F) will be described in detail.

In the general formula (F), $R^{71}$ to $R^{76}$ each independently represent a hydrogen atom or a monovalent substituent. Examples of the monovalent substituent include a halogen atom, an alkyl group having 1 to 30 carbon atoms (indicating herein a saturated aliphatic group, such as a cycloalkyl group and a bicycloalkyl group), an alkenyl group having 2 to 30 carbon atoms (indicating herein an unsaturated aliphatic group having a double bond, such as a cycloalkenyl group and a bicycloalkenyl group), an alkynyl group having 2 to 30 carbon atoms, an aryl group having 6 to 30 carbon atoms, a heterocyclic group having 3 to 30 carbon atoms, a cyano group, an aliphatic oxy group having 1 to 30 carbon atoms, an aryloxy group having 6 to 30 carbon atoms, an acyloxy group having 2 to 30 carbon atoms, a carbamoyloxy group having 1 to 30 carbon atoms, an aliphatic oxycarbonyloxy group 2 to 30 carbon atoms, an aryloxy carbonyloxy group having 7 to 30 carbon atoms, an amino group having 0 to 30 carbon atoms (such as an alkylamino group, an anilino group, and a heterocyclic amino group), an acylamino group having 2 to 30 carbon atoms, an aminocarbonylamino group having 1 to 30 carbon atoms, an aliphatic oxycarbonylamino group having 2 to 30 carbon atoms, an aryloxycarbonylamino group having 7 to 30 carbon atoms, a sulfamoylamino group having 0 to 30 carbon atoms, an alkylsulfonylamino, and arylsulfonylamino group having 1 to 30 carbon atoms, an alkylthio group having 1 to 30 carbon atoms, an arylthio group having 6 to 30 carbon atoms, a sulfamoyl group having 0 to 30 carbon atoms, an alkyl sulfinyl, or arylsulfinyl group having 1 to 30 carbon atoms, an alkyl sulfonyl or arylsulfonyl group having 1 to 30 carbon atoms, an acyl group having 2 to 30 carbon atoms, an aryloxycarbonyl group having 6 to 30 carbon atoms, an aliphatic oxycarbonyl group having 2 to 30 carbon atoms, a carbamoyl group having 1 to 30 carbon atoms, an aryl azo or heterocyclic azo group having 3 to 30 carbon atoms, and an imido group. Each of these substituents may further have a substituent.

In the general formula (F), it is preferable that $R^{71}$ and $R^{72}$ each independently represent a hydrogen atom, a heterocyclic group, or a cyano group; and it is more preferable that $R^{71}$ and $R^{72}$ represent a cyano group.

In the general formula (F), it is preferable that $R^{73}$ and $R^{74}$ each independently represent a hydrogen atom, a substituted or unsubstituted alkyl group, or a substituted or unsubstituted aryl group; and it is more preferable that $R^{73}$ and $R^{74}$ represent a substituted or unsubstituted alkyl group.

In the general formula (F), it is preferable that $R^{75}$ and $R^{76}$ each independently represent a hydrogen atom, a substituted or unsubstituted alkyl group, or a substituted or unsubstituted aryl group; and it is more preferable that $R^{75}$ and $R^{76}$ represent a substituted or unsubstituted alkyl group.

In the general formula (F), the position to which a polymerizable group relating to the multimerization (the formation of a colorant multimer) is introduced is not particularly limited, but is preferably any one or two or more of $R^{73}$, $R^{75}$, and $R^{76}$, more preferably $R^{73}$ and/or $R^{75}$, and still more preferably $R^{73}$, in view of synthetic compatibility.

—Yellow Colorant—

As a yellow colorant used for a red color resist and a green color resist, or an ink jet ink, azo colorants represented by the general formula (G), the following general formula (H) and the following general formula (1) below are preferable (including tautomers thereof).

General Formula (G)

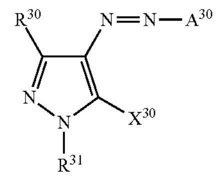

In the general formula (G), $R^{30}$ represents a hydrogen atom or a monovalent substituent; $R^{31}$ represents a hydrogen atom, an alkyl group, an alkenyl group, an aryl group, a heterocyclic group, an acyl group, an alkoxycarbonyl group, or a carbamoyl group; $X^{30}$ represents an —OM group or —N($R^{32}$)($R^{33}$); M represents a hydrogen atom or an alkyl group, or a metal atom or an organic base pair required for neutralization of charges; $R^{32}$ and $R^{33}$ each independently represent a hydrogen atom, an alkyl group, an alkenyl group, an aryl group, a heterocyclic group, an acyl group, an alkoxycarbonyl group, or a carbamoyl group; and $A^{30}$ represents an aryl group or an aromatic heterocyclic group.

Each of the substituents of the general formula (G) will be described in detail.

In the general formula (G), $R^{30}$ represents a hydrogen atom or a monovalent substituent. Examples of the substituent include the substituents mentioned as $R^{12}$ to $R^{15}$ in the general formula (8). Among these, a substituted or unsubstituted alkyl group, a substituted or unsubstituted aryl group, or a heterocyclic group is preferable, and a substituted or unsubstituted alkyl group or a substituted or unsubstituted aryl group is more preferable.

In the general formula (G), $R^{31}$ represents a hydrogen atom, alkyl groups (preferably linear, branched, or cyclic alkyl groups having 1 to 36 carbon atoms, and more preferably linear, branched, or cyclic alkyl groups having 1 to 12 carbon atoms, for example, methyl, ethyl, propyl, isopropyl, butyl, isobutyl, t-butyl, hexyl, 2-ethylhexyl, dodecyl, cyclopropyl, cyclopentyl, cyclohexyl, and 1-adamantyl), alkenyl groups (preferably alkenyl groups having 2 to 24 carbon atoms, and more preferably alkenyl groups having 2 to 12 carbon atoms, for example, vinyl, allyl, and 3-buten-1-yl), aryl groups (preferably aryl groups having 6 to 36 carbon atoms, and more preferably aryl groups having 6 to 18 carbon atoms, for example, phenyl and naphthyl), heterocyclic groups (preferably heterocyclic groups having 1 to 24 carbon atoms, and more preferably heterocyclic groups having 1 to 12 carbon atoms, for example, 2-thienyl, 4-pyridyl, 2-furyl, 2-pyrimidinyl, 1-pyridyl, 2-benzothiazolyl, 1-imidazolyl, 1-pyrazolyl, and benzotriazol-1-yl), acyl groups (preferably acyl groups having 1 to 24 carbon atoms, and more preferably acyl groups having 2 to 18 carbon atoms, for example, acetyl, pivaloyl, 2-ethylhexyl, benzoyl, and cyclohexanoyl), alkoxycarbonyl groups (preferably alkoxycarbonyl groups having 1 to 6 carbon atoms, and more preferably alkoxycarbonyl groups having 1 to 4 carbon atoms, for example, a methoxycarbonyl group), or carbamoyl groups (preferably carbamoyl groups having 1 to 6 carbon atoms, and more preferably carbamoyl groups having 1 to 4 carbon atoms, for example, an N,N-dimethylcarbamoyl).

In the general formula (G), $X^{30}$ represents an —OM group or —N($R^{32}$)($R^{33}$); M represents a hydrogen atom, an alkyl group, or a metal atom or an organic base pair required for neutralization of charges; and $R^{32}$ and $R^{33}$ each independently represent a hydrogen atom, an alkyl group, an alkenyl group, an aryl group, a heterocyclic group, an acyl group, an alkoxycarbonyl group, or a carbamoyl group.

In the general formula (G), $A^{30}$ has the same definition as $A^{60}$ in the general formula (E), and a preferable embodiment thereof is also the same.

In the general formula (G), the position to which a polymerizable group relating to the multimerization (the formation of a colorant multimer) is introduced is not particularly limited, but is preferably $R^{31}$ and/or $A^{30}$ in view of synthetic compatibility.

General Formula (H)

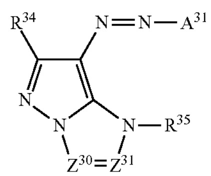

In the general formula (H), $R^{34}$ represents a hydrogen atom or a monovalent substituent; $R^{35}$ represents a hydrogen atom, an alkyl group, an alkenyl group, an aryl group, a heterocyclic group, an acyl group, an alkoxycarbonyl group, or carbamoyl group; $Z^{30}$ and $Z^{31}$ each independently represent —C($R^{36}$)═, or —N═; $R^{36}$ represents a hydrogen atom or a monovalent substituent; and $A^{31}$ represents an aryl group or an aromatic heterocyclic group.

Each of the substituents of the general formula (H) will be described in detail.

In the general formula (H), $R^{34}$ represents a hydrogen atom or a monovalent substituent and has the same definition as $R^{30}$ in the general formula (G), and a preferable embodiment thereof is also the same.

In the general formula (H), $R^{35}$ represents a hydrogen atom, alkyl groups (preferably linear, branched, or cyclic alkyl groups having 1 to 36 carbon atoms, and more preferably linear, branched, or cyclic alkyl groups having 1 to 12 carbon atoms, for example, methyl, ethyl, propyl, isopropyl, butyl, isobutyl, t-butyl, hexyl, 2-ethylhexyl, dodecyl, cyclopropyl, cyclopentyl, cyclohexyl, and 1-adamantyl), alkenyl groups (preferably alkenyl groups having 2 to 24 carbon atoms, and more preferably alkenyl groups having 2 to 12 carbon atoms, for example, vinyl, allyl, and 3-buten-1-yl), aryl groups (preferably aryl groups having 6 to 36 carbon atoms, and more preferably aryl groups having 6 to 18 carbon atoms, for example, phenyl and naphthyl), heterocyclic groups (preferably heterocyclic groups having 1 to 24 carbon atoms, and more preferably heterocyclic groups having 1 to 12 carbon atoms, for example, 2-thienyl, 4-pyridyl, 2-furyl, 2-pyrimidinyl, 1-pyridyl, 2-benzothiazolyl, 1-imidazolyl, 1-pyrazolyl, and benzotriazol-1-yl), acyl groups (preferably acyl groups having 1 to 24 carbon atoms, and more preferably acyl groups having 2 to 18 carbon atoms, for example, acetyl, pivaloyl, 2-ethylhexyl, benzoyl, and cyclohexanoyl), alkoxycarbonyl groups (preferably alkoxycarbonyl groups having 1 to 10 carbon atoms, and more preferably alkoxycarbonyl groups having 1 to 6 carbon atoms, for example, a methoxycarbonyl group and an ethoxycarbonyl group), or carbamoyl groups (preferably carbamoyl groups having 1 to 10 carbon atoms, and more preferably carbamoyl groups having 1 to 6 carbon atoms, for example, N,N-dimethylcarbamoyl).

In the general formula (H), $Z^{30}$ and $Z^{31}$ each independently represent —C($R^{36}$)═ or —N═; and $R^{36}$ represents a hydrogen atom or a monovalent substituent. Examples of the substituent of $R^{36}$ include the substituents mentioned as $R^{12}$ to $R^{15}$ in the general formula (8). When the substituent of $R^{36}$ is a group which may further be substituted, it may be substituted with, for example, any of the substituents mentioned as $R^{12}$ to $R^{15}$ in the general formula (8). When the substituent of $R^{36}$ is substituted with two or more substituents, the substituents may be the same as or different from each other.

In the general formula (H), for $Z^{30}$ and $Z^{31}$, it is preferable that $Z^{30}$ represent —N═; and $Z^{31}$ represent —C($R^{36}$)═.

In the general formula (H), $A^{31}$ has the same definition as $A^{60}$ in the general formula (E), and a preferable embodiment thereof is also the same.

In the general formula (H), the multimerization (the formation of a colorant multimer) is introduced is not particularly limited, but is preferably $R^{34}$ and/or $A^{31}$, in view of synthetic compatibility.

General Formula (I)

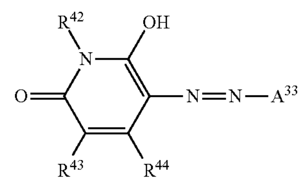

In the general formula (1), $R^{42}$ represents a hydrogen atom, an alkyl group, an alkenyl group, an aryl group, or a heterocyclic group; $R^{43}$ and $R^{44}$ each independently represent a hydrogen atom or a monovalent substituent; and $A^{33}$ represents an aryl group or an aromatic heterocyclic group.

Each of the substituents of the general formula (1) will be described in detail.

In the general formula (1), $R^{42}$ represents a hydrogen atom, alkyl groups (preferably linear, branched, or cyclic alkyl groups having 1 to 36 carbon atoms, and more preferably linear, branched, or cyclic alkyl groups having 1 to 12 carbon atoms, for example, methyl, ethyl, propyl, isopropyl, butyl, isobutyl, t-butyl, hexyl, 2-ethylhexyl, dodecyl, cyclopropyl, cyclopentyl, cyclohexyl, and 1-adamantyl), alkenyl groups (preferably alkenyl groups having 2 to 24 carbon atoms, and more preferably alkenyl groups having 2 to 12 carbon atoms, for example, vinyl, allyl, and 3-buten-1-yl), aryl groups (preferably aryl groups having 6 to 36 carbon atoms, and more preferably aryl groups having 6 to 18 carbon atoms, for example, phenyl and naphthyl), or heterocyclic groups (preferably heterocyclic groups having 1 to 24 carbon atoms, and more preferably heterocyclic groups having 1 to 12 carbon atoms, for example, 2-thienyl, 4-pyridyl, 2-furyl, 2-pyrimidinyl, 1-pyridyl, 2-benzothiazolyl, 1-imidazolyl, 1-pyrazolyl, and benzotriazol-1-yl).

In the general formula (1), $R^{43}$ and $R^{44}$ each independently represent a hydrogen atom or a monovalent substituent, and examples of the substituent include the substituents mentioned as $R^{12}$ to $R^{15}$ in the general formula (8). When the substituent of $R^{43}$ and $R^{44}$ is a group which may further be substituted, it may be substituted with, for example, any of the substituents mentioned as $R^{12}$ to $R^{15}$ in the general formula (8). When the substituent of $R^{43}$ and $R^{44}$ is substituted with two or more substituents, the substituents may be the same as or different from each other.

In the general formula (1), $A^{33}$ has the same definition as $A^{60}$ in the general formula (E), and a preferable embodiment thereof is also the same.

In the general formula (1), the multimerization (the formation of a colorant multimer) is introduced is not particularly limited, but is preferably $R^{42}$ and/or $A^{33}$, in view of synthetic compatibility.

General Formula (I-1)

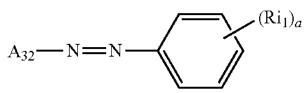

General Formula (I-2)

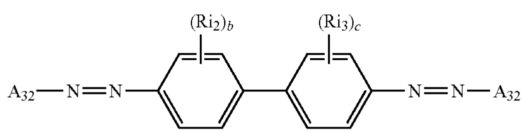

In the general formula (I-1) and the general formula (I-2), $Ri_1$ $Ri_2$, and $Ri_3$ each independently represent a monovalent substituent; a represents an integer of 0 to 5, and when a is 2 or more, two adjacent $Ri_1$'s may be bonded to each other to form a fused ring; b and c each independently represent an integer of 0 to 4 and when b and c are 1 or more, two adjacent $Ri_1$'s may be bonded to each other to form a fused ring; and $A_{32}$ represents the following general formula (IA), the general formula (IB), or the general formula (IC).

General Formula (IA)

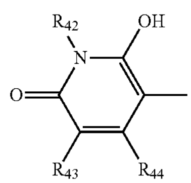

In the general formula (IA), $R_{42}$ represents a hydrogen atom, an alkyl group, or an aryl group; $R_{43}$ represents a monovalent substituent; and $R_{44}$ represents a hydrogen atom, an alkyl group, or an aryl group.

General Formula (IB)

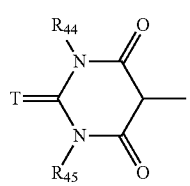

In the general formula (IB), $R_{44}$ and $R_{45}$ each independently represent a hydrogen atom, an alkyl group, or an aryl group; and T represents an oxygen atom or a sulfur atom.

General Formula (IC)

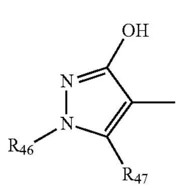

In the general formula (IC), $R_{46}$ represents a hydrogen atom, an alkyl group, or an aryl group; and $R_{47}$ represents a monovalent substituent.

In the general formula (I-1) and the general formula (I-2), examples of the monovalent substituent represented by any of $Ri_1$, $Ri_2$, and $Ri_3$ include the substituents as mentioned in the section of the substituent group A. More specific examples of the monovalent substituent include alkyl groups (preferably linear, branched, or cyclic alkyl groups having 1 to 10 carbon atoms, and more preferably linear, branched, or cyclic alkyl groups having 1 to 5 carbon atoms, for example, methyl, ethyl, propyl, isopropyl, butyl, isobutyl, t-butyl, hexyl, 2-ethylhexyl, dodecyl, cyclopropyl, cyclopentyl, cyclohexyl, and 1-adamantyl), aryl groups (preferably aryl groups having 6 to 36 carbon atoms, and more preferably aryl groups having 6 to 18 carbon atoms, for example, phenyl, naphthyl, and sulfonamide groups), alkenyl groups (preferably linear, branched, or cyclic alkenyl groups having 1 to 10 carbon atoms, and more preferably linear, branched, or cyclic alkenyl groups having 1 to 5 carbon atoms, for example, vinyl, allyl, furenyl, geranyl, and oleyl), sulfo groups, and sulfamoyl groups (preferably alkylsulfamoyl groups having 1 to 10 carbon atoms), and particularly preferably alkyl groups having 1 to 5 carbon atoms and alkylsulfamoyl groups having 1 to 10 carbon atoms. a is preferably 1 to 3. b and c are preferably 1 to 3.

In the general formula (IA), $R_{42}$ represents a hydrogen atom, an alkyl group, or an aryl group, and particularly an alkyl group having 1 to 5 carbon atoms, or a phenyl group. Examples of the monovalent substituent represented by $R_{43}$ include the substituents as mentioned in the section of the substituent group A, and particularly preferably a cyano group and a carbamoyl group. $R_{44}$ represents a hydrogen atom, an alkyl group, or an aryl group; and particularly preferably an alkyl group having 1 to 5 carbon atoms, or a phenyl group.

In the general formula (IB), T represents an oxygen atom or a sulfur atom, and preferably an oxygen atom. $R_{44}$ and $R_{45}$ each independently represent a hydrogen atom, an alkyl group, or an aryl group, and particularly preferably an alkyl group having 1 to 5 carbon atoms, or a phenyl group.

In the general formula (IC), $R_{46}$ represents a hydrogen atom, an alkyl group, or an aryl group, and particularly preferably an alkyl group having 1 to 5 carbon atoms, or a phenyl group. Examples of the monovalent substituent represented by $R_{47}$ include the substituents as mentioned in the section of the substituent group A, preferably a hydrogen atom, an alkyl group, and an aryl group, and particularly preferably an alkyl group having 1 to 5 carbon atoms, or a phenyl group.

General Formula (V)

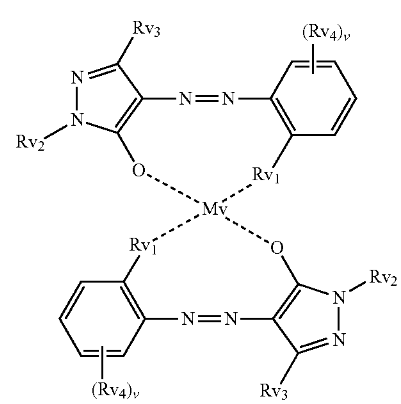

In the general formula (V), My represents Cr or Co. $Rv_1$ represents an oxygen atom or —COO—; $Rv_2$ and $Rv_3$ each independently represent a hydrogen atom, an alkyl group, or aryl group; v represents an integer of 0 to 4; and $Rv_4$ represents a monovalent substituent, and when v is 2 or more, adjacent $Rv_4$'s may be bonded to each other to form a ring.

In the general formula (V), $Rv_2$ and $Rv_3$ particularly preferably an alkyl group having 1 to 5 carbon atoms, or a phenyl group. Examples of the monovalent substituent represented by $Rv_4$ include the substituents as mentioned in the section of the substituent group A, particularly preferably an alkyl group, an aryl group, a nitro group, a sulfamoyl group, and a sulfo group, and most preferably an alkyl group having 1 to 5 carbon atoms, a phenyl group, or a nitro group.

When $Rv_2$, $Rv_3$, and $Rv_4$ are each a group which may further be substituted, they may further have a substituent mentioned in the section of the substituent group A, and when they are substituted with two or more substituents, the substituents may be the same as or different from each other.

Specific examples of the azo colorant are shown below, and the present invention is not limited thereto.

(AZ-1)

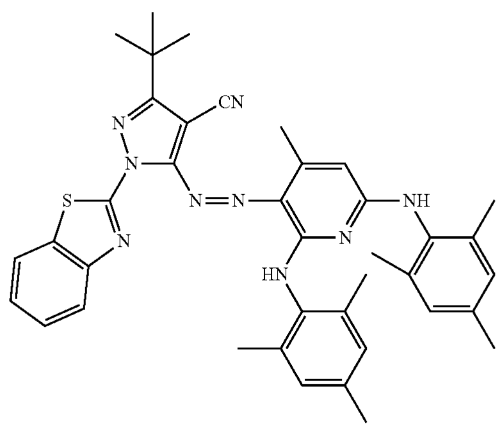

(AZ-2)

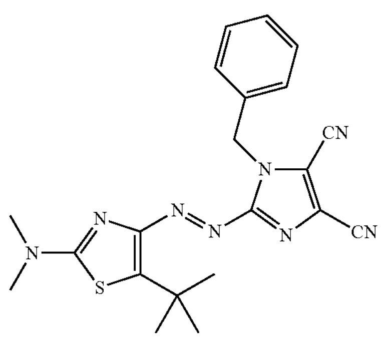

(AZ-3)

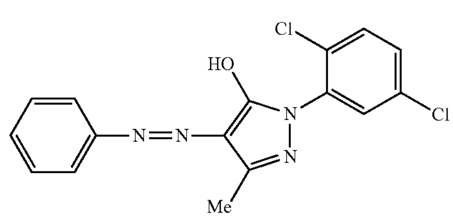

(AZ-4)

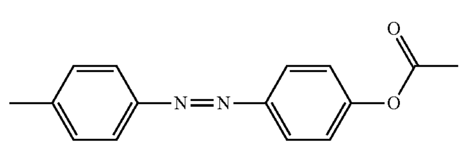

-continued (AZ-5)

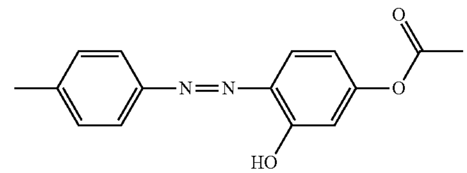

(AZ-6)

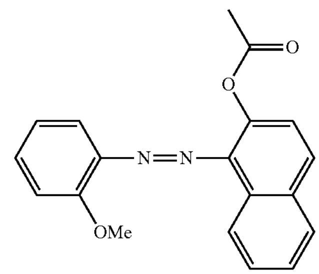

(AZ-7)

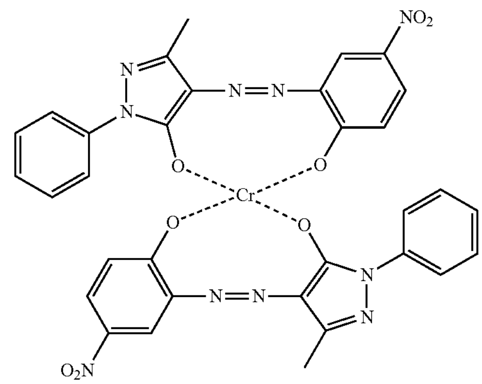

(AZ-8)

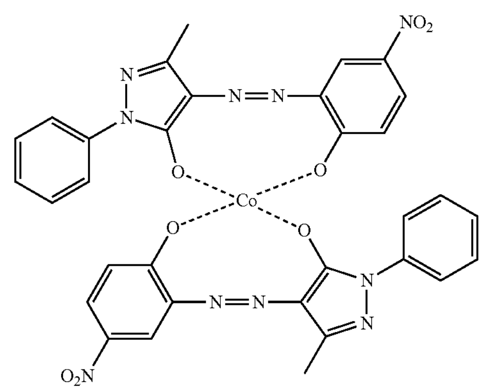

(AZ-9)

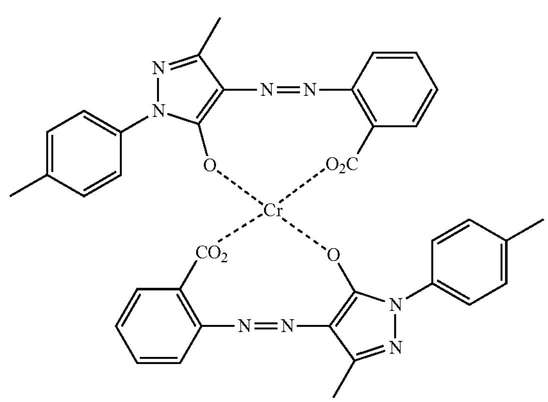

-continued
(AZ-10)
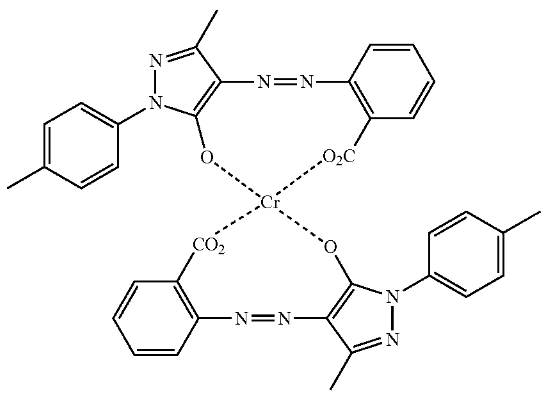
(AZ-11)
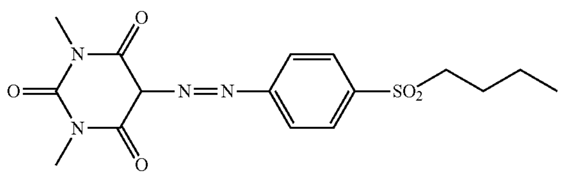
(AZ-12)
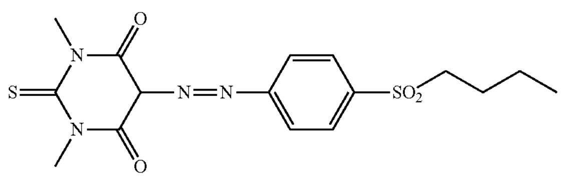
(AZ-13)
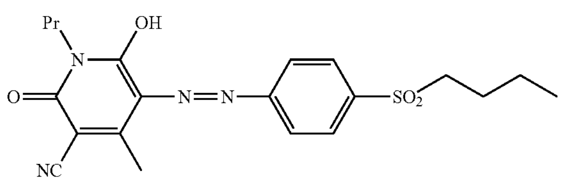
(AZ-14)
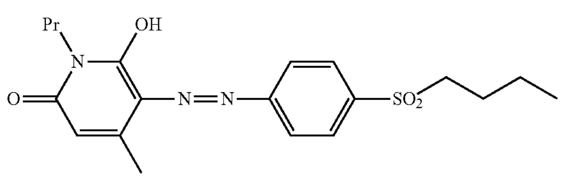
(AZ-15)
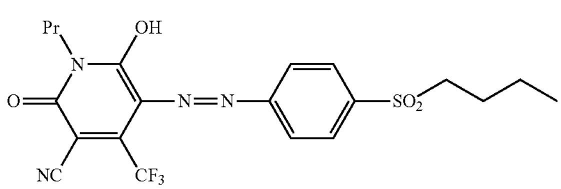
(AZ-16)
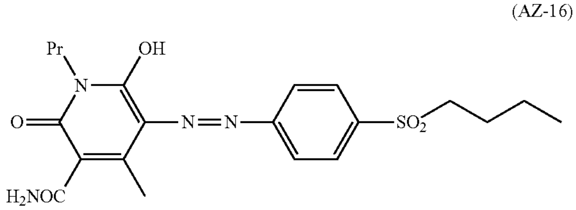
-continued
(AZ-17)
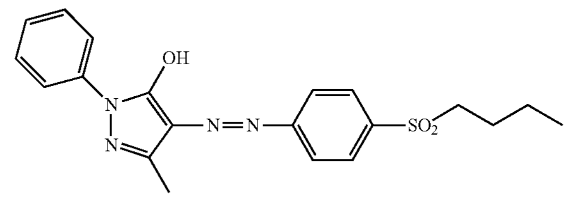
(AZ-18)
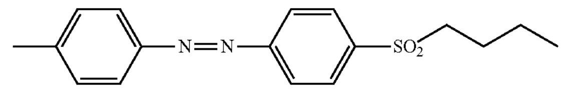
(AZ-19)
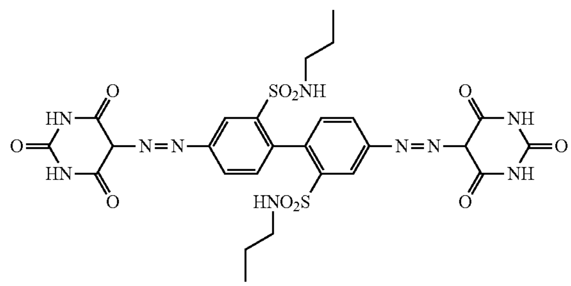
(AZ-20)
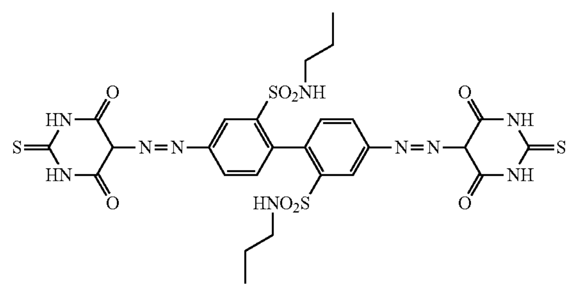
(AZ-21)
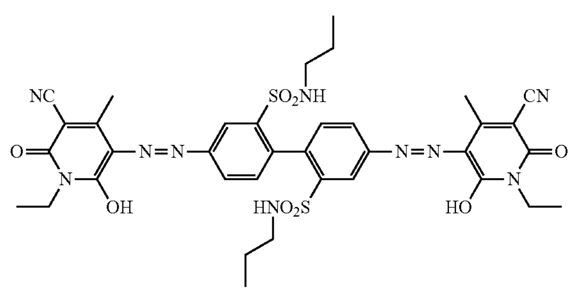
(AZ-22)
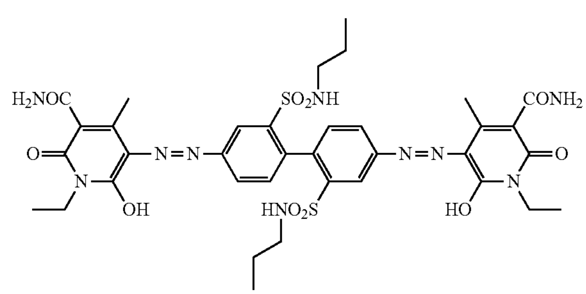
Among the specific examples above, (AZ-7), (AZ-8), (AZ-9), (AZ-11), (AZ-13), (AZ-14), (AZ-15), (AZ-16), (AZ-17), (AZ-19), (AZ-20), (AZ-21), and (AZ-22) are particularly preferable, from the viewpoints of color characteristics and heat resistance.

Among the azo colorants above, the azo colorant represented by the general formula (I) is preferable as a yellow colorant from the viewpoint of spectroscopic properties, and the azo colorant represented by the general formula (G) as a yellow colorant from the viewpoint of light resistance and heat resistance.

The azo colorant or the dipyrromethene colorant can be easily synthesized in accordance with the methods described in JP2005-189802A, JP2007-250224A, JP2006-124634A, JP2007-147784A, JP2007-277176A, and JP2008-292970A, U.S. Pat. No. 5,789,560, and the like.

Furthermore, the azo colorant or the dipyrromethene colorant can be synthesized using known methods such as a method of multimerizing the colorant, or a method of introducing a polymerizable group into a colorant. Specific examples of the methods are described in Examples.

<Xanthene Colorant>

In a preferable embodiment, the colorant multimer in the present invention has a partial structure derived from a xanthene colorant (xanthene compound). Examples of the colorant multimer (A) include colorant multimers including a colorant skeleton derived from a xanthene compound represented by the following general formula (J) as a partial structure of a colorant moiety.

General Formula (J)

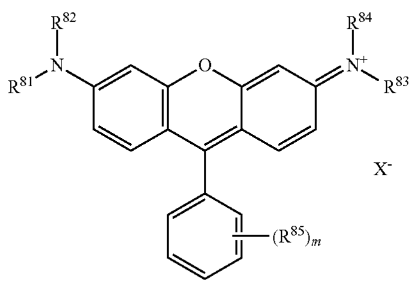

In the general formula (J), $R^{81}$, $R^{82}$, $R^{83}$, $R^{83}$, and $R^{84}$ each independently a hydrogen atom or a monovalent substituent; $R^{85}$'s each independently a monovalent substituent; m represents an integer of 0 to 5; and $X^-$ represents an anion.

When $R^{81}$ to $R^{84}$, and $R^{85}$ in the general formula (J) each represent a monovalent substituent, examples of the monovalent substituent include halogen atoms (such as a fluorine atom, a chlorine atom, and a bromine atom), alkyl groups (preferably linear, branched, or cyclic alkyl groups having 1 to 48 carbon atoms, and more preferably linear, branched, or cyclic alkyl groups having 1 to 24 carbon atoms, for example, a methyl group, an ethyl group, a propyl group, an isopropyl group, a butyl group, a t-butyl group, a pentyl group, a hexyl group, a heptyl group, an octyl group, a 2-ethylhexyl group, a dodecyl group, a hexadecyl group, a cyclopropyl group, a cyclopentyl group, a cyclohexyl group, a 1-norbornyl group, and a 1-adamantyl group), alkenyl groups (preferably alkenyl groups having 2 to 48 carbon atoms, and more preferably alkenyl groups having 2 to 18 carbon atoms, for example, vinyl group, an allyl group, and a 3-buten-1-yl group), aryl groups (preferably aryl groups having 6 to 48 carbon atoms, and more preferably aryl groups having 6 to 24 carbon atoms, for example, a phenyl group and a naphthyl group), heterocyclic groups (preferably heterocyclic groups having 1 to 32 carbon atoms, and more preferably heterocyclic groups having 1 to 18 carbon atoms, for example, a 2-thienyl group, a 4-pyridyl group, a 2-furyl group, a 2-pyrimidinyl group, a 1-pyridyl group, a 2-benzothiazolyl group, a 1-imidazolyl group, a 1-pyrazolyl group, a benzotriazol-1-yl group), silyl groups (preferably silyl groups having 3 to 38 carbon atoms, and more preferably silyl groups having 3 to 18 carbon atoms, for example, a trimethylsilyl group, a triethylsilyl group, a tributylsilyl group, a t-butyldimethylsilyl group, and a t-hexyldimethylsilyl group), a hydroxyl group, a cyano group, a nitro group, alkoxy groups (preferably alkoxy groups having 1 to 48 carbon atoms, and more preferably alkoxy groups having 1 to 24 carbon atoms, for example, a methoxy group, an ethoxy group, a 1-butoxy group, a 2-butoxy group, an isopropoxy group, a t-butoxy group, a dodecyloxy group, and preferably cycloalkyloxy groups having 1 to 48 carbon atoms, and more preferably cycloalkyloxy groups having 1 to 24 carbon atoms, for example, a cyclopentyloxy group and a cyclohexyloxy group), aryloxy groups (preferably aryloxy groups having 6 to 48 carbon atoms, and more preferably aryloxy groups having 6 to 24 carbon atoms, for example, a phenoxy group and a 1-naphthoxy group), heterocyclic oxy groups (preferably heterocyclic oxy groups having 1 to 32 carbon atoms, and more preferably heterocyclic oxy groups having 1 to 18 carbon atoms, for example, a 1-phenyltetrazol-5-oxy group and a 2-tetrahydropyranyloxy group), silyloxy groups (preferably silyloxy groups having 1 to 32 carbon atoms, and more preferably silyloxy groups having 1 to 18 carbon atoms, for example, a trimethylsilyloxy group, a t-butyldimethylsilyloxy group, and a diphenylmethylsilyloxy group), acyloxy groups (preferably acyloxy groups having 2 to 48 carbon atoms, and more preferably acyloxy groups having 2 to 24 carbon atoms, for example, an acetoxy group, a pivaloyloxy group, a benzoyloxy group, and a dodecanoyloxy group), alkoxycarbonyloxy groups (preferably alkoxycarbonyloxy groups having 2 to 48 carbon atoms, and more preferably alkoxycarbonyloxy groups having 2 to 24 carbon atoms, for example, an ethoxycarbonyloxy group, and a t-butoxycarbonyloxy group, and preferably cycloalkyloxycarbonyloxy groups having 2 to 48 carbon atoms, and more preferably cycloalkyloxycarbonyloxy groups having 2 to 24 carbon atoms, for example, cyclohexyloxycarbonyloxy), aryloxycarbonyloxy groups (preferably aryloxycarbonyloxy groups having 7 to 32 carbon atoms, and more preferably aryloxycarbonyloxy groups having 7 to 24 carbon atoms, for example, phenoxycarbonyloxy), carbamoyloxy groups (preferably carbamoyloxy groups having 1 to 48 carbon atoms, and more preferably carbamoyloxy groups having 1 to 24 carbon atoms, for example, an N,N-dimethylcarbamoyloxy group, an N-butylcarbamoyloxy group, an N-phenylcarbamoyloxy group, and an N-ethyl-N-phenylcarbamoyloxy group), sulfamoyloxy groups (preferably sulfamoyloxy groups having 1 to 32 carbon atoms, and more preferably sulfamoyloxy groups having 1 to 24 carbon atoms, for example, an N,N-diethylsulfamoyloxy group and an N-propylsulfamoyloxy group), alkylsulfonyloxy groups (preferably alkylsulfonyloxy groups having 1 to 38 carbon atoms, and more preferably alkylsulfonyloxy groups having 1 to 24 carbon atoms, for example, a methylsulfonyloxy group, a hexadecylsulfonyloxy group, and a cyclohexylsulfonyloxy group), arylsulfonyloxy groups (preferably arylsulfonyloxy groups having 6 to 32 carbon atoms, and more preferably arylsulfonyloxy groups having 6 to 24 carbon atoms, for example, a phenylsulfonyloxy group), acyl groups (preferably acyl groups having 1 to 48 carbon atoms, and more preferably acyl groups having 1 to 24 carbon atoms, for example, a formyl group, an acetyl group, a pivaloyl group, a benzoyl group, a tetradecanoyl group, and a cyclohexanoyl group), alkoxycarbonyl groups (preferably alkoxycarbonyl groups having 2 to 48 carbon atoms, and more preferably alkoxycarbonyl groups having 2 to 24 carbon atoms, for example, a methoxycarbonyl group, an ethoxycarbonyl group, an octadecyloxycarbonyl group, a cyclohexyloxycarbonyl group, and a 2,6-di-tert-butyl-4-methylcyclohexyloxycarbonyl group), aryloxycarbonyl groups (preferably aryloxycarbonyl groups having 7 to 32 carbon atoms, and more preferably aryloxycarbonyl groups having 7 to 24 carbon atoms, for example, a phenoxycarbonyl group), carbamoyl groups (preferably carbamoyl groups having 1 to 48 carbon atoms, and more preferably carbamoyl groups having 1 to 24 carbon atoms, for example, a carbamoyl group, an N,N-diethylcarbamoyl group, an N-ethyl-N-octylcarbamoyl group, an N,N-dibutylcarbamoyl group, an N-propylcarbamoyl group, an N-phenylcarbamoyl group, an N-methyl-N-phenylcarbamoyl group, and an N,N-dicyclohexylcarbamoyl group), amino groups (preferably amino groups having 32 or less carbon atoms, and more preferably amino groups having 24 or less carbon atoms, for example, an amino group, a methylamino group, an N,N-dibutylamino group, a tetradecylamino group, a 2-ethylhexylamino group, and a cyclohexylamino group), anilino groups (preferably anilino groups having 6 to 32 carbon atoms, and more preferably anilino groups having 6 to 24 carbon atoms, for example, an anilino group and an N-methylanilino group), heterocyclic amino groups (preferably heterocyclic amino groups having 1 to 32 carbon atoms, and more preferably heterocyclic amino groups having 1 to 18 carbon atoms, for example, a 4-pyridylamino group), carbonamide groups (preferably carbonamide groups having 2 to 48 carbon atoms, and more preferably carbonamide groups having 2 to 24 carbon atoms, for example, an acetamide group, a benzamide group, a tetradecaneamide group, a pivaloylamide group, and a cyclohexanamide group), ureido groups (preferably ureido groups having 1 to 32 carbon atoms, and more preferably ureido groups having 1 to 24 carbon atoms, for example, a ureido group, an N,N-dimethylureido group, and an N-phenylureido group), imide groups (preferably imide groups having 36 or less carbon atoms, and more preferably imide groups having 24 or less, for example, an N-succinimide group and an N-phthalimide group), alkoxycarbonylamino groups (preferably alkoxycarbonylamino groups having 2 to 48 carbon atoms, and more preferably alkoxycarbonylamino groups having 2 to 24 carbon atoms, for example, a methoxycarbonylamino group, an ethoxycarbonylamino group, a t-butoxycarbonylamino group, an octadecyloxycarbonylamino group, and a cyclohexyloxycarbonylamino group), aryloxycarbonylamino groups (preferably aryloxycarbonylamino groups having 7 to 32 carbon atoms, and more preferably aryloxycarbonylamino groups having 7 to 24 carbon atoms, for example, a phenoxycarbonylamino group), sulfonamide groups (preferably sulfonamide groups having 1 to 48 carbon atoms, and more preferably sulfonamide groups having 1 to 24 carbon atoms, for example, a methane sulfonamide group, a butanesulfonamide group, a benzene sulfonamide group, a hexadecanesulfoneamide group, and a cyclohexane sulfonamide group), sulfamoylamino groups (preferably sulfamoylamino groups having 1 to 48 carbon atoms, and more preferably sulfamoylamino groups having 1 to 24 carbon atoms, for example, an N,N-dipropylsulfamoylamino group, and an N-ethyl-N-dodecylsulfamoylamino group), azo groups (preferably azo groups having 1 to 32 carbon atoms, and more preferably azo groups having 1 to 24 carbon atoms, for example, a phenylazo group and a 3-pyrazolylazo group), alkylthio groups (preferably alkylthio groups having 1 to 48 carbon atoms, and more preferably alkylthio groups having 1 to 24 carbon atoms, for example, a methylthio group, an ethylthio group, an octylthio group, and a cyclohexylthio), arylthio groups (preferably arylthio groups having 6 to 48 carbon atoms, and more preferably arylthio groups having 6 to 24 carbon atoms, for example, a phenylthio group), heterocyclic thio groups (preferably heterocyclic thio groups having 1 to 32 carbon atoms, and more preferably heterocyclic thio groups having 1 to 18 carbon atoms, for example, a 2-benzothiazolylthio group, a 2-pyridylthio group, and a 1-phenyltetrazolylthio group), alkylsulfinyl groups (preferably alkylsulfinyl groups having 1 to 32 carbon atoms, and more preferably alkylsulfinyl groups having 1 to 24 carbon atoms, for example, a dodecanesulfinyl group), arylsulfinyl groups (preferably arylsulfinyl groups having 6 to 32 carbon atoms, and more preferably arylsulfinyl groups having 6 to 24 carbon atoms, for example, a phenylsulfinyl group), alkylsulfonyl groups (preferably alkylsulfonyl groups having 1 to 48 carbon atoms, and more preferably alkylsulfonyl groups having 1 to 24 carbon atoms, for example, a methylsulfonyl group, an ethylsulfonyl group, a propylsulfonyl group, a butylsulfonyl group, an isopropylsulfonyl group, a 2-ethylhexylsulfonyl group, a hexadecylsulfonyl group, an octylsulfonyl group, and a cyclohexylsulfonyl group), arylsulfonyl groups (preferably arylsulfonyl groups having 6 to 48 carbon atoms, and more preferably arylsulfonyl groups having 6 to 24 carbon atoms, for example, a phenylsulfonyl group and a 1-naphthylsulfonyl group), sulfamoyl groups (preferably sulfamoyl groups having 32 or less carbon atoms, and more preferably sulfamoyl groups having 24 or less carbon atoms, for example, a sulfamoyl group, an N,N-dipropylsulfamoyl group, an N-ethyl-N-dodecylsulfamoyl group, an N-ethyl-N-phenylsulfamoyl group, and an N-cyclohexylsulfamoyl group), sulfo groups, phosphonyl groups (preferably phosphonyl groups having 1 to 32 carbon atoms, and more preferably phosphonyl groups having 1 to 24 carbon atoms, for example, a phenoxyphosphonyl group and an octyloxyphosphonyl group, phenylphosphonyl), phosphinoylamino groups (preferably phosphinoylamino groups having 1 to 32 carbon atoms, and more preferably phosphinoylamino groups having 1 to 24 carbon atoms, for example, a diethoxyphosphinoylamino group and a dioctyloxyphosphinoylamino group).

When the monovalent group represented by $R^{81}$ to $R^{85}$ in the general formula (J) is a group that may further be substituted, the monovalent group may further be substituted with any of the substituents mentioned as in $R^{81}$ to $R^{85}$ above. When the monovalent group has two or more substituents, these substituents may be the same as or different from each other.

$R^{81}$ and $R^{82}$, $R^{83}$ and $R^{84}$, and any two $R^{85}$'s when m is 2 or more in the general formula (J) may be each independently bonded to each other to form a 5-, 6-, or 7-membered saturated ring or unsaturated ring. When the 5-, 6-, or 7-membered ring thus formed is a group which may further be substituted, they may be substituted with any of the substituents mentioned as $R^{81}$ to $R^{85}$, they are substituted with two or more substituents, the substituents may be the same as or different from each other.

When $R^{81}$ and $R^{82}$, $R^{83}$ and $R^{84}$, and any two $R^{85}$'s when m is 2 or more in the general formula (J) each independently bonded to each other to form a 5-, 6-, or 7-membered saturated ring or unsaturated ring having no substituent, examples of the 5-, 6-, or 7-membered saturated ring or unsaturated ring having no substituent include a pyrrole ring, furan ring, a thiophene ring, a pyrazole ring, an imidazole ring, a triazole ring, an oxazole ring, a thiazole ring, a pyrrolidine ring, a piperidine ring, a cyclopentene ring, a cyclohexene ring, a benzene ring, a pyridine ring, a pyridine ring, and a pyridazine ring, and preferably a benzene ring and a pyridine ring.

Particularly, in the general formula (J), it is preferable that $R^{82}$ and $R^{83}$ be hydrogen atoms; and $R^{81}$ and $R^{84}$ be unsubstituted phenyl groups. Further, it is preferable that $R^{85}$ be a halogen atom, a linear or branched alkyl group having 1 to 5 carbon atoms, a sulfo group, a sulfonamide group, or a carboxyl group. It is most preferable that the substituent introduced in the phenyl group of $R^{81}$ and $R^{84}$ represent a hydrogen atom, a halogen atom, a linear or branched alkyl group having 1 to 5 carbon atoms, a sulfo group, a sulfonamide group, or a carboxyl group.

In the general formula (J), $X^-$ represents an anion. Specific examples of $X^-$ include inorganic anions such as a fluorine anion, a chlorine anion, a bromine anion, an iodine anion, a perchlorate anion, a thiocyanate anion, a hexafluorophosphate anion, a hexafluoroantimony anion, a tetrafluoroborin anion, and the like; carboxylate anions such as an acetate anion, a benzoate anion, and the like; organic sulfonate anions such as a benzene sulfonate anion, a toluene sulfonate anion, a trifluoromethane sulfonate anion, and the like; and organic phosphate anions such as an octyl phosphate anion, a dodecyl phosphate anion, an octadecyl phosphate anion, a phenyl phosphate anion, a nonylphenyl phosphate anion, and the like. $X^-$ may be linked to a colorant skeleton or to a part (a polymer chain and the like) of a colorant multimer.

In the general formula (J), $X^-$ is preferably a fluorine anion, a chlorine anion, a bromine anion, an iodine anion, a perchlorate anion, or a carboxylic acid anion, and most preferably a perchlorate anion or a carboxylic acid anion.

Specific examples of the xanthene compound are shown below, but the present invention is not limited thereto.

(1a)

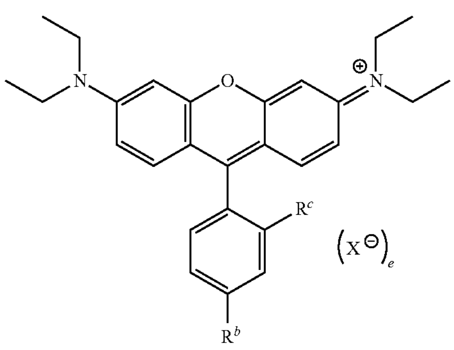

(1b)

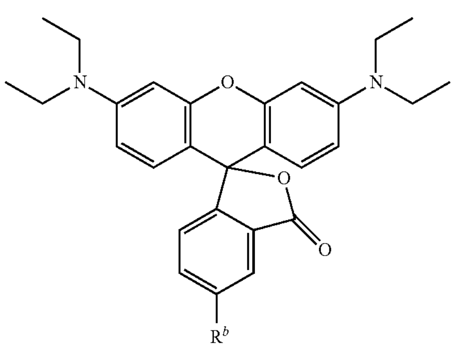

-continued (1b-1)

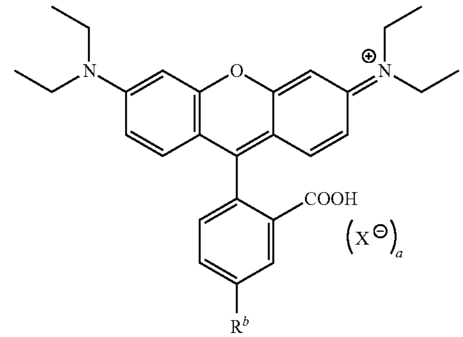

(1c)

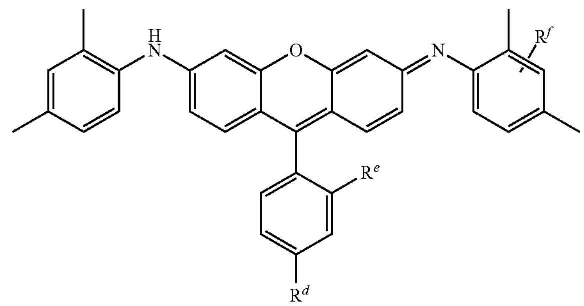

(1d)

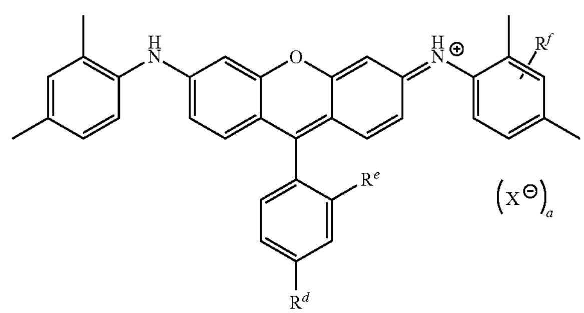

(1e)

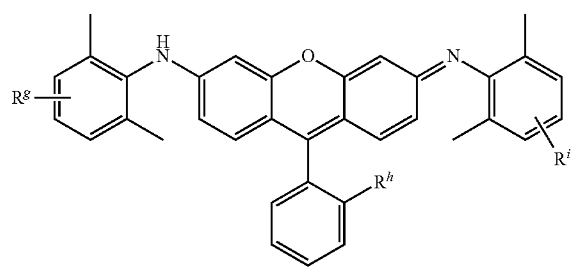

(1f)

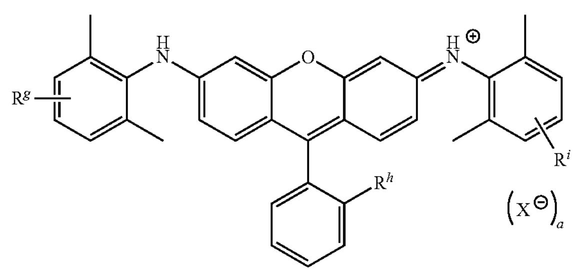

In the formulae (1a) to (1f), Rb and Rc each independently represent a hydrogen atom, —$SO_3$—, —$CO_2H$, or —$SO_2NHR^a$, and $R^d$, $R^e$, and $R^f$ each independently represent —$SO_3$—, —$SO_3Na$, or —$SO_2NHR^a$.

$R^g$, $R^h$, and $R^i$ each independently represent a hydrogen atom, —$SO_3$—, —$SO_3H$, or —$SO_2NHR^a$.

$R^a$ represents an alkyl group having 1 to 10 carbon atoms, and preferably a 2-ethylhexyl group. X and a have the same definitions as above, respectively.)

A compound represented by the formula (1b) is a tautomer of a compound represented by the formula (1b-1).

Among these, the formulae (1e) and (1f) are preferable from the viewpoints of color characteristics and heat resistance.

It is preferable that the molar extinction coefficient of the compound having the xanthene skeleton represented by the general formula (J) be as high as possible in view of the film thickness. Further, the maximum absorption wavelength λmax is preferably from 520 nm to 580 nm, and more preferably from 530 nm to 570 nm, from the viewpoint of the improvement of color purity. Further, the maximal absorption wavelength and the molar extinction coefficient are measured by means of a spectrophotometer UV-2400PC (manufactured by Shimadzu Corporation).

It is preferable that the melting point of the compound having a xanthene skeleton represented by the general formula (J) be not too high in view of solubility.

The compound having the xanthene skeleton represented by the general formula (J) can be synthesized by the method described in Documents above. Specifically, the method described in Tetrahedron Letters, 2003, vol. 44, No. 23, pp. 4355 to 4360, Tetrahedron, 2005, vol. 61, No. 12, pp. 3097 to 3106, or the like can be employed.

<Squalirium Colorant>

One of the embodiments of the colorant multimer according to the present invention is a colorant multimer which has a partial structure derived from a squalirium colorant (squalirium compound). The colorant multimer (A) is a colorant multimer which has a structure derived from a compound represented by the following general formula (K) (squalirium compound) as a partial structure of a colorant moiety. The squalirium compound in the present invention totally refers to a compound having a colorant moiety including a squalirium skeleton in the molecule.

General Formula (K)

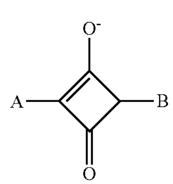

In the general formula (K), A and B each independently represent an aryl group or a heterocyclic group. Examples of the aryl group preferably include aryl groups having 6 to 48 carbon atoms, and more preferably aryl groups having 6 to 24 carbon atoms, for example, phenyl, naphthyl, and the like. As the heterocyclic group, a heterocyclic group of a 5- or 6-membered ring is preferable, and examples thereof include pyrrolyl, imidazoyl, pyrazoyl, thienyl, pyridyl, pyrimidyl, pyridazyl, triazol-1-yl, thienyl, furyl, thiadiazolyl, and the like.

As the compound represented by the general formula (K), a compound represented by the following general formula (K-1), the following general formula (K-2), the following general formula (K-3) or the following general formula (K-4) is particularly preferable.

General Formula (K-1)

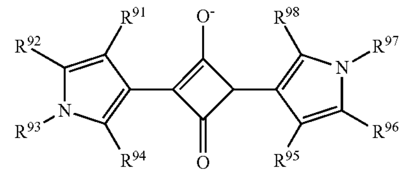

In the general formula (K-1), $R^{91}$, $R^{92}$, $R^{94}$, $R^{95}$, $R^{96}$, and $R^{98}$ each independently represent a hydrogen atom, a halogen atom, a linear or branched alkyl group, a cycloalkyl group, a linear or branched alkenyl group, a cycloalkenyl group, an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an amino group (including an alkylamino group and an anilino group), an acylamino group, an aminocarbonylamino group, an alkoxycarbonylamino group, an aryloxycarbonylamino group, a sulfamoylamino group, an alkyl or arylsulfonylamino group, a mercapto group, an alkylthio group, an arylthio group, a heterocyclic thio group, a sulfamoyl group, a sulfo group, an alkyl or arylsulfinyl group, an alkyl or arylsulfonyl group, an acyl group, an aryloxycarbonyl group, an alkoxycarbonyl group, a carbamoyl group, an arylazo group, a heterocyclic azo group, an imide group, a phosphino group, a phosphinyl group, a phosphinyloxy group, a phosphinylamino group, or a silyl group.

$R^{93}$ and $R^{97}$ each independently represent a hydrogen atom, a linear or branched alkyl group, a cycloalkyl group, a cycloalkenyl group, an alkynyl group, an aryl group, or a heterocyclic group.

$R^{91}$ and $R^{92}$, and $R^{95}$ and $R^{96}$ may be bonded to each other to form a ring.

General Formula (K-2)

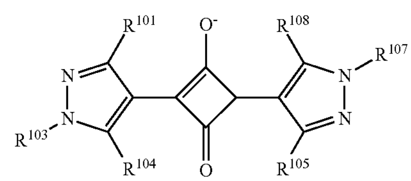

In the general formula (K-2), $R^{101}$, $R^{103}$, $R^{104}$, $R^{105}$, $R^{107}$, and $R^{108}$ have the same definitions as $R^{91}$, $R^{93}$, $R^{94}$, $R^{95}$, $R^{97}$, and $R^{98}$, respectively.

The substituents above, which can be introduced into $R^{91}$, $R^{92}$, $R^{94}$, $R^{95}$, $R^{96}$, and $R^{98}$ in the general formula (K-1) will be described specifically.

Examples of the substituent include halogen atoms (such as a fluorine atom, a chlorine atom, a bromine atom, and an iodine atom), and groups having polycyclic structures, such as linear or branched alkyl groups (linear or branched substituted or unsubstituted alkyl groups, and preferably alkyl groups having 1 to 30 carbon atoms, for example, methyl, ethyl, n-propyl, isopropyl, t-butyl, n-octyl, 2-chloroethyl, 2-cyanoethyl, and 2-ethylhexyl), cycloalkyl groups (preferably substituted or unsubstituted cycloalkyl groups having 3 to 30 carbon atoms, for example, cyclohexyl, cyclopentyl, and dicycloalkyl groups, for example, bicycloalkyl groups (preferably substituted or unsubstituted bicycloalkyl groups having 5 to 30 carbon atoms, for example, bicyclo[1,2,2]heptan-2-yl and bicyclo[2,2,2]octan-3-yl), tricycloalkyl groups, and the like; preferably monocyclic cycloalkyl groups and bicycloalkyl groups; and particularly preferably monocyclic cycloalkyl groups), linear or branched alkenyl groups (linear or branched substituted or unsubstituted alkenyl groups, and preferably alkenyl groups having 2 to 30 carbon atoms, for example, vinyl, allyl, furenyl, geranyl, and oleyl), cycloalkenyl groups (preferably substituted or unsubstituted cycloalkenyl groups having 3 to 30 carbon atoms, for example, 2-cyclopenten-1-yl, 2-cyclohexen-1-yl, dicycloalkenyl groups, for example, bicycloalkenyl groups (preferably substituted or unsubstituted bicycloalkenyl groups having 5 to 30 carbon atoms, for example, bicyclo[2,2,1]hept-2-en-1-yl and bicyclo[2,2,2]oct-2-en-4-yl), and tricycloalkenyl groups; and particularly preferably monocyclic cycloalkenyl groups), alkynyl groups (preferably substituted or unsubstituted alkynyl groups having 2 to 30 carbon atoms, for example, ethynyl, propargyl, and trimethylsilylethynyl groups), aryl groups (preferably substituted or unsubstituted aryl groups having 6 to 30 carbon atoms, for example, phenyl, p-tolyl, naphthyl, m-chlorophenyl, and o-hexadecanoylaminophenyl), heterocyclic groups (preferably substituted or unsubstituted, saturated or unsaturated, aromatic or non-aromatic, or monocyclic or fused-ring heterocyclic groups of 5-to 7-membered rings; more preferably heterocyclic groups in which the ring-constituting atom is selected from a carbon atom, a nitrogen atom, and a sulfur atom, and has at least one hetero atoms such as a nitrogen atom, an oxygen atom, and a sulfur atom; and still more preferably 5- or 6-membered-ring aromatic heterocyclic groups having 3 to 30 carbon atoms. Examples thereof include 2-furyl, 2-thienyl, 2-pyridyl, 4-pyridyl, 2-pyrimidinyl, and 2-benzothiazolyl), a cyano group, a hydroxyl group, a nitro group, and a carboxyl group), alkoxy groups (preferably substituted or unsubstituted alkoxy groups having 1 to 30 carbon atoms, for example, methoxy, ethoxy, isopropoxy, t-butoxy, n-octyloxy, and 2-methoxyethoxy), aryloxy groups (preferably substituted or unsubstituted aryloxy groups having 6 to 30 carbon atoms, for example, phenoxy, 2-methylphenoxy, 2,4-di-t-amylphenoxy, 4-t-butylphenoxy, 3-nitrophenoxy, and 2-tetradecanoylaminophenoxy), silyloxy groups (preferably silyloxy groups having 3 to 20 carbon atoms, for example, trimethylsilyloxy and t-butyldimethylsilyloxy), heterocyclic oxy groups (preferably substituted or unsubstituted heterocyclic oxy groups having 2 to 30 carbon atoms, in which the heterocyclic moiety is preferably a heterocyclic moiety mentioned as the heterocyclic group described above, for example, 1-phenyltetrazol-5-oxy and 2-tetrahydropyranyloxy), acyloxy group (preferably a formyloxy group, substituted or unsubstituted alkylcarbonyloxy groups having 2 to 30 carbon atoms, and substituted or unsubstituted arylcarbonyloxy groups having 6 to 30 carbon atoms, for example, formyloxy, acetyloxy, pivaloyloxy, stearoyloxy, benzoyloxy, and p-methoxyphenylcarbonyloxy), carbamoyloxy groups (preferably substituted or unsubstituted carbamoyloxy groups having 1 to 30 carbon atoms, for example, N,N-dimethylcarbamoyloxy, N,N-diethylcarbamoyloxy, morpholinecarbonyloxy, N,N-di-n-octylaminocarbonyloxy, and N-n-octylcarbamoyloxy), alkoxycarbonyloxy groups (preferably substituted or unsubstituted alkoxycarbonyloxy groups having 2 to 30 carbon atoms, for example, methoxycarbonyloxy, ethoxycarbonyloxy, t-butoxycarbonyloxy, and n-octylcarbonyloxy), aryloxycarbonyloxy groups (preferably substituted or unsubstituted aryloxycarbonyloxy groups having 7 to 30 carbon atoms, for example, a phenoxycarbonyloxy, p-methoxyphenoxycarbonyloxy, and p-n-hexadecyloxyphenoxycarbonyloxy), amino groups (preferably amino groups, substituted or unsubstituted alkylamino groups having 1 to 30 carbon atoms, substituted or unsubstituted arylamino groups having 6 to 30 carbon atoms, and heterocyclic amino groups having 0 to 30 carbon atoms, for example, amino, methylamino, dimethylamino, anilino, N-methyl-anilino, diphenylamino, and N-1,3,5-triazin-2-ylamino), acylamino groups (preferably formylamino groups, substituted or unsubstituted alkylcarbonylamino groups having 1 to 30 carbon atoms, and substituted or unsubstituted arylcarbonylamino groups having 6 to 30 carbon atoms, for example, formylamino, acetylamino, pivaloylamino, lauroylamino, benzoylamino, and 3,4,5-tri-n-octyloxyphenylcarbonylamino), aminocarbonylamino groups (preferably substituted or unsubstituted aminocarbonylamino groups having 1 to 30 carbon atoms, for example, carbamoylamino, N,N-dimethylaminocarbonylamino, N,N-diethylaminocarbonylamino, and morpholinecarbonylamino), alkoxycarbonylamino groups (preferably substituted or unsubstituted alkoxycarbonylamino groups having 2 to 30 carbon atoms, for example, a methoxycarbonylamino, ethoxycarbonylamino, t-butoxycarbonylamino, n-octadecyloxycarbonylamino, and N-methylmethoxycarbonylamino), aryloxycarbonylamino groups (preferably substituted or unsubstituted aryloxycarbonylamino groups having 7 to 30 carbon atoms, for example, a phenoxycarbonylamino, p-chlorophenoxycarbonylamino, and m-n-octyloxyphenoxycarbonylamino), sulfamoylamino groups (preferably substituted or unsubstituted sulfamoylamino groups having 0 to 30 carbon atoms, for example, a sulfamoylamino, N,N-dimethylaminosulfonylamino, and N-n-octylaminosulfonylamino), alkylsulfonylamino groups or arylsulfonylamino groups (preferably substituted or unsubstituted alkylsulfonylamino groups having 1 to 30 carbon atoms, or substituted or unsubstituted arylsulfonylamino groups having 6 to 30 carbon atoms, for example, methylsulfonylamino, butylsulfonylamino, phenylsulfonylamino, 2,3,5-trichlorophenylsulfonylamino, and p-methylphenylsulfonylamino), mercapto groups, alkylthio groups (preferably substituted or unsubstituted alkylthio groups having 1 to 30 carbon atoms, for example, methylthio, ethylthio, and n-hexadecylthio), arylthio groups (preferably substituted or unsubstituted arylthio groups having 6 to 30 carbon atoms, for example, phenylthio, p-chlorophenylthio, and m-methoxyphenylthio), heterocyclic thio groups (preferably substituted or unsubstituted heterocyclic thio groups having 2 to 30 carbon atoms, in which a heterocyclic moiety is preferably a heterocyclic moiety mentioned as the heterocyclic group described above, for example, 2-benzothiazolylthio and 1-phenyltetrazol-5-ylthio), sulfamoyl groups (preferably substituted or unsubstituted sulfamoyl groups having 0 to 30 carbon atoms, for example, N-ethylsulfamoyl, N-(3-dodecyloxy propyl)sulfamoyl, N,N-dimethylsulfamoyl, N-acetylsulfamoyl, N-benzoylsulfamoyl, and N—(N'-phenylcarbamoyl)sulfamoyl), sulfo groups, alkylsulfinyl groups or arylsulfinyl groups (preferably substituted or unsubstituted alkylsulfinyl groups having 1 to 30 carbon atoms or substituted or unsubstituted arylsulfinyl groups having 6 to 30 carbon atoms, for example, methylsulfinyl, an ethylsulfinyl, phenylsulfinyl, and p-methylphenylsulfinyl), alkylsulfonyl groups or arylsulfonyl groups (preferably substituted or unsubstituted alkylsulfonyl groups having 1 to 30 carbon atoms, or substituted or unsubstituted arylsulfonyl groups having 6 to 30 carbon atoms, for example, methylsulfonyl, ethylsulfonyl, phenylsulfonyl, and p-methylphenylsulfonyl), acyl groups (preferably formyl groups, substituted or unsubstituted alkylcarbonyl groups having 2 to 30 carbon atoms, or substituted or unsubstituted arylcarbonyl groups having 7 to 30 carbon atoms, for example, acetyl, pivaloyl, 2-chloroacetyl, stearoyl, benzoyl, and p-n-octyloxyphenylcarbonyl), aryloxycarbonyl groups (preferably substituted or unsubstituted aryloxycarbonyl groups having 7 to 30 carbon atoms, for example, phenoxycarbonyl, o-chlorophenoxycarbonyl, m-nitrophenoxycarbonyl, and p-t-butylphenoxycarbonyl), alkoxycarbonyl groups (preferably substituted or unsubstituted alkoxycarbonyl groups having 2 to 30 carbon atoms, for example, methoxycarbonyl, ethoxycarbonyl, t-butoxycarbonyl, and n-octadecyloxycarbonyl), carbamoyl groups (preferably substituted or unsubstituted carbamoyl having 1 to 30 carbon atoms, for example, carbamoyl, N-methylcarbamoyl, N,N-dimethylcarbamoyl, N,N-di-n-octylcarbamoyl, and N-(methylsulfonyl)carbamoyl), arylazo groups or heterocyclic azo groups (preferably substituted or unsubstituted arylazo groups having 6 to 30 carbon atoms, or substituted or unsubstituted heterocyclic azo groups having 3 to 30 carbon atoms (in which a heterocyclic moiety is preferably a heterocyclic moiety mentioned as the heterocyclic group described above), for example, phenylazo, p-chlorophenylazo, and 5-ethylthio-1,3,4-thiadiazol-2-ylazo), imide groups (preferably substituted or unsubstituted imide groups having 2 to 30 carbon atoms, for example, N-succinimide and N-phthalimide), phosphino groups (preferably substituted or unsubstituted phosphino groups having 2 to 30 carbon atoms, for example, dimethylphosphino, diphenylphosphino, and methylphenoxyphosphino), phosphinyl groups (preferably substituted or unsubstituted phosphonyl groups having 2 to 30 carbon atoms, for example, phosphinyl, dioctyloxyphosphinyl, and diethoxyphosphinyl), phosphinyloxy groups (preferably substituted or unsubstituted phosphinyloxy groups having 2 to 30 carbon atoms, for example, diphenoxyphosphinyloxy and dioctyloxyphosphinyloxy), phosphinylamino groups (preferably substituted or unsubstituted phosphinylamino groups having 2 to 30 carbon atoms, for example, dimethoxyphosphinylamino and dimethylaminophosphinylamino), silyl groups (preferably substituted or unsubstituted silyl groups having 3 to 30 carbon atoms, for example, trimethylsilyl, t-butyldimethylsilyl, and phenyldimethylsilyl).

Ones having hydrogen atoms in the functional groups above may have the parts of the hydrogen atoms in the functional groups substituted with several groups. Examples of the functional group that can be introduced as a substituent include an alkylcarbonylaminosulfonyl group, an arylcarbonylaminosulfonyl group, an alkylsulfonylaminocarbonyl group, and an arylsulfonylaminocarbonyl group, and specifically, aa methylsulfonylaminocarbonyl group, a p-methylphenylsulfonylaminocarbonyl group, an acetylaminosulfonyl group, and a benzoylaminosulfonyl group.

In the general formula (K-1), it is preferable that $R^{91}$ to $R^{98}$ each independently represent a hydrogen atom, an alkyl group, a hydroxyl group, an amino group, an aryl group, or a heterocyclic group; it is more preferable that $R^{93}$, $R^{94}$, $R^{97}$, and $R^{98}$ each represent an alkyl group, and $R^{91}$ and $R^{92}$, and $R^{95}$ and $R^{96}$ are bonded to each other to form an aryl ring; and it is most preferable that $R^{93}$, $R^{94}$, $R^{97}$, and $R^{98}$ each represent alkyl groups having 1 to 20 carbon atoms, and $R^{91}$ and $R^{92}$, and $R^{95}$ and $R^{96}$ are bonded to each other to form a benzene ring.

In the general formula (K-2), $R^{101}$, $R^{103}$, $R^{104}$, $R^{105}$, $R^{107}$, and $R^{108}$ have the same definitions as $R^{91}$, $R^{93}$, $R^{94}$, $R^{95}$, $R^{97}$, and $R^{98}$, respectively, in the general formula (K-1).

Particularly, it is preferable that $R^{101}$, $R^{103}$, $R^{105}$, $R^{107}$, and $R^{108}$ each represent a hydrogen atom, an alkyl group, a hydroxyl group, an amino group, an aryl group, or a heterocyclic group; it is more preferable that $R^{101}$, $R^{103}$, $R^{105}$, and $R^{107}$ each represent an alkyl group or an aryl group; it is still more preferable that $R^{104}$ and $R^{108}$ each represent a hydroxyl group or an amino group; it is even still more preferable that $R^{101}$, $R^{103}$, $R^{105}$, and $R^{107}$ each represent an alkyl group having 1 to 20 carbon atoms, and $R^{104}$ and $R^{108}$ are each a hydroxyl group.

When $R^{91}$, $R^{92}$, $R^{93}$, $R^{94}$, $R^{95}$, $R^{96}$, $R^{97}$, $R^{98}$, $R^{101}$, $R^{103}$, $R^{104}$, $R^{105}$, $R^{107}$, and $R^{108}$ are each a group which may further be substituted, they may be substituted with a substituent selected from the monovalent substituents exemplified as $R^{94}$ to $R^{98}$. When they have two or more substituents, the substituents may be the same as or different from each other.

It is preferable to have a structure derived from a squalirium compound represented by the general formula (K-2) as the colorant structure of the present invention from the viewpoints of a hue.

When the squalirium-based compound represented by the general formula (K) is introduced into the structural units represented by the general formula (A) and the general formula (C), the multimer represented by the general formula (D) or the monomer represented by the general formula (1), the position to be introduced is not particularly limited, but is preferably any one of A and B in view of the synthetic compatibility. Particularly, when the squalirium compound represented by the general formula (K-1) or the general formula (K-2) is introduced into the structural units represented by the general formula (A) and the general formula (C), the multimer represented by the general formula (D) or the monomer represented by the general formula (1), the position to be introduced is not particularly limited, but is preferably any one of $R^{91}$, $R^{93}$, $R^{94}$, $R^{95}$, $R^{97}$, and $R^{98}$, or $R^{101}$, $R^{103}$, $R^{104}$, $R^{105}$, $R^{107}$, and $R^{108}$, and most preferably any one of $R^{93}$ and $R^{97}$, or $R^{103}$ and $R^{107}$ in view of the synthetic compatibility.

Examples of the method of introducing an alkali-soluble group into the colorant multimer according to the present invention include a method in which the alkali-soluble group is introduced into one, or two or more substituents of any of A and B. Particularly, when the squalirium compound is represented by the general formula (K-1) or (K-2), an alkali-soluble group may be introduced into one, or two or more substituents of any of $R^{91}$, $R^{93}$, $R^{94}$, $R^{95}$, $R^{97}$, and $R^{98}$, or $R^{101}$, $R^{103}$, $R^{104}$, $R^{105}$, $R^{107}$, and $R^{108}$. Among these, it is a most preferable embodiment that an alkali-soluble group is introduced into any one of $R^{93}$ and $R^{97}$, or $R^{103}$ and $R^{107}$.

General Formula (K-3)

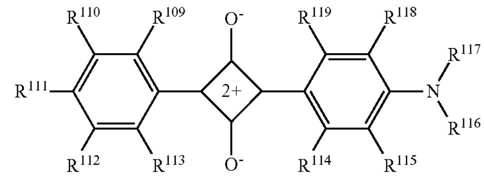

In the general formula (K-3), $R^{109}$, $R^{110}$, $R^{111}$, $R^{112}$, $R^{112}$, $R^{113}$, $R^{114}$, $R^{115}$, $R^{118}$, and $R^{119}$ have the same definitions as $R^{91}$, $R^{93}$, $R^{94}$, $R^{95}$, $R^{97}$, and $R^{98}$ in the general formula (K-3). $R^{116}$ and $R^{117}$ have the same definitions as $R^{93}$ and $R^{97}$ in the general formula (K-1).

In the general formula (K-3), it is preferable that $R^{109}$, $R^{110}$, $R^{111}$, $R^{112}$, $R^{113}$, $R^{114}$, $R^{115}$, $R^{118}$, and $8^{119}$ be a hydrogen atom, a halogen atom, a linear or branched alkyl group, a hydroxyl group, or an alkoxy group; and particularly, it is most preferable that $R^{109}$, $R^{113}$, $R^{115}$, $R^{118}$, and $R^{119}$ be a hydrogen atom, and $R^{110}$, $R^{111}$, and $R^{112}$ be a hydrogen atom or an alkoxy group, and $R^{114}$ be a hydrogen atom, a halogen atom, a hydroxyl group, an alkyl group having 1 to 5 carbon atoms, or an alkoxy group having 1 to 5 carbon atoms.

General Formula (K-4)

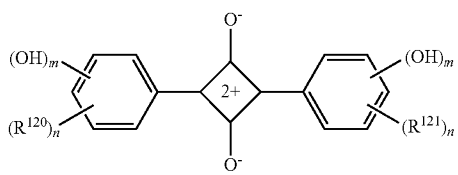

In the general formula (K-4), $R^{120}$ represents a halogen atom, an alkyl group, an alkoxy group, or an alkenyl group; m represents an integer of 1 to 4; and n represents an integer of 0 to 4.

$R^{120}$ is particularly preferably an alkyl group having 1 to 5 carbon atoms or an alkoxy group having 1 to 5 carbon atoms. m is preferably 1 to 3, and most preferably 3. n is preferably 0 to 3, and more preferably 0 or 1.

As the colorant compound which is capable of forming the colorant structure in the present invention, the squalirium compound represented by the general formula (K-1) is preferable from the viewpoint of a hue.

The squalirium compounds represented by the general formula (K-1) to the general formula (K-4) can be synthesized by employing the method described in J. Chem. Soc., Perkin Trans. 1, 2000, 599.

(sq-1)

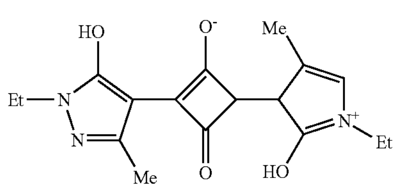

(sq-2)

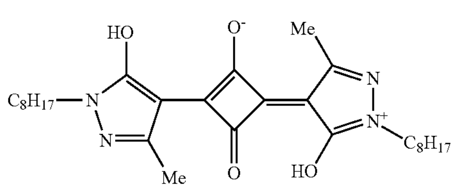

(sq-3)

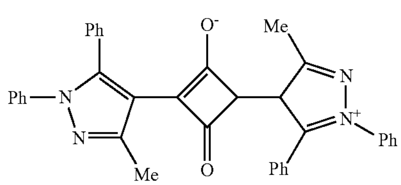

-continued (sq-4)

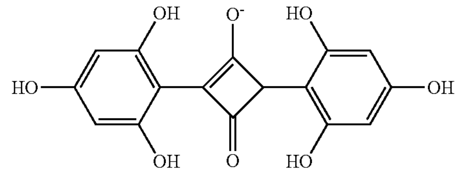

(sq-5)

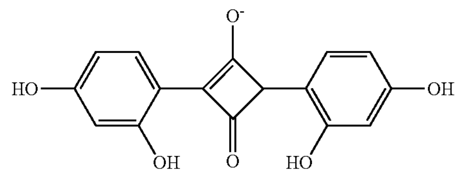

(sq-6)

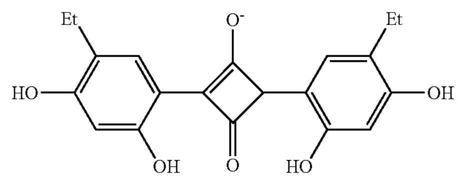

(sq-7)

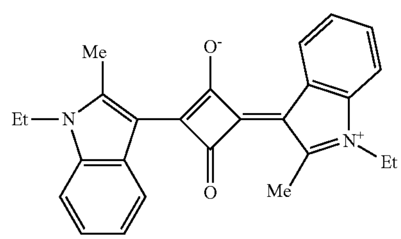

(sq-8)

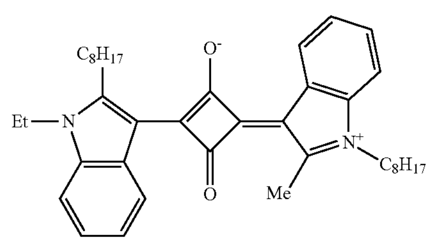

(sq-9)

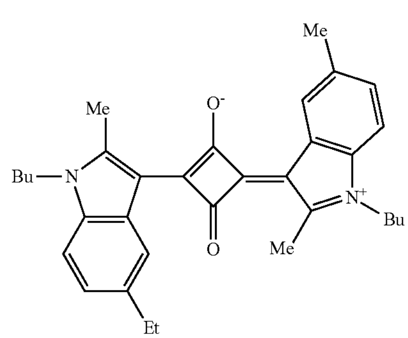

-continued (sq-10)

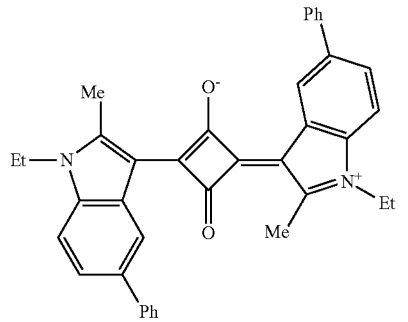

(sq-11)

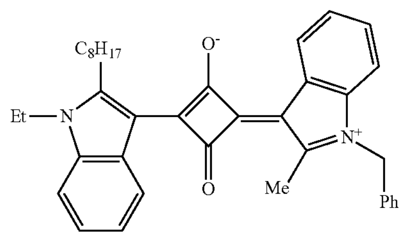

(sq-12)

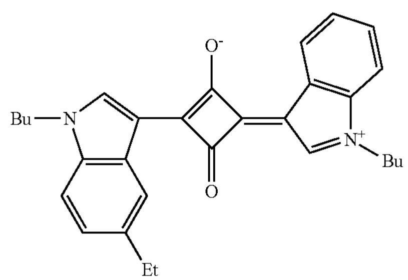

(sq-13)

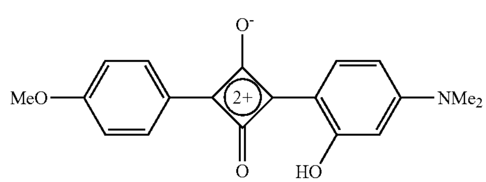

(sq-14)

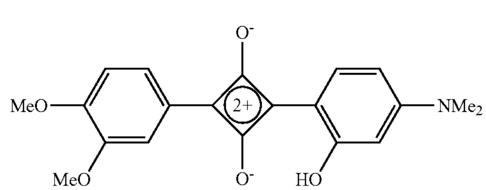

-continued (sq-15)

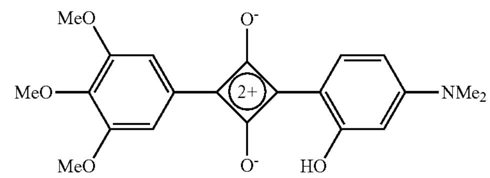

(sq-16)

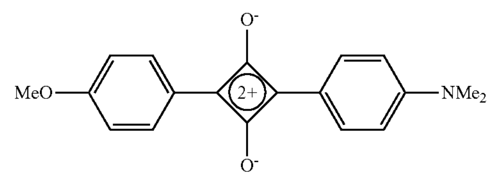

Among the specific examples above, (sq-1), (sq-2), (sq-3), (sq-7), (sq-8), (sq-9), (s9-9), (sq-10), (sq-11), and (sq-12) are preferable from the viewpoints of color characteristics and heat resistance.

The squalirium compound represented by any of the general formula (K) and the general formula (K-1) to the general formula (K-4) may have a functional group in addition to the alkali-soluble group unless the effect of the present invention is impaired.

It is preferable that the molar extinction coefficient of the squalirium compound represented by any of the general formula (K) and the general formula (K-1) to the general formula (K-4) be as high as possible in view of the film thickness. Further, the maximum absorption wavelength λmax is preferably from 520 nm to 580 nm, and more preferably from 530 nm to 570 nm, from the viewpoint of improvement of the color purity. Further, the maximal absorption wavelength and the molar extinction coefficient are measured by means of a spectrophotometer UV-2400PC (manufactured by Shimadzu Corporation).

It is preferable that the melting point of the squalirium compound represented by any of the general formula (K) and the general formula (K-1) to the general formula (K-4) be not too high in view of solubility. More specifically, the melting point is preferably from 50° C. to 150° C.

The squalirium compound represented by any of the general formula (K) and the general formula (K-1) to the general formula (K-4) can be synthesized by employing the method described in J. Chem. Soc., Perkin Trans. 1, 2000, 599.

(Phthalocyanine Colorant)

One of the embodiments of the colorant multimer according to the present invention is a colorant multimer which has a partial structure derived from a phthalocyanine colorant (phthalocyanine compound. The colorant multimer (A) includes a colorant multimer having a compound represented by the following general formula (PH) (phthalocyanine compound) as a partial structure of a colorant moiety. The phthalocyanine compound in the present invention totally refers to a compound having a colorant moiety containing a phthalocyanine skeleton in the molecule.

General Formula (PH)

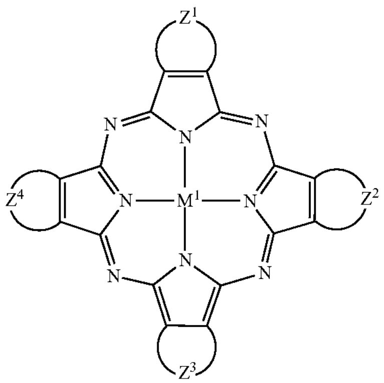

In the general formula (PH), $M^1$ represents a metal; $Z^1$, $Z^2$, $Z^3$, and $Z^4$ each independently represent an atomic group required for forming a 6-membered ring constituted with atoms selected from a hydrogen atom, a carbon atom, and a nitrogen atom.

The general formula (PH) will be described in detail.

In the general formula (PH), examples of the metal represented by $M^1$ include metal atoms such as Zn, Mg, Si, Sn, Rh, Pt, Pd, Mo, Mn, Pb, Cu, Ni, Co, Fe, and the like, metal chlorides such as AlCl, InCl, FeCl, TiCk, $SnCl_2$, $SiCl_2$, $GeCl_2$, and the like, metal oxides such as TiO, VO, and the like, and metal hydroxides such as $Si(OH)_2$ and the like, particularly preferably Cu and Zn.

In the general formula (PH), $Z^1$, $Z^2$, $Z^3$, and $Z^4$ each independently represent an atomic group required for forming a 6-membered ring constituted with atoms selected from a hydrogen atom, a carbon atom, and a nitrogen atom. The 6-membered ring may be either a saturated ring or an unsaturated ring, and may or may not have a substituent. Examples of the substituent include the substituents as mentioned in the section of the substituent group A above. Further, when the 6-membered ring has two or more substituents, the substituents may be the same as or different from each other. Further, the 6-membered ring may be fused with another 5-membered ring or 6-membered ring.

Examples of the 6-membered ring include a benzene ring, a cyclohexane ring, and the like.

Among the phthalocyanine colorant residues represented by the general formula (PH), a residue derived from a phthalocyanine colorant represented by the following general formula (PH-1) is particularly Preferable.

General Formula (PH-1)

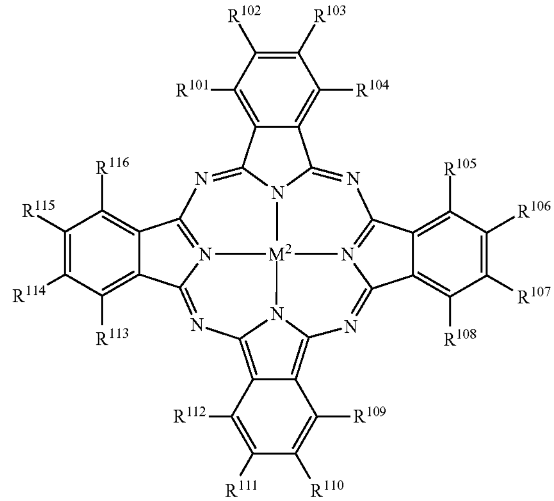

In the general formula (PH-1), $M^2$ has the same definition as $M^1$ in the general formula (PH), and in the general formula (PH-1), $M^2$ has the same definition as $M^1$ in the general formula (PH) and a preferable embodiment thereof is also the same.

In the general formula (PH-1), when $R^{101}$ to $R^{116}$ are each independently a hydrogen atom or a substituent, and the substituents represented by $R^{101}$ to $R^{116}$ are each a group which may further be substituted, they may be substituted with a group mentioned in the section of the substituent group A above. When they have two or more substituents, the substituents may be the same as or different from each other.

Among these, the substituents represented by $R^{101}$ to $R^{116}$ are each preferably a hydrogen atom, $SO^2NR^{117}R^{118}$ (wherein $R^{117}$ and $R^{118}$ each represent a hydrogen atom or a linear or branched alkyl group which may have 3 to 20 carbon atoms), $SR^{119}$ (wherein $R^{119}$ represents a linear or branched alkyl group which may have 3 to 20 carbon atoms).

Specific examples of the compound represented by the general formula (PH) are shown below, but the present invention is not limited thereto.

(Ph-1)

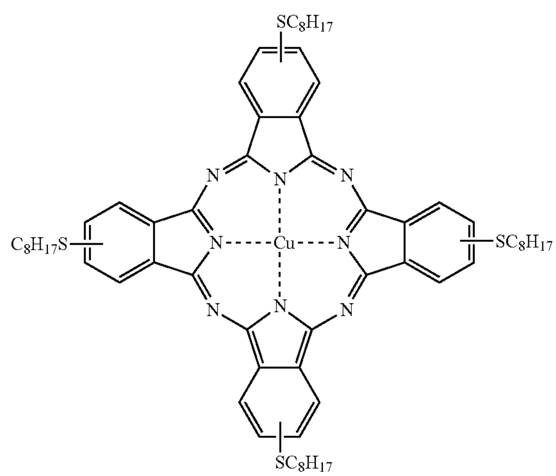

-continued
(Ph-2)
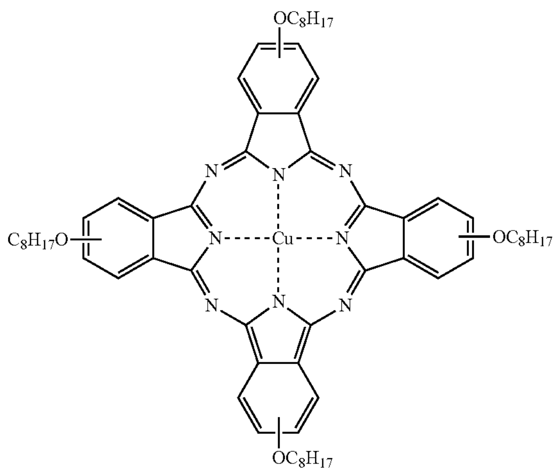
(Ph-3)
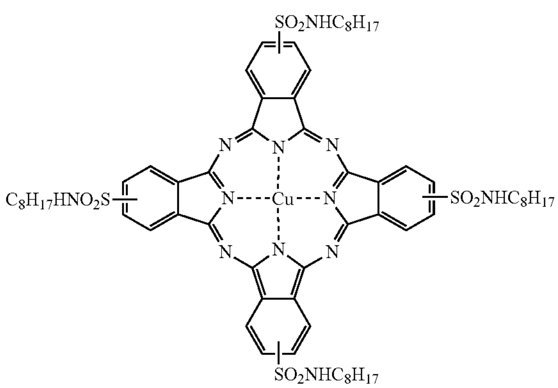
(Ph-4)
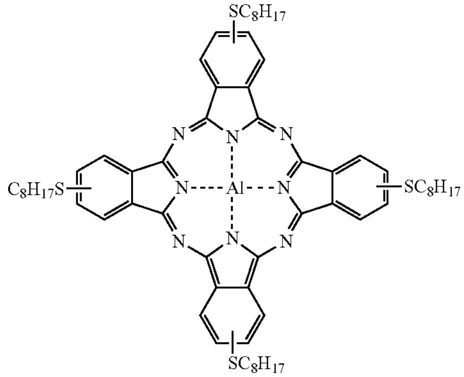
-continued
(Ph-5)
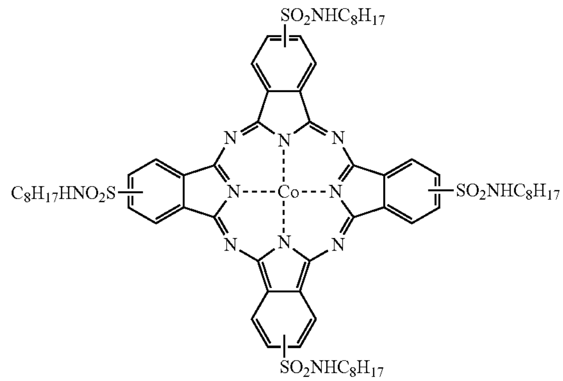
(Ph-6)
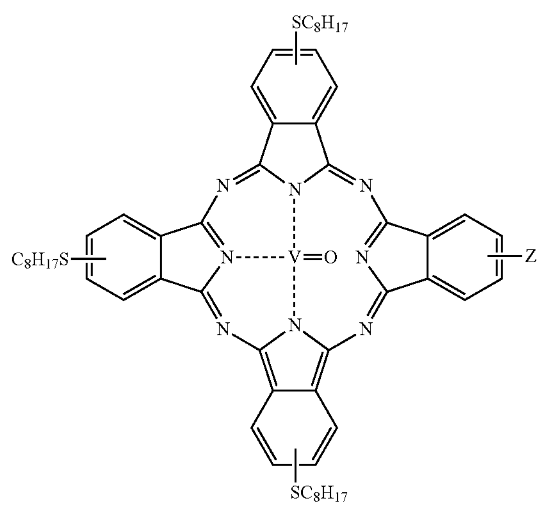
(Ph-7)
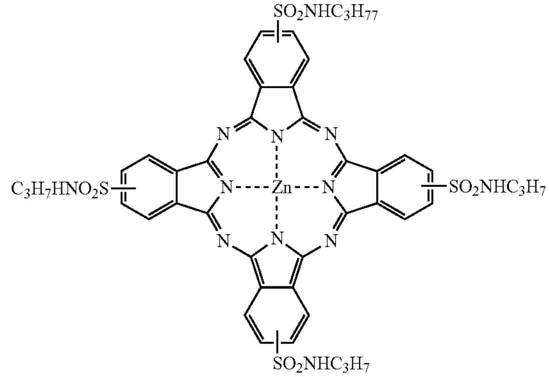

-continued (Ph-8)

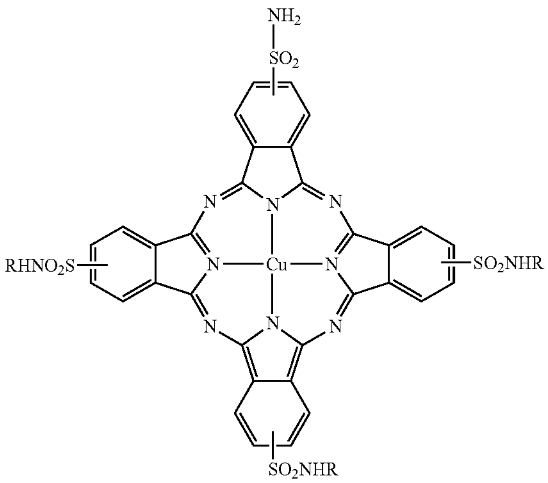

R = $CH_2CH_2CH_2OH$ (Ph-9)

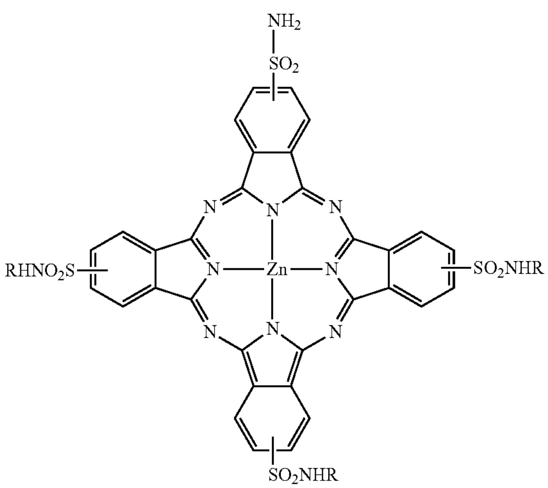

R = $CH_2CH_2CH_2OH$ (Ph-10)

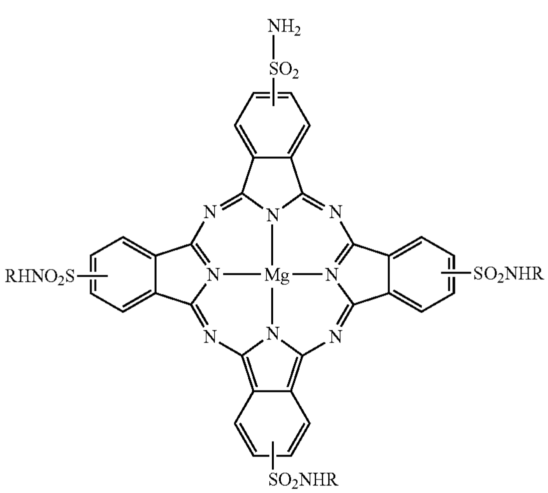

R = $CH_2CH_2CH_2OH$

Among the specific examples above, (Ph-1) to (Ph-3), and (Ph-7) to (Ph-10) are particularly preferable from the viewpoints of color characteristics and heat resistance.

(Subphthalocyanine Compound)

One of the embodiments of the colorant multimer according to the present invention is a colorant multimer which has a partial structure derived from a subphthalocyanine colorant (phthalocyanine compound) as a partial structure of a colorant moiety. The colorant multimer (A) is a colorant multimer which has a structure derived from a compound represented by the following general formula (SP) (subphthalocyanine compound) as a partial structure of a colorant moiety. The subphthalocyanine compound in the present invention totally refers to a compound having a colorant moiety including a subphthalocyanine skeleton in the molecule.

General Formula (SP)

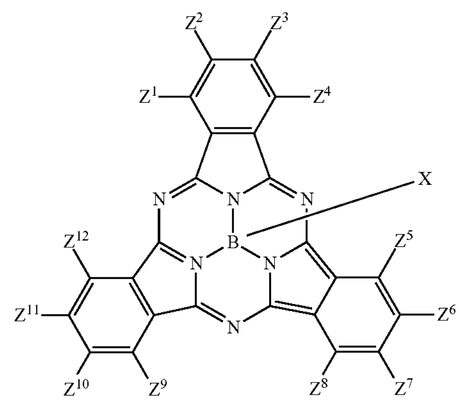

In the general formula (SP), $Z^1$ to $Z^{12}$ each independently represent a hydrogen atom, an alkyl group, an aryl group, a hydroxyl group, a mercapto group, an amino group, an alkoxy group, an aryloxy group, or a thioether group; and X represents an anion.

The general formula (SP) will be described in detail.

The alkyl group which $Z^1$ to $Z^{12}$ in the general formula (SP) may have is a linear or branched substituted or unsubstituted alkyl group. $Z^1$ to $Z^{12}$ particularly preferably have 1 to 20 carbon atoms, and still more preferably 1 to 10 carbon atoms. Examples of the substituent which $Z^1$ to $Z^{12}$ may have include the substituents as mentioned in the section of the substituent group A above, but particularly preferably include a fluorine atom, a hydroxyl group, and a mercapto group.

X in the general formula (SP) is an anion. $X^-$ is anion. Specific examples of $X^-$ include inorganic anions such as a fluorine anion, a chlorine anion, a bromine anion, an iodine anion, a perchlorate anion, a thiocyanate anion, a hexafluorophosphate anion, a hexafluoroantimony anion, a tetrafluoroborin anion, and the like; carboxylate anions such as an acetate anion, a benzoate anion, and the like; organic sulfonate anions such as a benzene sulfonate anion, a toluene sulfonate anion, a trifluoromethane sulfonate anion, and the like; and organic phosphate anions such as an octyl phosphate anion, a dodecyl phosphate anion, an octadecyl phosphate anion, a phenyl phosphate anion, a nonylphenyl phosphate anion, and the like. $X^-$ may be linked to a colorant skeleton or to a part (a polymer chain and the like) of a colorant multimer.

$X^-$ is preferably a fluorine anion, a chlorine anion, a bromine anion, an iodine anion, a perchlorate anion, or a carboxylic acid anion, and most preferably a perchlorate anion or a carboxylic acid anion.

Specific examples of the subphthalocyanine compound are shown below, but the present invention is not limited thereto.
(SP-1)
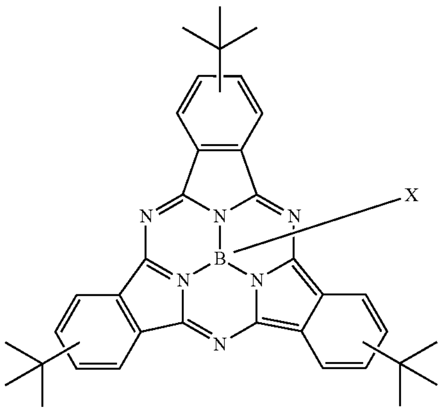
(SP-2)
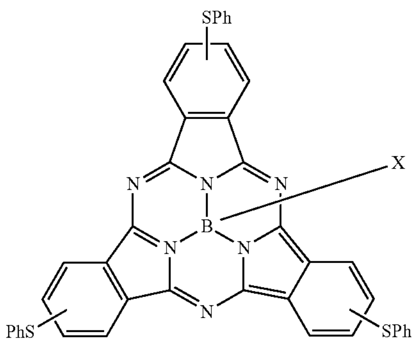
(SP-3)
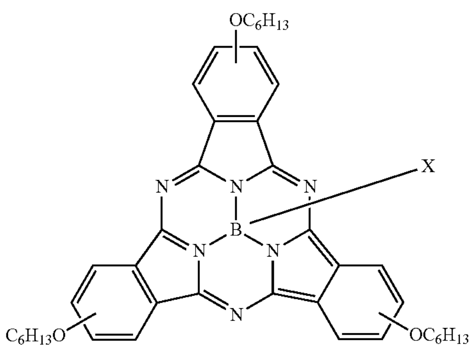
(SP-4)
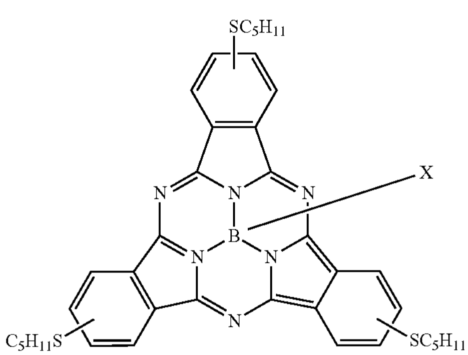
-continued
(SP-5)
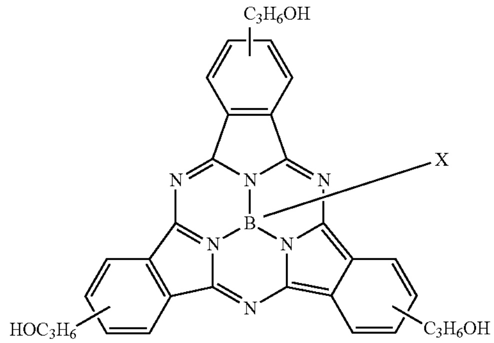
(SP-6)
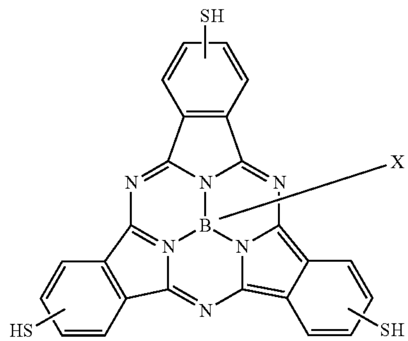
(SP-7)
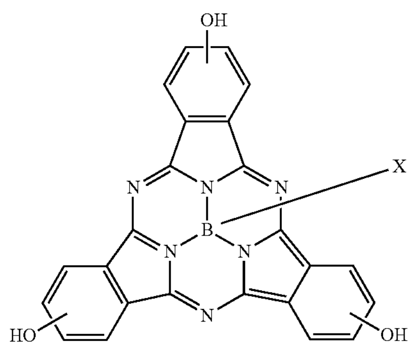
(SP-8)
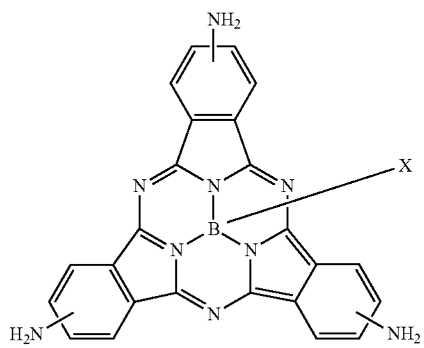

-continued (SP-9)

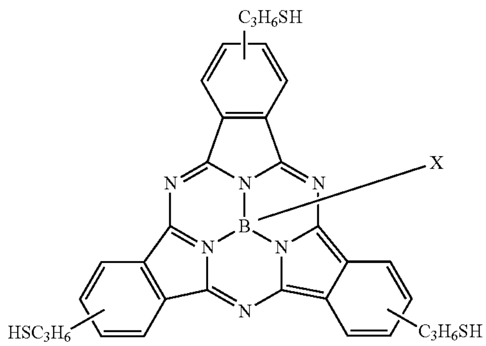

(SO-10)

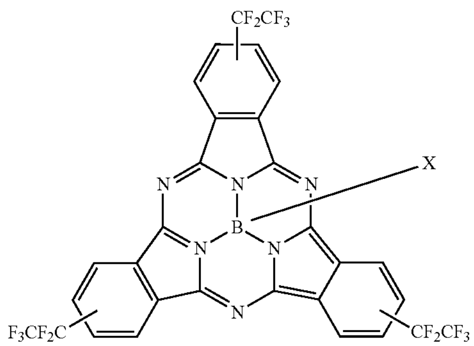

Among the specific examples above, (SP-2), (SP-3), (SP-4), (SP-5), (SP-6), and (SP-7) are particularly preferable from the viewpoints of color characteristics and heat resistance.

(Anthraquinone Colorant)

One of the embodiments of the colorant multimer (A) according to the present invention is one which has a partial structure derived from an anthraquinone colorant (anthraquinone compound). The colorant multimer (A) is a colorant multimer which has a structure derived from a compound represented by any of the following general formulae (AQ-1) to (AQ-3) (anthraquinone compound) as a partial structure of a colorant moiety. The anthraquinone compound in the present invention totally refers to a compound having a colorant moiety including an anthraquinone skeleton in the molecule.

General Formula (AQ-1)

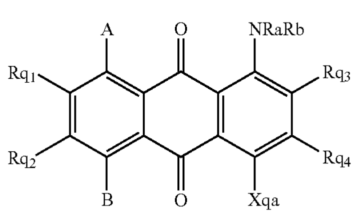

-continued

General Formula (AQ-2)

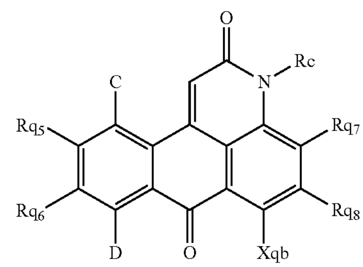

General Formula (AQ-3)

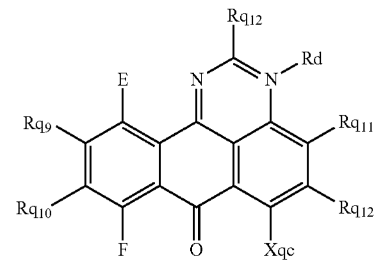

In the general formula (AQ-1), A and B each independently represent an amino group, a hydroxyl group, an alkoxy group, or a hydrogen atom; Xqa represents $ORqa_1$ or $NRqa_2Rqa_3$; $Rqa_1$ to $Rqa_3$ each independently represent a hydrogen atom, an alkyl group, or an aryl group; and $Rq_1$ to $Rq_4$ each represent a substituent. The substituents which $Rq_1$ to $Rq_4$ may have are the same as the substituents as mentioned in the section of the substituent group A above. Ra and Rb each independently represent a hydrogen atom, an alkyl group, or aryl group.

In the general formula (AQ-2), C and D have the same definitions as A and B in the general formula (AQ-1); Xqb represents $ORqb_1$ or $NRqb_2Rqb_3$; $Rqb_1$ to $Rqb_3$ each independently represent a hydrogen atom, an alkyl group, or an aryl group; and $Rq_5$ to $Rq_8$ each represent a substituent. $Rq_5$ to $Rq_8$ have the same definitions as $Rq_1$ to $Rq_4$ in the general formula. (AQ-1). Rc has the same definition as Ra or Rb in the general formula (AQ-1).

In the general formula (AQ-3), E and F have the same definitions as A and B in the general formula (AQ-1); Xqc represents $ORqc_1$ or $NRqc_2Rqc_3$; and $Rqc_1$ to $Rqc_3$ each independently represent a hydrogen atom, an alkyl group, or an aryl group. $Rq_9$ to $Rq_{12}$ have the same definitions as $Rq_1$ to $Rq_4$ in the general formula (AQ-1). Rd has the same definition as Ra or Rb in the general formula (AQ-1).

In the general formula (AQ-1), A and B are preferably a hydrogen atom. Xqa is preferably $ORqa_1$ (wherein $Rqa_1$ represents a hydrogen atom, an alkyl group having 1 to 5 carbon atoms, or a phenyl group), $NRqa_2Raq_3$ (wherein $Rqa_2$ represents a hydrogen atom, and $Rqa_3$ represents an alkyl group having 1 to 5 carbon atoms, or a phenyl group). $Rq_1$ to $Rq_4$ preferably represent a hydrogen atom, a halogen atom, or an alkoxy group. Ra is preferably a hydrogen atom. Rb preferably represents a hydrogen atom, an alkyl group having 1 to 5 carbon atoms, or a phenyl group, In the general formula (AQ-2), C and D are preferably a hydrogen atom. Xqb is preferably $ORqb_1$ (wherein $Rqb_1$ represents a hydrogen atom, an alkyl group having 1 to 5 carbon atoms, or a phenyl group), $NRqb_2Rbq_3$ (wherein $Rqb_2$ represents a hydrogen atom, and $Rqb_3$ represents an alkyl group having 1 to 5 carbon atoms, or a phenyl group). $Rq_5$ to $Rq_8$ preferably represent a hydrogen atom, a halogen atom, or an alkoxy group. Rc preferably represents a hydrogen atom, an alkyl group having 1 to 5 carbon atoms, or a phenyl group.

In the general formula (AQ-3), E and F are preferably a hydrogen atom. Xqb is preferably $ORqc_1$ (wherein $Rqc_1$ represents a hydrogen atom, an alkyl group having 1 to 5 carbon atoms, or a phenyl group), $NRqc_2Rbq_3$ (wherein $Rqc_2$ represents a hydrogen atom, and $Rqc_3$ represents an alkyl group having 1 to 5 carbon atoms, or a phenyl group). $Rq_9$ to $Rq_{12}$ preferably represent a hydrogen atom, a halogen atom, or an alkoxy group. Rd preferably represents a hydrogen atom, an alkyl group having 1 to 5 carbon atoms, or a phenyl group.

Specific examples of the anthraquinone colorant are shown below, but the present invention is not limited thereto.

(aq-1)

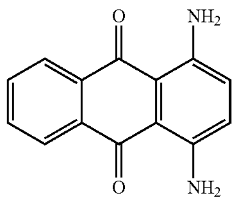

(aq-2)

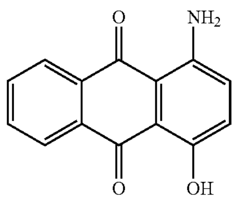

(aq-3)

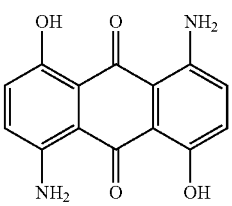

(aq-4)

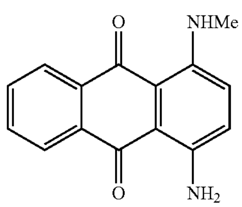

(aq-5)

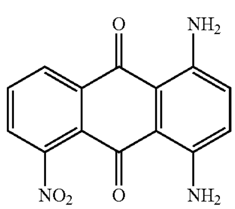

(aq-6)

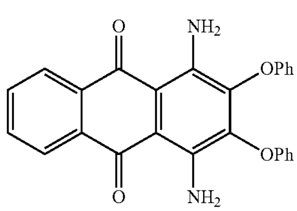

-continued (aq-7)

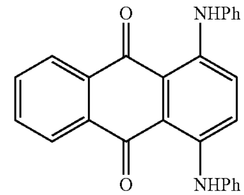

(aq-8)

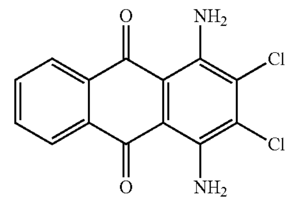

(aq-9)

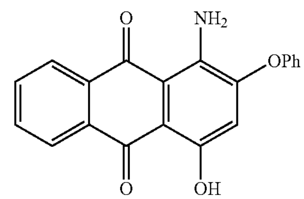

(aq-10)

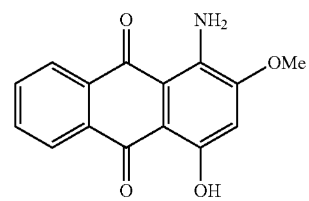

(aq-11)

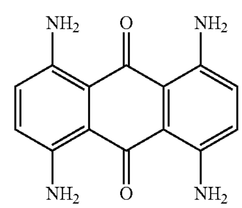

(aq-12)

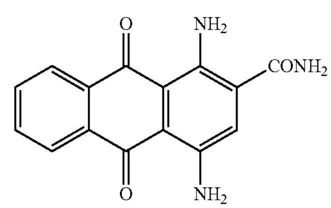

(aq-13)

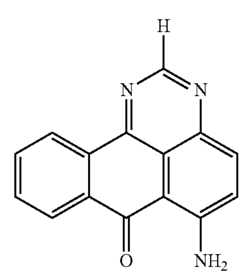

-continued (aq-14)

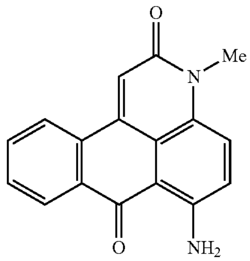

(aq-15)

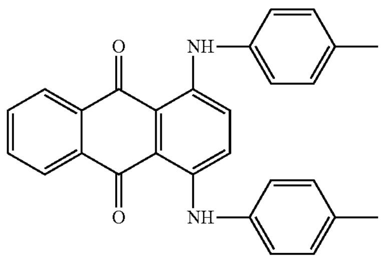

Among the specific examples above, (aq-1) to (aq-4), (aq-13), (aq-14), and (aq-15) are particularly preferable from the viewpoints of color characteristics and heat resistance.

(Triphenylmethane Colorant)

One of the embodiments of the colorant multimer according to the present invention is one which has a partial structure derived from a triphenylmethane colorant (triphenylmethane compound. The colorant multimer (A) includes a colorant multimer having a compound represented by the following general formula (TP) (triphenylmethane compound) as a partial structure of a colorant moiety. The phthalocyanine compound in the present invention totally refers to a compound having a colorant moiety containing a triphenylmethane skeleton in the molecule.

General Formula (TP)

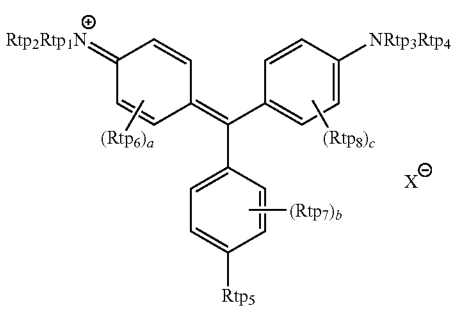

In the general formula (TP), $Rtp_1$ to $Rtp_4$ each independently represent a hydrogen atom, an alkyl group, or an aryl group; $Rtp_5$ represents a hydrogen atom, an alkyl group, an aryl group or $NRtp_9Rtp_{10}$ (wherein $Rtp_9$ and $Rtp_{10}$ each represent a hydrogen atom, an alkyl group, or an aryl group); $Rtp_6$, $Rtp_7$, and $Rtp_8$ each represent a substituent; and a, b, and c each represent an integer of 0 to 4, and when a, b, and c are 2 or more, $Rtp_6$, $Rtp_7$, and Rtpg may be bonded to each other to form a ring; and $X^-$ represents an anion.

In the general formula (TP), $Rtp_1$ to $Rtp_6$ are preferably a hydrogen atom, a linear or branched alkyl group having 1 to 5 carbon atoms, or a phenyl group. $Rtp_5$ is preferably a hydrogen atom or $NRtp_9Rtp_{10}$, and most preferably $NRtp_9Rtp_{10}$. $Rtp_9$ and $Rtp_{10}$ each represent a hydrogen atom, a linear or branched alkyl group having 1 to 5 carbon atoms, or a phenyl group. As the substituents represented by $Rtp_6$, $Rtp_7$, and $Rtp_8$, any of the substituents mentioned in the section of the substituent group A above may be used, but a linear or branched alkyl group having 1 to 5 carbon atoms, an alkenyl group having 1 to 5 carbon atoms, an aryl group having 6 to 15 carbon atoms, a carboxyl group, or a sulfo group is particularly preferable, and a linear or branched alkyl group having 1 to 5 carbon atoms, an alkenyl group having 1 to 5 carbon atoms, a phenyl group, or a carboxyl group is still more preferable. Particularly, $Rtp_6$ and $Rtp_8$ are preferably an alkyl group having 1 to 5 carbon atoms, $Rtp_7$ is preferably an alkenyl group (particularly a phenyl group formed by linking adjacent two alkenyl groups is preferable), a phenyl group, or a carboxyl group.

In the general formula (TP), a, b, or c each independently represent an integer of 0 to 4. Particularly, a and b are preferably 0 to 1, and c is preferably 0 to 2.

In the general formula (TP), $X^-$ represents an anion. Specific examples of $X^-$ include inorganic anions such as a fluorine anion, a chlorine anion, a bromine anion, an iodine anion, a perchlorate anion, a thiocyanate anion, a hexafluorophosphate anion, a hexafluoroantimony anion, a tetrafluoroborin anion, and the like; carboxylate anions such as an acetate anion, a benzoate anion, and the like; organic sulfonate anions such as a benzene sulfonate anion, a toluene sulfonate anion, a trifluoromethane sulfonate anion, and the like; and organic phosphate anions such as an octyl phosphate anion, a dodecyl phosphate anion, an octadecyl phosphate anion, a phenyl phosphate anion, a nonylphenyl phosphate anion, and the like. $X^-$ may be linked to a colorant skeleton or to a part (a polymer chain and the like) of a colorant multimer.

In the general formula (TP), $X^-$ is preferably a fluorine anion, a chlorine anion, a bromine anion, an iodine anion, a perchlorate anion, or a carboxylic acid anion, and most preferably a perchlorate anion or a carboxylic acid anion.

Specific examples of the compound represented by the general formula (TP) are shown below, but the present invention is not limited thereto.

(tp-1)

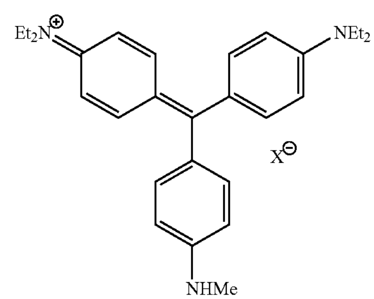

(tp-2)

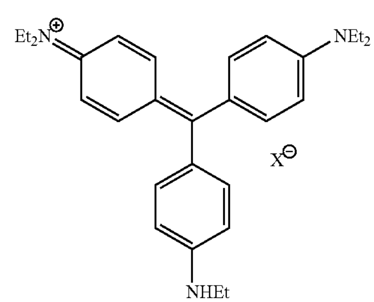

-continued
(tp-3)
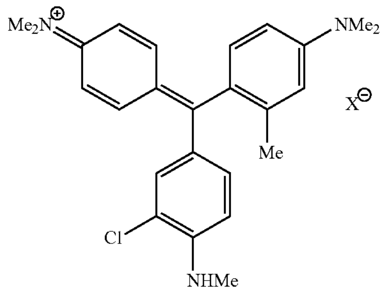
(tp-4)
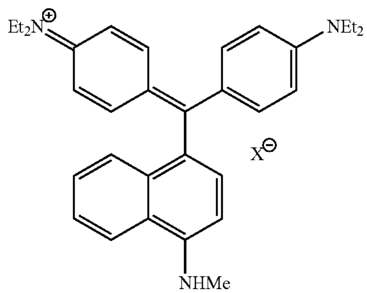
(tp-5)
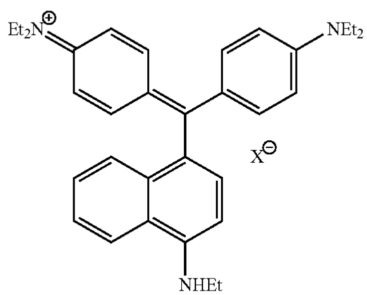
(tp-6)
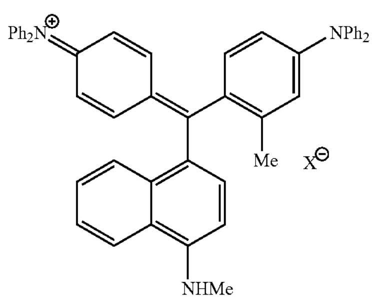
(tp-7)
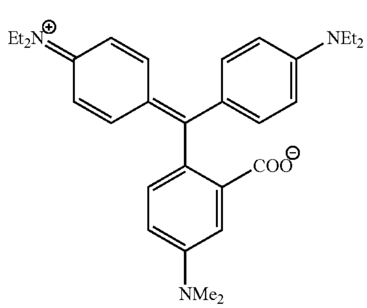
-continued
(tp-8)
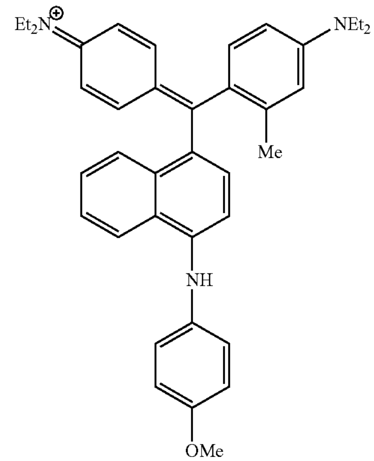
(tp-9)
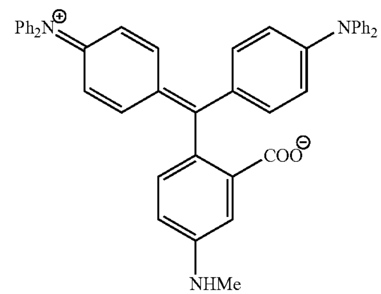
(tp-10)
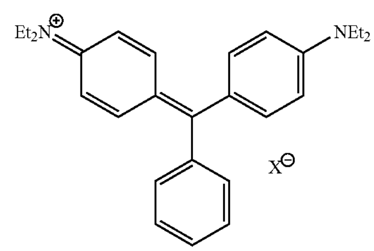
(tp-11)
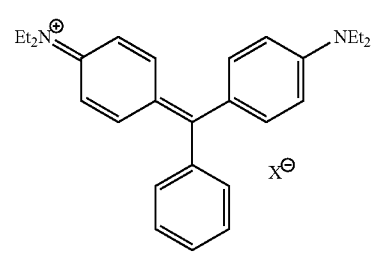
(tp-12)
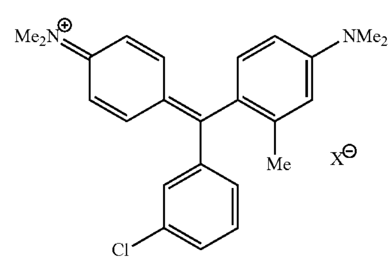

-continued (tp-13)

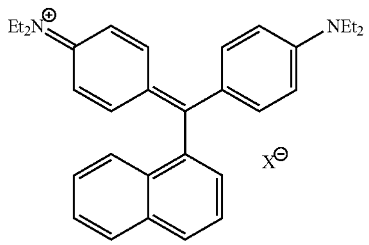

(tp-14)

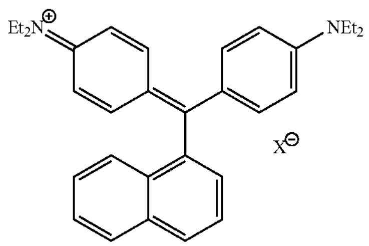

(tp-15)

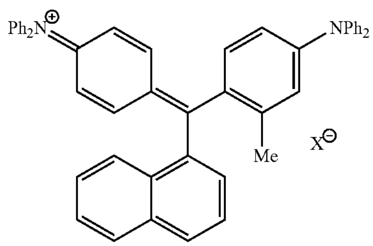

(tp-16)

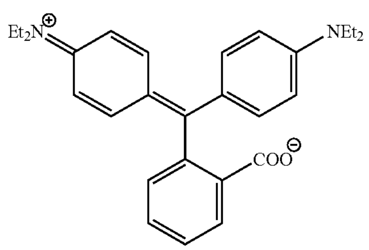

(tp-17)

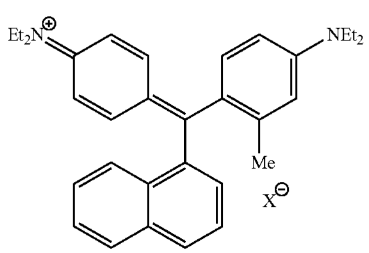

(tp-18)

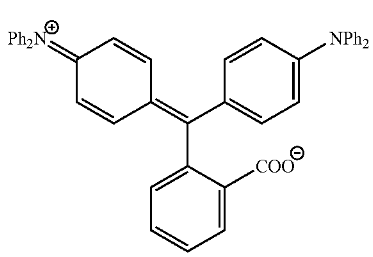

Among the specific examples above, (tp-4), (tp-5), (tp-6), and (tp-8) are particularly preferable from the viewpoints of color characteristics and heat resistance.

(Cyanine Colorant)

One of the embodiments of the colorant multimer according to the present invention is a colorant multimer which has a partial structure derived from a cyanine colorant (cyanine compound). The colorant multimer (A) is a colorant multimer which has a structure derived from a compound represented by the following general formula (PM) (cyanine compound) as a partial structure of a colorant moiety. The cyanine compound in the present invention totally refers to a compound having a colorant moiety including a cyanine skeleton in the molecule.

General Formula (PM)

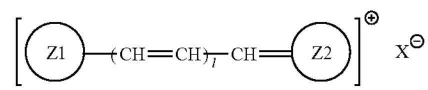

In the general formula (PM), the rings Z1 and Z2 each independently represent a heterocycle which may have a substituent; 1 represents an integer of 0 to 3; and $X^-$ represents an anion.

In the general formula (PM), examples of the rings Z1 and Z2 each independently include oxazole, benzoxazole, oxazoline, thiazole, thiazoline, benzothiazole, indolenine, benzoindolenine, 1,3-thiadiazine, and the like.

In the general formula (PM), the substituents which the rings Z1 and Z2 may have are the same as the substituents mentioned in the section of the substituent group A above. Specific of $X^-$ include inorganic anions such as a fluorine anion, a chlorine anion, a bromine anion, an iodine anion, a perchlorate anion, a thiocyanate anion, a hexafluorophosphate anion, a hexafluoroantimony anion, a tetrafluoroborin anion, and the like; carboxylate anions such as an acetate anion, a benzoate anion, and the like; organic sulfonate anions such as a benzene sulfonate anion, a toluene sulfonate anion, a trifluoromethane sulfonate anion, and the like; and organic phosphate anions such as an octyl phosphate anion, a dodecyl phosphate anion, an octadecyl phosphate anion, a phenyl phosphate anion, a nonylphenyl phosphate anion, and the like. $X^-$ may be linked to a colorant skeleton or to a part (a polymer chain and the like) of a colorant multimer.

The compound represented by the general formula (PM) is a preferably a compound represented by the following general formula (PM-2).

General Formula (PM-2)

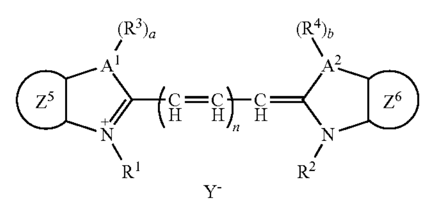

In the general formula (PM-2), the rings $Z^5$ and the rings $Z^6$ each independently represent a benzene ring which may have a substituent or a naphthalene ring which may have a substituent.

In the general formula (PM-2), $Y^-$ represents $Cl^-$, $Br^-$, $I^-$, $ClO_4^-$, $OH^-$, a monovalent organic carboxylic acid anion, a monovalent organic sulfonic acid anion, a monovalent bromine anion, or a monovalent organic metal complex anion. $Y^-$ may be linked to a colorant skeleton or to a part (a polymer chain and the like) of a colorant multimer.

In the general formula (PM-2), n represents an integer of an integer of 0 to 3.

In the general formula (PM-2), $A^1$ and $A^2$ each independently represent an oxygen atom, a sulfur atom, a selenium atom, a carbon atom, or a nitrogen atom.

In the general formula (PM-2), $R^1$ and $R^2$ each independently represent a monovalent aliphatic hydrocarbon group having 1 to 20 carbon atoms which may have a substituent.

In the general formula (PM-2), $R^3$ and $R^4$ each independently represent a hydrogen atom or a monovalent aliphatic hydrocarbon group having 1 to 6 carbon atoms, but one $R^3$ and one $R^4$ may be bonded to each other to form a divalent aliphatic hydrocarbon group having 2 to 6 carbon atoms.

In the general formula (PM-2), a and b each independently represent an integer of 0 to 2.

In the general formula (PM-2), $Y^-$ is preferably a fluorine anion, a chlorine anion, a bromine anion, an iodine anion, a perchlorate anion, or a carboxylic acid anion, and most preferably a chlorine anion, a perchlorine anion, or a carboxylic acid anion. n is preferably 1. $A^1$ and $A^2$ each independently represent an oxygen atom, a sulfur atom, or a carbon atom, and most preferably the both are carbon atoms.

Specific examples of the cyanine compound are shown below, but the present invention is not limited thereto.

(pm-1)

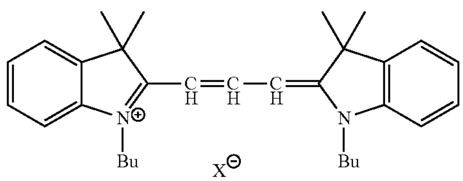

(pm-2)

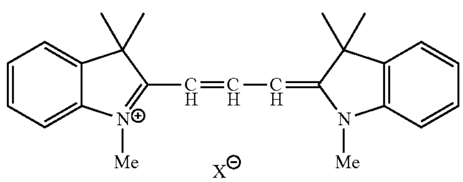

(pm-3)

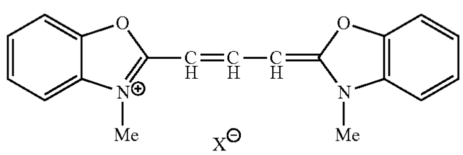

(pm-4)

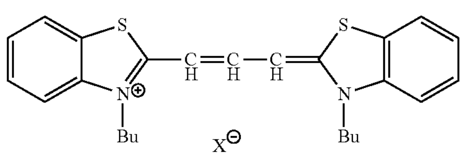

(pm-5)

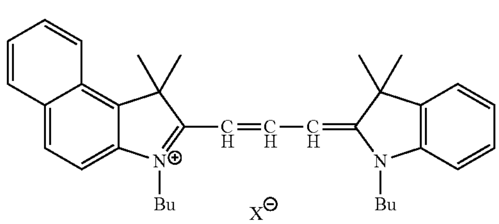

-continued (pm-6)

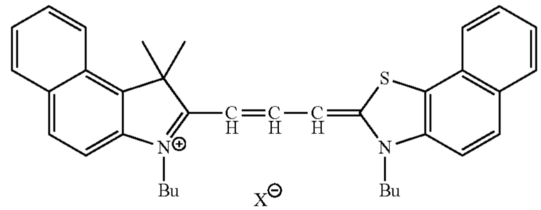

(pm-7)

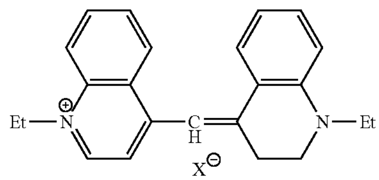

(pm-8)

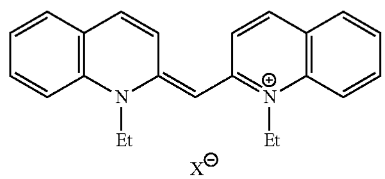

(pm-9)

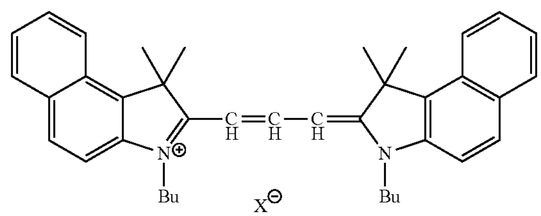

(pm-10)

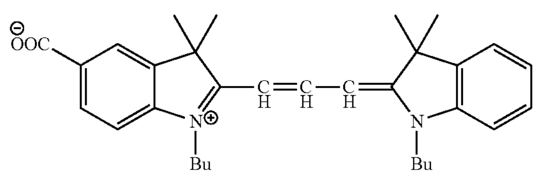

(pm-11)

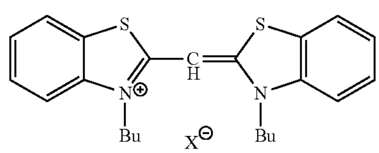

(pm-12)

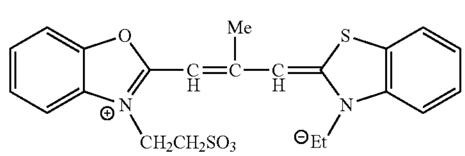

(pm-13)

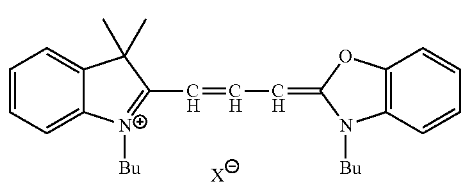

-continued (pm-14)

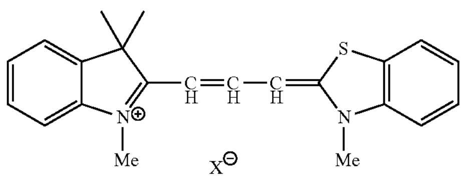

(pm-15)

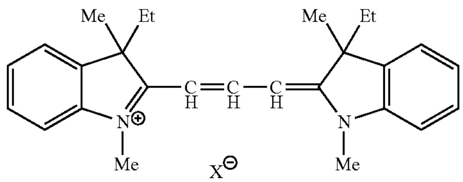

(pm-16)

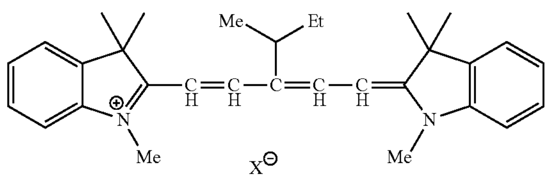

(pm-17)

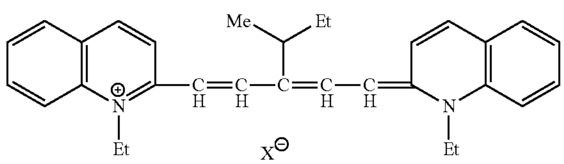

Among the specific examples above, the structures represented by (pm-1) to (pm-6), (pm-9), and (pm-10) are preferable, and among these, the colorant structures represented by (pm-1), (pm-2), and (pm-10) are particularly preferable from the viewpoints of color characteristics and heat resistance.

(Quinophthalone Colorant)

One of the embodiments of the colorant multimer according to the present invention is a colorant multimer which has a partial structure derived from a quinophthalone colorant (quinophthalone compound. The colorant multimer (A) includes a colorant multimer having a compound represented by the following general formula (QP) (quinophthalone compound) as a partial structure of a colorant moiety. The phthalocyanine compound in the present invention totally refers to a compound having a colorant moiety containing a quinophthalone skeleton in the molecule.

General Formula (QP)

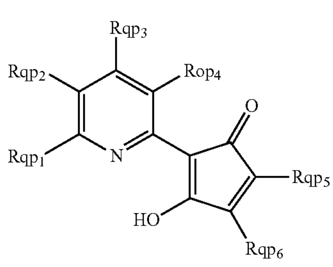

In the general formula (QP), $Rqp^1$ to $Rqp^6$ each independently represent a hydrogen atom or a substituent. When at least two of $Rqp^1$ to $Rqp^6$ are adjacent, they may be bonded to each other to form a ring and this ring may further have a substituent.

In the general formula (QP), the substituents represented by $Rqp^1$ to $Rqp^6$ represent the substituents as mentioned in the section of the substituent group A above. As the substituents represented by $Rqp^1$ to $Rqp^6$, a halogen atom, an alkyl group, an alkenyl group, and an aryl group are preferable, and $Rqp^1$ and $Rqp^2$, and $Rqp^5$ and $Rqp^6$ may be particularly preferably bonded to each other to form a substituted or unsubstituted phenyl group. $Rqp^3$ and $Rqp^4$ are preferably a hydrogen atom, a chlorine atom, or a bromine atom.

In the general formula (QP), examples of the substituent which the phenyl group formed by linking $Rqp^1$ and $Rqp^2$, and $Rqp^5$ and $Rqp^6$ may have include the substituents as mentioned in the section of the substituent above, but preferably a halogen atom, a carbamoyl group, an amino group, an alkoxy group, an aryloxy group, an alkylthio group, an arylthio group, and alkoxycarbonyl group.

Specific examples of the compound represented by the general formula (QP) are shown below, but the present invention is not limited thereto.

(QP-1)

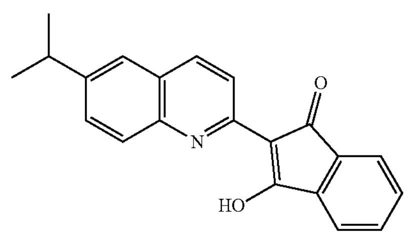

(QP-2)

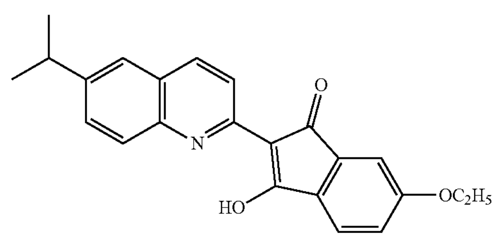

(QP-3)

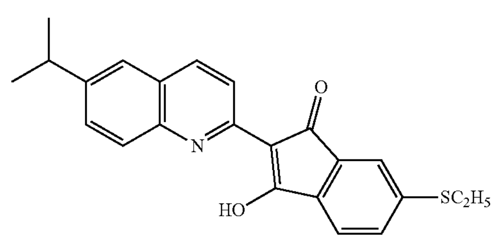

(QP-4)

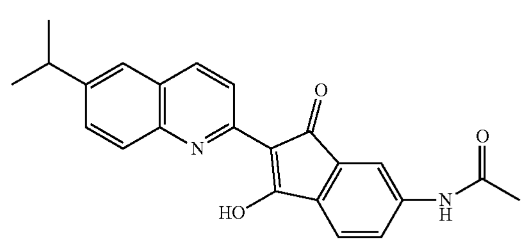

-continued (QP-5)

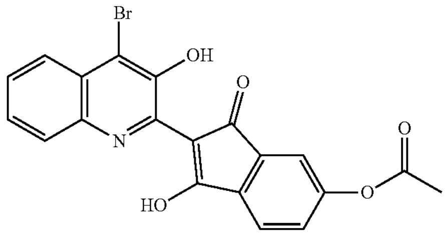

(QP-6)

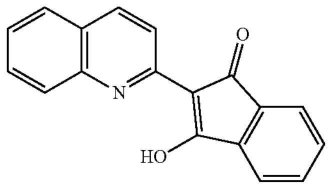

(QP-7)

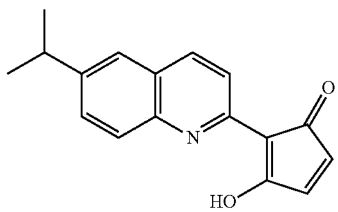

(QP-8)

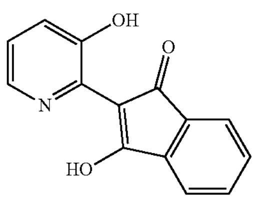

(QP-9)

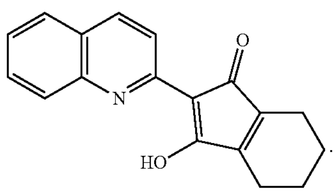

Among the specific examples above, (QP-1) to (QP-5) are preferable from the viewpoints of color characteristics and heat resistance.

It is preferable that the colorant structure used for the radiation-sensitive colored composition of the present invention further have a polymerizable group.

The method for introducing a polymerizable group into the colorant structure is not particularly limited, but a polymerizable compound having an ethylenically unsaturated group (such as a methacryl group, an acryl group, a styryl group, and the like), a cyclic ether group (such as an epoxy group, an oxetanyl group, and the like), and the like may be added to the colorant structure for introduction.

Specifically, a colorant structure having a polymerizable group can be synthesized by adding a polymerizable compound (methacryl chloride, acryl chloride, 4-(chloromethyl) styrene, glycidyl methacrylate, methacryloxyethyl isocyanate, and the like) to a colorant structure having a group which reacts with the polymerizable compound (such as a hydroxyl group, an amino group, a carboxyl group, and the like).

By introducing the polymerizable group to the colorant structure, curability, heat resistance, and solvent resistance are improved.

It is preferable that the colorant structure used for the radiation-sensitive colored composition of the present invention further have an alkali-soluble group.

The method for introducing an alkali-soluble group into the colorant structure is not particularly limited, but a compound having an alkali-soluble group may be added to the colorant structure for introduction.

Specifically, for example, by adding an alkali-soluble compound (such as thiomaleic acid, thioglycolic acid, 5-mercaptoisophthalic acid, 3-mercaptoenzoic acid, maleic acid, glycolic acid, 5-hydroxyisophthalic acid, 3-hydroxybenzoic acid, and the like) to a colorant structure having a group which reacts with a compound having an alkali-soluble group (such as an halogenated alkyl group, an α-halogenated acyl group, and the like), a colorant structure having an alkali-soluble group can be synthesized. By introducing the alkali-soluble group into the colorant structure, the formability of the color pattern is improved.

When a colorant compound which is capable of forming the colorant structure used for the radiation-sensitive colored composition of the present invention is employed in a radiation-sensitive colored composition, from the viewpoint of formability of the color pattern, the colorant compound preferably contains the alkali-soluble group such that the colorant multimer has an acid value of 10 mgKOH/g to 400 mgKOH/g, more preferably an acid value of 30 mgKOH/g to 300 mgKOH/g, and still more preferably an acid value of 50 mgKOH/g to 200 mgKOH/g.

In the present invention, the acid value is determined by the method as described in JIS Standard (JIS K 0070: 1992).

(Colorant Multimer)

The colorant multimer used for the radiation-sensitive colored composition of the present invention is a colorant multimer including the above-described colorant structure as a partial structure of a colorant moiety. Particularly, it may be a colorant multimer including a colorant structure derived from a dipyrromethene compound as a partial structure of a colorant moiety, or a colorant multimer including a colorant structure derived from a dipyrromethene metal complex compound as a partial structure of a colorant moiety.

Any of methods for introducing a colorant structure into the colorant multimer of the present invention may be used, and thus, a multimer may be obtained by polymerizing or copolymerizing polymerizable monomers having the colorant skeleton introduced therein; or a multimer may be formed in advance and then a colorant skeleton may be introduced by a molecular reaction or the like.

In a preferable embodiment, examples of the colorant multimer include a colorant multimer including at least one constitutional unit represented by any of the following general formulae (A) to (C), a colorant multimer represented by the following general formula (D), and a multimer including colorant monomers represented by the following general formula (1) as a polymerization component.

(Preferable Physical Properties of Colorant Multimer Used in Radiation-Sensitive Colored Composition of the Present Invention)

The colorant multimer used for the radiation-sensitive colored composition of the present invention has excellent heat resistance and solvent resistance and less color transfer, and is capable of forming a good colored cured film having pattern formability, and therefore, it can be used for a radiation-sensitive colored composition which is preferable for formation of a color pattern of the color filter. From the viewpoints of improving the formability of the color pattern when forming a radiation-sensitive colored composition, the colorant multimer preferably has an alkali-soluble group.

The method for introducing an alkali-soluble group into the colorant multimer used for the radiation-sensitive colored composition of the present invention is not particularly limited, but may be introduced by synthesizing a colorant multimer using a monomer having an alkali-soluble group, or an alkali-soluble group may be introduced after synthesizing a colorant multimer.

In the case where a colorant multimer is synthesized using a monomer having an alkali-soluble group, the structure is different from ones of a colorant multimer including at least one constitutional unit represented by any of the following general formula (A), the following general formula (B), and the following general formula (C), a colorant multimer represented by the following general formula (D), and a colorant monomer represented by the general formula (1), and at least one of the monomers having a terminal ethylenically unsaturated bond preferably has an alkali-soluble group.

In the case where the constitutional unit represented by the following general formula (A), the following general formula (B), and the following general formula (C), or the colorant monomer represented by the following general formula (1) is a monomer having an alkali-soluble group, the monomer may have an alkali-soluble group at a Dye part (colorant residue). From the viewpoints of synthetic compatibility, a monomer in which at least one monomer having another ethylenically unsaturated bond, included as a copolymerization component, has an alkali-soluble group is preferable for a monomer which forms a constitutional unit having a Dye part (colorant residue).

From the viewpoint of formability of the color pattern, the colorant multimer used for the radiation-sensitive colored composition of the present invention has an acid value of 10 mgKOH/g to 400 mgKOH/g, more preferably an acid value of 30 mgKOH/g to 300 mgKOH/g, and still more preferably an acid value of 50 mgKOH/g to 200 mgKOH/g.

In the present invention, the acid value is determined by the method as described in JIS Standard (JIS K 0070: 1992).

The solubility (25° C.) of the colorant multimer used for the radiation-sensitive colored composition of the present invention in an alkaline solution (pH of 9 to 15) which is a developing liquid is preferably from 0.1% by mass to 80% by mass, more preferably from 0.5% by mass to 50% by mass, and still more preferably from 1% by mass to 30% by mass. When the solubility of the colorant multimer is within the above-described range, a suitable pattern shape can be obtained and residues on a substrate can be reduced when the radiation-sensitive colored composition of the present invention is used in the applications, which require alkali development.

Furthermore, the colorant multimer used for the radiation-sensitive colored composition of the present invention suppresses color transfer, and from the viewpoints of improving formability of the color pattern, it preferably has a polymerizable group. The polymerizable group included in the colorant multimer may be used singly or in combination of two or more kinds thereof.

Examples of the polymerizable group include an ethylenically unsaturated group (such as a methacryl group, an acryl group, a styryl group, and the like), a cyclic ether group (such as an epoxy group, an oxetanyl group, and the like), etc. Among these, in view of heat resistance after polymerization and solvent resistance, an ethylenically unsaturated group is preferable.

The colorant multimer containing a polymerizable group preferably includes a constitutional unit having a polymerizable group and a group derived from a colorant, as repeating units.

Furthermore, the colorant multimer containing a polymerizable group may include constitutional units other than a constitutional unit having a polymerizable group and a group derived from a colorant.

In the case where the colorant multimer has a polymerizable group, from the viewpoints of obtaining a thinner layer of a color filter, the constitutional unit having a group derived from the colorant is preferably included in an amount of 60% by mass to 99% by mass, more preferably 70% by mass to 97% by mass, and still more preferably 80% by mass to 95% by mass, in terms of the mass ratio, with respect to the total solid contents of the radiation-sensitive colored composition.

Furthermore, from the viewpoint of heat resistance and solvent resistance, the constitutional unit having a polymerizable group is preferably included in the amount of 1% by mass to 40% by mass, preferably 3% by mass to 30% by mass, and still more preferably 5% by mass to 20% by mass, with respect to the total content of the radiation-sensitive colored composition.

Herein, in the present specification, the total solid contents refer to the total content of all the components except for the solvent constituting the radiation-sensitive colored composition in the radiation-sensitive colored composition.

The constitutional unit having a polymerizable group can be introduced into the colorant multimer, for example, by the method as described later.

That is, copolymerization of a polymerizable component having a colorant structure and a copolymerization component having no colorant structure (such as methacrylic acid, acrylic acid, hydroxyethyl methacrylate, and the like) can be carried out to obtain a multimer, and then a polymerizable compound (such as glycidyl methacrylate, methacryloxyethyl isocyanate, and the like) having a group which reacts with a constitutional unit derived from the copolymerization component can be added thereto to introduce the constitutional unit having a polymerizable group.

Furthermore, in the colorant structure, a polymerizable group other than the polymerizable group involving the multimerization of the colorant structure can be introduced into the colorant structure, and the colorant structure can also be polymerized to obtain a polymerizable group-containing colorant multimer.

(Structure of Colorant Multimer Used for Radiation-Sensitive Colored Composition of the Present Invention)

As the colorant multimer used for the radiation-sensitive colored composition of the present invention, a colorant multimer having a colorant structure derived from a dipyrromethene metal complex compound, an azo colorant, a xanthene colorant, a squalirium colorant, a phthalocyanine colorant, a subphthalocyanine colorant, an anthraquinone colorant, a triphenylmethane colorant, a cyanine colorant, a quinophthalone colorant, or the like is preferable; a colorant multimer having a colorant structure derived from a dipyrromethene metal complex compound, an azo colorant, a xanthene colorant, a squalirium colorant, or a phthalocyanine colorant is still more preferable; a colorant multimer having a colorant structure derived from a dipyrromethene metal complex compound, an azo colorant, or a phthalocyanine colorant is still more preferable; and a colorant multimer having a colorant structure derived from a dipyrromethene metal complex compound is particularly preferable. Examples of the colorant multimer having the colorant structure include a colorant multimer including at least one of the structural units represented by the general formula (A), the general formula (B), and the general formula (C) below, a colorant multimer represented by the general formula (D), or a colorant monomer represented by the following general formula (1) as the polymerization components. These will be described sequentially.

<Constitutional Unit Represented by General Formula (A)>

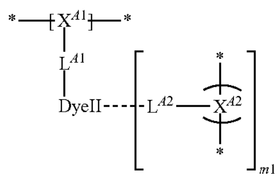

(A)

(in the general formula (A), $X^{A1}$ represents a linking group formed by polymerization; $L^{A1}$ represents a single bond or a divalent linking group; DyeII represents a color structure, and examples thereof include a colorant structure formed by removing any one to p hydrogen atoms from the dipyrromethene metal complex compound or tautomer thereof obtained from the dipyrromethene compound represented by the general formula (M) and a metal or a metal compound; p represents 1 or 2; $X^{A2}$ represents a linking group formed by polymerization; $L^{A2}$ represents a single bond or a divalent linking group; m1 represents an integer of 0 to 3, and when m1 is 2 or more, the structure in [ ] may be the same as or different from each other; and DyeII and $L^{A2}$ may be linked to each other by a covalent bond, an ionic bond or a coordinate bond.)

In the general formula (A), $X^{A1}$ and $X^{A2}$ each independently represent a linking group formed by polymerization, that is, they indicate parts that form repeating units corresponding main chains formed by a polymerization reaction. Further, the moieties represented by two *'s become units. $X^{A1}$ and $X^{A2}$ are not limited as long as they are formed from known polymerizable monomers, but examples thereof include linking groups formed by the polymerization of substituted or unsubstituted unsaturated ethylene groups, linking groups formed by the ring-opening polymerization of cyclic ethers, and the like, and preferably linking groups formed by the polymerization of unsaturated ethylene groups. Further, the groups shown below are preferable, and among these, styrenic and (meth)acrylic linking groups such as (X-11), (X-15), (XX-1), (XX-2), (XX-9), (XX-10), (XX-11), (XX-12), (XX-13), (XX-14), and (XX-15) are preferable from the heat resistance.

Furthermore, in (X-1) to (X-15), and (XX-1) to (XX-19) below, the moiety represented by * is linked with $L^{A1}$. Me represents a methyl group. R in (XX-14) and (XX-15) represents a hydrogen atom, an alkyl group having 1 to 5 carbon atoms, or a phenyl group.

(X-1)

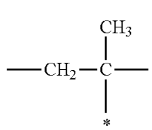

(X-2)

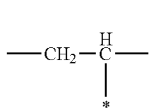

-continued (X-3)

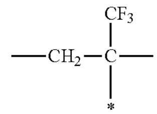

(X-4)

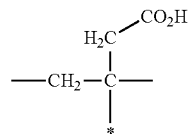

(X-5)

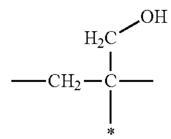

(X-6)

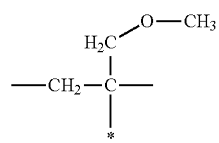

(X-7)

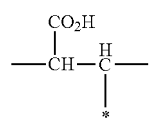

(X-8)

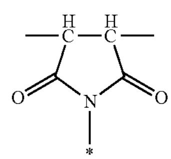

(X-9)

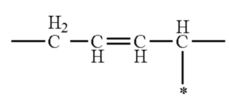

(X-10)

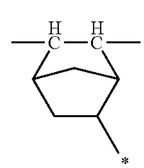

(X-11)

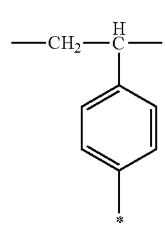

-continued
(X-12)
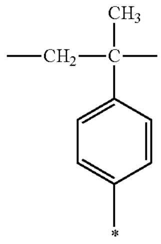
(X-13)
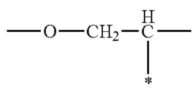
(X-14)
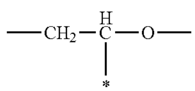
(X-15)
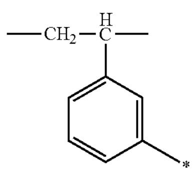
(XX-1)
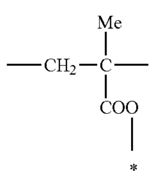
(XX-2)
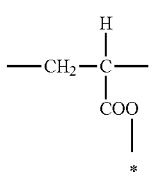
(XX-3)
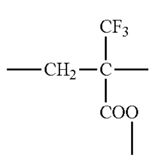
(XX-4)
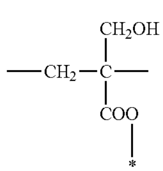
-continued
(XX-5)
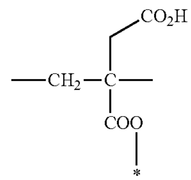
(XX-6)
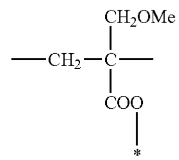
(XX-7)
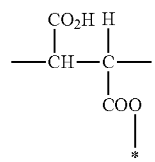
(XX-8)
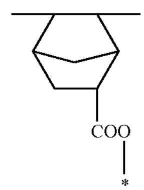
(XX-9)
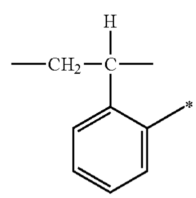
(XX-10)
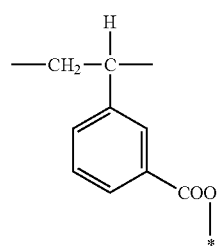
(XX-11)
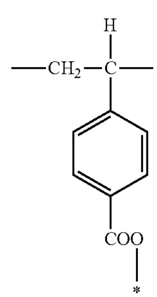

-continued (XX-12)

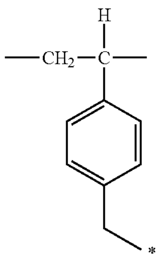

(XX-13)

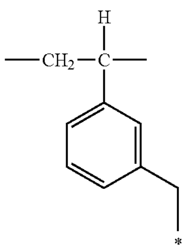

(XX-14)

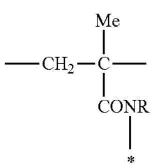

(XX-15)

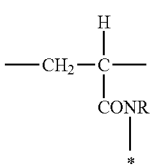

(XX-16)

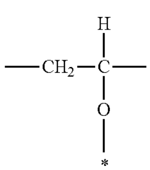

(XX-17)

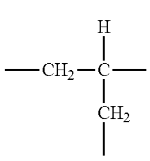

-continued (XX-18)

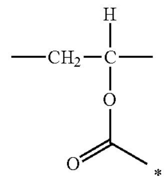

(XX-19)

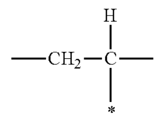

(in the general formula (A), $L^{A1}$ represents a single bond or a divalent linking group; and examples of the divalent linking group in the case where $L^{A1}$ represents a divalent linking group include substituted or unsubstituted alkylene groups having 1 to 30 carbon atoms (such as a methylene group, an ethylene group, a trimethylene group, a propylene group, a butylene group, and the like), substituted or unsubstituted allylene groups having 6 to 30 carbon atoms (such as a phenylene group, a naphthalene group, and the like), substituted or unsubstituted heterocyclic linking groups, —CH═CH—, —O—, —S—, —NR— (wherein R's each independently represent a hydrogen atom, an alkyl group, an aryl group, or a heterocyclic group), —C(═O)—, —SO—, —$SO_2$—, and a linking group formed by linking two or more of these groups.)

The divalent linking group in the general formula (A) is not limited in any way as long as it is within the range not impairing the effect of the present invention.

In the general formula (A), DyeII represents a colorant structure derived from the above-described colorant compound. For example, in the general formula (A), the colorant structure represented by DyeII represents a residue formed by removing any one to p hydrogen atoms from the dipyrromethene metal complex compound obtained from the dipyrromethene compound represented by the general formula (M) and a metal or a metal compound; and p represents 1 or 2.

The colorant multimer having a constitutional unit represented by the general formula (A) can be synthesized by (1) a method for synthesizing a monomer having a colorant residue by addition polymerization, or (2) a method for reacting a polymer having a highly reactive functional group such as an isocyanate group, an acid anhydride group, an epoxy group, and the like with a functional group that can react with a highly reactive functional group (a hydroxyl group, a primary or secondary amino group, a carboxyl group, and the like).

For the addition polymerization, known addition polymerization (radical polymerization, anion polymerization, or cationic polymerization) can be employed, but among these, particularly, synthesis by the radical polymerization can make the reaction condition milder and do not cause decomposition of the colorant structure, which is thus preferable. For the radical polymerization, known reaction conditions can be employed.

Among these, the colorant multimer having the constitutional unit represented by the general formula (A) in the present invention is preferably a radical polymer obtained by the radical polymerization using a colorant monomer having an ethylenically unsaturated bond from the viewpoint of heat resistance.

Specific examples of the constitutional unit represented by the general formula (A) are shown below, but the present invention is not limited thereto.

(A-dp-1)
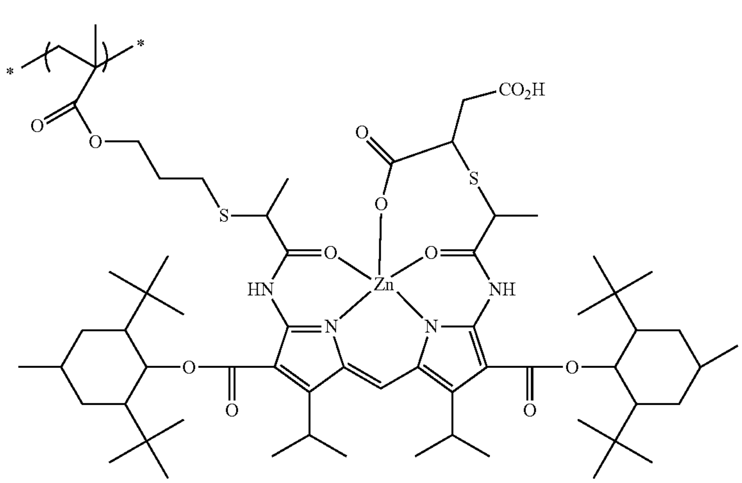
(A-dp-2)
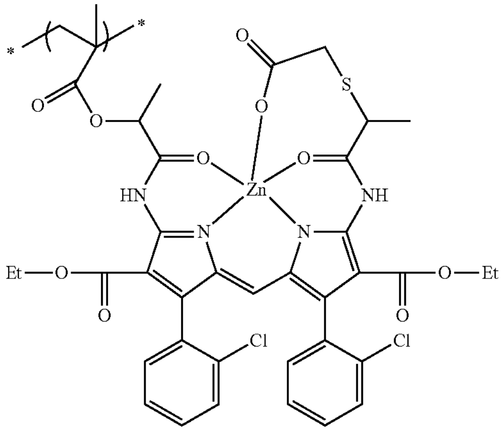
(A-dp-3)
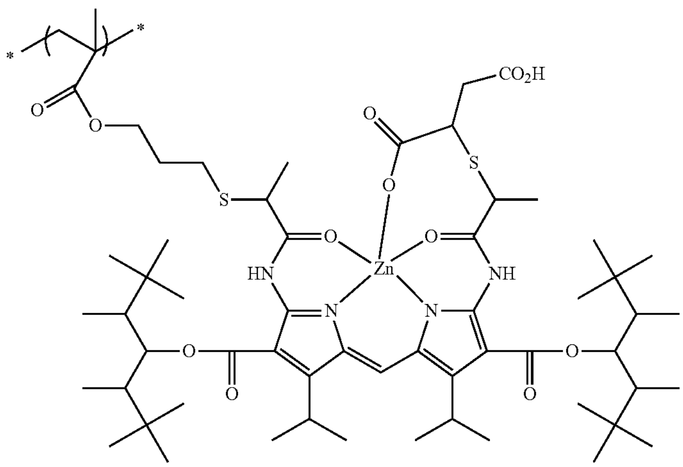

-continued
(A-dp-4)
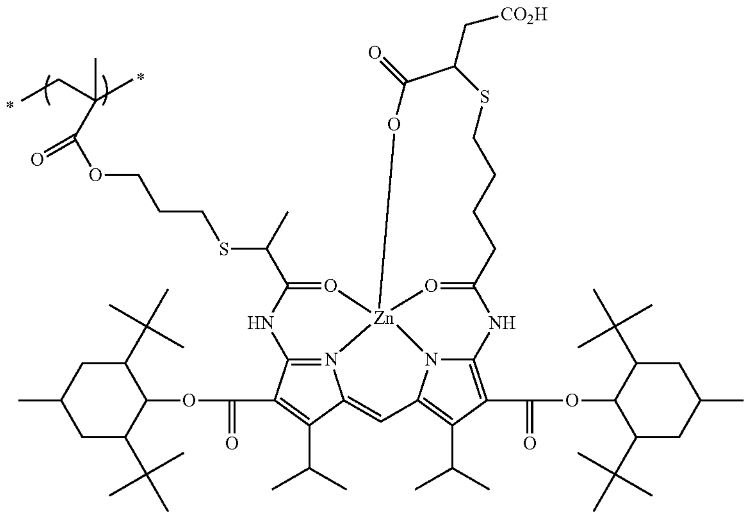
(A-dp-5)
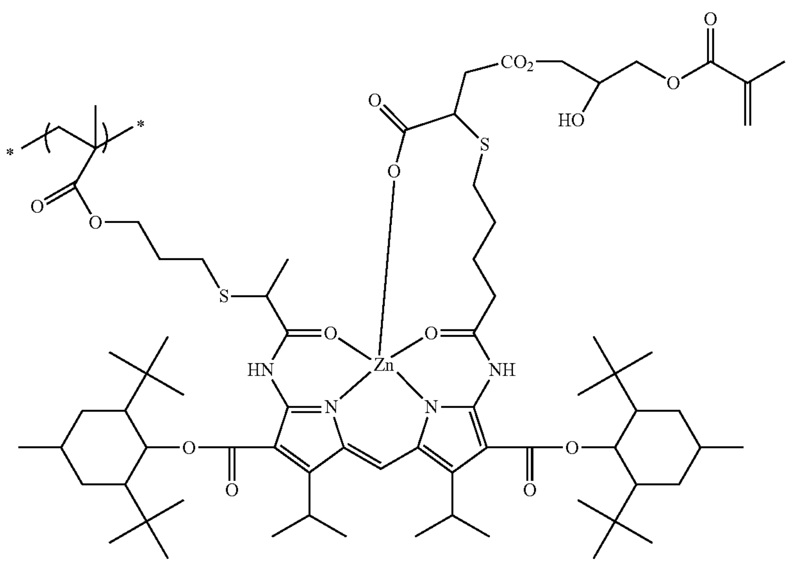
(A-dp-6)
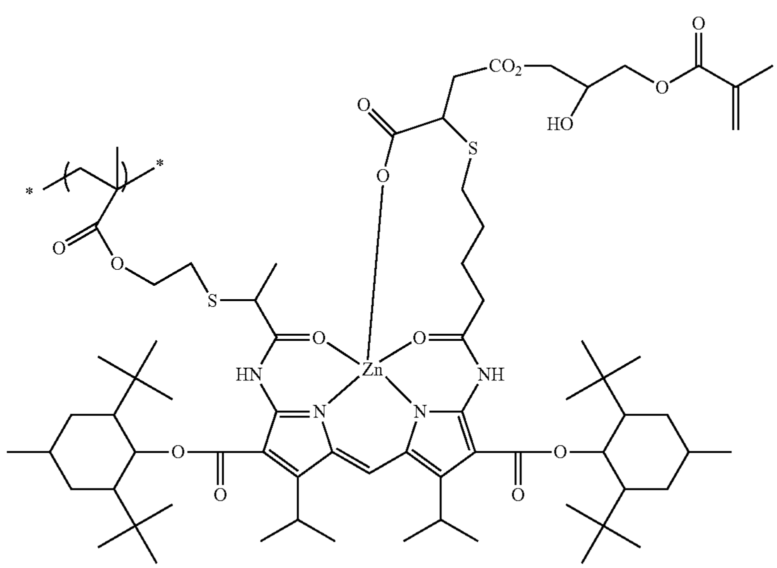

-continued
(A-dp-7)
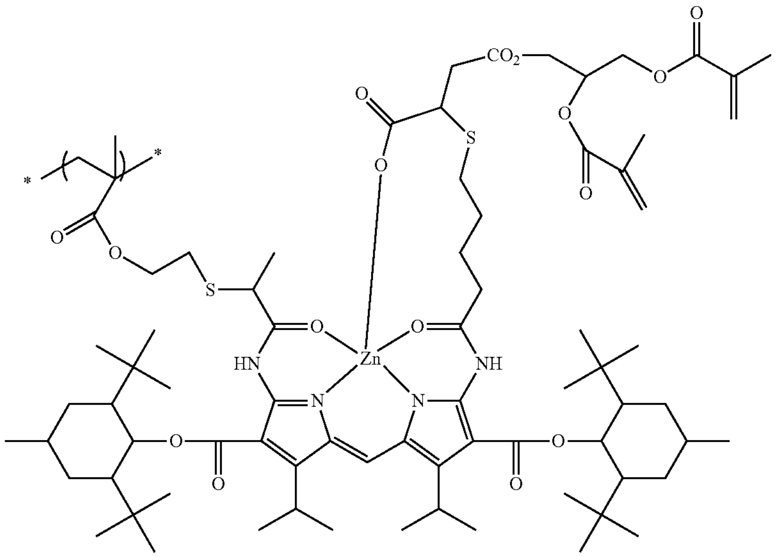
(A-dp-8)
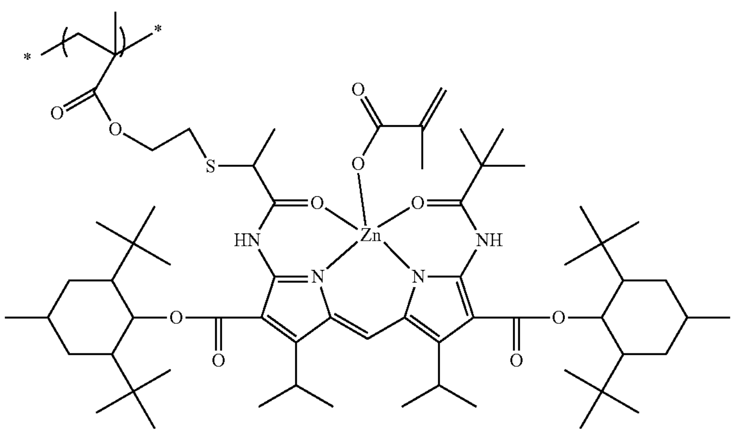
(A-dp-9)
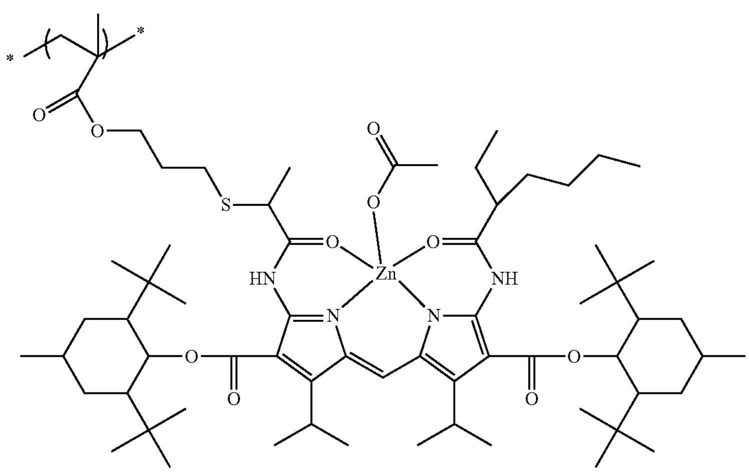

-continued
(A-dp-10)
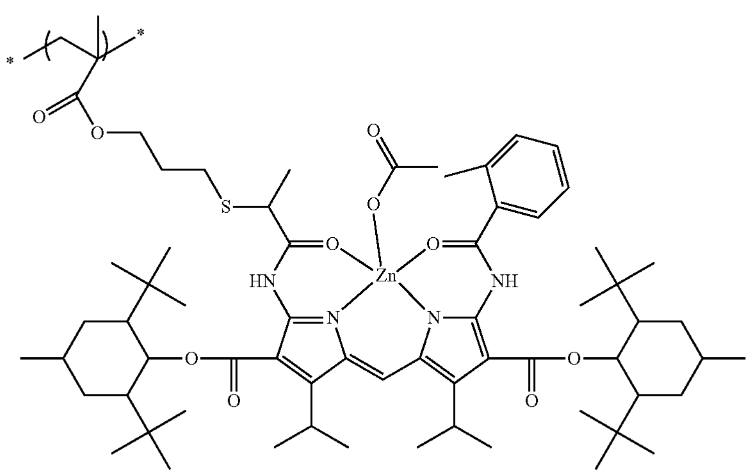
(A-dp-11)
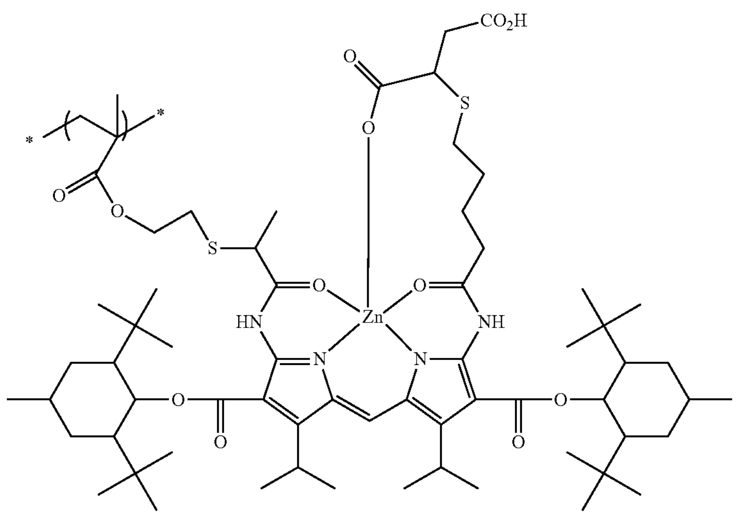
(A-dp-12)
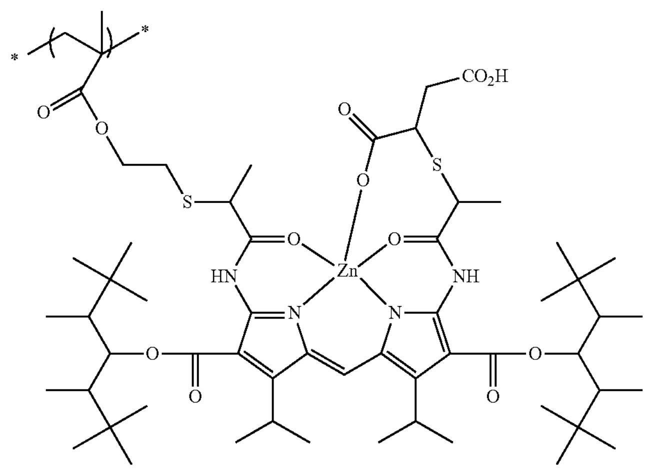

-continued
(A-dp-13)
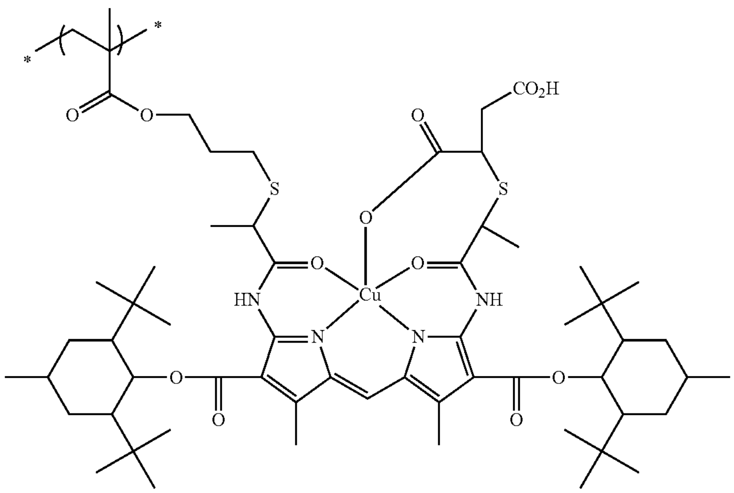
(A-dp-14)
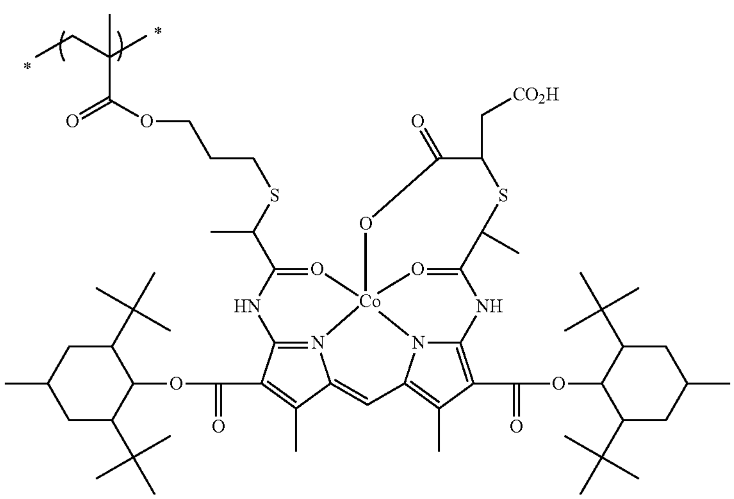
(A-dp-15)
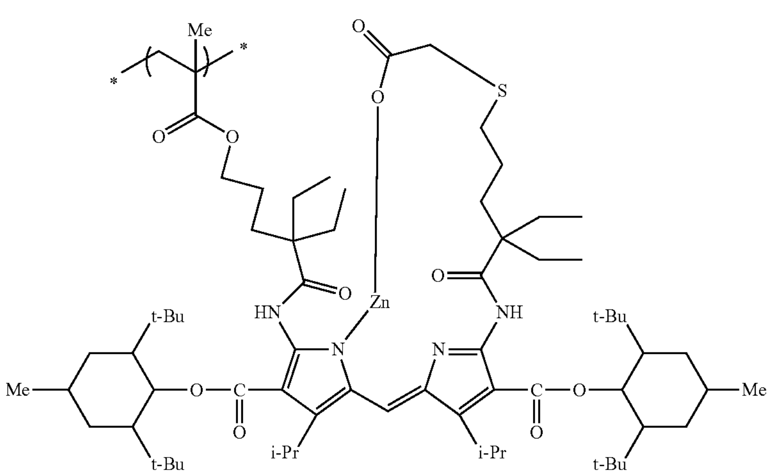

-continued
(A-dp-16)
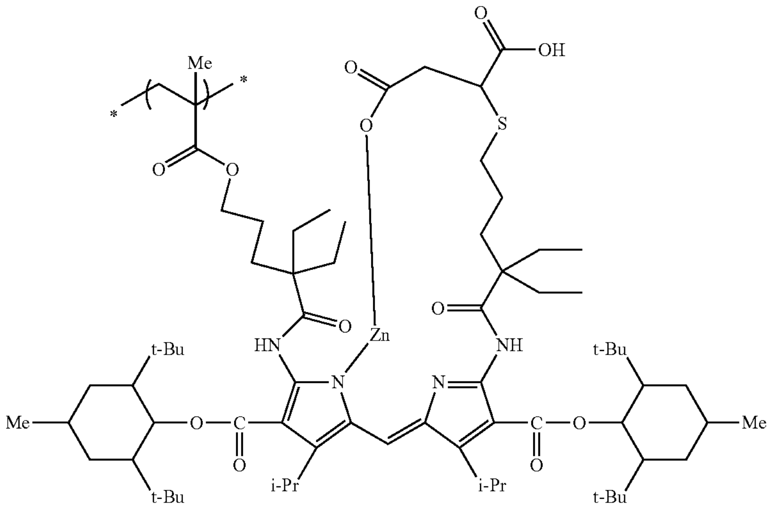
(A-dp-17)
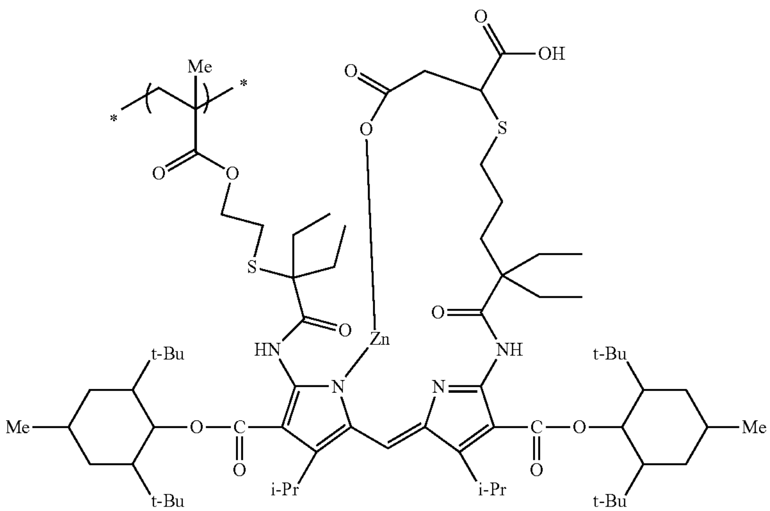
(A-dp-18)
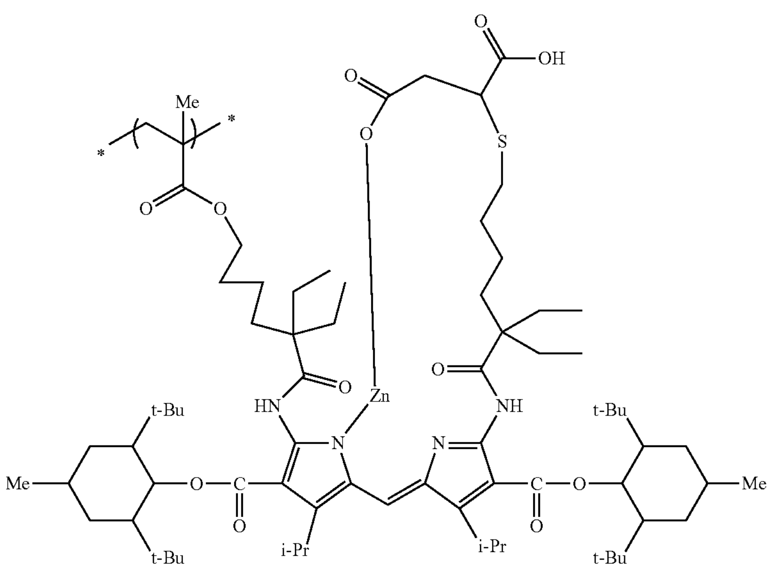

-continued
(A-dp-19)
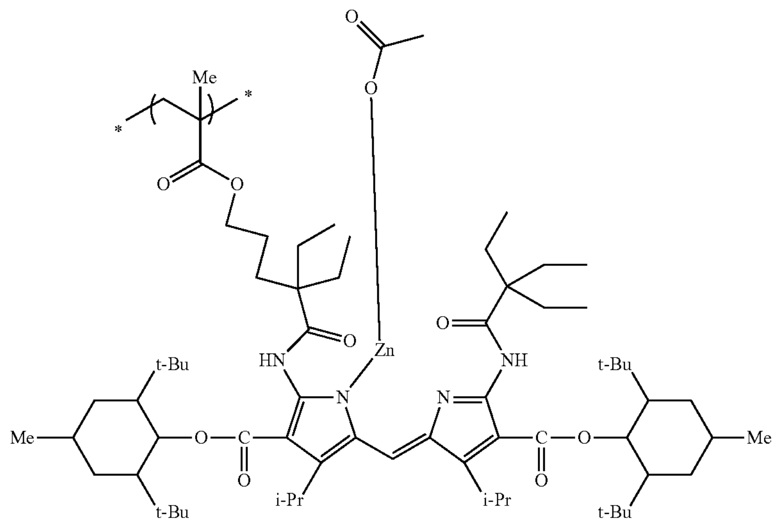
(A-dp-20)
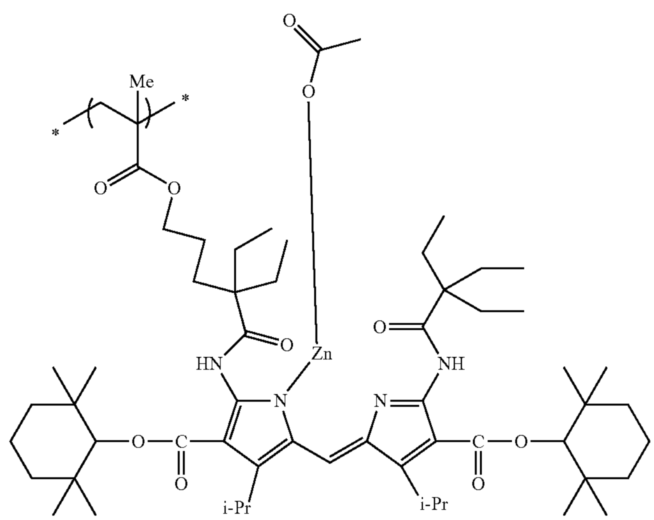
(A-dp-21)
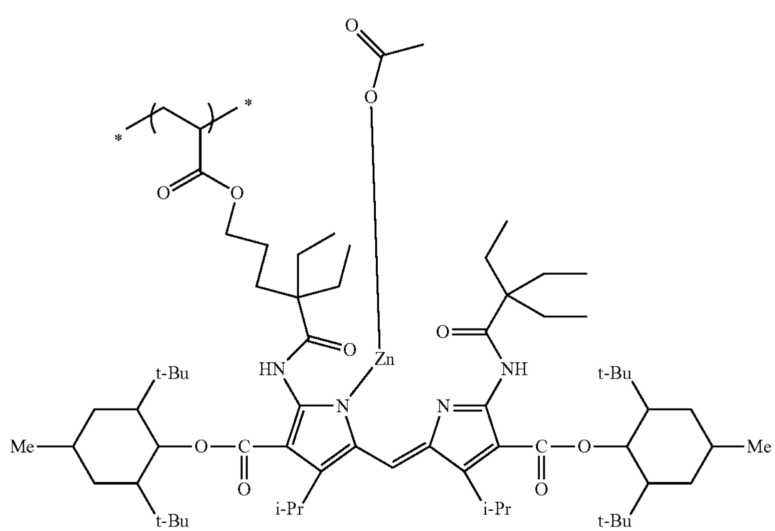

-continued
(A-dp-22)
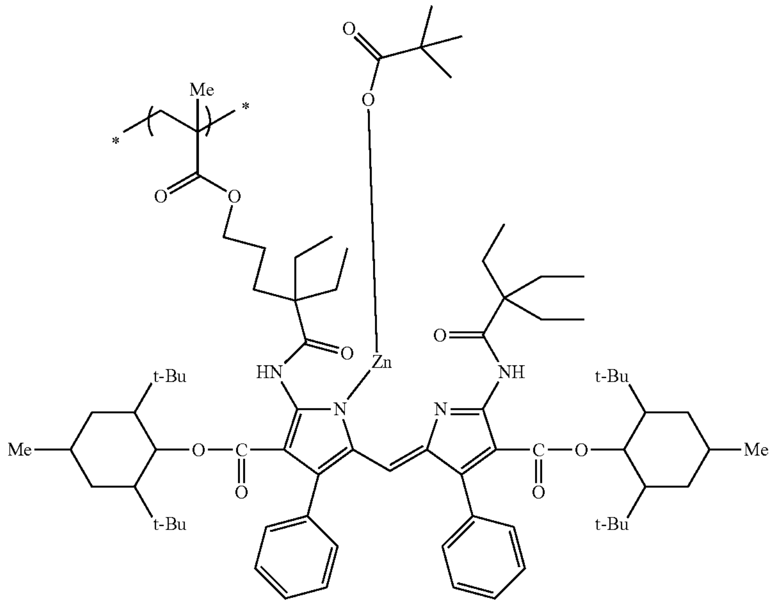
(A-dp-23)
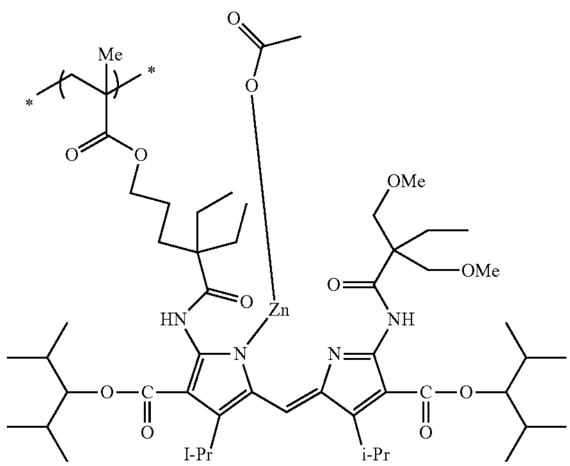
(A-dp-24)
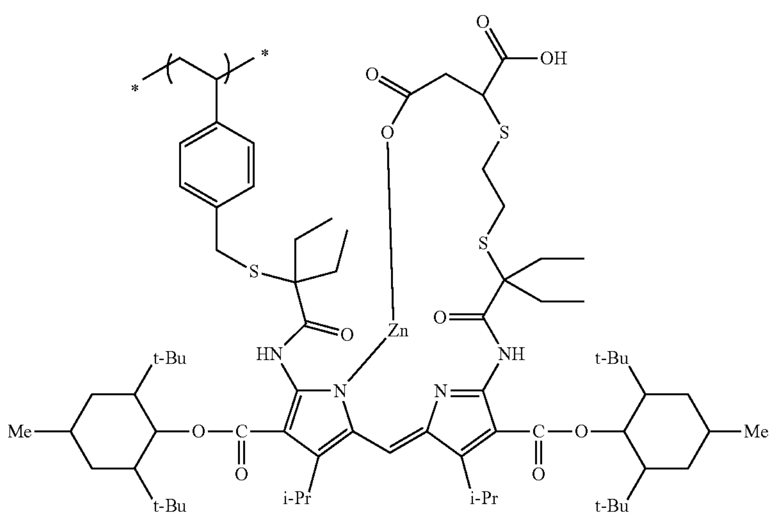

-continued
(A-dp-25)
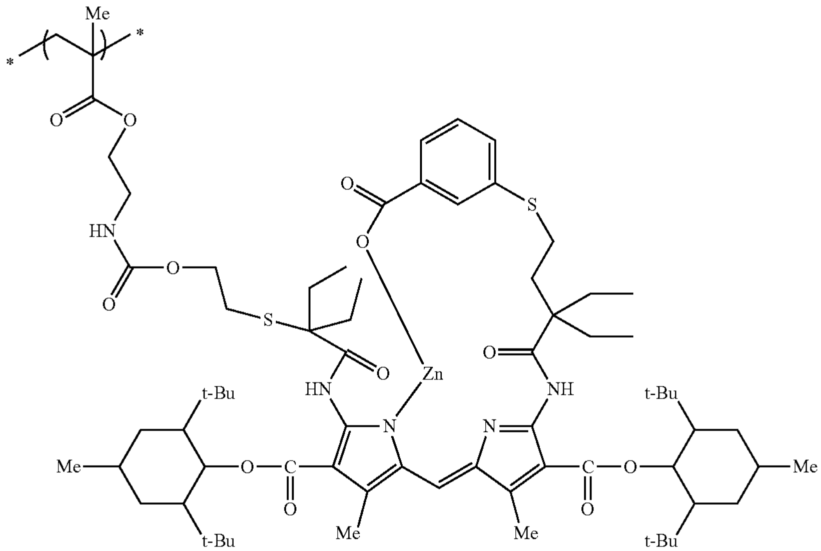
(A-dp-26)
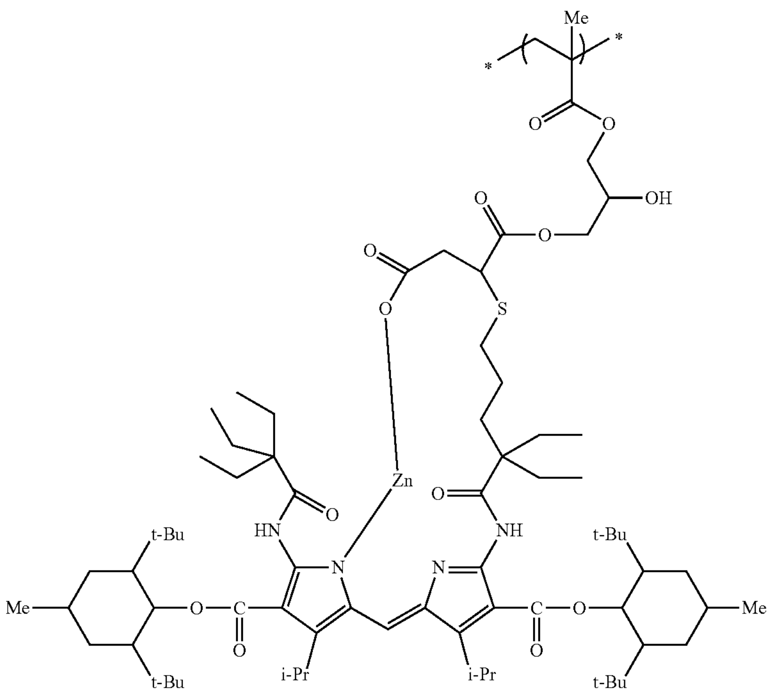
(A-az-1)
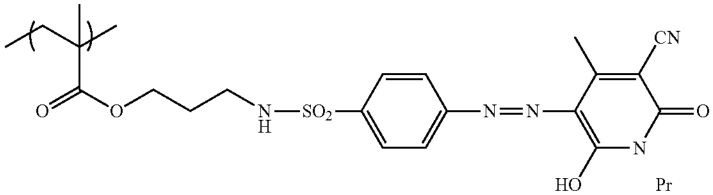
(A-az-2)
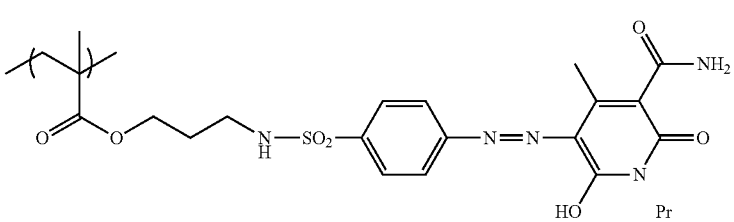

-continued
(A-az-3)
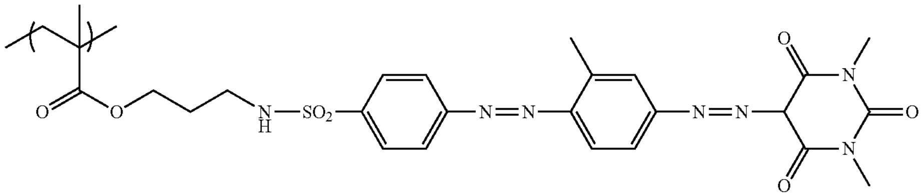
(A-az-4)
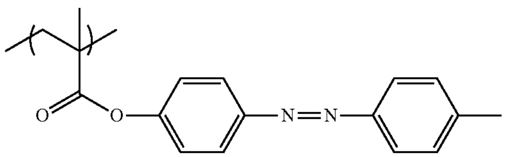
(A-az-5)
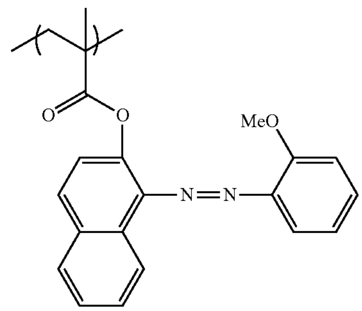
(A-az-6)
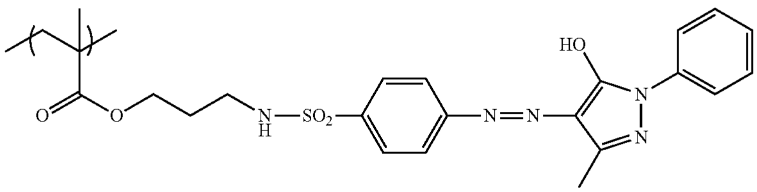
(A-az-7)
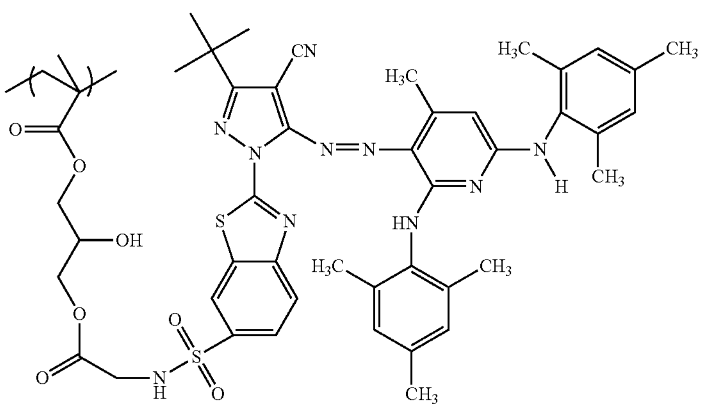
(A-az-8)
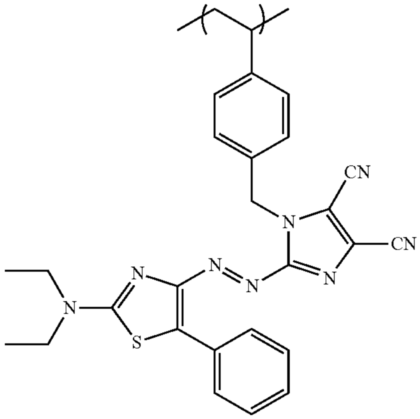
(A-az-9)
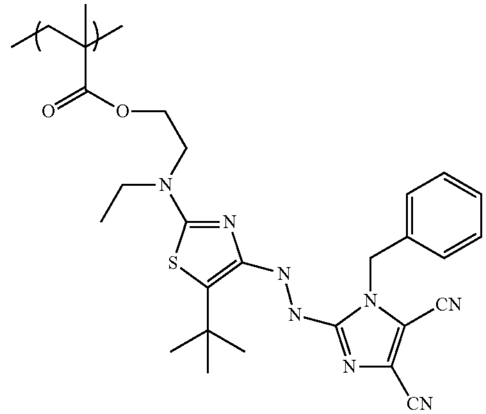

-continued
(A-az-10)
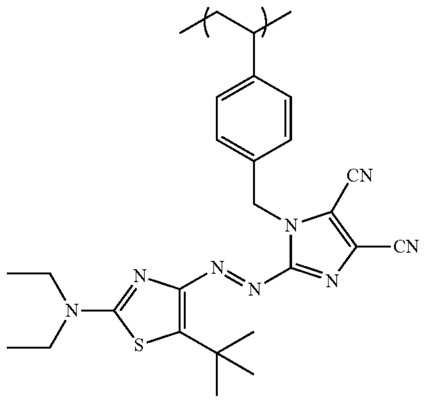
(A-az-11)
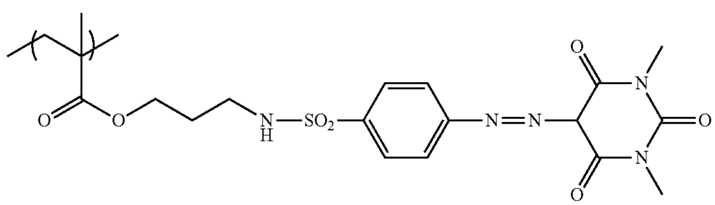
(A-aq-1)
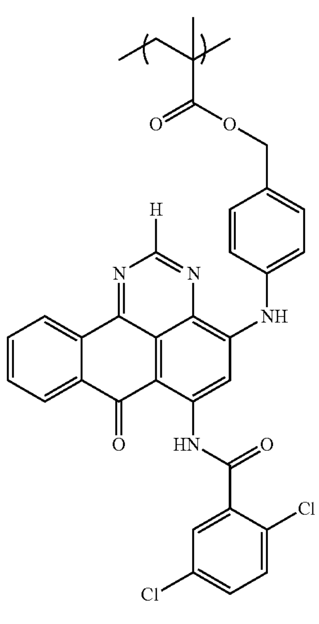
(A-aq-2
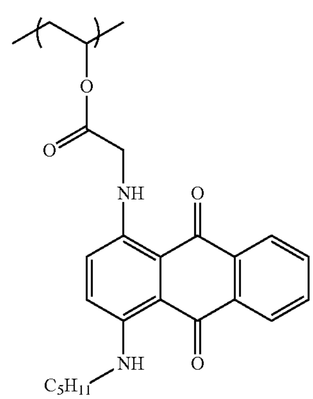

-continued
(A-aq-3)
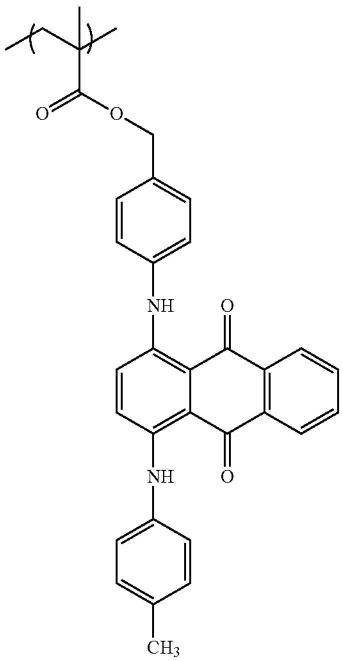
(A-aq-4)
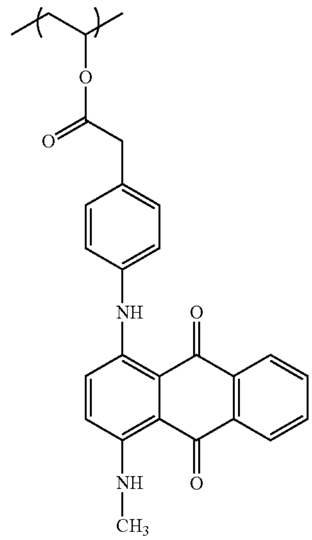
(A-aq-5)
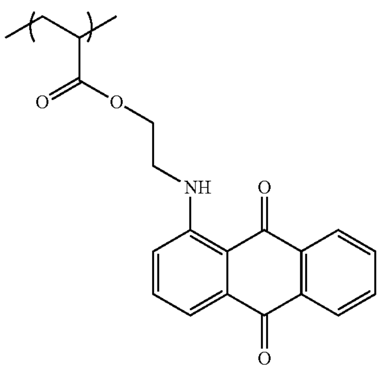
(A-aq-6)
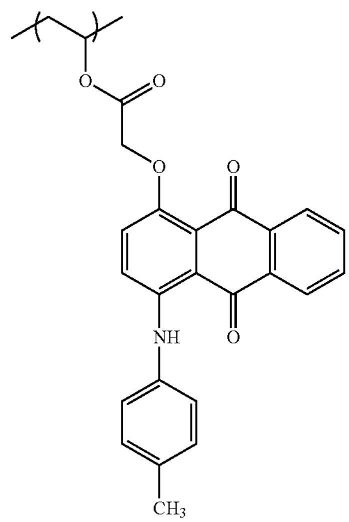
(A-aq-7)
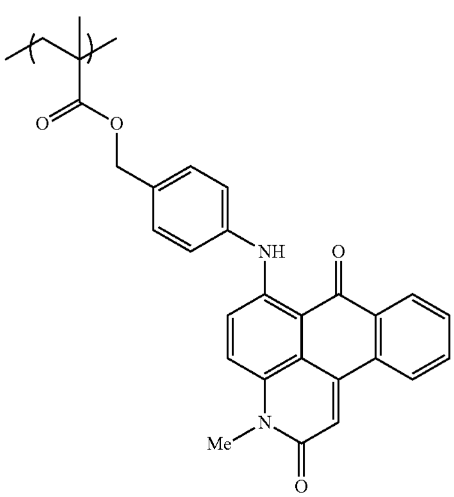
(A-aq-8)
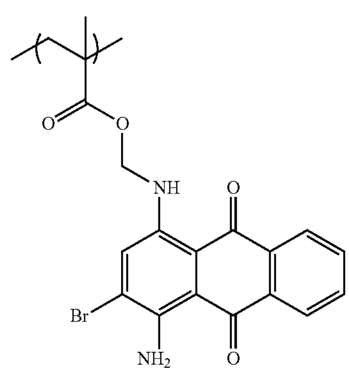

-continued
(A-aq-9)
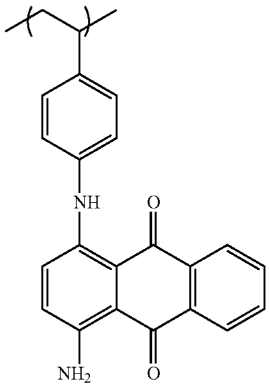
(A-aq-10)
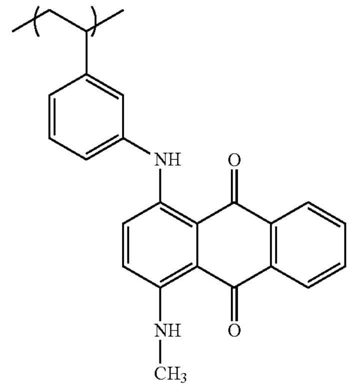
(A-aq-11)
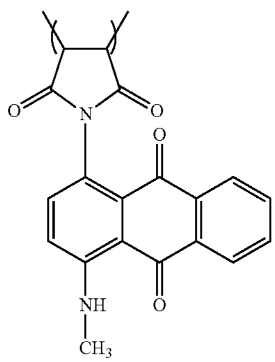
(A-aq-12)
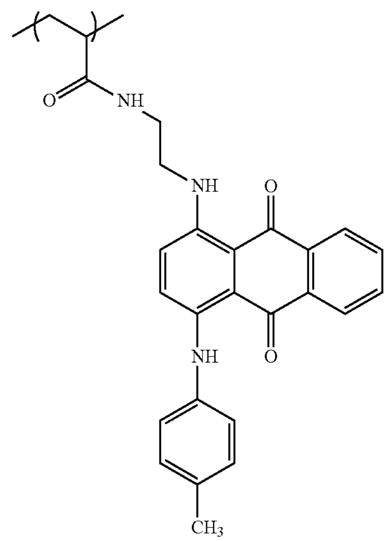
(A-tp-1)
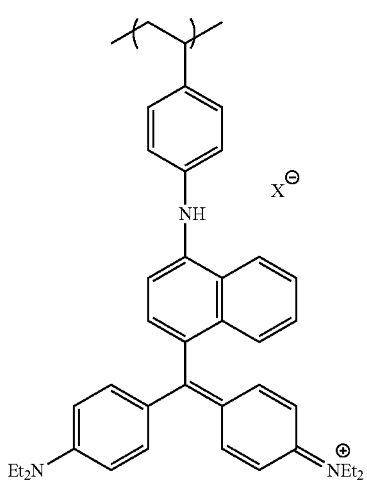
(A-tp-2)
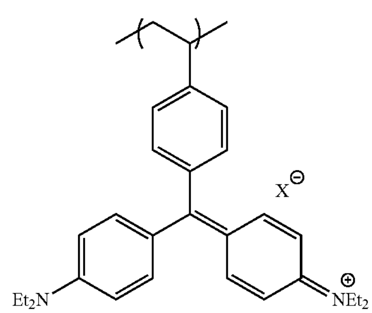

-continued
(A-tp-3)
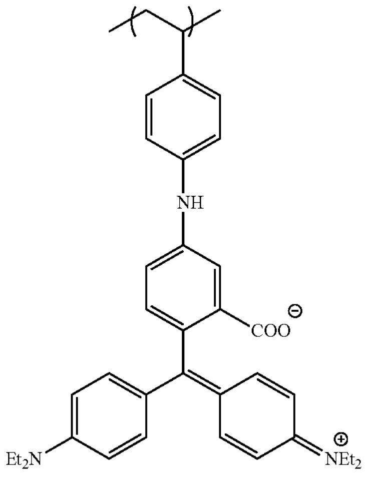
(A-xt-1)
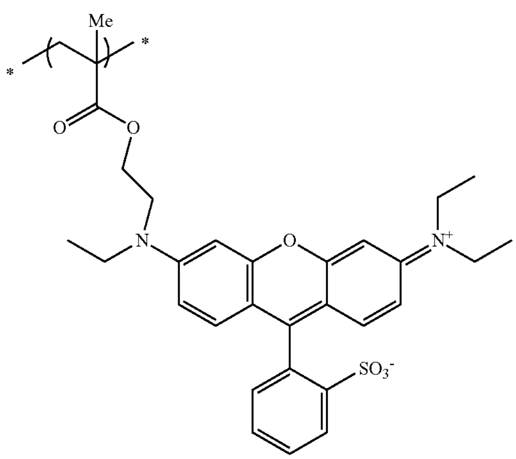
(A-xt-2)
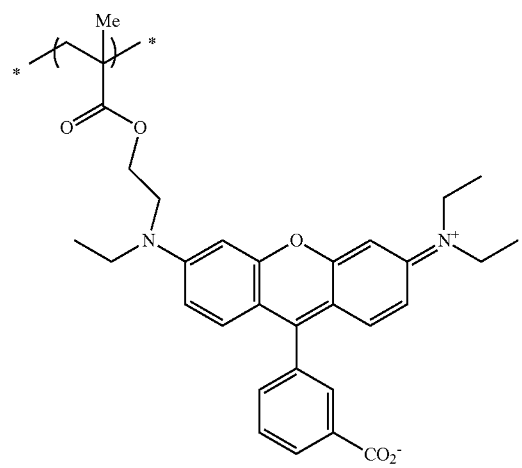
(A-xt-3)
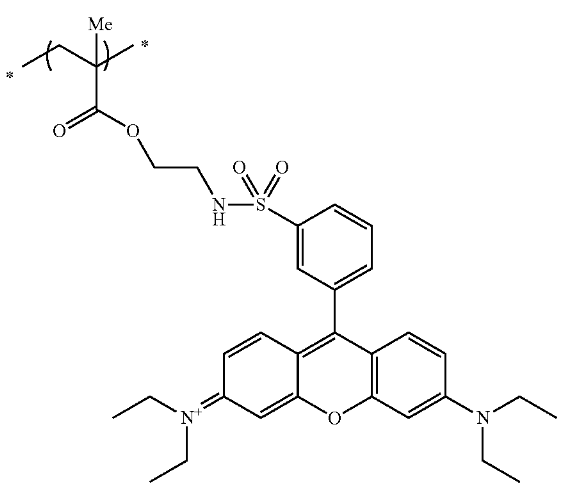

-continued
(A-xt-4)
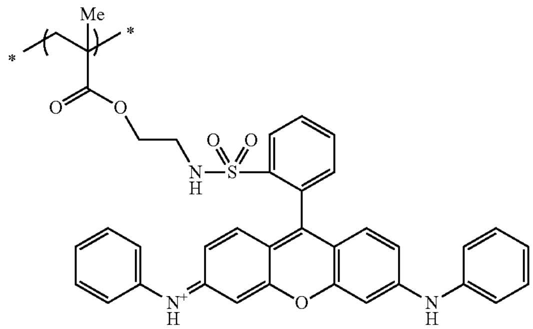
(A-xt-5)
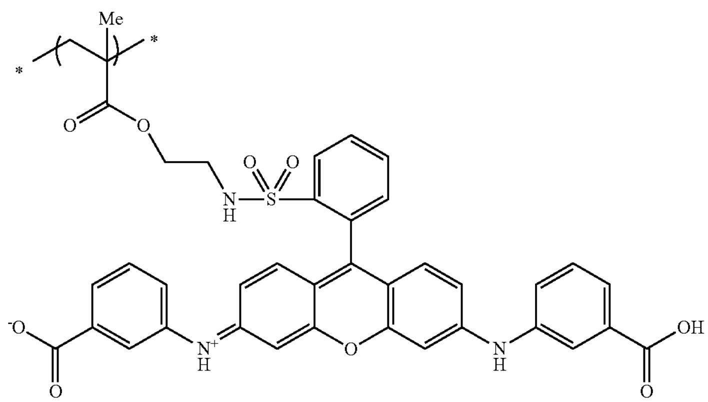
(A-xt-6)
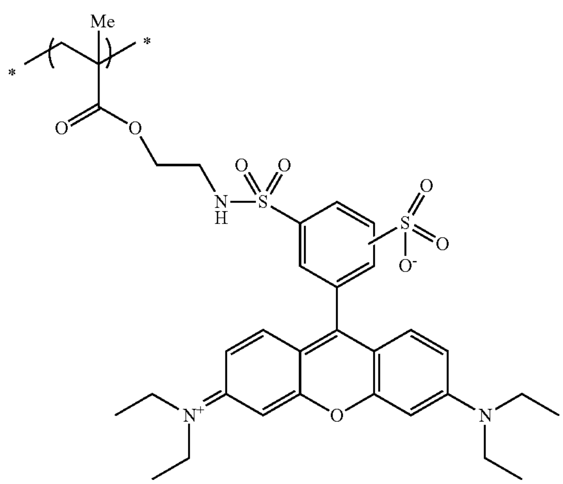
(A-pm-1)
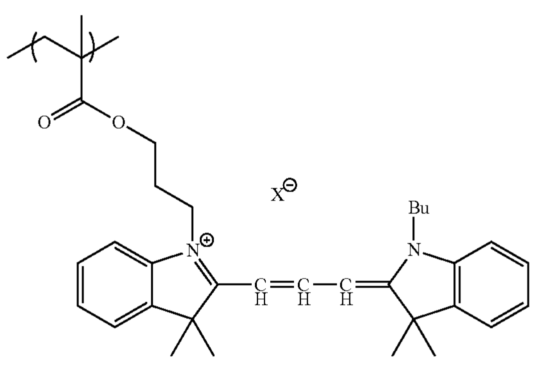
(A-pm-2)
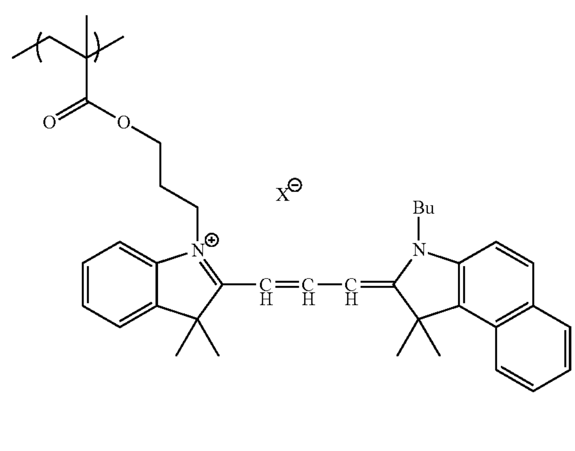

-continued
(A-pm-3)
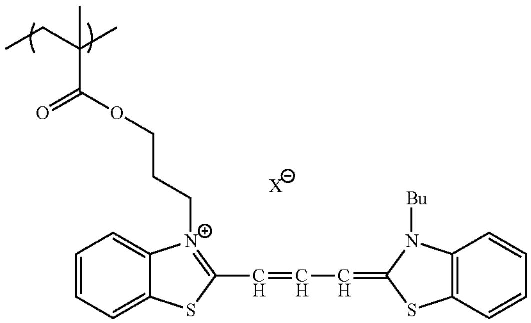
(A-pm-4)
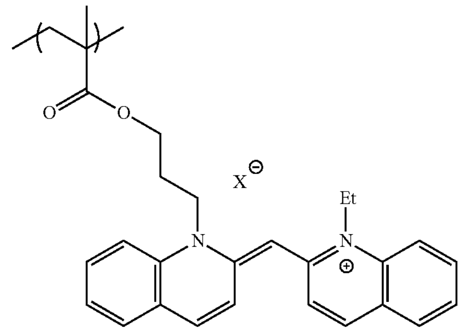
(A-pm-5)
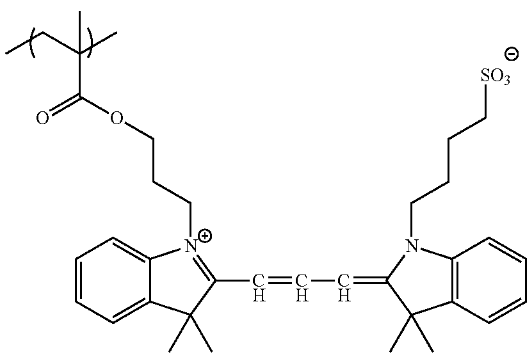
(A-pm-6)
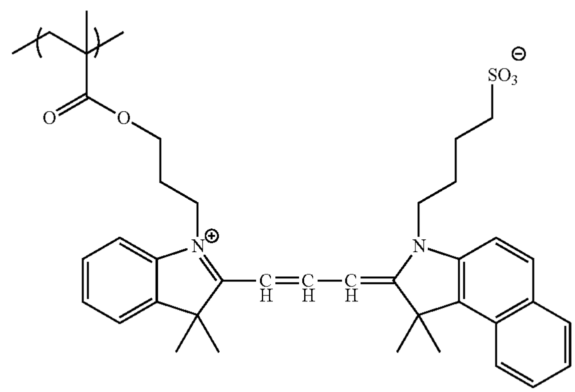
(A-sq-1)
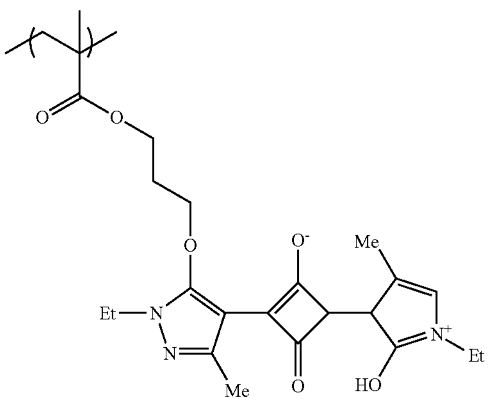
(A-sq-2)
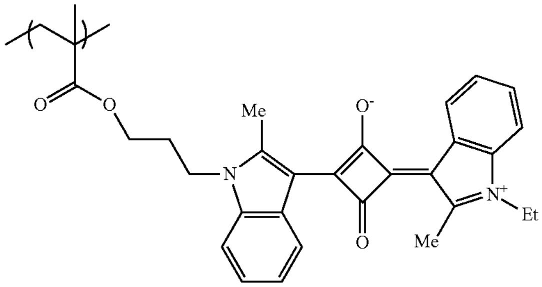

-continued
(A-sq-3)
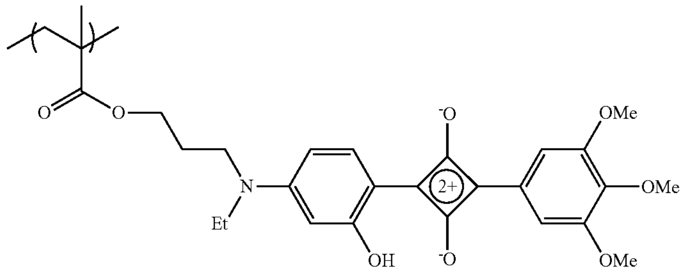
(A-sq-4)
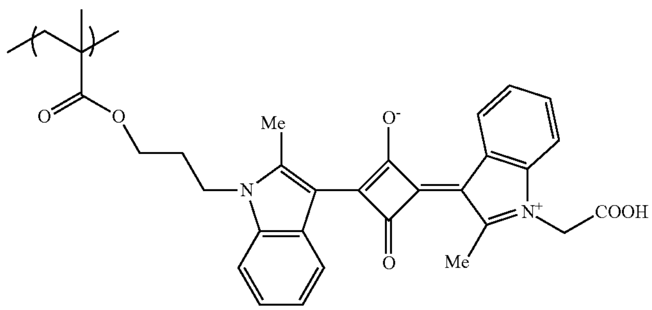
(A-sq-4)
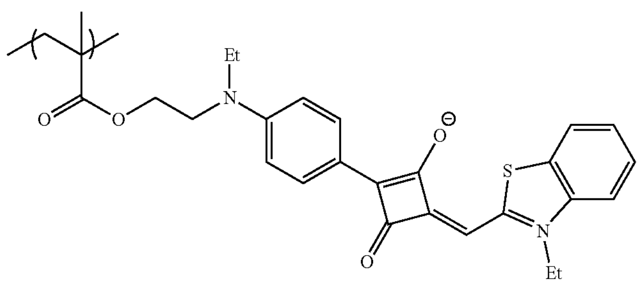
(A-qp-1)
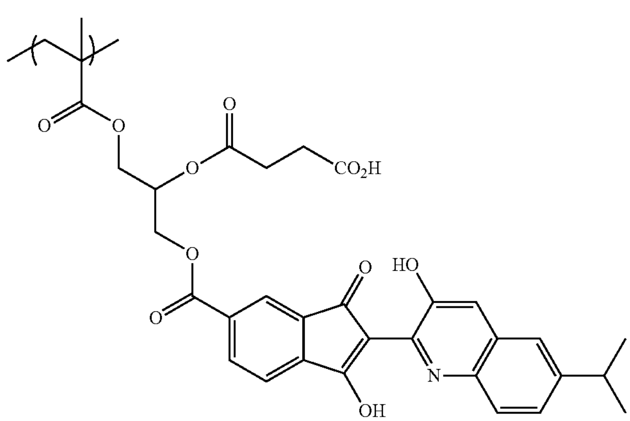

-continued
(A-qp-2)
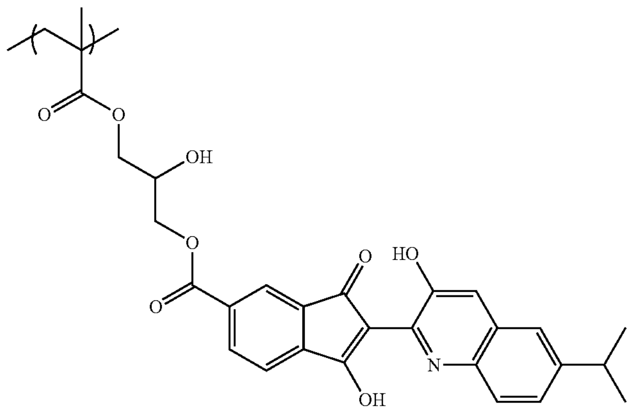
(A-SP-1)
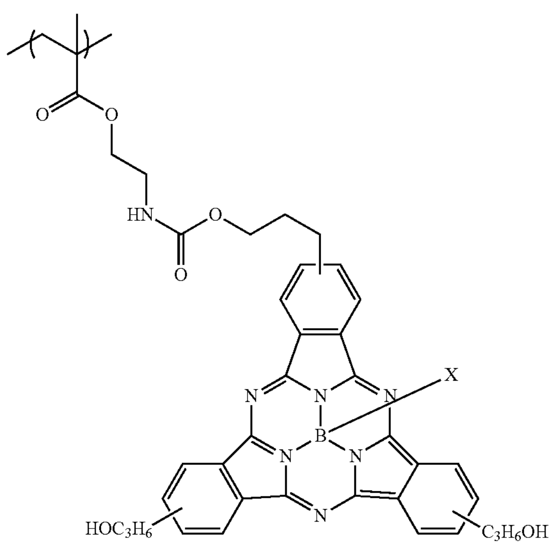
(A-SP-2)
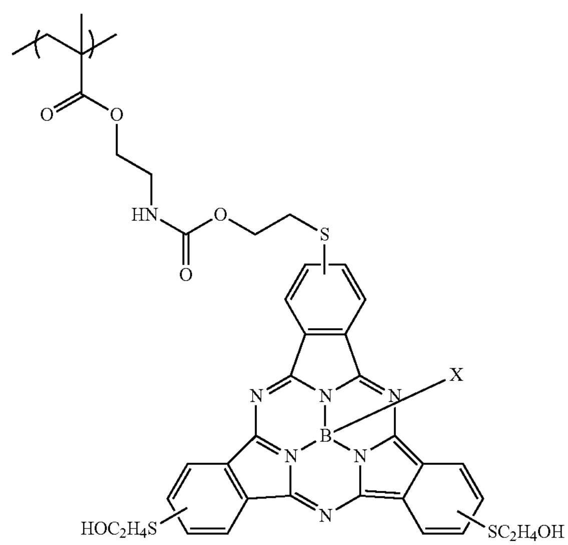
(A-SP-3)
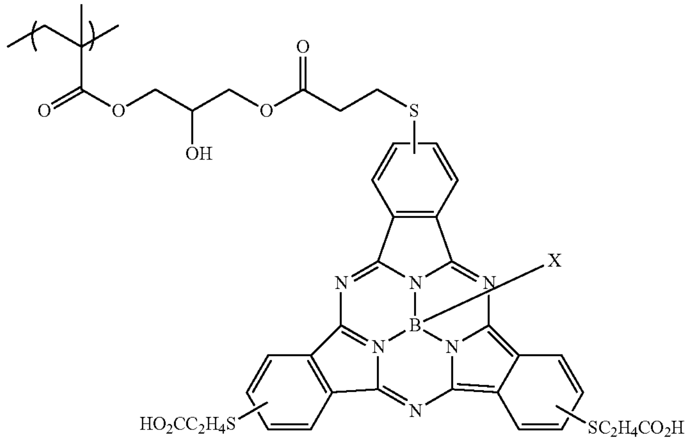

-continued
(A-SP-4)
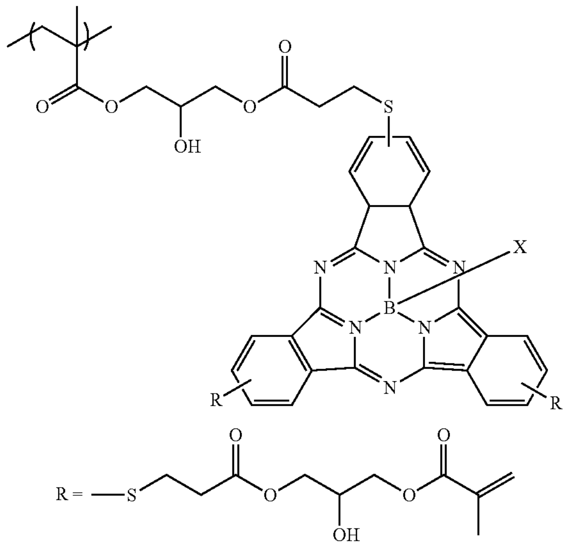
(A-ph-1)
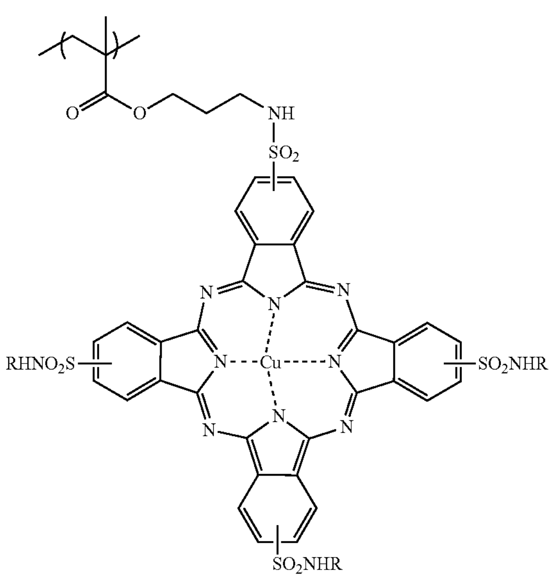
R = CH2CH2CH2OH
(A-ph-2)
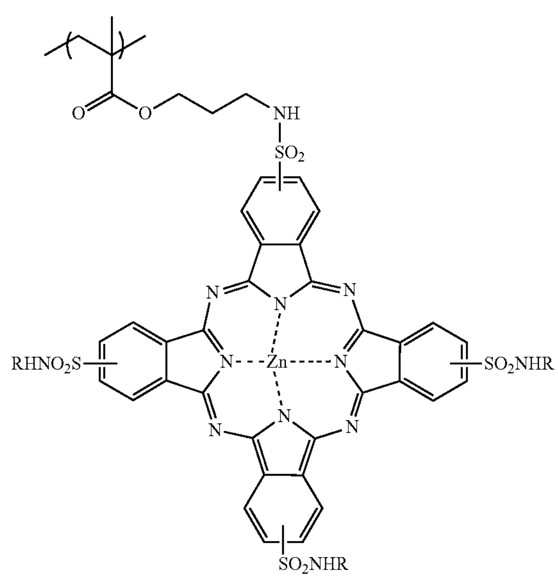
R = CH2CH2CH2OH -continued
(A-ph-3)
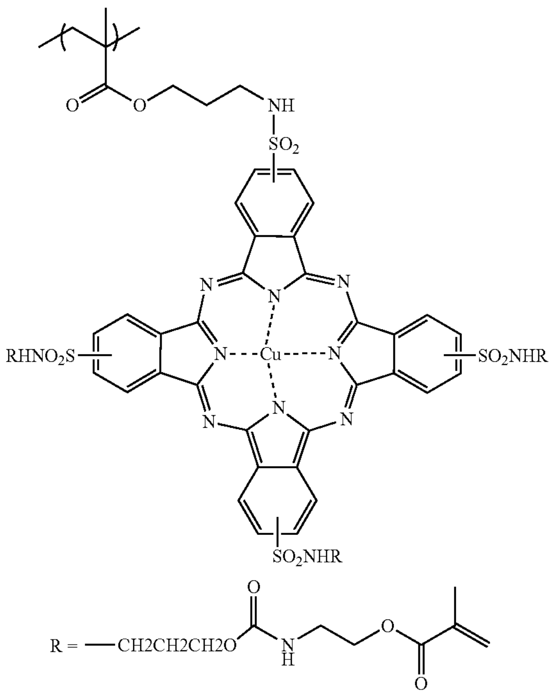
(A-ph-4)
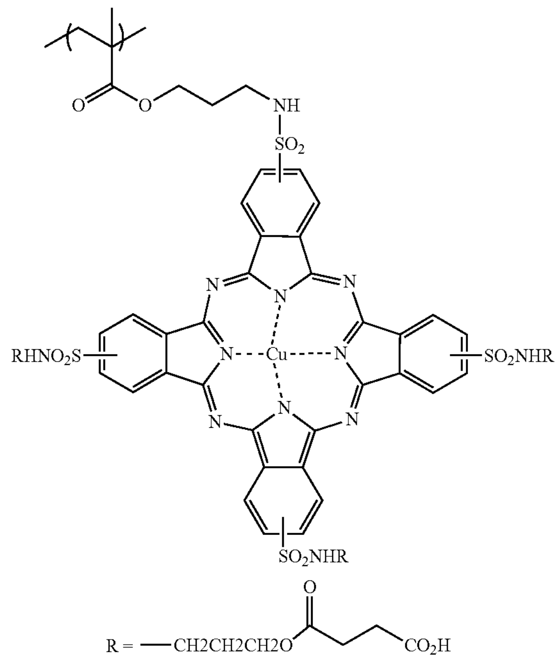
(A-st-1)
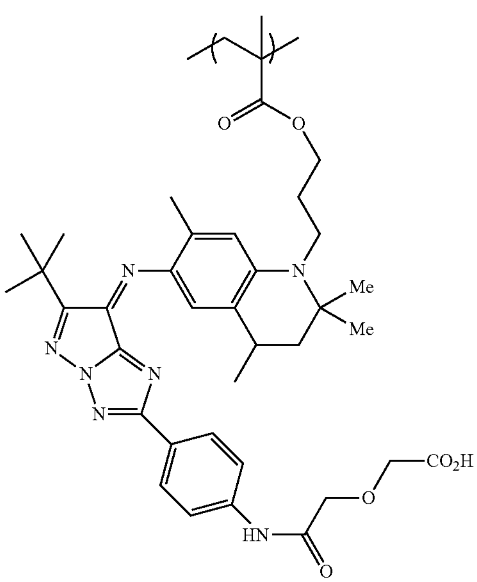
(A-st-2)
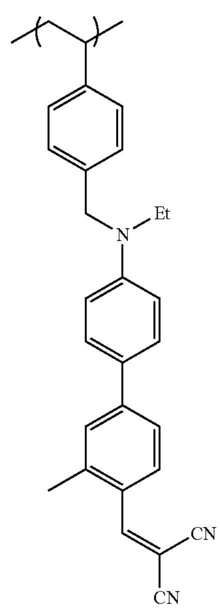

-continued (A-st-3)

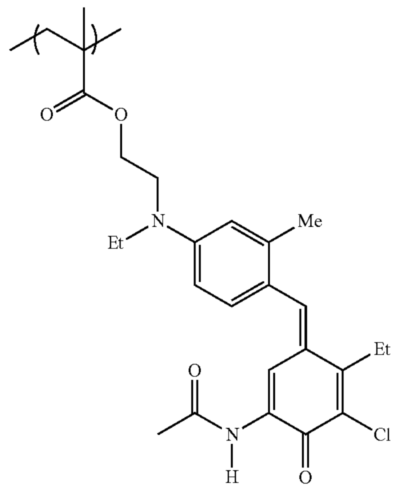

(A-st-4)

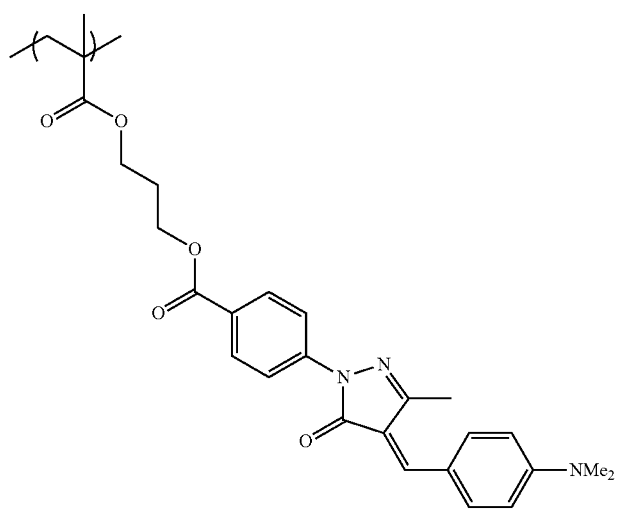

Furthermore, more preferable embodiments of the colorant structure include the colorant structures formed by removing any m1+1 hydrogen atoms of the dipyrromethene metal complex compound represented by the following general formula (6).

(6)

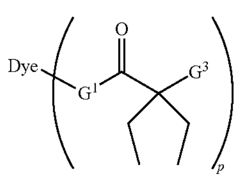

(in the general formula (6), Dye represents a colorant structure; $G^1$ represents a nitrogen atom or an oxygen atom; $G^3$ represents carbon atom, sulfur atom, an oxygen atom, or a nitrogen atom; and p represents 1 or 2, and when p is 2, the structures in [ ] may be the same as or different from each other. Dye is preferably, for example, a colorant structure formed by removing any one to p hydrogen atoms from the dipyrromethene metal complex compound obtained from the dipyrromethene compound represented by the general formula (M) and a metal or a metal compound; or the like.)

Specific examples of the constitutional unit represented by the general formula (A) in the case where a colorant structure formed by removing any m1+1 hydrogen atoms from the dipyrromethene metal complex compound represented by the general formula (6) is used are shown below, but the present invention is not limited thereto.

(A-1)
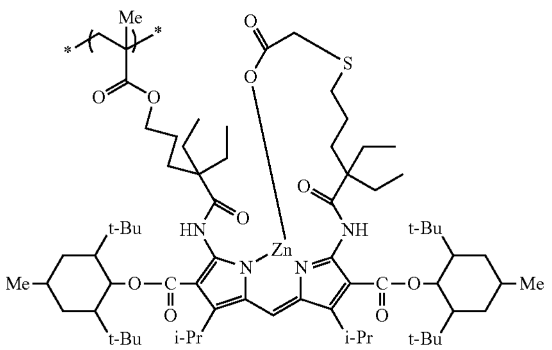
(A-2)
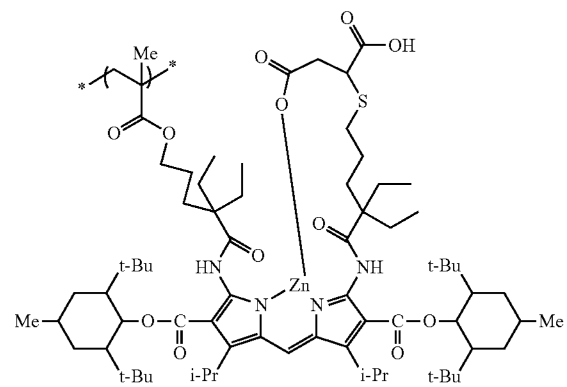
(A-3)
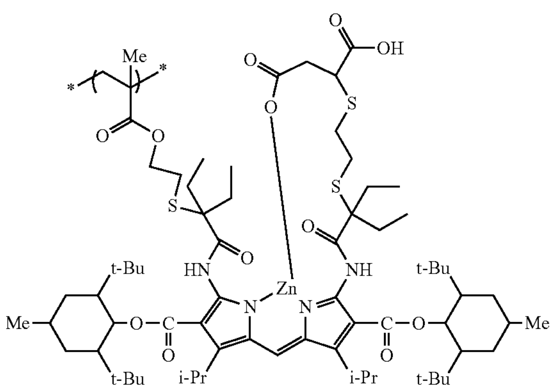
(A-4)
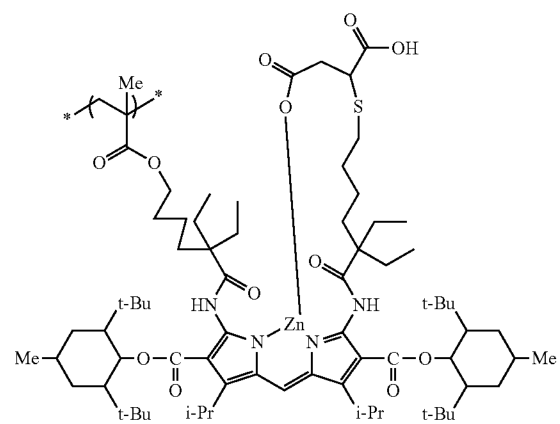
(A-5)
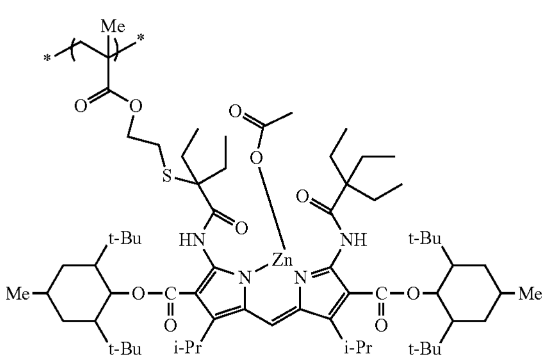
(A-6)
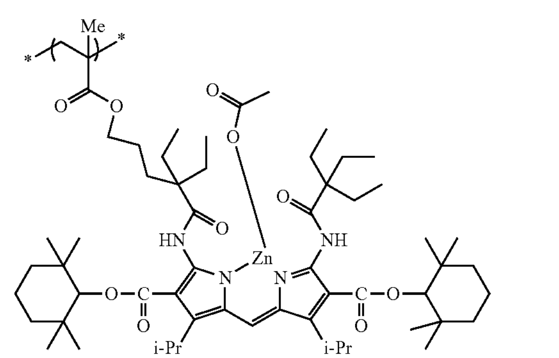
(A-7)
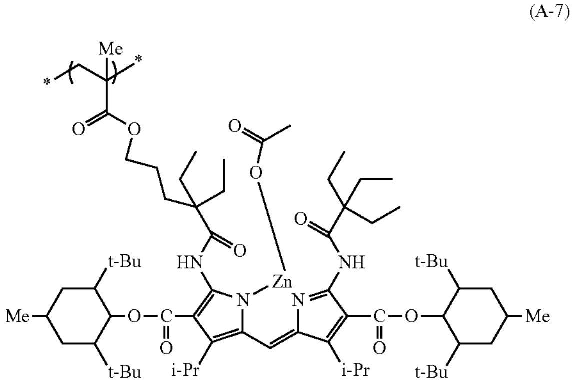
(A-8)
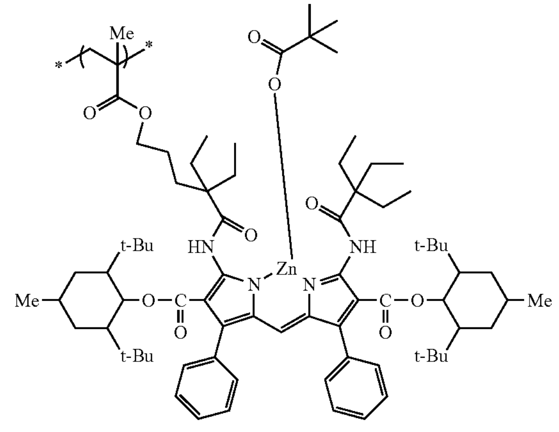

-continued
(A-9)
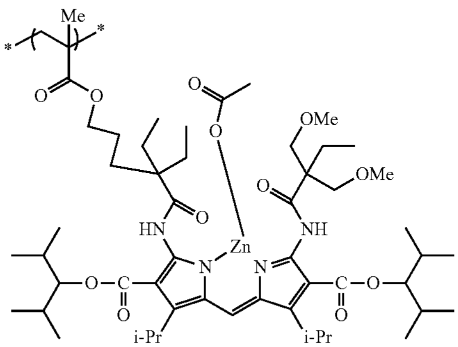
(A-10)
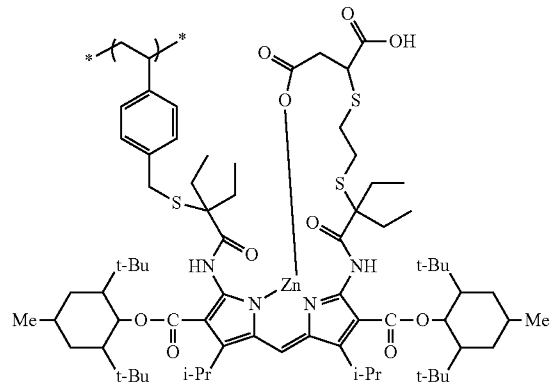
(A-11)
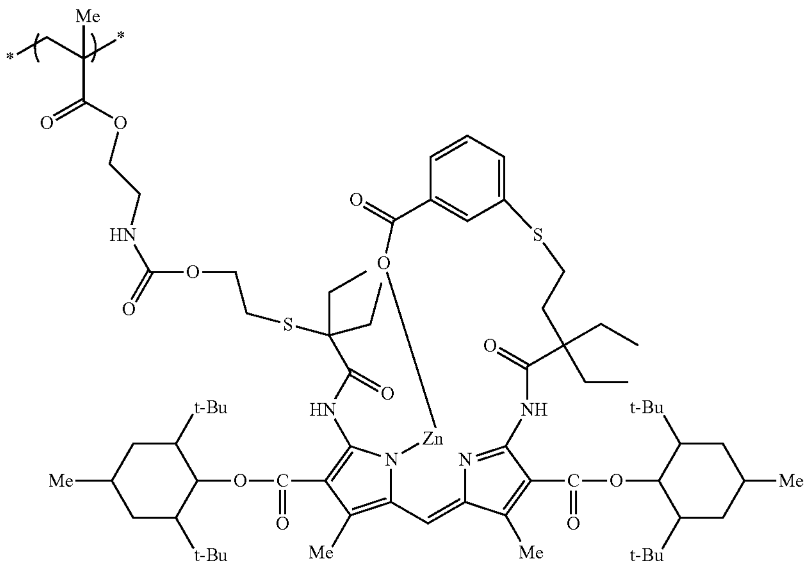
(A-13)
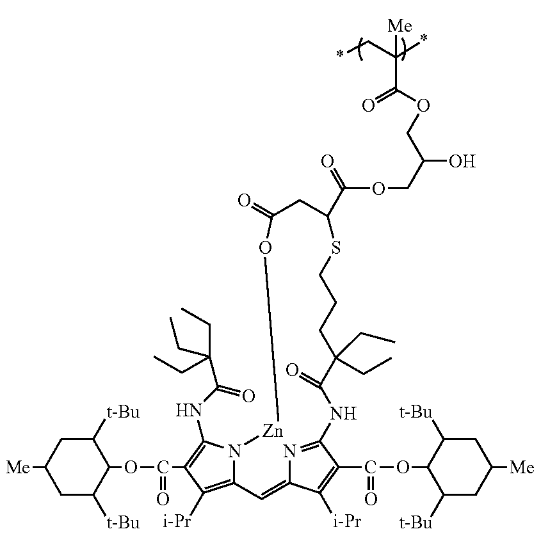
(A-12)
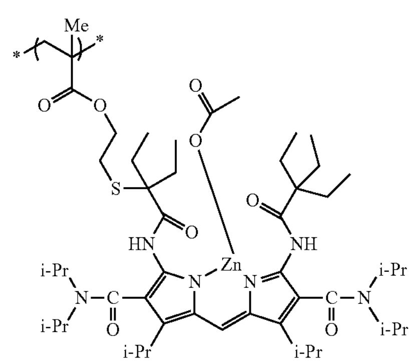

-continued
(A-14)
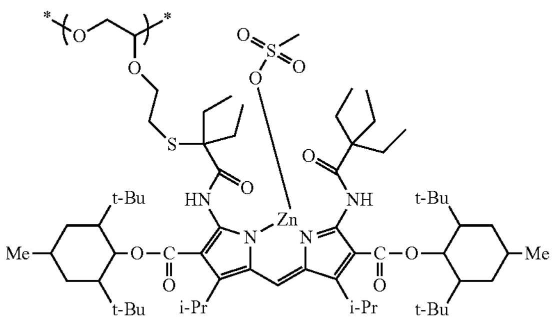
(A-15)
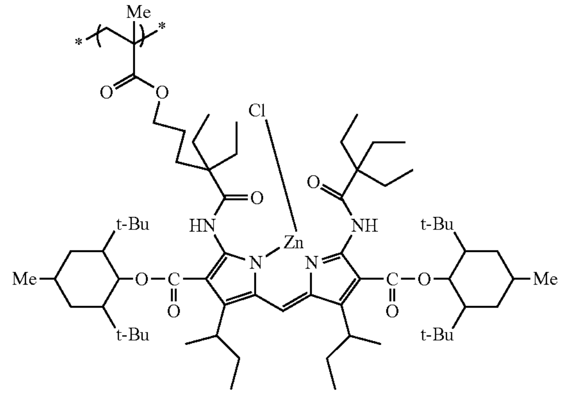
(A-16)
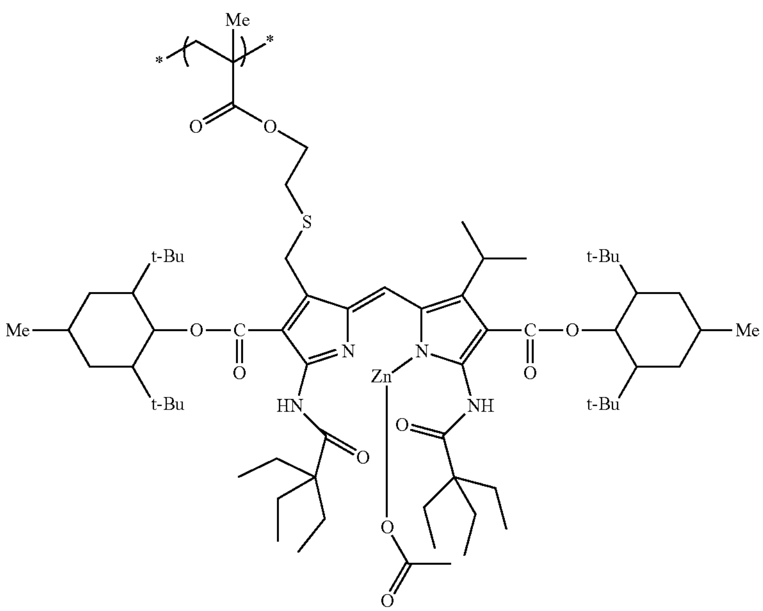
(A-17)
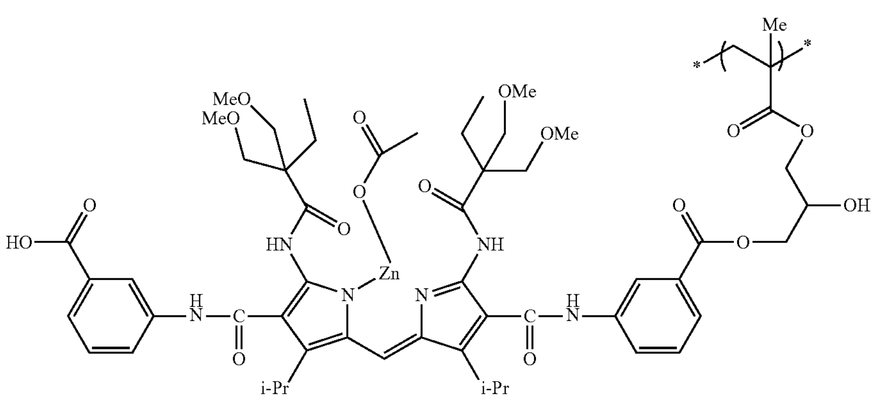

-continued
(A-18)
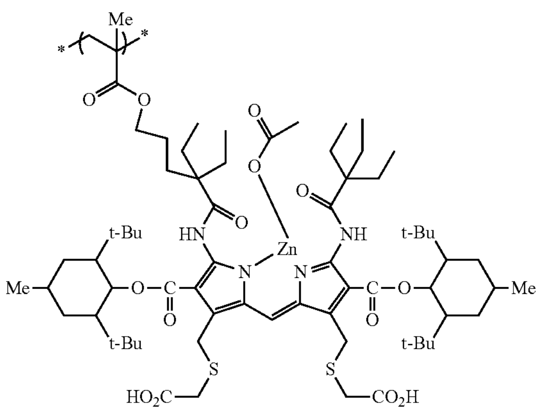
(A-19)
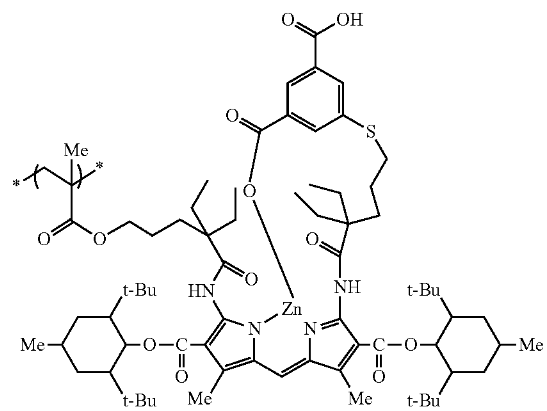
(A-20)
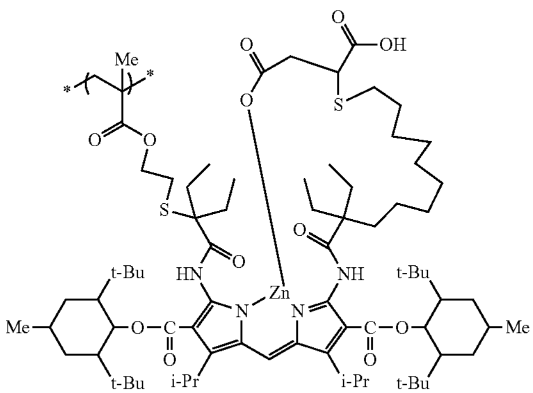
(A-21)
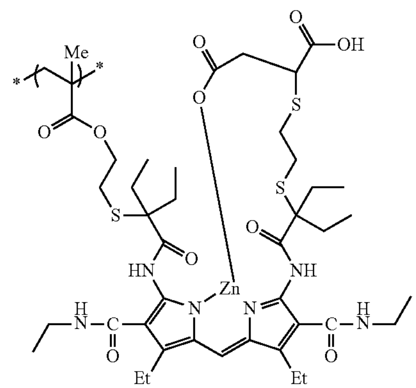
(A-22)
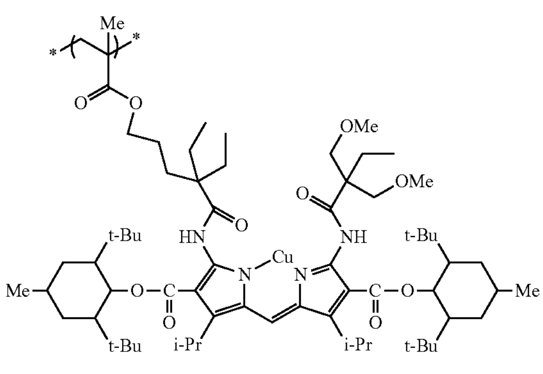
(A-23)
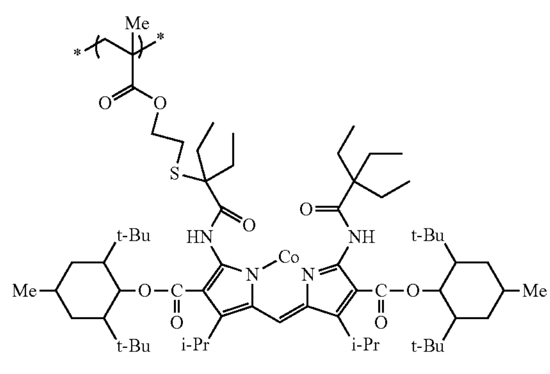

-continued
(A-24)
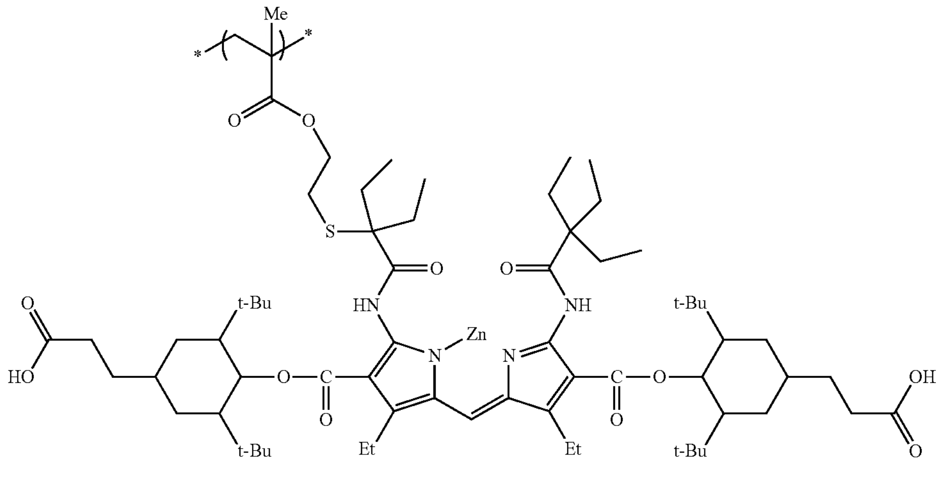
(A-25)
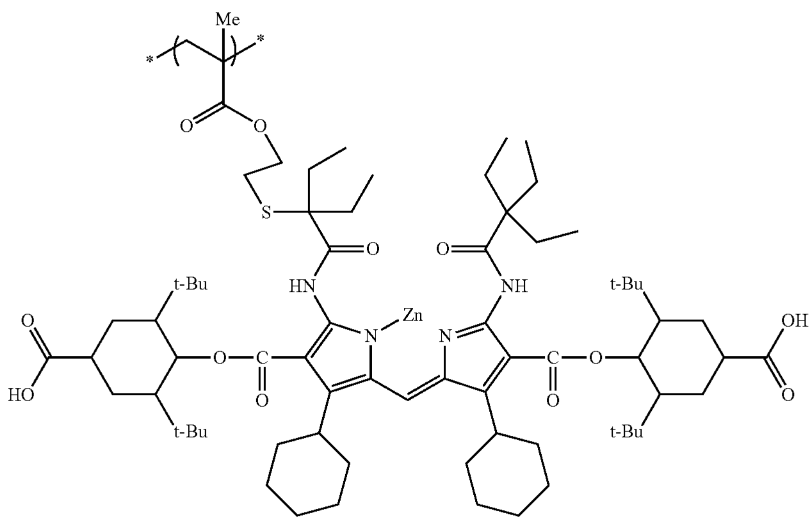
(A-26)
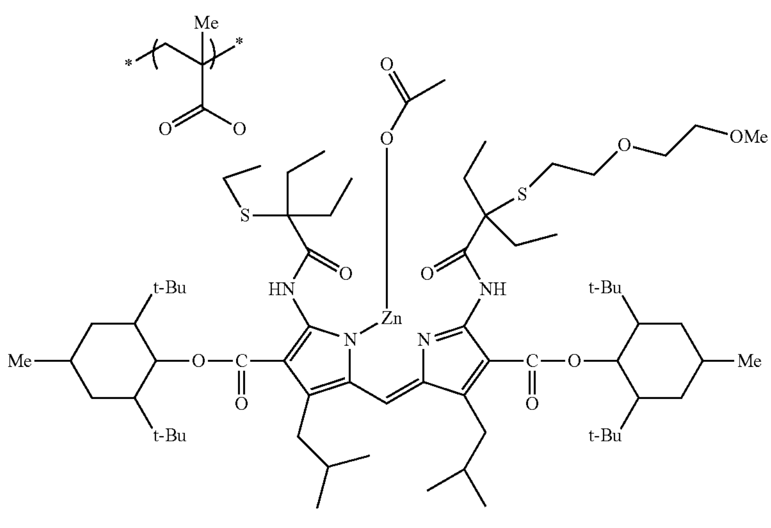

-continued
(A-27)
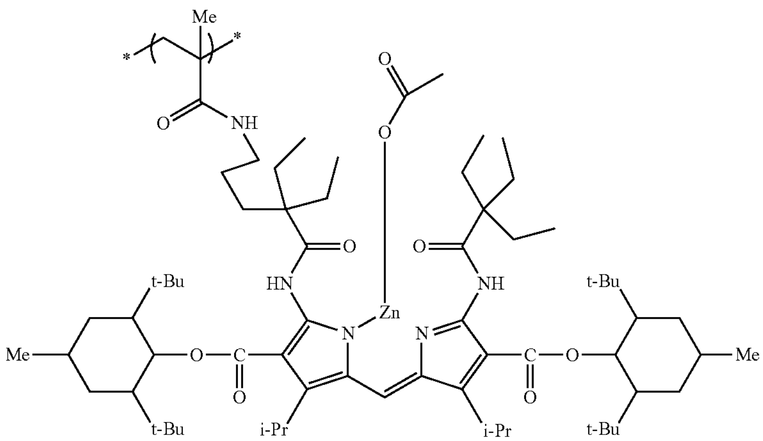
(A-28)
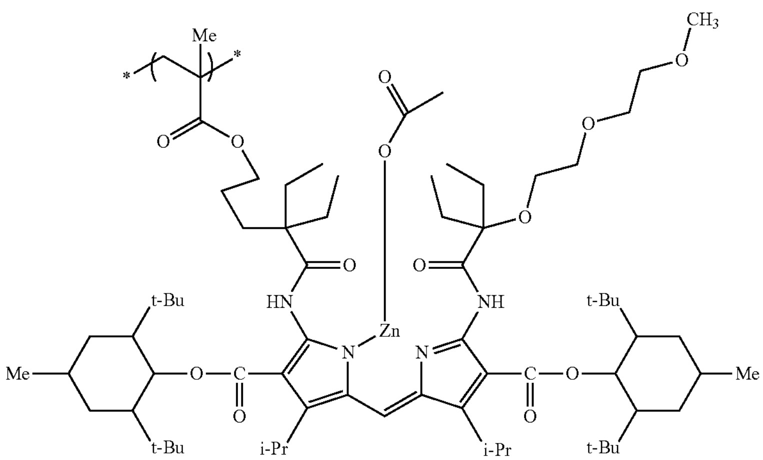
(A-29)
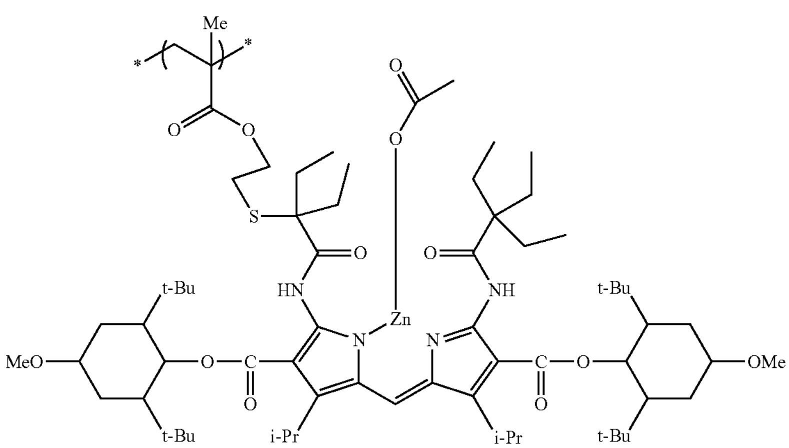

-continued
(A-30)
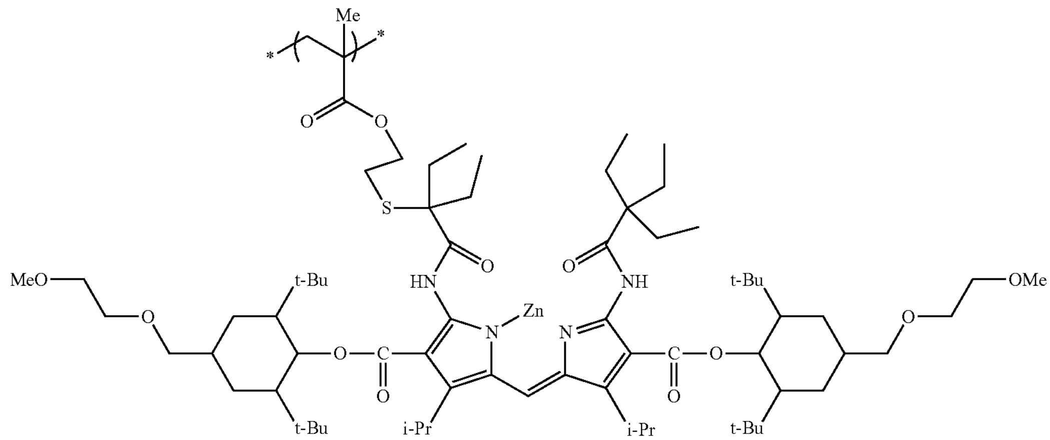
(A-31)
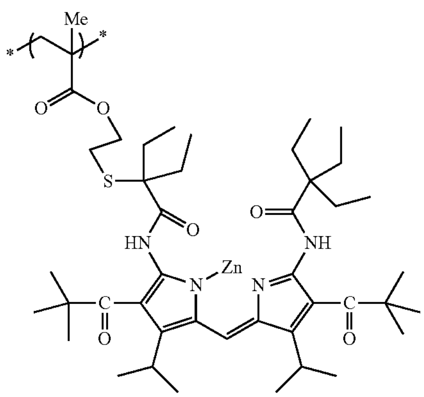
(A-32)
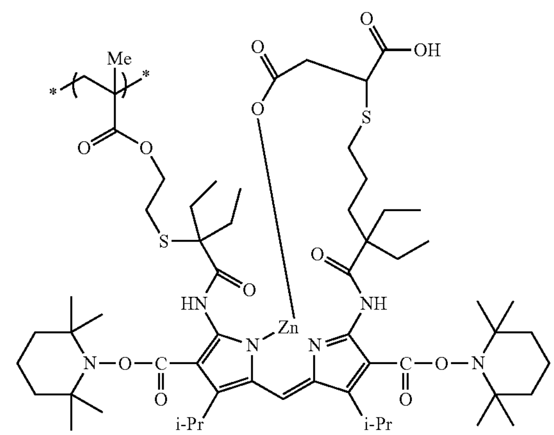
(A-33)
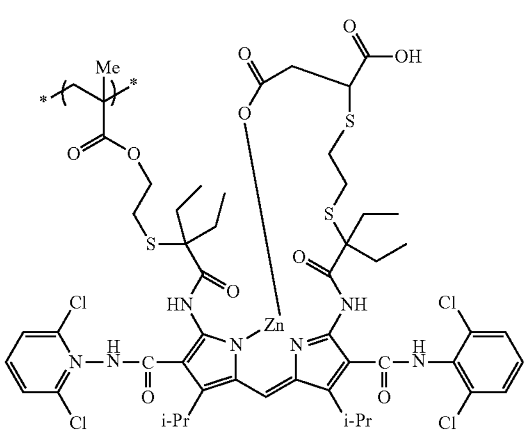
(A-34)
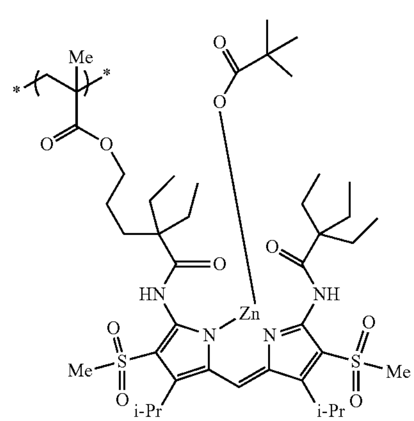

-continued
(A-35)
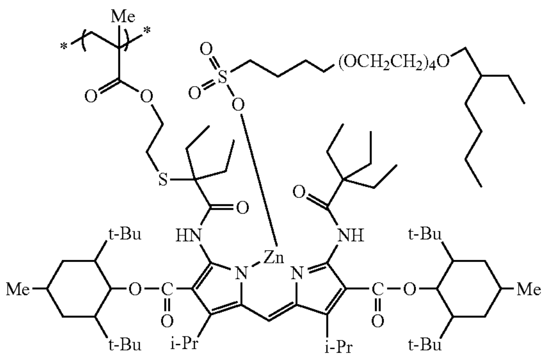
(A-36)
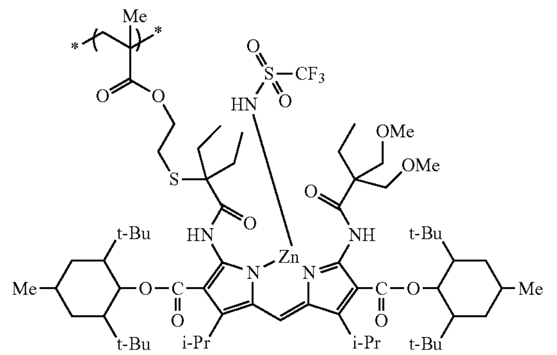
(A-37)
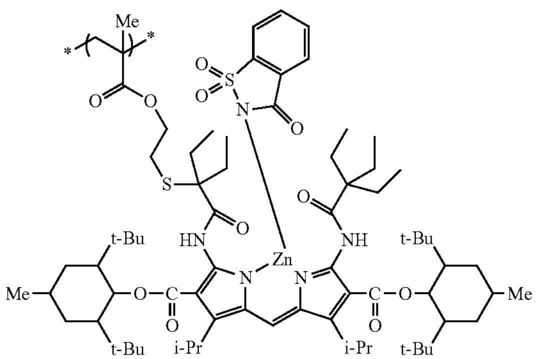
(A-38)
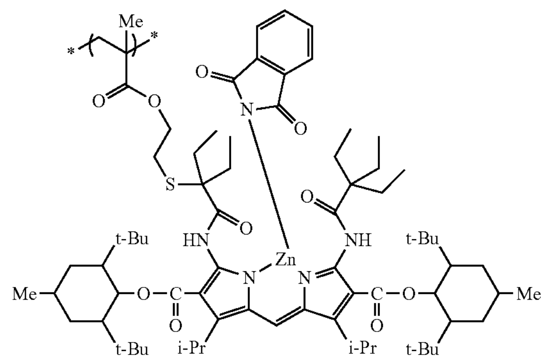
(A-39)
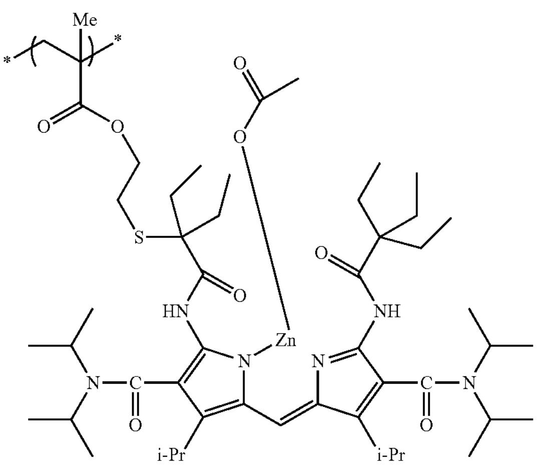
(A-40)
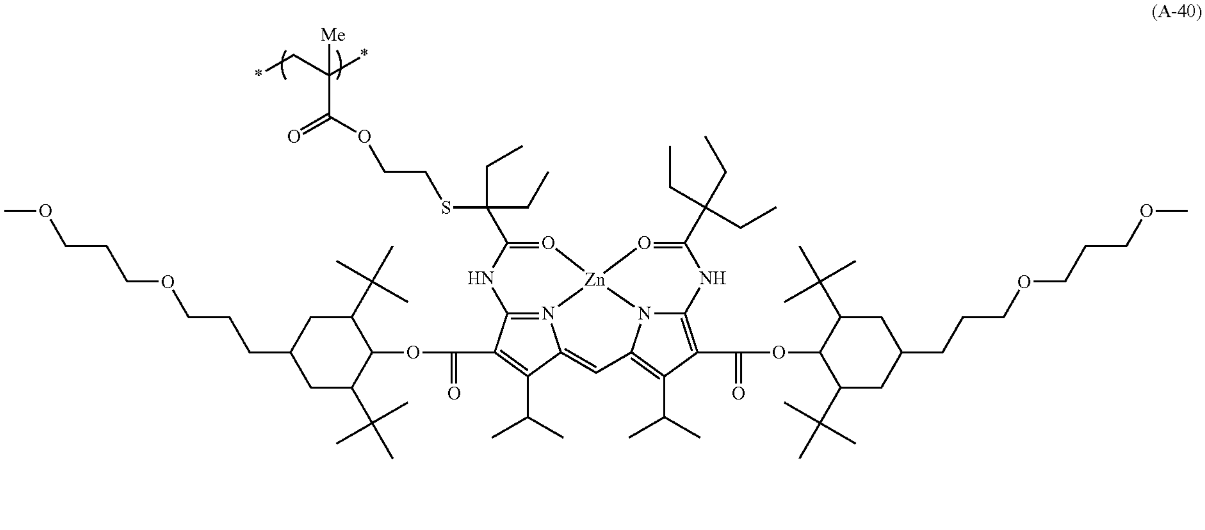

-continued
(A-41)
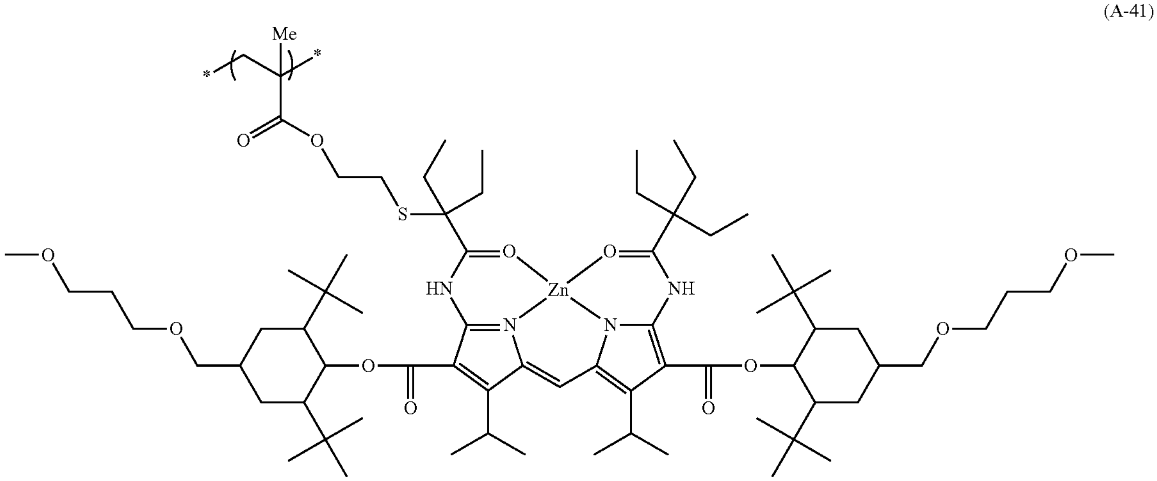
(A-42)
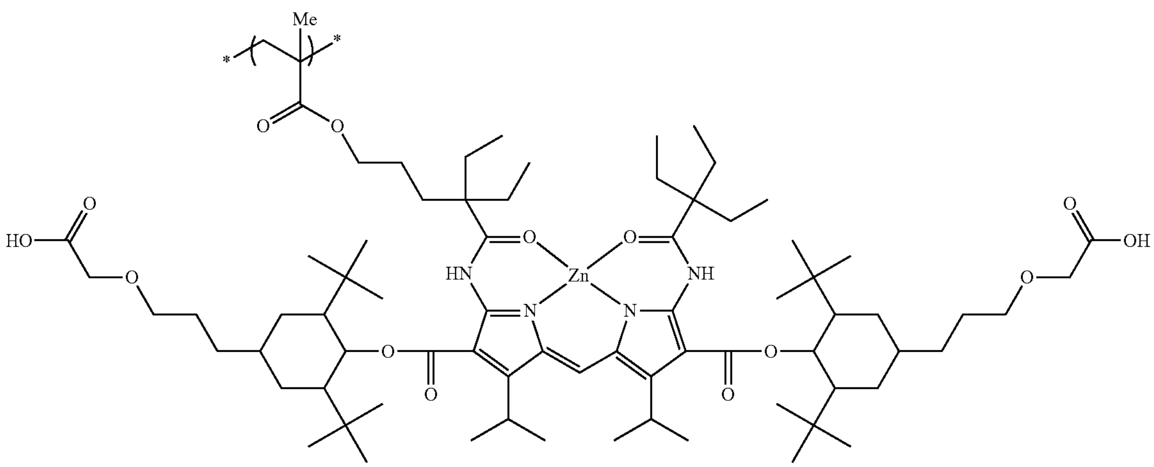
(A-43)
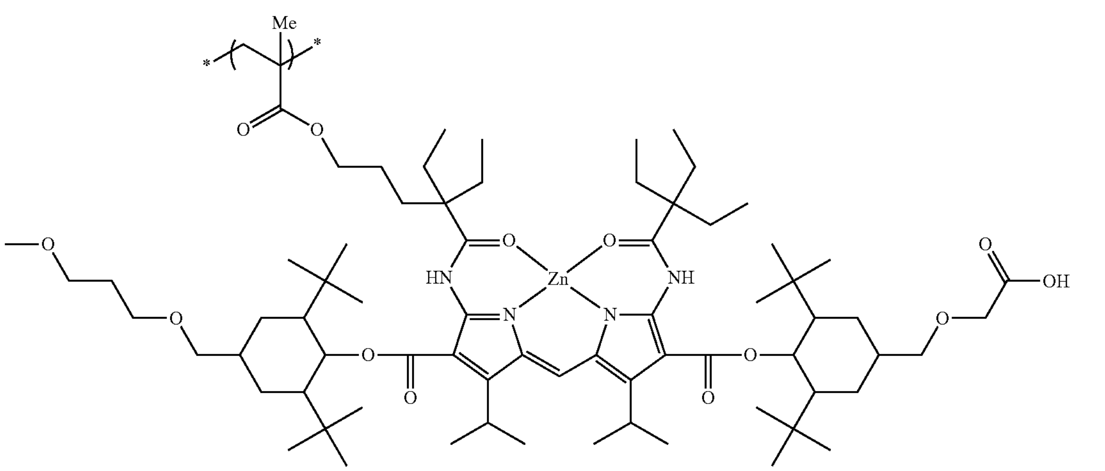

-continued
(A-44)
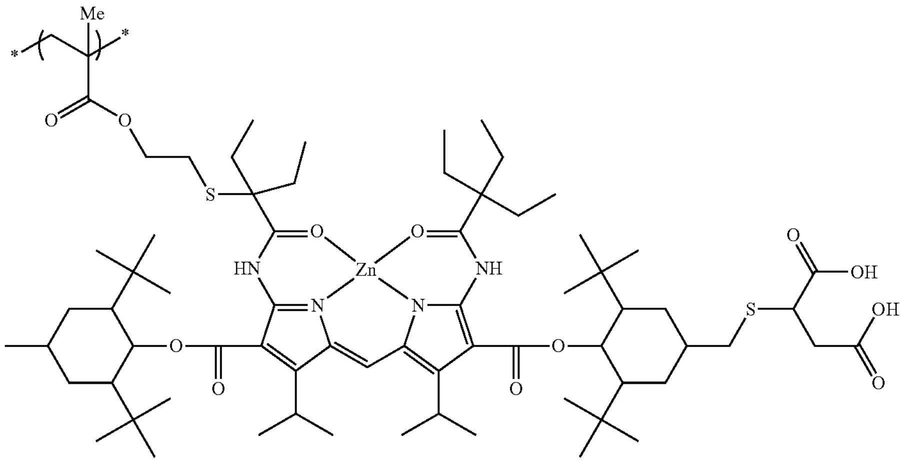
(A-45)
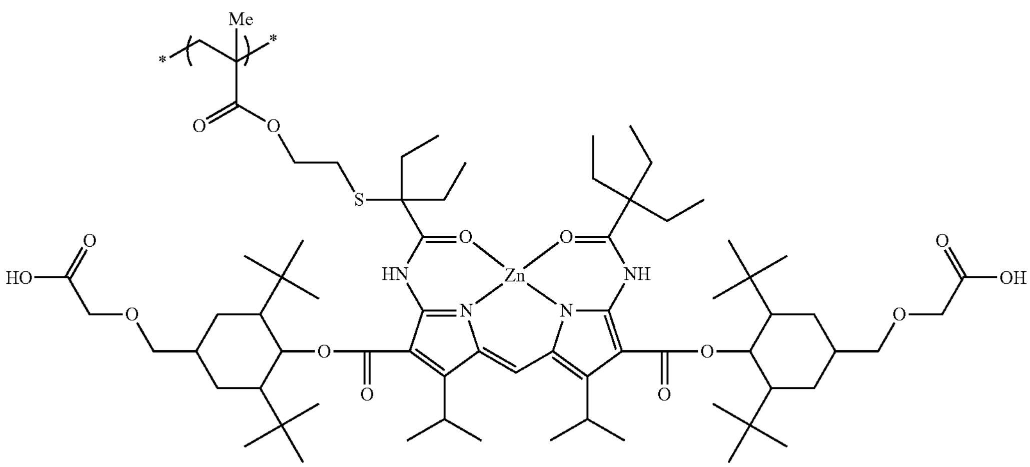
(A-46)
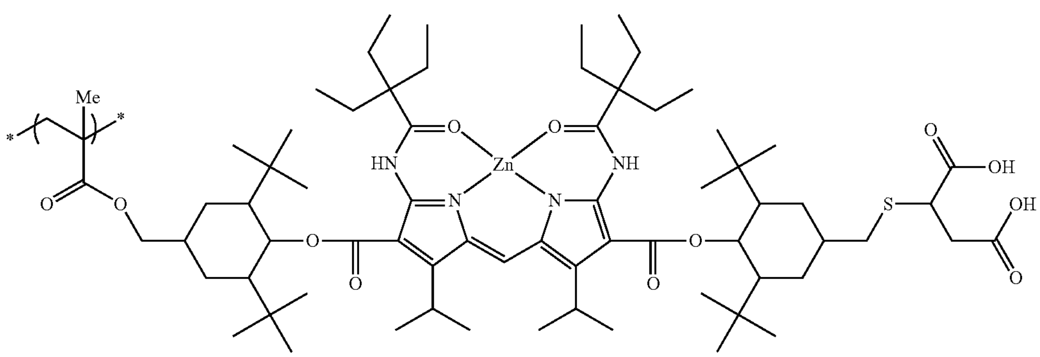
(A-47)
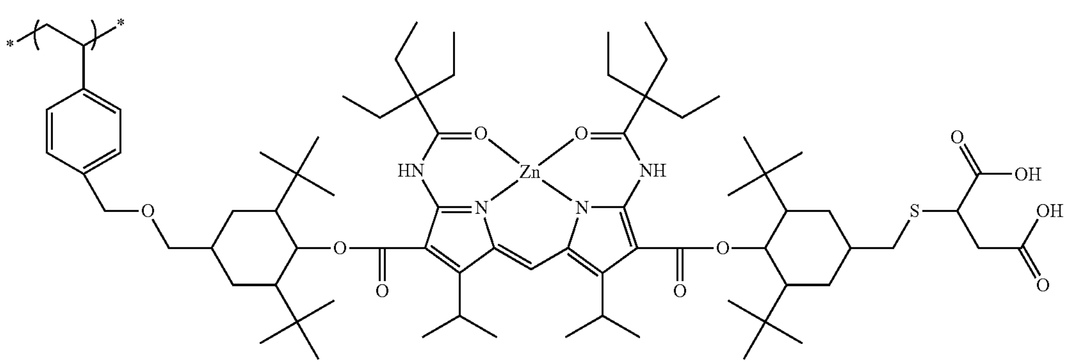

-continued (A-48)

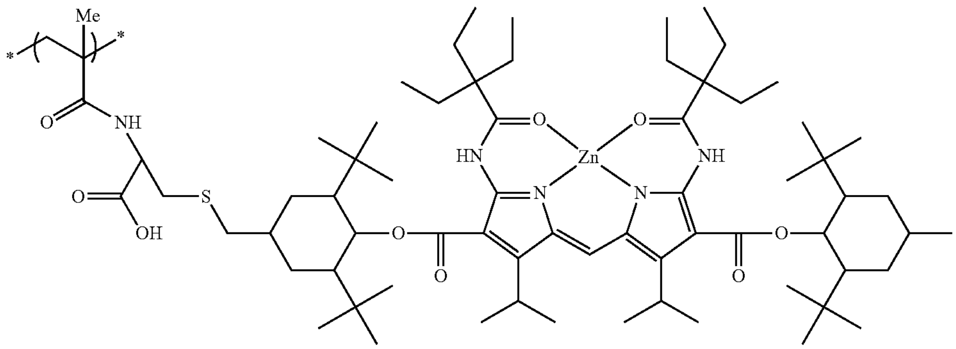

(A-49)

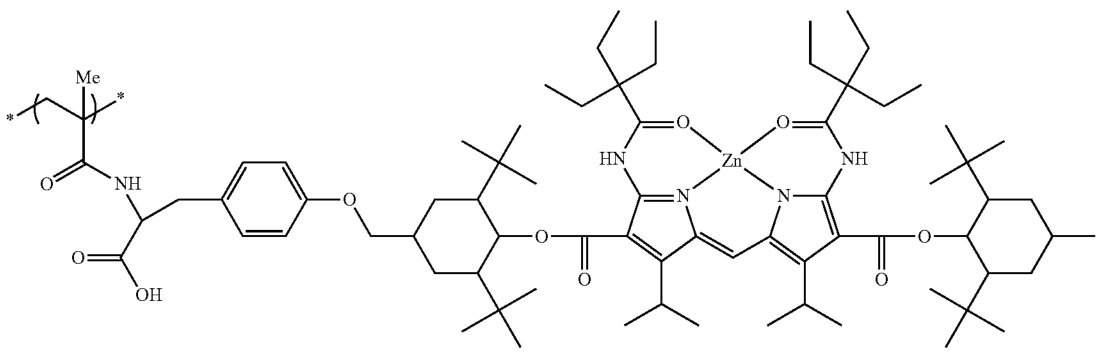

<Constitutional Unit Represented by General Formula (B)>

Next, the constitutional unit represented by the general formula (B) will be described in detail.

(B)

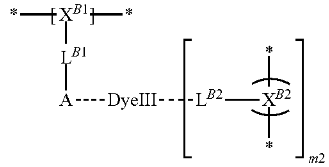

(in the general formula (B), $X^{B1}$ represents a linking group formed by polymerization;

$L^{B1}$ represents a single bond or a divalent linking group; A represents a group which is capable of forming an ionic bond or a coordinate bond with DyeIII; DyeIII represents a color structure, and examples thereof include a colorant structure formed by removing any one to p hydrogen atoms from the dipyrromethene metal complex compound obtained from the dipyrromethene compound represented by the general formula (M) and a metal or a metal compound; p represents 1 or 2; $X^{B2}$ represents a linking group formed by polymerization; $L^{B2}$ represents a single bond or a divalent linking group; m2 represents an integer of 0 to 3, and when m2 is 2 or more, the structure in [ ] may be the same as or different from each other; and DyeII and $L^{B2}$ may be linked to each other by a covalent bond, an ionic bond or a coordinate bond.)

In the general formula (B), $X^{B1}$ and $L^{B1}$ are the same groups as $X^{A1}$ and $L^{A1}$ in the general formula (A), respectively, and preferable ranges thereof are also the same.

The group represented by A in the general formula (B) is any group as long as the group can be bonded to the DyeIII group via an ionic bond or a coordinate bond. Examples of the group that can be bonded to the DyeIII group via an ionic bond may be an anionic group or a cationic group. Examples of the anionic group include an anionic group having a pKa of 12 or less, preferably a pKa of 7 or less, and more preferably a pKa of 5 or less, such as a carboxyl group, a phospho group, a sulfo group, an acyl sulfonamido group, a sulfonimido group, and the like. The anionic group may be linked with Ma or a heterocyclic group in the DyeIII via an ionic bond or a coordinate bond, and is preferably linked with Ma via an ionic bond.

Preferable specific examples of the anionic group are shown below, but the present invention is not particularly limited thereto. In the anionic groups shown below, R's each independently represent a hydrogen atom, an alkyl group, an aryl group, or a heterocyclic group.

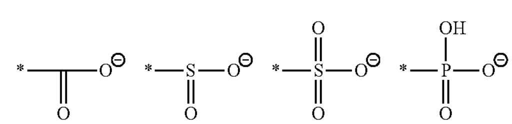

-continued

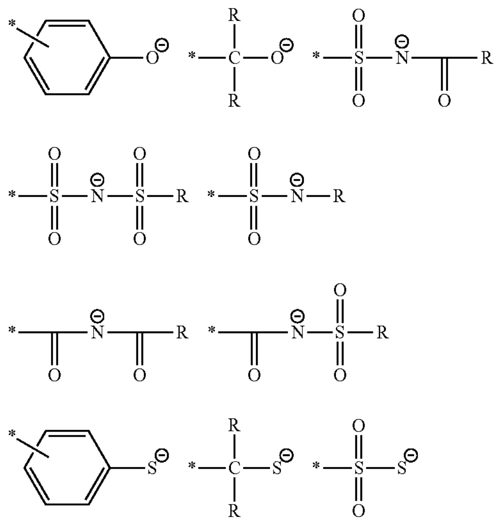

The cationic group represented by A in the general formula (B) is preferably a substituted or unsubstituted onium cation (such as a substituted or unsubstituted ammonium group, a substituted or unsubstituted pyridinium group, a substituted or unsubstituted imidazolium group, a substituted or unsubstituted sulfonium group, a substituted or unsubstituted phosphonium group, and the like), and particularly preferably a substituted ammonium group.

A can be bonded to an anion moiety (COO—, $SO_3$—, O—, or the like) or a cationic moiety (the Onium cation, metal cation, and the like) included in DyeIII.

Among these, the colorant multimer having the constitutional unit represented by the general formula (B) in the present invention is preferably a radical polymer obtained by the radical polymerization using a colorant monomer having an ethylenically unsaturated bond from the viewpoint of heat resistance.

Specific examples of the constitutional unit represented by the general formula (B) are shown below, but the present invention is not limited thereto.

(B-1)

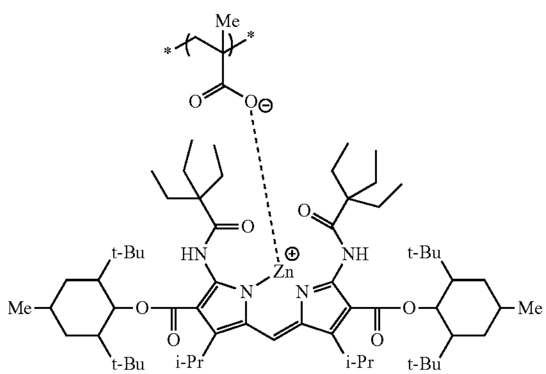

(B-2)

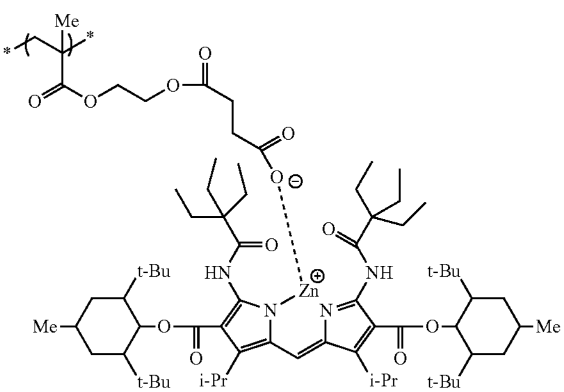

(B-3)

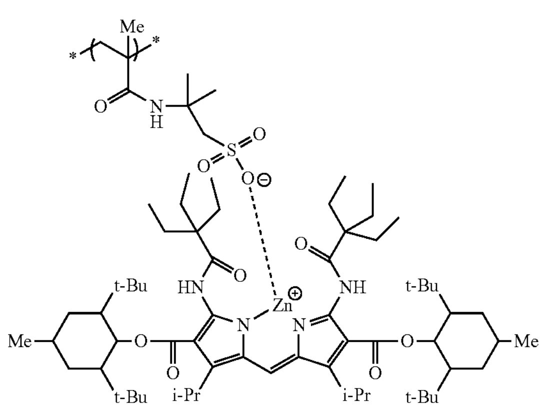

(B-4)

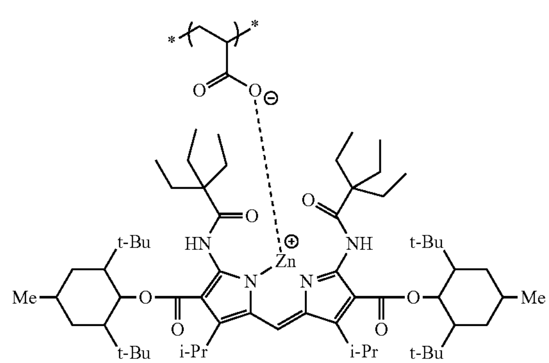

-continued
(B-5)
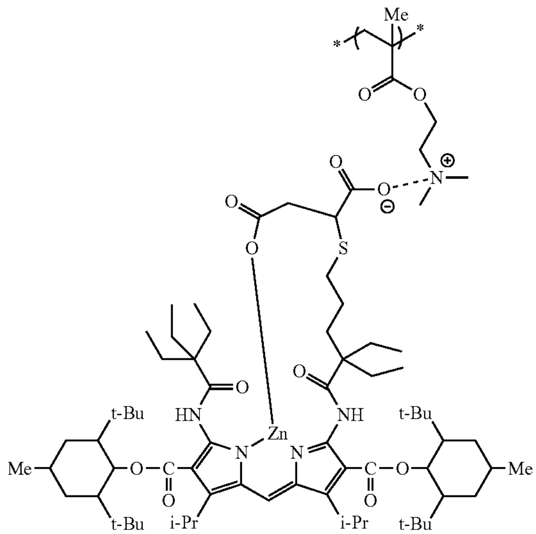
(B-6)
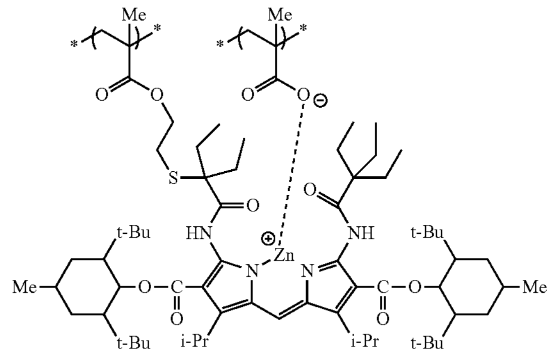
(B-7)
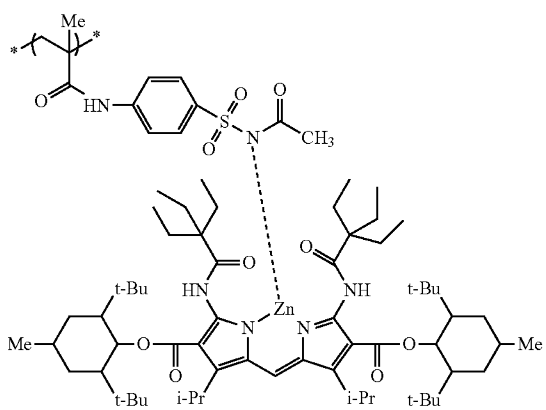
(B-8)
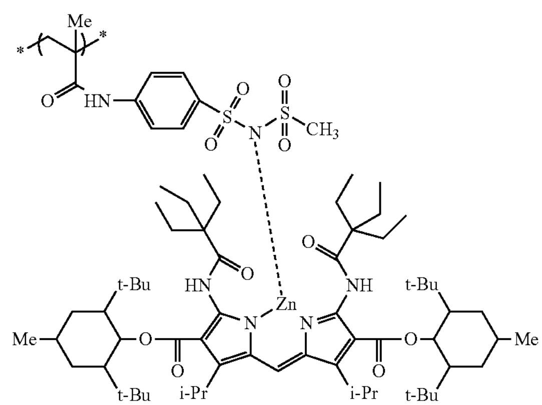
(B-dp-1)
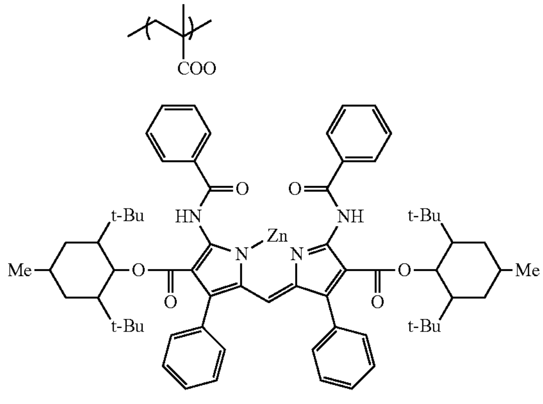
(B-tp-1)
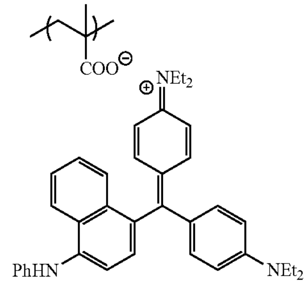

-continued (B-tp-2)

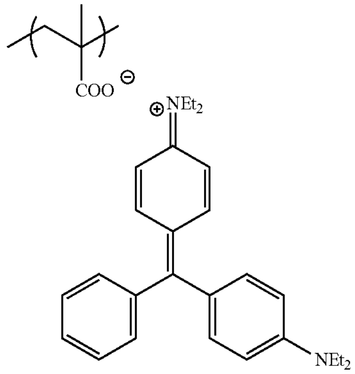

(B-pm-1)

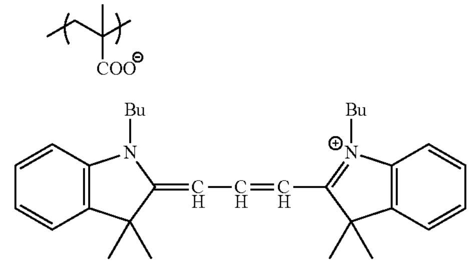

(B-sp-1)

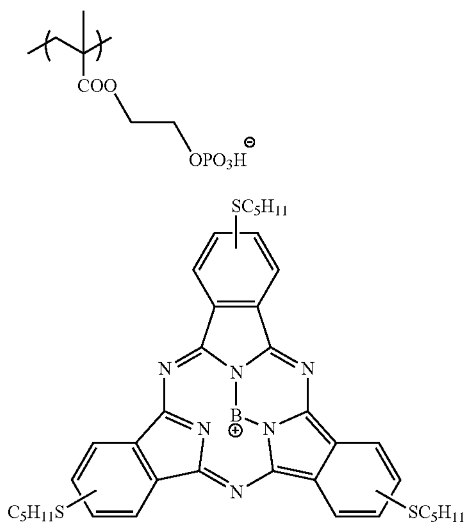

(B-pm-2)

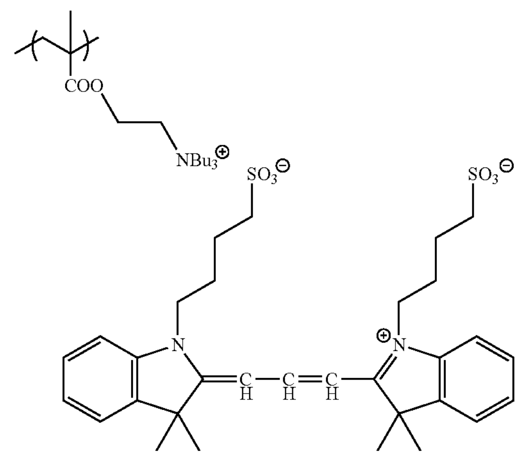

<Constitutional Unit Represented by General Formula (C)>

Next, the constitutional unit represented by the general formula (C) will be described in detail.

$$* - [\text{DyeIV-}(L^{C1})_{m3}] - * \qquad (C)$$

(in the general formula (C), $L^{C1}$ represents a single bond or a divalent linking group; DyeIV represents a colorant structure, and examples thereof include a colorant structure formed by removing any p hydrogen atoms from the dipyrromethene metal complex compound obtained from the dipyrromethene compound represented by the general formula (M) and a metal or a metal compound; p represents 1 or 2; and m3 represents an integer of 1 to 4, and when m3 is 2 or more, the $L^{C1}$ structures may be the same as or different from each other.)

In the general formula (C), preferable examples of the divalent linking group represented by $L^{C1}$ include substituted or unsubstituted linear alkylene groups having 1 to 30 carbon atoms (such as a methylene group, an ethylene group, a trimethylene group, a propylene group, a butylene group, and the like), substituted or unsubstituted allylene groups having 6 to 30 carbon atoms (such as a phenylene group, a naphthalene group, and the like), substituted or unsubstituted heterocyclic linking groups, —CH═CH—, —O—, —S—, —NR— (wherein R's each independently represent a hydrogen atom, an alkyl group, an aryl group, or a heterocyclic group), —C(═O)—, —SO—, —$SO_2$—, and a linking group formed by linking two or more of these groups.

Specific examples of ones that are preferably used as the divalent linking group represented by $L^{C1}$ in the general formula (C) are shown below, but the present invention is not limited thereto.

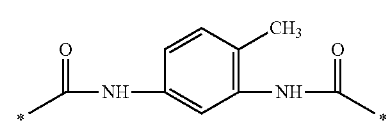

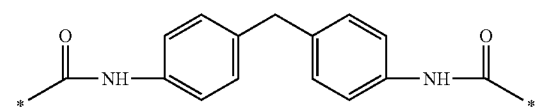

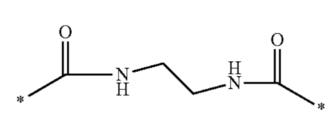

-continued
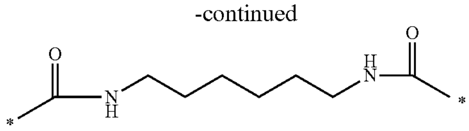
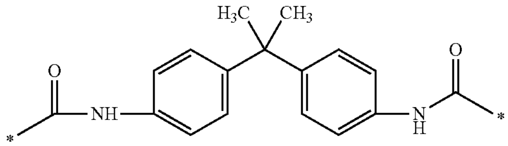
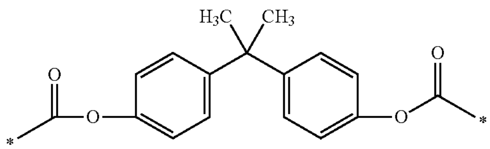
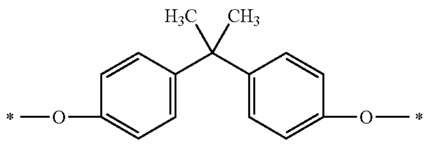
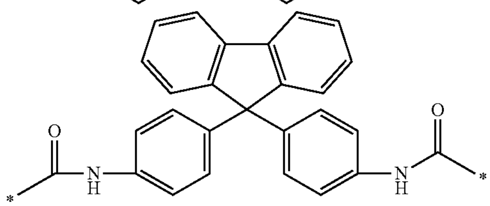
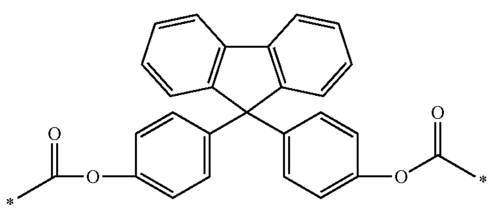
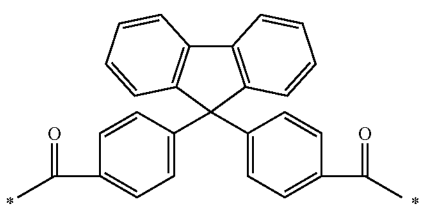
-continued
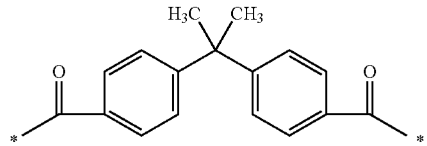
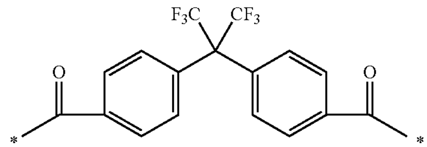
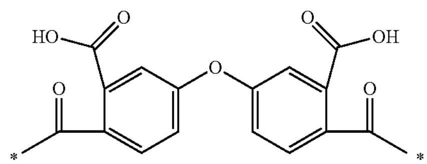
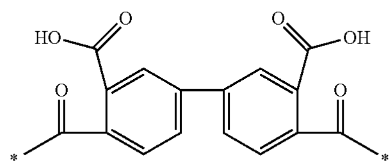
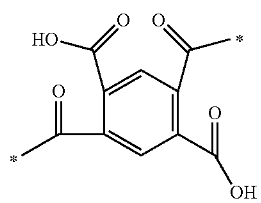
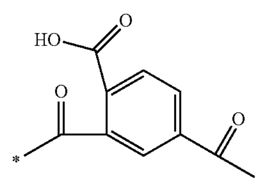
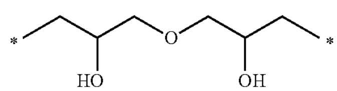
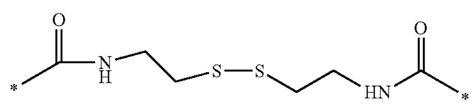
Specific examples of the constitutional unit represented by the general formula (C) are shown below, but the present invention is not limited thereto.
(C-1)
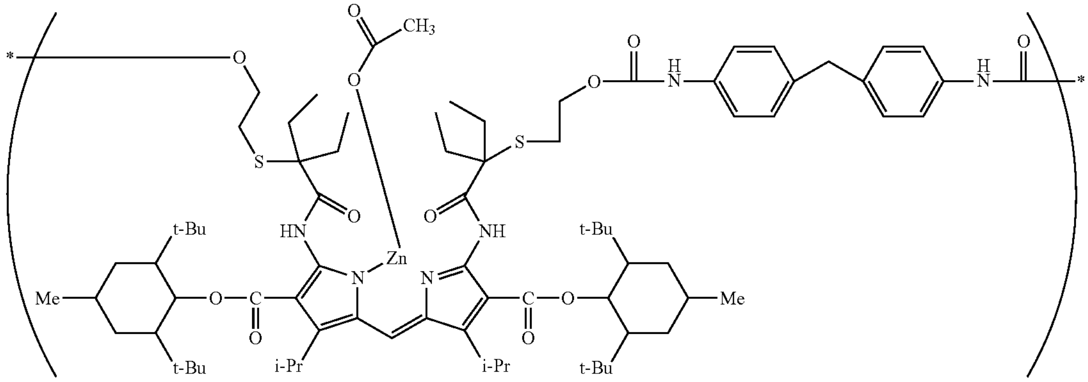

-continued
(C-2)
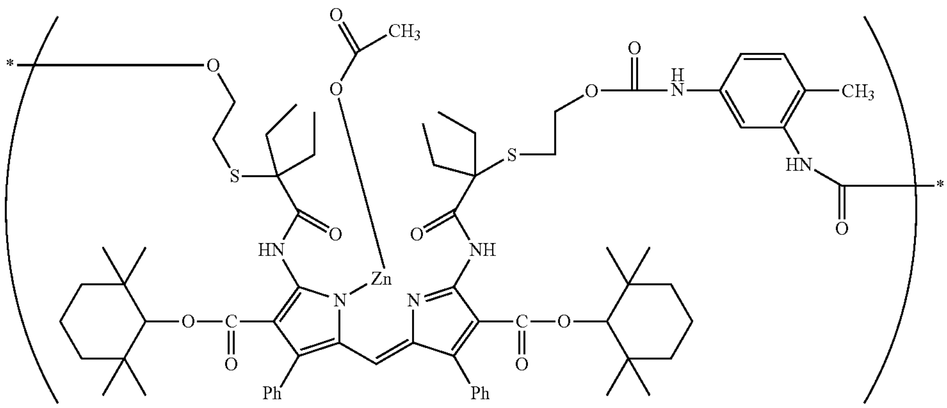
(C-3)
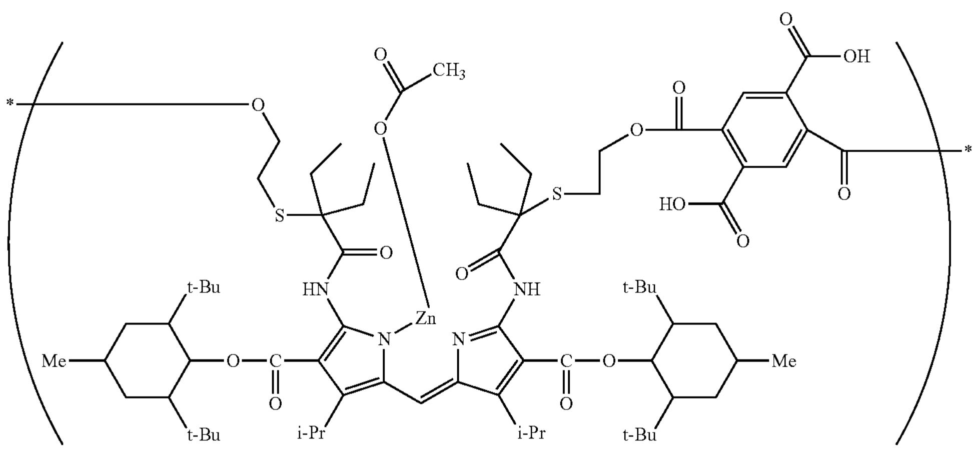
(C-4)
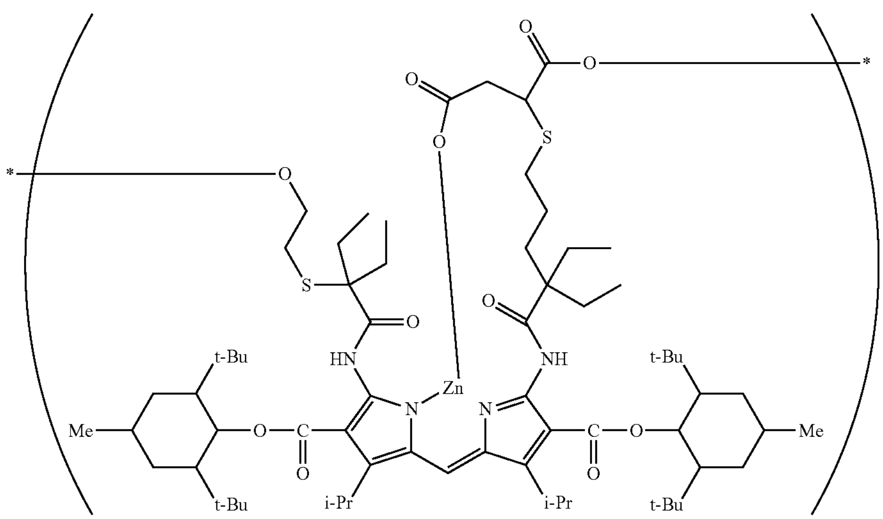

-continued
(C-5)
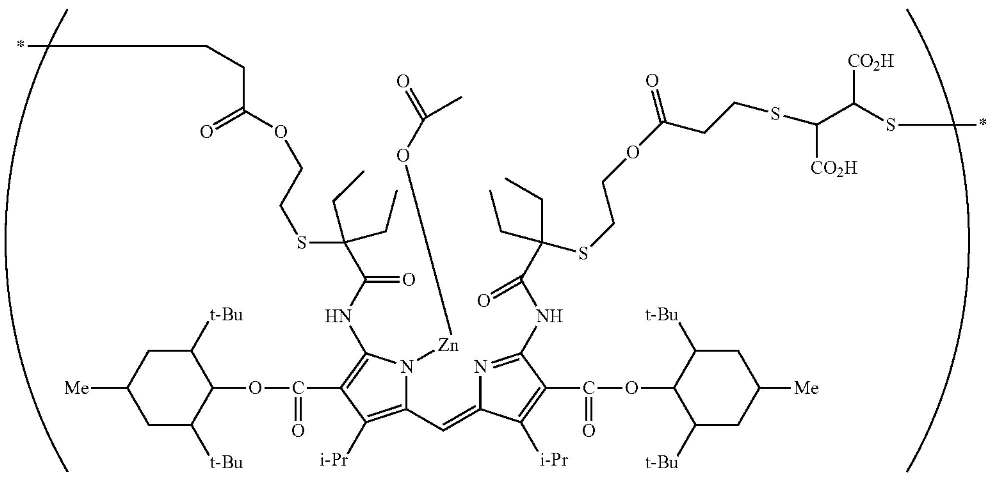
(C-az-1)
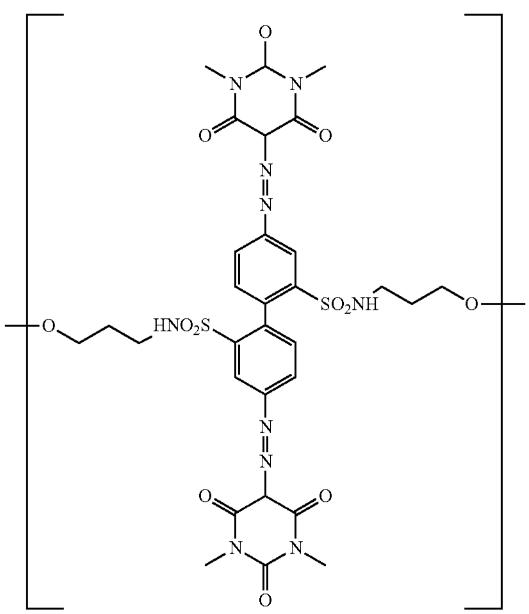
(C-pm-1)
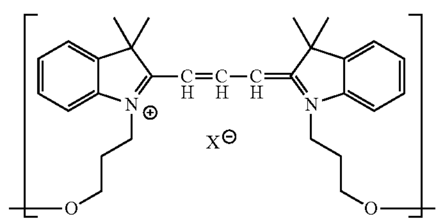
(C-aq-1)
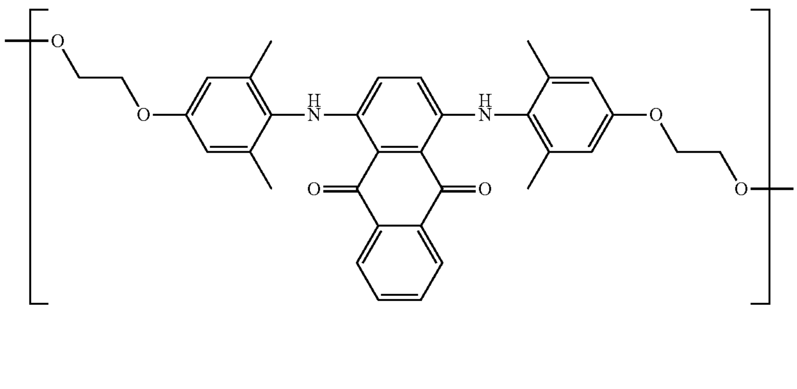

-continued (C-sq-1)

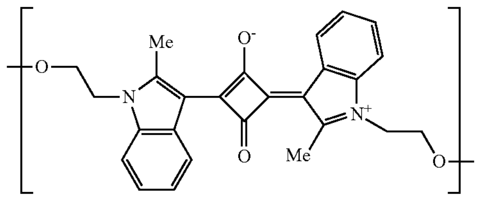

(C-az-2)

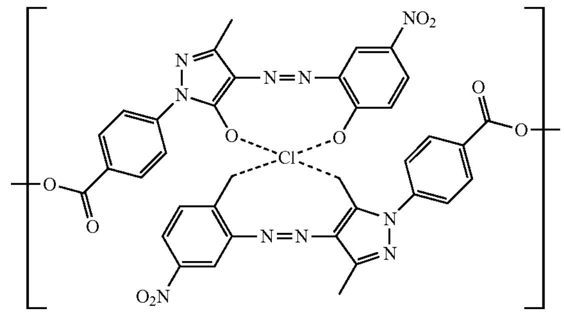

<Copolymerization Components>

The colorant multimer of the present invention may be formed from the constitutional units represented by the general formula (A), the general formula (B), and the general formula (C), but may be multimerized with other constitutional units. Preferable examples of such other constitutional units include constitutional units shown below and specific examples thereof are shown, but the present invention is not limited thereto.

(H-1)

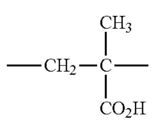

(H-2)

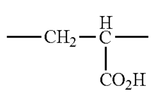

(H-3)

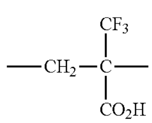

(H-4)

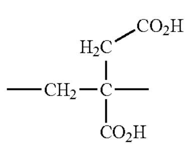

(H-5)

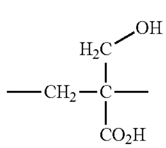

(H-6)

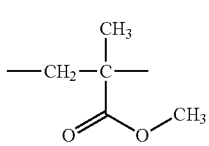

(H-7)

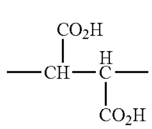

-continued (H-8)

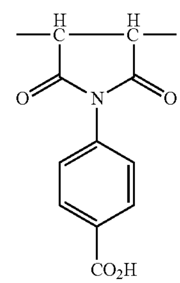

(H-9)

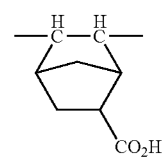

(H-10)

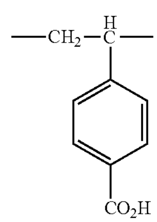

(H-11)

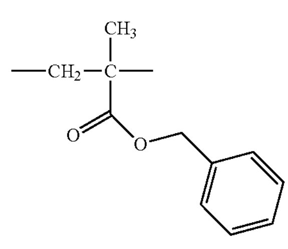

(H-12)

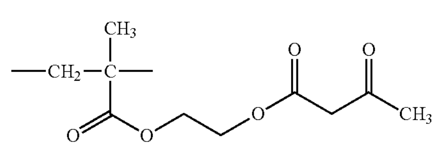

(H-13)

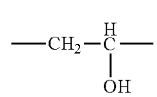

-continued
(H-14)
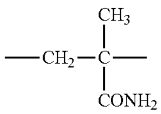
(H-15)
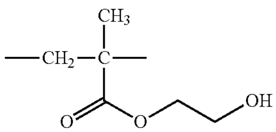
(H-16)
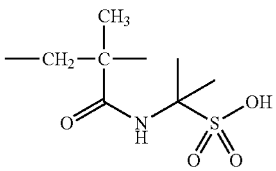
(H-17)
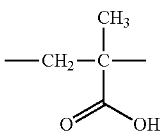
(H-18)
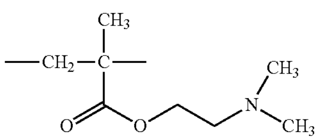
(H-19)
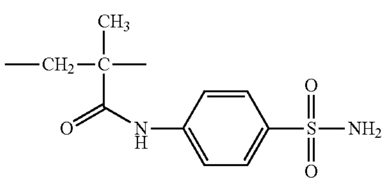
(H-20)
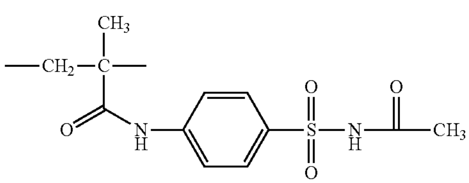
(H-21)
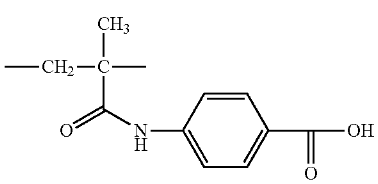
(H-22)
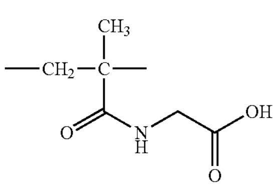
-continued
(H-23)
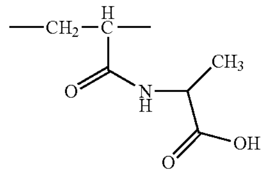
(H-24)
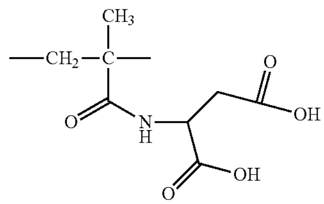
(H-25)
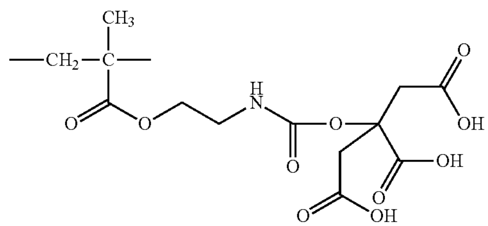
(H-26)
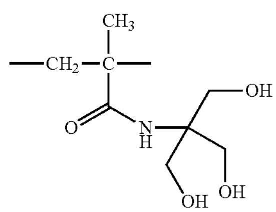
(H-27)
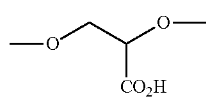
(H-28)
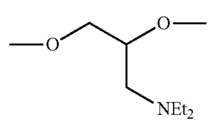
(H-29)
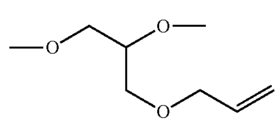
(H-30)
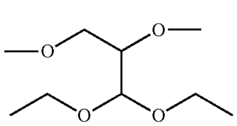
(H-31)
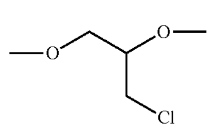

-continued (H-32)

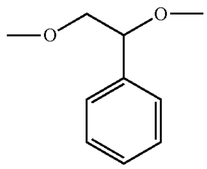

Furthermore, a constitutional unit having a polymerizable group may be included as the other constitutional unit. Examples of the constitutional unit having a polymerizable group include the following constitutional units.

That is, the constitutional unit having a polymerizable group is a constitutional unit formed by adding, to a constitutional unit derived from the above-described copolymerization component (such as methacrylic acid, acrylic acid, hydroxyethyl methacrylate, and the like), a polymerizable compound (such as glycidyl methacrylate, methacryloxyethyl isocyanate, and the like) having a group that reacts with the constitutional unit.

The polymerizable group included in the constitutional unit having a polymerizable group (which may be hereinafter referred to as a "polymerizable unit" in some cases) is not particularly limited, but examples thereof include ethylenically unsaturated groups (such as a methacryl group, an acryl group, a styryl group, and the like), cyclic ether groups (such as an epoxy group, an oxetanyl group, and the like), etc. Among these, an ethylenically unsaturated group is preferable in view of heat resistance and solvent resistance.

Specific examples of the constitutional unit having a polymerizable group are shown below, and the present invention is not limited thereto.

G-1

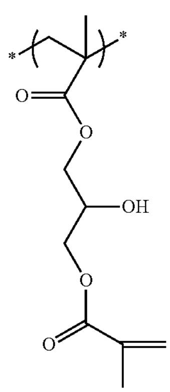

G-2

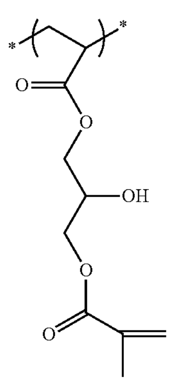

-continued

G-3

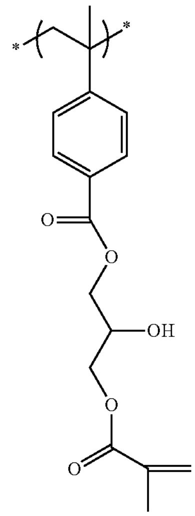

G-4

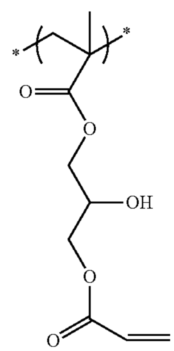

(G-5)

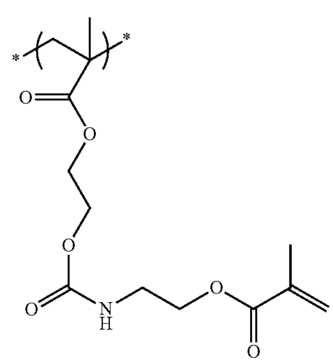

(G-6)

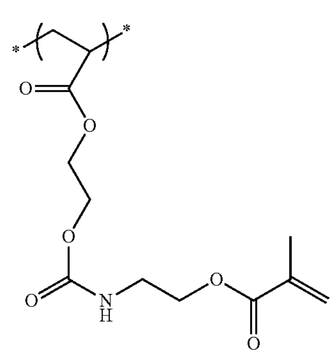

-continued (G-7)

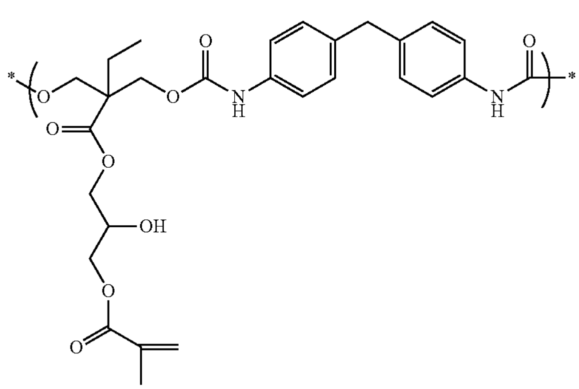

(G-8)

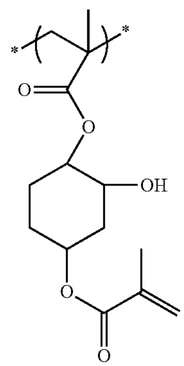

(G-9)

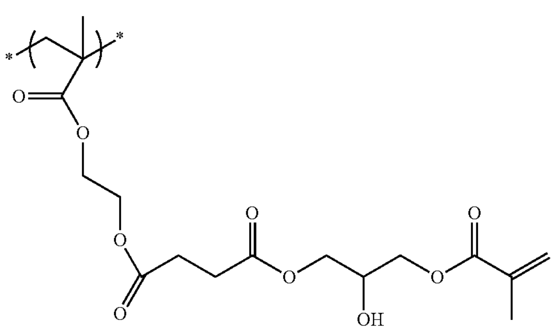

(G-10)

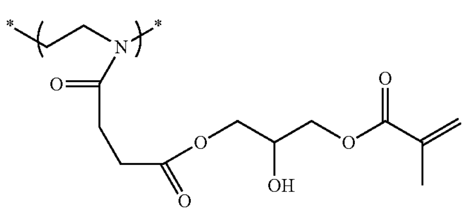

-continued (G-11)

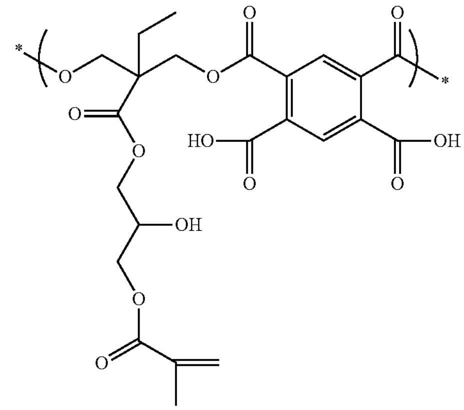

(G-12)

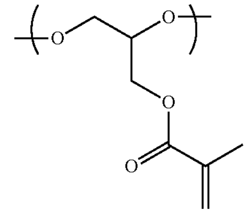

(G-13)

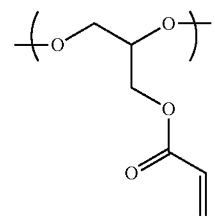

(G-14)

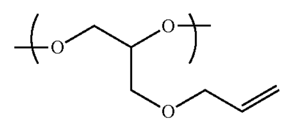

(G-15)

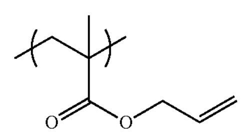

(G-16)

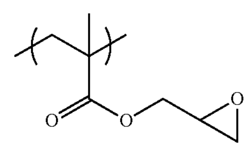

(G-17)

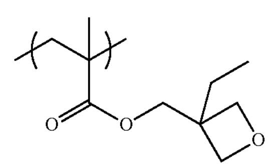

<Color Multimer Represented by General Formula (D)>

Next, the color multimer represented by the general formula (D) will be described in detail.

$$(L^{D1})\!-\!\!\left(\mathrm{DyeV}\right)_{m4} \quad \text{(D)}$$

(in the general formula (C), $L^{D1}$ represents a m4-valent linking group; m4 represents an integer of 2 to 100, and when m4 is 2 or more, the DyeV structures may be the same as or different from each other; DyeV represents a colorant structure, and examples thereof include a colorant structure formed by removing any p hydrogen atoms from the dipyrromethene metal complex compound obtained from the dipyrromethene compound represented by the general formula (M) and a metal or a metal compound; and p represents 1 or 2.)

In the general formula (D), m4 is preferably 2 to 80, more preferably 2 to 40, and particularly preferably 2 to 10.

In the general formula (D), when m4 is 2, examples of the divalent linking group represented by $L^{D1}$ include substituted or unsubstituted alkylene groups having 1 to 30 carbon atoms (such as a methylene group, an ethylene group, a trimethylene group, a propylene group, a butylene group, and the like), substituted or unsubstituted allylene groups having 6 to 30 carbon atoms (such as a phenylene group, a naphthalene group, and the like), substituted or unsubstituted heterocyclic linking groups, —CH═CH—, —O—, —S—, —NR— (wherein R's each independently represent a hydrogen atom, an alkyl group, an aryl group, or a heterocyclic group), —C(═O)—, —SO—, —$SO_2$—, and a linking group formed by linking two or more of these groups.

When m4 represents an integer of 3 or more, examples of the m4-valent linking group include substituted or unsubstituted arylene groups (such as a 1,3,5-phenylene group, a 1,2,4-phenylene group, a 1,4,5,8-naphthalene group, and the like), heterocyclic linking groups (such as a 1,3,5-triazine group and the like), and a linking group formed by the substitution of an alkylene linking group or the like as a mother skeleton by the divalent linking group described above.

Specific examples of L4 in the general formula (D) are shown below, but the present invention is not limited thereto.

(L4-1)

$*—CH_2CH_2CH_2CH_2—*$ (L4-2)

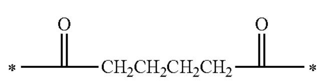

(L4-3)

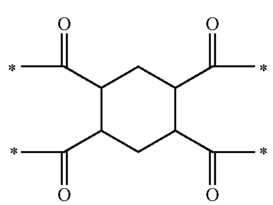

(L4-4)

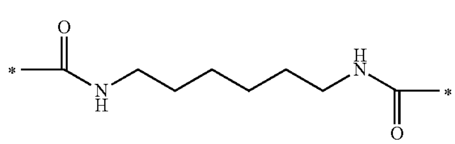

(L4-5)

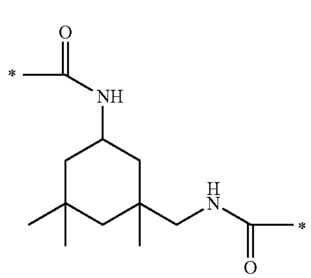

-continued (L4-6)

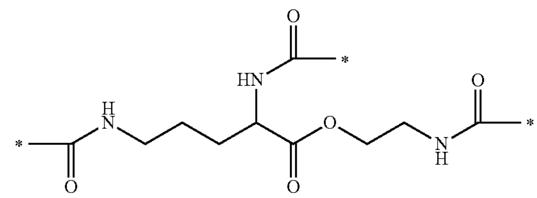

(L4-7)

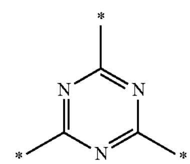

(L4-8)

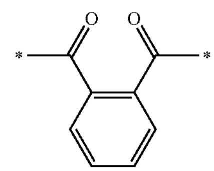

(L4-9)

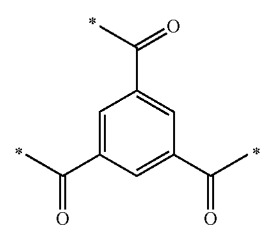

(L4-10)

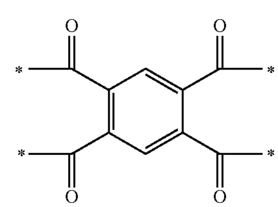

(L4-11)

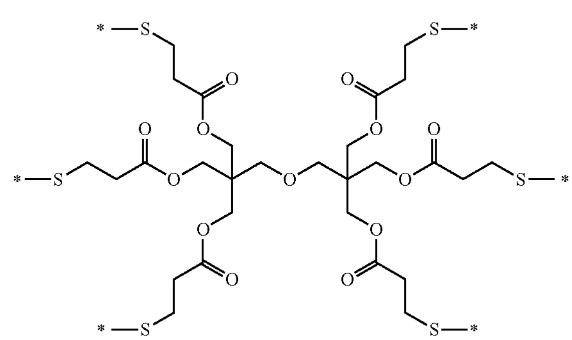

-continued
(L4-12)
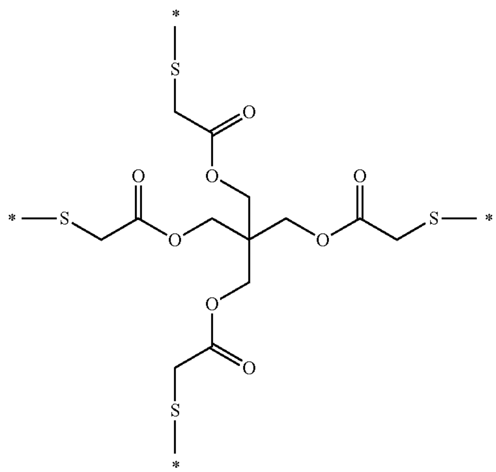
-continued
(L4-13)
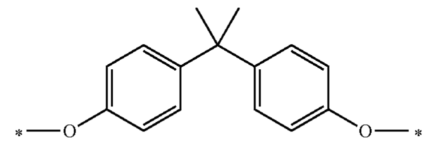
(L4-14)
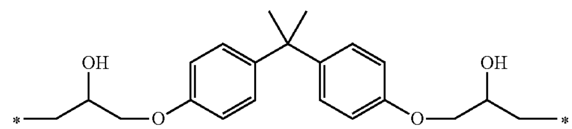
Specific examples of DyeIV in the general formula (D) are shown below, but the present invention is not limited thereto.
(D-sq-1)
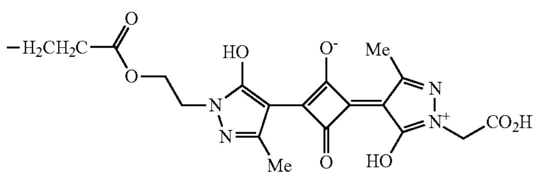
(D-az-1)
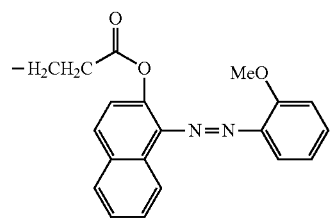
(D-az-2)
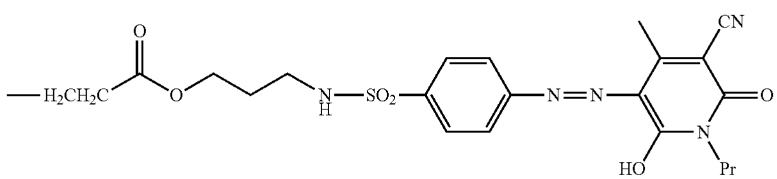
(D-tp-1)
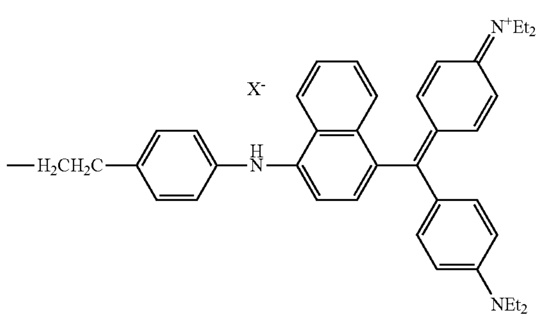
(D-sp-1)
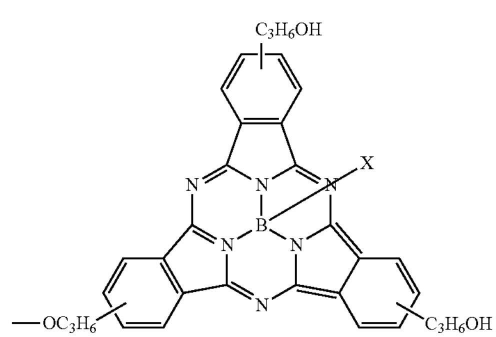

-continued
(D-qp-1)
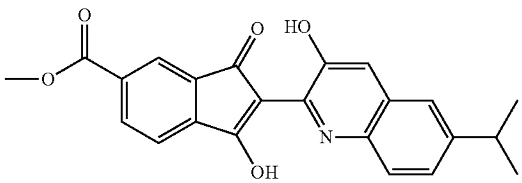
(D-xt-1)
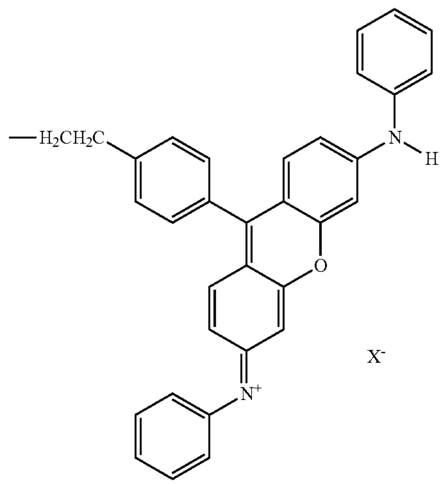
(D-az-3)
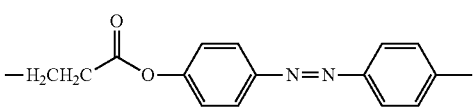
(D-aq-1)
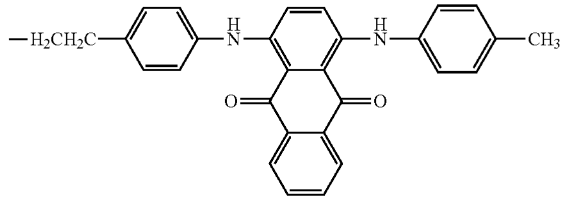
Specific examples of the colorant multimer represented by the general formula (D) are shown below, but the present invention is not limited thereto.
(D-1)
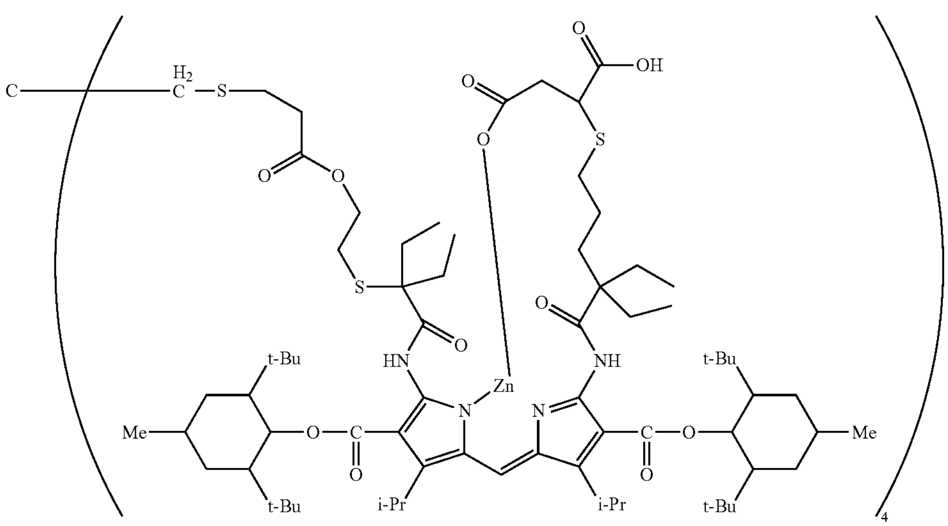

-continued
(D-2)
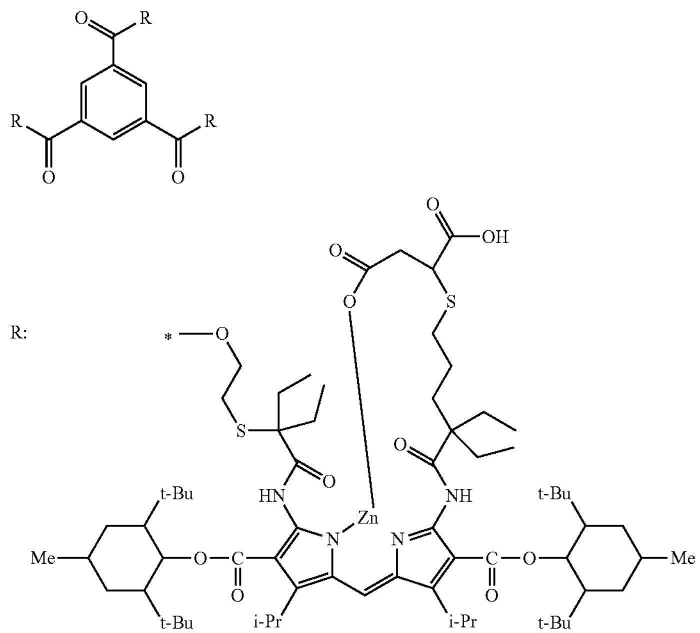
(D-3)
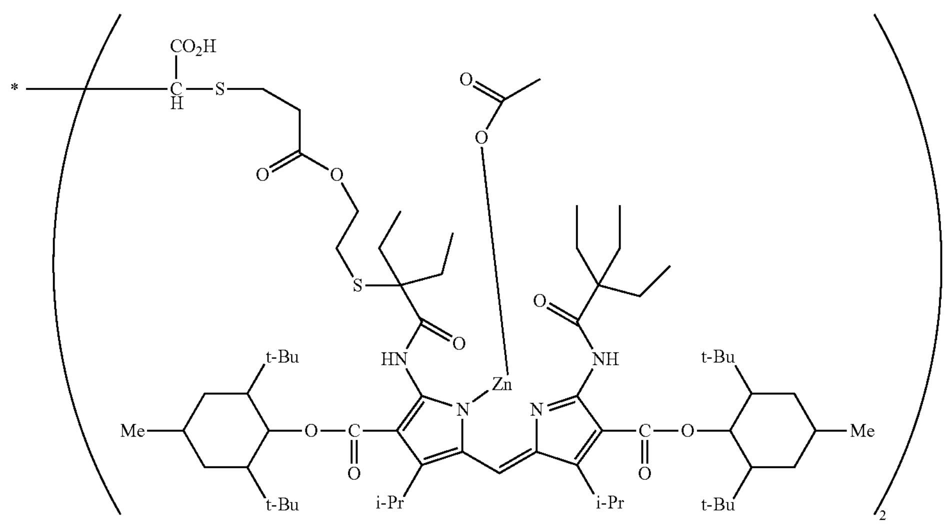
(D-4)
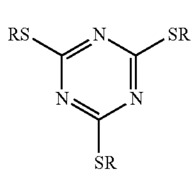

-continued
R:
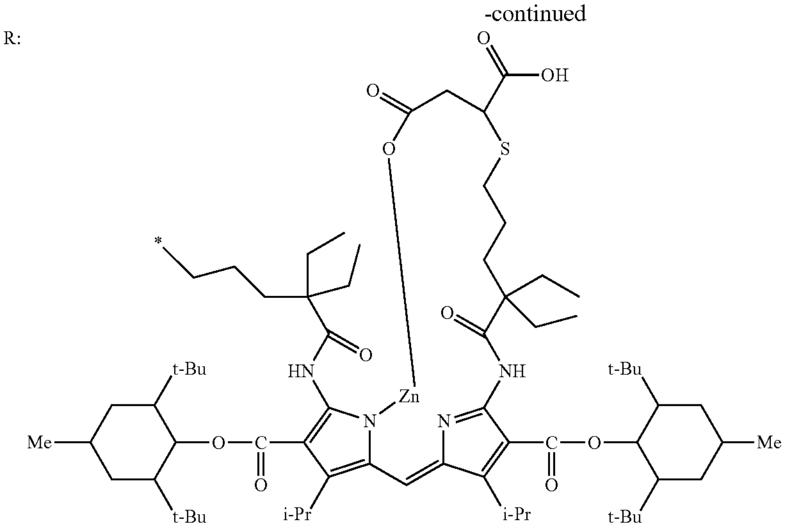
(D-5)
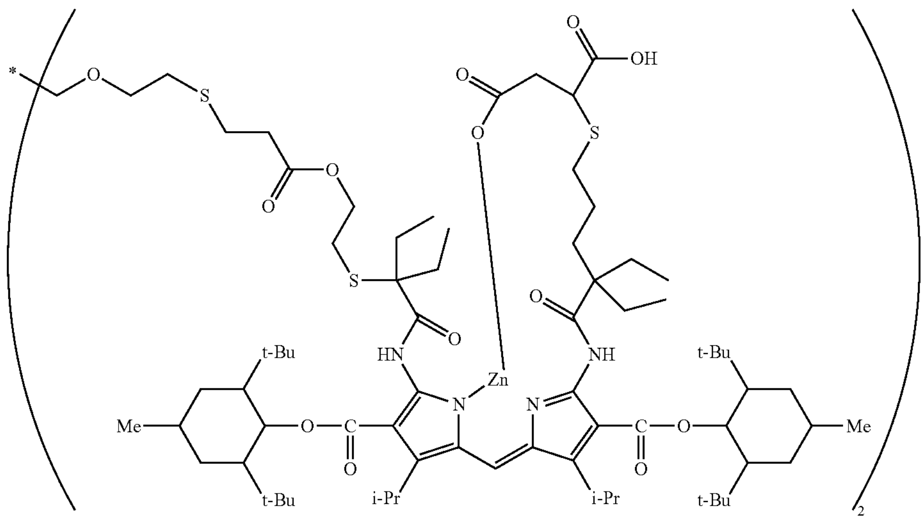
(D-6)
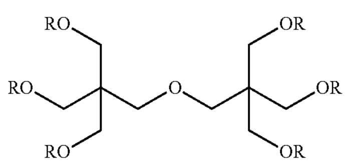
R:
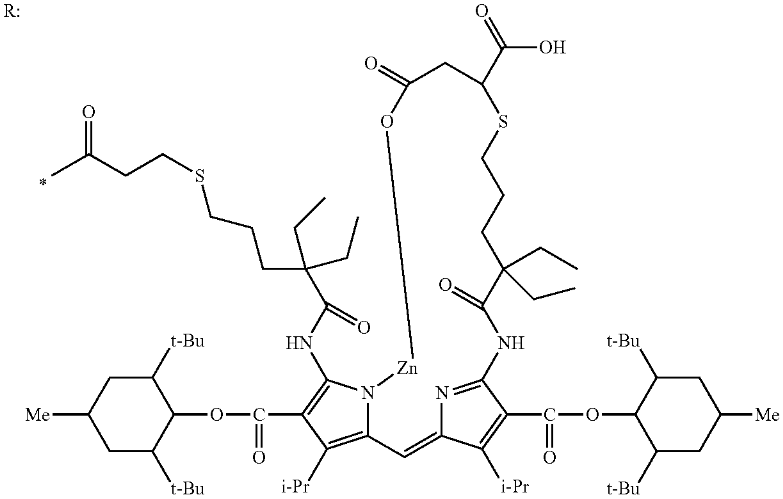

-continued (D-7)

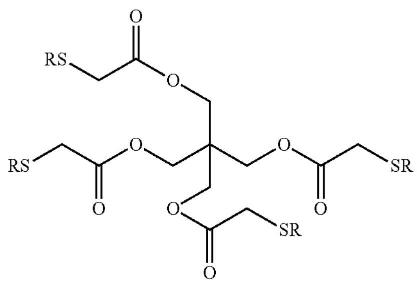

R

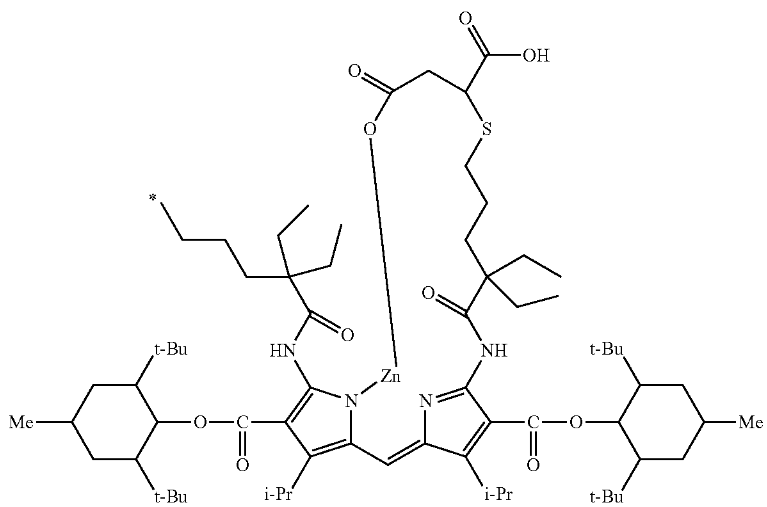

Preferable examples of the colorant multimer of the present invention are shown below, and the type and % by mass, and the weight average molecular weight and dispersity of the constitutional units (the constitutional units as described above) are denoted and shown in Tables 1 and 2 below.

TABLE 1

| Exemplary | Constitutional unit 1 | | Constitutional unit 2 | | Constitutional unit 3 | | Molecular weight | Dispersity |
|---|---|---|---|---|---|---|---|---|
| Compound | Type | Mass | Type | Mass | Type | Mass | Mw | Mw/Mn |
| S-1 | A-1 | 88 | H-1 | 12 | — | | 8000 | 1.9 |
| S-2 | A-2 | 100 | — | | — | | 7200 | 2.3 |
| S-3 | A-2 | 88 | H-1 | 12 | — | | 9000 | 1.7 |
| S-4 | A-2 | 88 | H-1 | 12 | — | | 15000 | 1.8 |
| S-5 | A-2 | 82 | H-1 | 18 | — | | 5500 | 2.2 |
| S-6 | A-2 | 88 | H-1 | 6 | G-1 | 6 | 7800 | 1.8 |
| S-7 | A-2 | 88 | H-1 | 9 | G-1 | 3 | 8100 | 1.8 |
| S-8 | A-2 | 82 | H-1 | 12 | G-1 | 6 | 6400 | 2.6 |
| S-9 | A-2 | 82 | H-1 | 12 | H-3 | 6 | 7900 | 1.5 |
| S-10 | A-2 | 82 | H-1 | 12 | H-12 | 6 | 9100 | 1.8 |
| S-11 | A-2 | 82 | H-1 | 12 | H-20 | 6 | 10000 | 1.7 |
| S-12 | A-2 | 88 | H-3 | 12 | — | | 7400 | 2 |
| S-13 | A-2 | 88 | H-4 | 12 | — | | 6000 | 2.3 |
| S-14 | A-2 | 88 | H-12 | 12 | — | | 8500 | 1.8 |
| S-15 | A-2 | 88 | H-20 | 12 | — | | 8400 | 1.7 |
| S-16 | A-3 | 100 | — | | — | | 9600 | 1.9 |
| S-17 | A-3 | 88 | H-1 | 12 | — | | 5700 | 1.9 |
| S-18 | A-3 | 82 | H-1 | 18 | — | | 12000 | 2.1 |
| S-19 | A-3 | 88 | H-1 | 6 | G-1 | 6 | 9900 | 1.8 |
| S-20 | A-4 | 100 | — | | — | | 8700 | 2.3 |
| S-21 | A-4 | 88 | H-1 | 12 | — | | 7400 | 1.7 |
| S-22 | A-4 | 82 | H-1 | 18 | — | 6 | 6300 | 2 |
| S-23 | A-4 | 88 | H-1 | 6 | G-1 | | 7500 | 1.8 |
| S-24 | A-5 | 100 | — | | — | | 7600 | 1.8 |

TABLE 1-continued

| Exemplary | Constitutional unit 1 | | Constitutional unit 2 | | Constitutional unit 3 | | Molecular weight | Dispersity |
|---|---|---|---|---|---|---|---|---|
| Compound | Type | Mass | Type | Mass | Type | Mass | Mw | Mw/Mn |
| S-25 | A-5 | 88 | H-1 | 12 | — | 6 | 14000 | 2 |
| S-26 | A-5 | 88 | H-1 | 6 | G-1 | 3 | 6900 | 2.4 |
| S-27 | A-5 | 88 | H-1 | 9 | G-1 | 6 | 8400 | 1.9 |
| S-28 | A-5 | 82 | H-1 | 12 | H-3 | 6 | 9600 | 1.7 |
| S-29 | A-5 | 82 | H-1 | 12 | H-20 | 6 | 9400 | 1.7 |
| S-30 | A-5 | 88 | H-3 | 12 | — | | 7600 | 2.1 |

TABLE 2

| Exemplary | Constitutional unit 1 | | Constitutional unit 2 | | Constitutional unit 3 | | Molecular weight | Dispersity |
|---|---|---|---|---|---|---|---|---|
| Compound | Type | Mass | Type | Mass | Type | Mass | Mw | Mw/Mn |
| S-31 | A-5 | 88 | H-1 | 12 | — | | 8000 | 1.9 |
| S-32 | A-7 | 88 | H-1 | 12 | — | | 6000 | 1.9 |
| S-33 | A-8 | 88 | H-1 | 12 | — | | 9400 | 1.6 |
| S-34 | A-9 | 88 | H-1 | 12 | — | | 5900 | 2.1 |
| S-35 | A-10 | 88 | H-1 | 12 | — | | 8300 | 1.9 |
| S-36 | A-15 | 88 | H-1 | 12 | — | | 11000 | 1.7 |
| S-37 | A-19 | 88 | H-1 | 12 | — | | 8700 | 1.8 |
| S-38 | A-24 | 88 | H-1 | 12 | — | | 6600 | 2.2 |
| S-39 | A-26 | 88 | H-1 | 12 | — | | 6800 | 2.1 |
| S-40 | A-27 | 88 | H-1 | 12 | — | | 8800 | 1.8 |
| S-41 | A-37 | 88 | H-1 | 12 | — | | 7600 | 1.7 |
| S-42 | A-41 | 88 | H-1 | 12 | — | | 9400 | 2.3 |
| S-43 | A-44 | 88 | H-1 | 12 | — | | 7200 | 1.9 |
| S-44 | A-45 | 88 | H-11 | 12 | — | | 7500 | 1.9 |
| S-45 | A-46 | 88 | H-1 | 12 | — | | 9000 | 2.2 |
| S-46 | B-1 | 88 | H-1 | 12 | — | | 8600 | 2.2 |
| S-47 | B-1 | 82 | H-1 | 12 | H-6 | 6 | 7600 | 1.9 |
| S-48 | B-4 | 82 | H-1 | 12 | G-1 | 6 | 13200 | 1.8 |
| S-49 | B-5 | 82 | H-1 | 12 | H-18 | 6 | 9800 | 1.9 |
| S-50 | B-6 | 88 | H-1 | 12 | — | | 7600 | 2.3 |
| S-51 | B-6 | 82 | A-6 | 6 | H-1 | 12 | 7900 | 2.1 |
| S-52 | C-1 | 100 | — | | — | | 5400 | 1.2 |
| S-53 | C-5 | 100 | — | | — | | 5900 | 1.3 |
| S-54 | D-1 | 100 | — | | — | | 4800 | 1.2 |
| S-55 | D-2 | 100 | — | | — | | 3700 | 1.4 |
| S-56 | D-4 | 100 | — | | — | | 4400 | 1.3 |
| S-57 | D-6 | 100 | — | | — | | 4900 | 1.1 |
| S-58 | D-7 | 100 | — | | — | | 5900 | 1.2 |

Among the colorant multimers having constitutional unit(s) represented by the general formula (A), the general formula (B), and/or the general formula (C) and the constitutional unit represented by the general formula (D), the colorant multimers having constitutional units represented by the general formula (A) and the general formula (C), and the colorant multimer represented by the general formula (D) which has a partial structure derived from a colorant covalently bonded in the molecular structure, and therefore, enables the colored curable composition including the colorant multimer to have heat resistance. Accordingly, when the colored curable composition is employed in the pattern formation having a high-temperature process, an effect of suppression of color transfer to adjacent other colored patterns is obtained, which is thus preferable. Further, the colorant multimer of the present invention preferably includes a constitutional unit represented by the general formula (A), the general formula (B), or the general formula (C), and among these, the constitutional unit represented by the general formula (A) is preferably included from the viewpoint of easy control of the molecular weight of the colorant multimer. In addition, the constitutional unit represented by the general formula (A) is preferably formed using the colorant monomer represented by the following general formula (1) as a polymerization component.

The colorant monomer represented by the general formula (1) will be described in detail.

<Colorant Monomer Represented by General Formula (1)>

The colorant monomer that is included in the colorant multimer of the present invention as a polymerization component will be described in detail.

The colorant monomer is a compound represented by the following general formula (1).

(1)

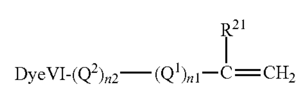

(in the general formula (1), $R^{21}$ represents a hydrogen atom, a halogen atom, an alkyl group, or an aryl group;*$Q^1$ represents —N($R^2$)C(═O)—, —OC(═O)—, —C(═O)N($R^2$)—, —C(═O)O—, a group represented by the following general formula (2), a group represented by the following general formula (3), or a group represented by the following general formula (4); $Q^2$ represents a divalent linking group; n1 and n2 each independently represent 0 or 1; DyeIV represents a colorant structure, and examples thereof include a colorant structure formed by removing any p hydrogen atoms from the dipyrromethene metal complex compound obtained from the dipyrromethene compound represented by the general formula (7) or (8) and a metal or a metal compound; p represents 1 or 2; and $R^2$ in Q' represents a hydrogen atom, an alkyl group, an aryl group, or a heterocyclic group.)

(2)

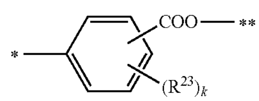

(3)

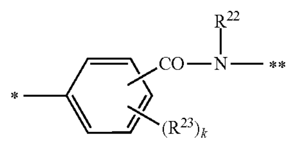

(4)

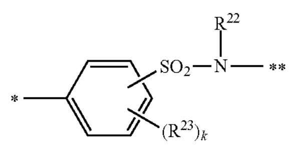

(in the general formulae (2) to (4), $R^{22}$ represents a hydrogen atom, an alkyl group, an aryl group, or a heterocyclic group; plural $R^{23}$'s each independently represent a hydrogen atom or a monovalent substituent; k represents an integer of 0 to 4 and when k is 2 or more, $R^{23}$'s may be the same as or different from each other; * represents a position to which the —$C(R^{21})$=$CH_2$ group in the general formula (1) is bonded; and ** represents a position to which $Q^2$ or DyeVI (in the case of n2=0) in the general formula (1) is bonded.)

(7)

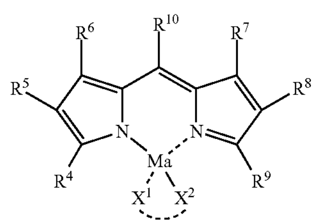

In the general formula (7), $R^4$ to $R^9$ each independently represent a hydrogen atom or a monovalent substituent; $R^{10}$ represents a hydrogen atom, a halogen atom, an alkyl group, an aryl group, or a heterocyclic group; Ma represents a metal atom or metal compound; $X^1$ represents a group that can be bonded to Ma; $X^2$ represents a group that neutralizes the charge of Ma; and $X^1$ and $X^2$ may be bonded to each other to form a 5-, 6-, or 7-membered ring together with Ma, provided that $R^4$ and $R^9$ are not bonded to each other to form a ring.

Furthermore, examples of the dipyrromethene metal complex represented by the general formula (7) include tautomers thereof.

(8)

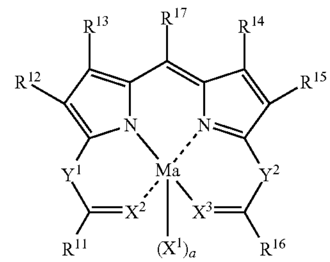

In the general formula (8), $R^{11}$ and $R^{16}$ each independently represent an alkyl group, an alkenyl group, an aryl group, a heterocyclic group, an alkoxy group, an aryloxy group, an alkylamino group, an arylamino group, or a heterocyclic amino group; $R^{12}$ to $R^{15}$ each independently represent a hydrogen atom or a monovalent substituent; $R^{17}$ represents a hydrogen atom, a halogen atom, an alkyl group, an aryl group, or a heterocyclic group; Ma represents a metal atom or metal compound; $X^2$ and $X^3$ each independently represent NR (wherein R represents a hydrogen atom, an alkyl group, an alkenyl group, an aryl group, a heterocyclic group, an acyl group, an alkylsulfonyl group, or an arylsulfonyl group), a nitrogen atom, an oxygen atom, or a sulfur atom; $Y^1$ and $Y^2$ each independently represent $NR^c$ (wherein $R^c$ represents a hydrogen atom, an alkyl group, an alkenyl group, an aryl group, a heterocyclic group, an acyl group, an alkylsulfonyl group, or an arylsulfonyl group), a nitrogen atom or a carbon atom; $R^{11}$ and $Y^1$ may be bonded to each other to form a 5-, 6-, or 7-membered ring, and $R^{16}$ and $Y^2$ may be bonded to each other to form a 5-, 6-, or 7-membered ring; $X^1$ represents a group that can be bonded to Ma; and a represents 0, 1, or 2.

Further, the dipyrromethene metal complex compound represented by the general formula (8) also includes a tautomer thereof.

That is, the colorant monomer represented by the general formula (1) is a compound in which a polymerizable group represented by -$(Q^2)$n2-$(Q^1)$n1-$C(R^{21})$=$CH_2$ in the general formula (1) is introduced into the dipyrromethene metal complex compound represented by the general formula (7) or the general formula (8).

Furthermore, when n1 and n2 are both 0, —$C(R^{21})$=CH2 group is directly introduced into the dipyrromethene metal complex compound. Herein, $Q^1$, $Q^2$, and $R^{21}$ each have the same definitions as $Q^1$, $Q^2$, and $R^{21}$ in the general formula (1).

In the dipyrromethene metal complex compound represented by the general formula (7), the position at which the polymerizable group is introduced is not particularly limited, but from the viewpoint of synthetic suitability, introduction of the polymerizable group at any one position of $R^4$ to $R^9$ is preferable, introduction of the polymerizable group at any one position of $R^4$, $R^6$, $R^7$, and $R^9$ is more preferable, and introduction of the polymerizable group at any one position of $R^4$ and $R^9$ is still more preferable.

In the dipyrromethene metal complex compound represented by the general formula (8), the position at which the polymerizable group is introduced is not particularly limited, but from the viewpoint of synthetic suitability, introduction at any one position of $R^4$ to $R^9$ is preferable, introduction at any one position of $R^4$ to $R^9$ is one position in any of $R^{11}$ to $R^{17}$, $X^1$, $Y^1$ to $Y^2$. Among these substituents, from the synthetic compatibility, introduction of the polymerizable group at any one position of $R^{11}$ to $R^{16}$ and $X^1$ is preferable, introduction of the polymerizable group at any one position of $R^{11}$, $R^{13}$, $R^{14}$, and $R^{16}$ is more preferable, and introduction of the polymerizable group at any one position of $R^{11}$ and $R^{16}$ is even still more preferable.

In the general formula (1), $R^{21}$ represents a hydrogen atom, a halogen atom, an alkyl group, or an aryl group. When $R^{21}$ is an alkyl group or an aryl group, it may be unsubstituted or substituted.

In the general formula (1), when $R^{21}$ is an alkyl group, it is preferably a substituted or unsubstituted alkyl group having 1 to 36 carbon atoms, and more preferably a substituted or unsubstituted alkyl group having 1 to 6 carbon atoms. Examples of the alkyl group include a methyl group, an ethyl group, a propyl group, a butyl group, an octyl group, an isopropyl group, a cyclohexyl group, and the like.

In the general formula (1), when $R^{21}$ is an aryl group, it is preferably a substituted or unsubstituted aryl group having 6 to 18, more preferably a substituted or unsubstituted aryl group having 6 to 14, and still more preferably a substituted or unsubstituted aryl group having 6 to 12 carbon atoms. Examples of the aryl group include a phenyl group, a naphthyl group, and the like.

In the general formula (1), when $R^{21}$ is a substituted alkyl group or a substituted aryl group, examples of the substituent include halogen atoms (such as a fluorine atom, a chlorine atom, a bromine atom, an iodine atom), alkyl groups (preferably alkyl groups having 1 to 24 carbon atoms, and more preferably alkyl groups having 1 to 12 carbon atoms, for example, a methyl group, an ethyl group, a propyl group, a butyl group, an isopropyl group, a t-butyl group, a 2-ethylhexyl group, a dodecyl group, a cyclopropyl group, a cyclopentyl group, a cyclohexyl group, and an adamantyl group), aryl groups (preferably aryl groups having aryl groups 6 to 24 carbon atoms, and more preferably aryl groups having 6 to 12 carbon, for example, phenyl and naphthyl), heterocyclic groups (preferably heterocyclic groups having 1 to 24 carbon atoms, and more preferably heterocyclic groups having 1 to 12 carbon atoms, for example, a 2-thienyl ring group, a 4-pyridyl ring group, a 2-furyl ring group, a 2-pyrimidinyl ring group, a 1-pyridyl ring group, a 2-benzothiazolyl ring group, a 1-imidazolyl ring group, a 1-pyrazolyl ring group, and a benzotriazol-1-yl ring group), silyl groups (preferably silyl groups having 3 to 24 carbon atoms, and more preferably silyl groups having 3 to 12 carbon atoms, for example, a trimethylsilyl group, a triethylsilyl group, a tributylsilyl group, a t-butyldimethylsilyl group, and a t-hexyldimethylsilyl group), hydroxyl group, a cyano group, a nitro group, a sulfonic acid group, a phosphonic acid group, a carboxyl group, alkoxy groups (preferably alkoxy groups having 1 to 24 carbon atoms, more preferably alkoxy groups having 1 to 12 carbon atoms, and still more preferably alkoxy groups having 1 to 6 carbon atoms, for example, a methoxy group, an ethoxy group, a 1-butoxy group, a 2-butoxy group, an isopropoxy group, a t-butoxy group, and a dodecyloxy group, preferably cycloalkyloxy groups having 1 to 24 carbon atoms, more preferably cycloalkyloxy groups having 1 to 12, and still more preferably cycloalkyloxy groups having 1 to 6 carbon atoms, for example, a cyclopentyloxy group and a cyclohexyloxy group), aryloxy groups (preferably aryloxy groups having 6 to 24 carbon atoms, and more preferably aryloxy groups having 6 to 12 carbon atoms, for example, a phenoxy group and a 1-naphthoxy group), heterocyclic oxy groups (preferably heterocyclic oxy groups having 1 to 24 carbon atoms, and more preferably heterocyclic oxy groups having 1 to 12 carbon atoms, for example, a 1-phenyltetrazol-5-oxy group and a 2-tetrahydropyranyloxy group), silyloxy groups (preferably silyloxy groups having 1 to 24 carbon atoms, and more preferably silyloxy groups having 1 to 12 carbon atoms, for example, a trimethylsilyloxy group, a t-butyldimethylsilyloxy group, and a diphenylmethylsilyloxy group), acyloxy groups (preferably acyloxy groups having 2 to 24 carbon atoms, and more preferably acyloxy groups having 2 to 12 carbon atoms, for example, an acetoxy group, a pivaloyloxy group, a benzoyloxy group, and a dodecanoyloxy group), alkoxycarbonyloxy groups (preferably alkoxycarbonyloxy groups having 2 to 24 carbon atoms, more preferably alkoxycarbonyloxy groups having 2 to 12, and still more preferably alkoxycarbonyloxy groups having 2 to 6 carbon atoms, for example, an ethoxycarbonyloxy group and a t-butoxycarbonyloxy group), cycloalkyloxycarbonyloxy group (such as a cyclohexyloxycarbonyloxy group)), aryloxycarbonyloxy groups (preferably aryloxycarbonyloxy groups having 7 to 24 carbon atoms, and more preferably aryloxycarbonyloxy groups having 7 to 12 carbon atoms, for example, a phenoxycarbonyloxy group), carbamoyloxy groups (preferably carbamoyloxy groups having 1 to 24 carbon atoms, more preferably carbamoyloxy groups having 1 to 12 carbon atoms, and more preferably carbamoyloxy groups having 1 to 6 carbon atoms, for example, an N,N-dimethylcarbamoyloxy group, an N-butylcarbamoyloxy group, an N-phenylcarbamoyloxy group, and an N-ethyl-N-phenylcarbamoyloxy group), sulfamoyloxy groups (preferably sulfamoyloxy groups having 1 to 24 carbon atoms, more preferably sulfamoyloxy groups having 1 to 12 carbon atoms, and still more preferably sulfamoyloxy groups having 1 to 6 carbon atoms, for example, an N,N-diethylsulfamoyloxy group and an N-propylsulfamoyloxy group), alkylsulfonyloxy groups (preferably alkylsulfonyloxy groups having 1 to 24 carbon atoms, more preferably alkylsulfonyloxy groups having 1 to 12 carbon atoms, and still more preferably alkylsulfonyloxy groups having 1 to 6 carbon atoms, for example, a methylsulfonyloxy group, a hexadecylsulfonyloxy group, and a cyclohexylsulfonyloxy group), arylsulfonyloxy groups (preferably arylsulfonyloxy groups having 6 to 24 carbon atoms, and more preferably arylsulfonyloxy groups having 6 to 12 carbon atoms, for example, a phenylsulfonyloxy group), acyl groups (preferably acyl groups having 1 to 24 carbon atoms, and more preferably acyl groups having 1 to 12 carbon atoms, for example, a formyl group, an acetyl group, a pivaloyl group, a benzoyl group, a tetradecanoyl group, and a cyclohexanoyl group), alkoxycarbonyl groups (preferably alkoxycarbonyl groups having 2 to 24 carbon atoms, more preferably alkoxycarbonyl groups having 2 to 12 carbon atoms, and still more preferably alkoxycarbonyl groups having 2 to 6 carbon atoms, for example, a methoxycarbonyl group, an ethoxycarbonyl group, an octadecyloxycarbonyl group, and a cyclohexyloxycarbonyl group), aryloxycarbonyl groups (preferably aryloxycarbonyl groups having 7 to 24 carbon atoms, and more preferably aryloxycarbonyl groups having 7 to 12 carbon atoms, for example, a phenoxycarbonyl group), carbamoyl groups (preferably carbamoyl groups having 1 to 24 carbon atoms, and more preferably carbamoyl groups having 1 to 12 carbon atoms, for example, a carbamoyl group, an N,N-diethylcarbamoyl group, an N-ethyl-N-octylcarbamoyl group, an N,N-dibutylcarbamoyl group, an N-propylcarbamoyl group, an N-phenylcarbamoyl group, an N-methyl-N-phenylcarbamoyl group, and an N,N-dicyclohexylcarbamoyl group), amino groups (preferably amino groups having 24 or less carbon atoms, and more preferably amino groups having 12 or less carbon atoms, for example, an amino group, a methylamino group, an N,N-dibutylamino group, a tetradecylamino group, a 2-ethylhexylamino group, and a cyclohexylamino group), anilino groups (preferably anilino groups having 6 to 24 carbon atoms, and more preferably anilino groups having 6 to 12 carbon atoms, for example, an anilino group and an N-methylanilino group), heterocyclic amino groups (preferably heterocyclic amino groups having 1 to 24 carbon atoms, and more preferably heterocyclic amino groups having 1 to 12 carbon atoms, for example, 4-pyridylamino), carbonamide groups (preferably carbonamide groups having 2 to 24 carbon atoms, and more preferably carbonamide groups having 2 to 12 carbon atoms, for example, an acetamide group, a benzamide group, a tetradecaneamide group, a pivaloylamide group, and a cyclohexanamide group), ureido groups (preferably ureido groups having 1 to 24 carbon atoms, and more preferably ureido groups having 1 to 12 carbon atoms, for example, a ureido group, an N,N-dimethylureido group, and an N-phenylureido group), imide groups (preferably imide groups having 20 or less carbon atoms, and more preferably imide groups having 12 or less carbon atoms, for example, an N-succinimide group and an N-phthalimide group), alkoxycarbonylamino groups (preferably alkoxycarbonylamino groups having 2 to 24 carbon atoms, and more preferably alkoxycarbonylamino groups having 2 to 12 carbon atoms, for example, a methoxycarbonylamino group, an ethoxycarbonylamino group, a t-butoxycarbonylamino group, an octadecyloxycarbonylamino group, and a cyclohexyloxycarbonylamino group), aryloxycarbonylamino groups (preferably aryloxycarbonylamino groups having 7 to 24 carbon atoms, and more preferably aryloxycarbonylamino groups having 7 to 12 carbon atoms, for example, a phenoxycarbonylamino group), sulfonamide groups (preferably sulfonamide groups having 1 to 24 carbon atoms, and more preferably sulfonamide groups having 1 to 12 carbon atoms, for example, a methane sulfonamide group, a butanesulfonamide group, a benzene sulfonamide group, a hexadecanesulfoneamide group, and a cyclohexane sulfonamide group), sulfamoylamino groups (preferably, for example, an N,N-dipropylsulfamoylamino having 1 to 24 carbon atoms, and more preferably, for example, an N,N-dipropylsulfamoylamino having 1 to 12 carbon atoms, a sulfamoylamino group, and an N-ethyl-N-dodecylsulfamoylamino group), azo groups (preferably azo groups having 1 to 24 carbon atoms, and more preferably azo groups having 1 to 24 carbon atoms, for example, a phenylazo group and a 3-pyrazolylazo group), alkylthio groups (preferably alkylthio groups having 1 to 24 carbon atoms, and more preferably alkylthio groups having 1 to 12 carbon atoms, for example, a methylthio group, an ethylthio group, an octylthio group, and a cyclohexylthio group), arylthio groups (preferably arylthio groups having 6 to 24 carbon atoms, and more preferably arylthio groups having 6 to 12 carbon atoms, for example, a phenylthio group), heterocyclic thio groups (preferably heterocyclic thio groups having 1 to 24 carbon atoms, and more preferably heterocyclic thio groups having 1 to 12 carbon atoms, for example, a 2-benzothiazolylthio group, a 2-pyridylthio group, and a 1-phenyltetrazolylthio group), alkylsulfinyl groups (preferably alkylsulfinyl groups having 1 to 24 carbon atoms, and more preferably alkylsulfinyl groups having 1 to 12 carbon atoms, for example, a dodecanesulfinyl group), arylsulfinyl groups (preferably arylsulfinyl groups having 6 to 24 carbon atoms, and more preferably arylsulfinyl groups having 6 to 12 carbon atoms, for example, a phenylsulfinyl group), alkylsulfonyl groups (preferably alkylsulfonyl groups having 1 to 24 carbon atoms, and more preferably alkylsulfonyl groups having 1 to 12 carbon atoms, for example, a methylsulfonyl group, an ethylsulfonyl group, a propylsulfonyl group, a butylsulfonyl group, an isopropylsulfonyl group, a 2-ethylhexylsulfonyl group, a hexadecylsulfonyl group, an octylsulfonyl group, and a cyclohexylsulfonyl group), arylsulfonyl groups (preferably arylsulfonyl groups having 6 to 24 carbon atoms, and more preferably arylsulfonyl groups having 6 to 12 carbon atoms, for example, a phenylsulfonyl group and a 1-naphthylsulfonyl group), sulfamoyl groups (preferably sulfamoyl groups having 24 or less carbon atoms, and more preferably sulfamoyl groups having 16 or less carbon atoms, for example, a sulfamoyl group, an N,N-dipropylsulfamoyl group, an N-ethyl-N-dodecylsulfamoyl group, an N-ethyl-N-phenylsulfamoyl group, and an N-cyclohexylsulfamoyl group), sulfo groups, phosphonyl groups (preferably phosphonyl groups having 1 to 24 carbon atoms, and more preferably phosphonyl groups having 1 to 12 carbon atoms, for example, a phenoxyphosphonyl group, an octyloxyphosphonyl group, and a phenylphosphonyl group), and phosphinoylamino groups (preferably phosphinoylamino groups having 1 to 24 carbon atoms, and more preferably phosphinoylamino groups having 1 to 12 carbon atoms, for example, a diethoxyphosphinoylamino group and a dioctyloxyphosphihoylamino group).

Among the substituents, a halogen atom, an alkyl group, an aryl group, a hydroxyl group, a sulfonic acid group, a phosphonic acid group, a carboxyl group, an alkoxy group, an aryloxy group, an alkoxycarbonyloxy group, a cycloalkylcarbonyloxy group, an aryloxycarbonyloxy group, a carbamoyloxy group, a sulfamoyloxy group, an alkylsulfonyloxy group, an arylsulfonyloxy group, an acyl group, an alkoxycarbonyl group, an aryloxycarbonyl group, a carbamoyl group, a carbonamide group, an imide group, a sulfonamide group, a sulfamoylamino group, and a sulfamoyl group are preferable; an alkyl group, an aryl group, a hydroxyl group, a sulfonic acid group, a phosphonic acid group, a carboxyl group, an alkoxy group, an aryloxy group, an alkoxycarbonyloxy group, an aryloxycarbonyloxy group, a carbamoyloxy group, a sulfamoyloxy group, an alkylsulfonyloxy group, an arylsulfonyloxy group, an acyl group, an alkoxycarbonyl group, an aryloxycarbonyl group, a carbamoyl group, a carbonamide group, a sulfonamide group, a sulfamoylamino group, and a sulfamoyl group are more preferable; a hydroxyl group, a sulfonic acid group, a phosphonic acid group, a carboxyl group, an alkoxy group, an aryloxy group, an alkoxycarbonyloxy group, an aryloxycarbonyloxy group, a carbamoyloxy group, a sulfamoyloxy group, an alkylsulfonyloxy group, an arylsulfonyloxy group, an acyl group, an alkoxycarbonyl group, and an aryloxycarbonyl group are still more preferable; and a hydroxyl group, a sulfonic acid group, a carboxyl group, an alkoxy group, an alkoxycarbonyloxy group, a carbamoyloxy group, a sulfamoyloxy group, an alkylsulfonyloxy group, an acyl group, and an alkoxycarbonyl group are particularly preferable.

Among the particularly preferable substituents, a sulfonic acid group, a carboxyl group, an alkoxy group, an alkoxycarbonyloxy group, an alkylsulfonyloxy group, and an alkoxycarbonyl group are even still more preferable; a sulfonic acid group, a carboxyl group, an alkoxy group, and an alkoxycarbonyl group are even still more preferable; and a sulfonic acid group, a carboxyl group, and an alkoxy group are particularly preferable.

In the general formula (1), as $R^{21}$, a hydrogen atom, an alkyl group, or an aryl group is preferable; and a hydrogen atom or an alkyl group is particularly preferable.

In the general formula (1), when the substituent of the substituted alkyl group and substituted aryl group of $R^{21}$ is a group which may further be substituted, the group may be substituted with any of the substituents mentioned above, and when the group has two or more substituents, the substituents may be the same as or different from each other.

In the general formula (1), $Q^1$ represents —N($R^2$)C(═O)—, —OC(═O)—, —C(═O)N($R^2$)—, —C(═O)O—, a group represented by the following general formula (2), a group represented by the following general formula (3), or a group represented by the following general formula (4), wherein $R^2$ in $Q^1$ represents a hydrogen atom, an alkyl group, an aryl group, or a heterocyclic group.

In the general formula (1), $R^2$ in $Q^1$ represents a hydrogen atom, an alkyl group, an aryl group, or a heterocyclic group, and examples of the alkyl group; the aryl group, and the heterocyclic group are the same as the alkyl groups and the aryl groups as mentioned for the substituents of the substituted alkyl group and the substituted aryl group in $R^{21}$, and a preferable embodiment thereof is also the same.

In the general formula (1), the alkyl group, the aryl group, and the heterocyclic group as $R^2$ in $Q^1$ may be substituted with any of the substituents mentioned as $R^{21}$ above, and when they have two or more substituents, the substituents may be the same as or different from each other.

As $Q^1$ in the general formula (1), the group represented by the following general formula (2), the group represented by the following general formula (3), or the group represented by the following general formula (4) will be described below.

(2)

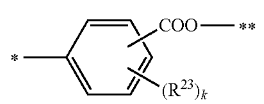

(3)

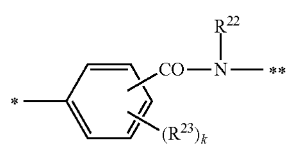

(4)

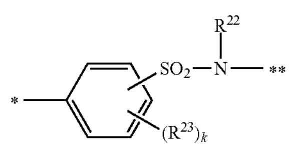

In the general formulae (2) to (4), $R^{22}$ represents a hydrogen atom, an alkyl group, an aryl group, or a heterocyclic group; $R^{23}$ represents a hydrogen atom or a monovalent substituent; k represents an integer of 0 to 4 and when k is 2 or more, $R^{23}$'s may be the same as or different from each other; * represents a position to which the —C($R^{21}$)═$CH_2$ group in the general formula (1) is bonded; and ** represents a position to which $Q^2$ or DyeVI (in the case of n2=0) in the general formula (0.1) is bonded)

$R^{22}$ in the general formulae (3) to (4) has the same definition as $R^{21}$ described in the general formula (1), and a preferable embodiment thereof is also the same.

$R^{23}$ in the general formulae (2) to (4) represents a hydrogen atom or a substituent, and examples of the substituent represented by $R^{23}$ include the substituents mentioned as the substituted alkyl group and substituted aryl group of $R^{21}$ in the general formula (1), and a preferable embodiment thereof is also the same. k represents an integer of 0 to 4 and when k is 2 or more, $R^{23}$'s may be the same as or different from each other.

When $R^{23}$ in the general formulae (2) to (4) represents a hydrogen atom or a substituent, and examples of the substituent represented by $R^{23}$ is a group which may further be substituted, it may be substituted with any of the substituents mentioned as $R^{21}$ in the general formula (1), and when they have two or more substituents, the substituents may be the same as or different from each other.

As $Q^1$ in the general formula (1), from the viewpoint of synthesis, —N($R^2$)C(═O)—, —OC(═O)—, —C(═O)N($R^2$)—, and —C(═O)O— are preferable; —OC(═O)—, —C(═O)N($R^2$)—, and —C(═O)O— are more preferable; and —C(═O)N($R^2$)— and —C(═O)O— are still more preferable.

In the general formula (1), in the case of n1=0, $Q^2$ represents a divalent linking group that links a —C($R^{21}$)═$CH_2$ group with Dye.

Preferable examples of $Q^2$ include an alkylene group, an aralkylene group, an allylene group, —O—, —C(═O)—, —OC(═O)—, OC(═O)O—, —$OSO_2$—, —OC(═O)N($R^{50}$)—, —N($R^{50}$)—, —N($R^{50}$)C(═O)—, —N($R^{50}$)C(═O)O—, —N($R^{50}$)C(═O)N($R^{51}$)—, —N($R^{50}$)$SO_2$—, —N($R^{50}$)$SO_2$N($R^{51}$)—, —S—, —S—S—, —SO—, —$SO_2$—, —$SO_2$N($R^{50}$)—, —$SO_2$O—, and the like. Further, a plurality of the divalent linking groups may be bonded to form a new divalent linking group.

Herein, in $Q^2$ of the general formula (1), $R^{50}$ and $R^{51}$ each independently represent a hydrogen atom, an alkyl group, an aryl group, or a heterocyclic group. Examples of the alkyl group, the aryl group, and the heterocyclic group in $R^{50}$ and $R^{51}$ are the same as the alkyl group, the aryl group, and the heterocyclic group described as the substituent of $R^{21}$ in the general formula (1), and preferable embodiments thereof are also the same. The alkyl group, the aryl group, and the heterocyclic group in $R^{50}$ and $R^{51}$ may be substituted with any of the substituents described as the substituent of $R^{21}$ in the general formula (1), and when they have two or more substituents, the substituents may be the same as or different from each other.

When $Q^2$ in the general formula (1) is an alkylene group, an aralkylene group, or an allylene group, it may be unsubstituted or substituted. When it is substituted, it may be substituted with any of the substituents mentioned as substituent of $R^1$, and when they have two or more substituents, the substituents may be the same as or different from each other.

When $Q^2$ in the general formula (1) is an alkylene group, an aralkylene group, or an allylene group, an alkylene group having 1 to 12 carbon atoms, an aralkylene group having 6 to 18 carbon atoms, and an allylene group having 6 to 18 carbon atoms are preferable; an alkylene group having 1 to 8 carbon atoms, an aralkylene group having 6 to 16 carbon atoms, and an allylene group having 6 to 12 carbon atoms are more preferable; and an alkylene group having 1 to 6 carbon atoms and an aralkylene having 6 to 12 carbon atoms are still more preferable.

For the combinations of $Q^1$ and $Q^2$ in the general formula (1), in a preferable embodiment, $Q^1$ represents —N($R^2$)C(═O)—, —OC(═O)—, —C(═O)N($R^2$)—, or —C(═O)O—, and $Q^2$ represents an alkylene group having 1 to 12 carbon atoms, an aralkylene group having 6 to 18 carbon atoms, an allylene group having 6 to 18 carbon atoms, an alkylthioether having 2 to 18 carbon atoms, an alkylcarbonamide group having 2 to 18 carbon atoms, or an alkylaminocarbonyl group having 2 to 18 carbon atoms. In a more preferable embodiment, $Q^1$ represents —OC(═O)—, —C(═O)N($R^2$)—, or —C(═O)O—, and $Q^2$ represents an alkylene group having 1 to 8 carbon atoms, an aralkylene group having 6 to 16 carbon atoms, an allylene group having 6 to 12 carbon atoms, an alkylthioether having 2 to 12 carbon atoms, an alkylcarbonamide group having 2 to 12 carbon atoms, or an alkylaminocarbonyl group having 2 to 12 carbon atoms, and in a still more preferable embodiment, $Q^1$ represents —C(=O)N($R^2$)— or —C(=O)O—, and $Q^2$ represents an alkylene group having 1 to 6 carbon atoms, an aralkylene group having 6 to 12 carbon atoms, an alkylthioether having 2 to 6 carbon atoms, an alkylcarbonamide group having 2 to 6 carbon atoms, or an alkylaminocarbonyl group having 2 to 6 carbon atoms.

Examples of the polymerizable group represented by -($Q^2$)n2-($Q^1$)n1-C($R^{21}$)=$CH_2$ in the general formula (1) are shown below, but the present invention is not limited thereto.

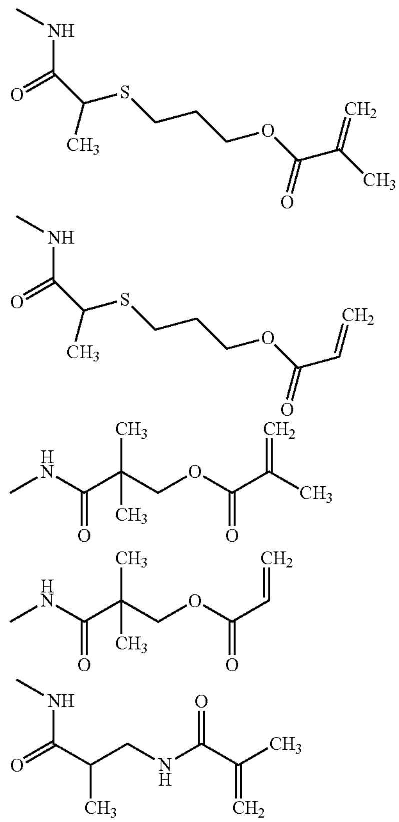

-continued

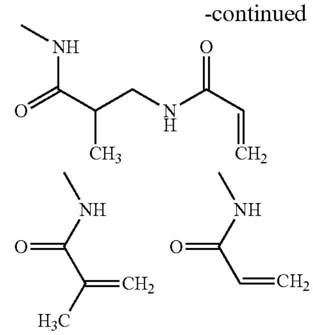

(Dipyrromethene Metal Complex Compound)

The colorant monomer represented by the general formula (1) has a colorant residue formed by removing any one hydrogen atom from the dipyrromethene metal complex compound represented by the general formula (7), or a colorant residue formed by removing any one hydrogen atom of any one substituent of $R^{11}$ to $R^{17}$, $X^1$, and $Y^1$ to $Y^2$ of the dipyrromethene metal complex compound represented by the general formula (8). In other words, the colorant monomer represented by the general formula (1) is a compound in which a polymerizable group represented by -($Q^2$)n2-($Q^1$)n1-C($R^{21}$)=$CH_2$ is introduced into the dipyrromethene metal complex compound represented by the general formula (7) or the general formula (8). Further, when n1 and n2 are both 0, a —C($R^{21}$)=$CH_2$ group is directly introduced into the dipyrromethene metal complex compound.

The dipyrromethene metal complex compound that is introduced to the general formula (1) is the dipyrromethene metal complex compound represented by the general formula (7) or the general formula (8), as described in detail above.

(Specific Examples of Colorant Structure)

Examples of the specific examples and synthesis methods of the colorant structure are shown below, but the present invention is not limited thereto.

The following Exemplary Compound M-53 is synthesized by the following formulation according to the following synthesis scheme.

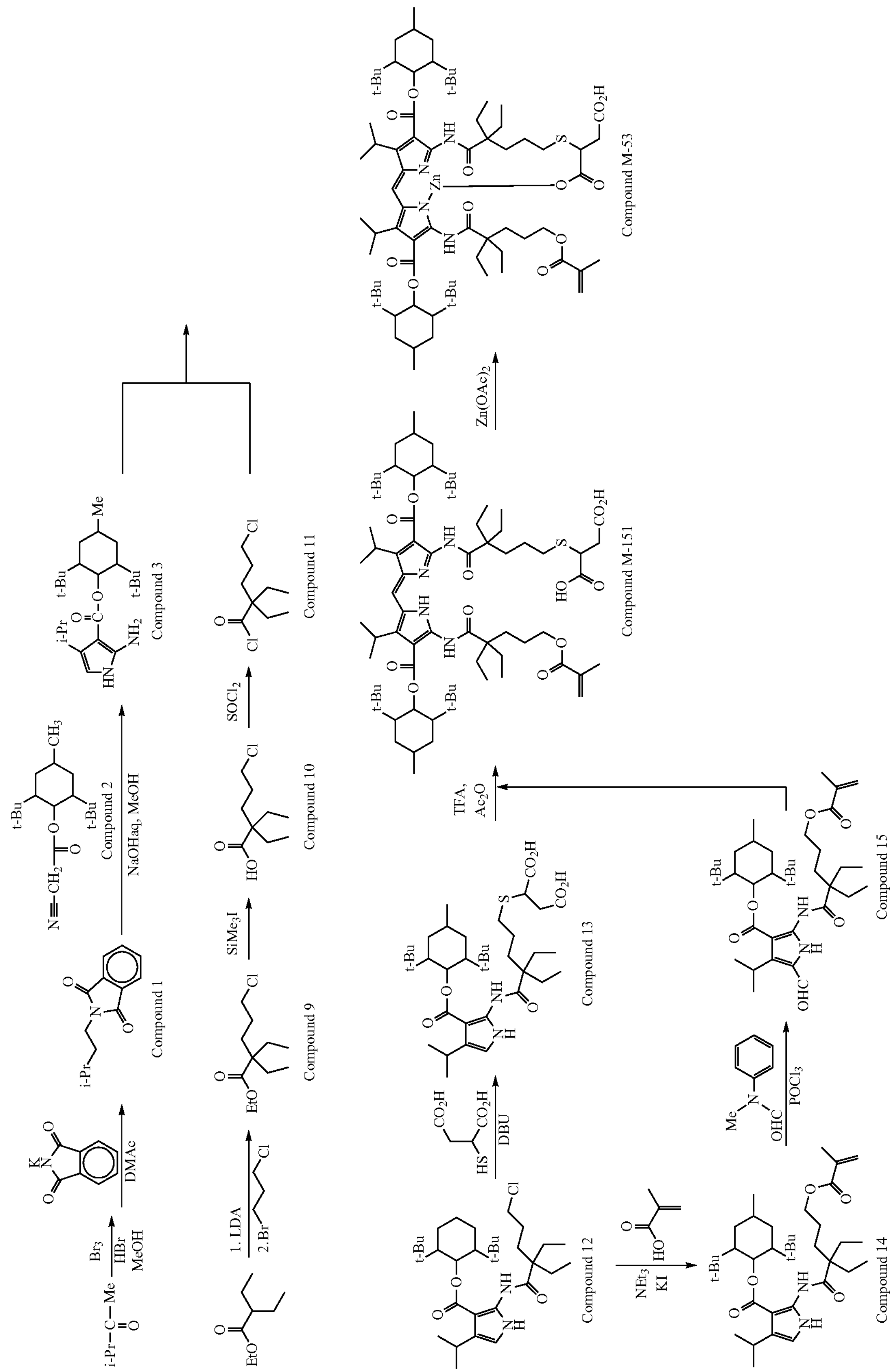
DMAc
Compound 1
Compound 2
NaOHaq, MeOH
Compound 3
1. LDA
2. Br
Compound 9
$SiMe_3I$
Compound 10
$SOCl_2$
Compound 11
Compound 12
DBU
Compound 13
$NEt_3$
KI
Compound 14
$POCl_3$
Compound 15
TFA,
$Ac_2O$
Compound M-151
$Zn(OAc)_2$
Compound M-53

<Synthesis of Compound 1>

206.4 g of isopropyl methyl ketone was stirred in 1 L of methanol, and then 7 mL of hydrobromic acid (a 47 to 49% aqueous solution) was added thereto. Subsequently, bromine was added to the mixture dropwise under the conditions of 30 to 34° C. over 3 hours. Thereafter, the mixture was stirred at 30° C. for 30 minutes. The mixture was neutralized with an aqueous solution of 124 g of sodium hydrogen carbonate in 1.3 L of water. Then, an aqueous solution of 400 g of sodium chloride dissolved in 1.3 L of water was then added thereto to isolate a liquid reaction product by phase separation.

The isolated reaction product was added dropwise to a water-cooled solution, in which 222 g of potassium phthalimide was dissolved while stirring in 800 mL of dimethyl acetamide (DMAc), and the mixture was stirred at room temperature for 4 hours. Thereafter, 720 mL of water was added to the resultant mixture with water-cooling and the precipitated crystals were filtered and separated. The obtained crystals were suspended in 1.5 L of toluene, insoluble substances were filtered off, and the filtrate was concentrated, thereby obtaining Compound 1 (100 g).

Compound 1: $^{1}$H-NMR, 400 MHz, δ ($CDCl_3$) ppm: 1.21 to 1.23 (6H, d), 2.74 to 2.79 (1H, m), 4.56 (2H, s), 7.72 to 7.74 (2H, d), 7.85 to 7.87 (2H, d)

<Synthesis of Compound 2>

Compound 2 was synthesized by the method described in paragraph No. [0134] of JP2008-292970A.

<Synthesis of Compound 3>

Compound 2 (293 g) and Compound 1 (231 g) were stirred in 1.4 L of methanol under a nitrogen gas atmosphere. Thereafter, a solution of sodium hydroxide (88 g) in 400 mL of water was added dropwise thereto at room temperature. The reaction mixture was then refluxed for 8 hours, and cooled to room temperature. The precipitated crystals were filtered and separated, and washed with 100 mL of methanol, thereby obtaining Compound 9 (299 g).

Compound 3: $^{1}$H-NMR, 400 MHz, δ ($CDCl_3$) ppm: 0.88 to 0.95 (18H, s), 1.00 to 1.03 (3H, d), 1.17 to 1.19 (6H, d), 1.20 to 1.66 (7H, m), 3.38 to 3.43 (1H, m), 5.19 to 5.24 (2H, br), 5.95 (1H, br), 6.00 (1H, s), 7.39 to 7.45 (1H, br)

<Synthesis of Compound 9>

N,N-Diisopropylamine (30 g) was stirred in 200 mL of anhydrous tetrahydrofuran under a nitrogen atmosphere, and 1.6 mol/L of a butyllithium in hexane solution (186 mL) was added dropwise thereto at −60° C. over 20 minutes. After stirring at −40° C. for 30 minutes, ethyl 2-ethylbutyrate (39 g) was added dropwise thereto over 10 minutes. After stirring for 30 minutes, the mixture was cooled to −78° C., and 1-bromo-3-chloropropane (47 g) was added dropwise thereto over 15 minutes, and the mixture was slowly warming to room temperature over 4 hours. After completion of the reaction, a 1 M aqueous hydrochloric acid solution was added thereto, and the mixture was extracted with 400 ml of ethyl acetate and washed with 200 mL of a 1 M aqueous hydrochloric acid solution, 200 mL of water, and 200 mL of saturated brine. The organic layer was dried over 15 g of magnesium sulfate and then filtered, and subsequently, the filtrate was concentrated. The concentrate was purified by column chromatography and concentrated under reduced pressure to obtain a Compound 9 (45 g).

Compound 9: $^{1}$H-NMR, 300 MHz, δ ($CDCl_3$) ppm: 0.79 (6H, t), 1.25 (3H, t), 1.57 (4H, q), 1.40-1.65 (4H, m), 3.52 (2H, t) 4.15 (2H, q)

<Synthesis of Compound 10>

Compound 9 (17.2 g) was dissolved in 80 mL of acetonitrile and trimethylsilyl iodide (47 g) was added dropwise thereto at room temperature over 10 minutes, and the mixture was stirred at 80° C. for 60 hours. Thereafter, 400 mL of water was added dropwise to the reaction solution over 30 minutes. The mixture was extracted with 500 ml of ethyl acetate, washed with 300 mL of an aqueous saturated sodium bicarbonate solution, water, and saturated brine, respectively, then dried over magnesium sulfate, and concentrated under reduced pressure. The concentrate was purified by column chromatography, and concentrated under reduced pressure to obtain Compound 10 (8.6 g).

Compound 10: $^{1}$H-NMR, 300 MHz, δ ($CDCl_3$) ppm: 0.80 (6H, t), 1.57-1.82 (8H, m), 3.52 (2H, t)

<Synthesis of Compound 11>

Compound 10 (5.8 g) was dissolved in 10 mL of dichloromethane, and then thionyl chloride (7.1 g) was added dropwise thereto over 10 minutes in an ice bath under a nitrogen atmosphere. After carrying out a reaction at room temperature for 2 hours, the reaction solution was distilled (11 mmHg, 80° C.) to obtain Compound 11 (5.7 g).

Compound 11: $^{1}$H-NMR, 300 MHz, δ ($CDCl_3$) ppm: 0.87 (6H, t), 1.62-1.83 (8H, m), 3.55 (2H, t)

<Synthesis of Compound 12>

Compound 3 (194 g) was dissolved in 1900 ml of acetonitrile under a nitrogen atmosphere, and then triethylamine (63 g) was added thereto and Compound 11 (120 g) was added dropwise thereto over 10 minutes while stirring at room temperature. Thereafter, the mixture was heated at 80° C. and stirred for 6 hours. After cooling to room temperature, 950 mL of water was poured into the reaction liquid, and the precipitated solid was filtered. Next, 950 mL of methanol was poured into the obtained solid, and heated and stirred at 70° C. to carry out suspension and washing. The mixture was cooled to room temperature and then filtered to obtain Compound 12 (260 g).

Compound 12: $^{1}$H-NMR, 300 MHz, δ ($CDCl_3$) ppm: 0.86 (6H, t), 0.90 (18H, s), 1.02 (3H, d), 1.21 (6H, d), 1.25-1.73 (15H, m), 3.45 (1H, quint), 6.02 (1H, s), 6.20 (1H, s), 10.52 (1H, s), 10.94 (1H, s)

<Synthesis of Compound 13>

Compound 12 (18.0 g) and thiomaleic acid (7.9 g) were added to 70 mL of dimethylacetamide, and the mixture was stirred at room temperature. Diazabicycloundecene (26.8 g) was added dropwise thereto over 30 minutes while maintaining the temperature at 30° C. or lower. After stirring at room temperature over 12 hours, the reaction solution was added dropwise to 400 mL of to 0.5 N HCl aq. The precipitated reaction solution was added dropwise thereto over 30 minutes. The precipitated solid was filtered and washed with water, and then the mixture was stirred in 400 mL of water again, and filtered. The obtained solid was dried in vacuo (45° C., 12 hours) to obtain a Compound 13 (18.4 g).

Compound 13: $^{1}$H-NMR, 300 MHz, δ ($CDCl_3$) ppm: 0.86 (6H, t), 0.89 (18H, s), 1.02 (3H, d), 1.18-1.80 (21H, m), 2.61-2.80 (3H, m), 2.98 (1H, td), 3.46 (1H, quint), 3.64 (1H, dd), 6.01 (1H, s), 6.23 (1H, s), 10.61 (1H, s), 10.94 (1H, s)

<Synthesis of Compound 14>

The Compound 12 (22.0 g), methacrylic acid (6.9 g), potassium iodide (6.6 g), and paramethoxyphenol (11.5 mg) were added to 50 mL of dimethylacetamide, and the mixture was stirred at room temperature. Triethylamine (10.1 g) was added thereto, heated until the internal temperature became 85° C., and stirred for 4 hours. After completion of the reaction, 75 mL of ethyl acetate was added thereto, and the mixture was washed with 50 mL of 1 N HCl aq., water, and an aqueous saturated sodium bicarbonate solution, respectively, and concentrated under reduced pressure. The obtained solid was recrystallized from 100 mL of acetonitrile to obtain a Compound 14 (16.5 g).

Compound 14: $^1$H-NMR, 300 MHz, δ ($CDCl_3$) ppm: 0.86 (6H, t), 0.89 (18H, s), 1.02 (3H, d), 1.27 (6H, d), 1.36 (4H, q), 1.73-1.93 (11H, m), 1.94 (3H, s), 3.46 (1H, quint), 4.14 (2H, t), 5.54 (1H, s), 6.02 (1H, s), 6.09 (1H, s), 6.22 (1H, s), 10.54 (1H, s), 10.94 (1H, s)

<Synthesis of Compound 15>

While stirring N-methyl formanilide (4.3 g) in 25 mL of acetonitrile at 5° C., phosphorous oxychloride (4.9 g) was added dropwise and the mixture was stirred for 1 hour. Then, the compound 15 (16.0 g) and 10 mL of acetonitrile were added thereto, and the mixture was stirred at room temperature for 30 minutes and then stirred at 40° C. for 5 hours. The reaction liquid was poured into 300 mL of water, and the mixture was stirred for 1 hour. The precipitated solid was collected and recrystallized from acetone to obtain a Compound 15 (10.3 g).

Compound 15: $^1$H-NMR, 300 MHz, δ ($CDCl_3$) ppm: 0.86 (6H, t), 0.89 (18H, s), 1.03 (3H, d), 1.26 (4H, q), 1.42 (6H, d), 1.57-1.94 (1H, m), 1.93 (3H, s), 4.11 (1H, quint), 4.14 (2H, t), 5.55 (1H, s), 6.04 (1H, s), 6.10 (1H, s), 9.87 (1H, s), 11.01 (1H, s), 11.16 (1H, s)

<Synthesis of Compound M-151>

The Compound 13 (10.7 g), the Compound 15 (10.1 g), and 100 ml of anhydrous acetic acid were stirred at room temperature, and 8.6 g of trifluoroacetic acid was added dropwise thereto. The mixture was stirred at room temperature for 4 hours to obtain a reaction liquid. 700 mL of water and 170 g of sodium hydrogen carbonate were stirred at room temperature, and the reaction liquid was slowly poured theretinto to carry out the neutralization. After stirring for 1 hour, the precipitated crystals were filtered and washed with 300 mL of water. The obtained solid was dissolved in 50 mL of tetrahydrofuran again, and 50 mL of water and (10.5 g) of triethylamine were added thereto to adjust the system to be uniform. Then, the mixture was stirred at room temperature for 10 minutes. To the reaction solution was added 400 mL of ethyl acetate, and the mixture was washed twice with each of 400 mL of 1 N HCl aq.×2, and 400 mL of water, and concentrated under reduced pressure. The obtained solid was dried by blowing air at 40° C. for 12 hours to obtain a Compound M-151 (19.5 g). The maximum absorption wavelength of M-151 in the absorption spectrum in ethyl acetate was 519 nm and the molar extinction coefficient was 44000.

Compound M-151: $^1$H-NMR, 300 MHz, S ($CDCl_3$) ppm: 0.79-0.94 (48H, m), 1.02 (6 d), 1.21-1.77 (22H, m), 1.42 (12H, d), 1.93 (3H, s), 2.59-2.78 (3H, m), 2.95 (1H, dd), 3.66 (1H, dd), 4.02-4.15 (4H, m), 5.54 (1H, s), 6.03 (2H, s), 6.11 (1H, s), 7.58 (1H, s), 10.75 (1H, s), 10.78 (1H, s)

<Synthesis of Exemplary Compound M-53>

The Compound M-151 (19.0 g) was dissolved in 90 ml of tetrahydrofuran (THF) under stirring. The mixture was stirred and dissolved at room temperature and then 90 mL of methanol was added thereto. Zinc acetate dihydrate (3.3 g) was added thereto, and a solution as dissolved in 90 mL of methanol was added thereto over 10 minutes. The mixture was stirred for 1 hour. Thereafter, the mixture was subjected to pressure reduction with an evaporator at 30° C. and 1000 Torr for 10 minutes. 90 mL of the solvent was evaporated from the reaction solution. The residual solution was added dropwise to 500 ml of water, and precipitated crystals were filtered and dried to obtain an Exemplary Compound M-53 (19.0 g). The maximum absorption wavelength of M-53 in the absorption spectrum in ethyl acetate was 545 nm and the molar extinction coefficient was 130000.

Exemplary Compound M-53: $^1$H-NMR, 300 MHz, δ ($CDCl_3$) ppm: 0.81-0.99 (48H, m), 1.02 (6H, d), 1.15-1.90 (34H, m), 1.94 (3H, s), 2.58-2.80 (3H, m), 3.00 (1H, d), 3.46 (1H, br), 4.14-4.30 (4H, m), 5.53 (1H, s), 6.04 (1H, s), 6.06 (1H, s), 6.11 (1H, s), 7.80 (1H, s), 11.29 (1H, s), 11.45 (1H, s)

The content of the inorganic metal salt in the colorant monomer represented by the general formula (1) included in the colorant multimer in the present invention is preferably 0.1% by mass or less, and more preferably 0.01% by mass or less, with respect to the dye solid.

Furthermore, the lower limit of the content of the inorganic metal salt in the present invention is preferably 0, and it is substantially any one in the range from 0.0001% by mass to 0.1% by mass, and preferably from 0.0001% by mass to 0.01% by mass.

Examples of the method for adjusting the content of the inorganic metal salt in the colorant monomer of the present invention to the above-described ranges include a method in which an excess metal salt (such as zinc acetate and the like) is not used as a raw material during the synthesis of the colorant monomer, and a method in which purification is enhanced. Examples of the enhancement of the purification include removal of calcium salts or sodium salts by enhancing the washing, and the like.

The colorant monomer represented by the general formula (1) in the colorant multimer in the present invention may be one kind or a combination of two or more kinds thereof.

Furthermore, the colorant multimer in the present invention has a structure different from that of the colorant monomer represented by the general formula (1), or may include a monomer having a terminal ethylenically unsaturated bond as a copolymerization component. In this case, it may include one kind or two or more kinds of the monomers. Further, additional monomers may further be included, as desired, as a copolymerization component, and in the case where the additional monomers are included as the copolymerization component, one kind or two or more kinds thereof may be included.

The additional monomers have a structure different from that of the colorant monomer represented by the general formula (1), and the monomer having a terminal ethylenically unsaturated bond will be described hereinbelow.

The colorant multimer in the present invention includes the colorant monomer represented by the general formula (1) which is a preferable monomer capable of forming the constitutional units represented by the general formula (A), the general formula (B), and the general formula (C), or the structural unit represented by the general formula (A), in the amount of 100% by mass in terms of mass ratio (% by mass), that is, it may be a multimer formed by the polymerization of only the constitutional units represented by the general formula (A), the general formula (B), and the general formula (C).

From the viewpoints of the coloring power, the colorant multimer preferably includes the constitutional units represented by the general formula (A), the general formula (B), and the general formula (C) in an amount of 10% by mass to 100% by mass, more preferably 20% by mass to 100% by mass, and still more preferably 30% by mass to 100% by mass, in terms of mass ratio (% by mass).

<Monomer Having Structure Different from that of Colorant Monomer Represented by General Formula (1) and Having Terminal Ethylenically Unsaturated Bond>

The colorant multimer in the present invention may include, as a polymerization component, the constitutional units represented by the general formula (A), the general formula (B), and the general formula (C), and in a preferable embodiment, the colorant monomer represented by the general formula (1), and further, a monomer, as a copolymerization component, having a structure different from that of the colorant monomer represented by the general formula (1) and a terminal ethylenically unsaturated bond (which is hereinafter appropriately referred to as the "additional monomers having ethylenically unsaturated bonds"). Further, it may further include monomers having structures different from those of the additional monomers having ethylenically unsaturated bonds as the copolymerization components.

That is, the colorant multimer in the present invention may be a copolymer including a colorant monomer capable of forming the constitutional units represented by the general formula (A), the general formula (B), and the general formula (C), the colorant monomer represented by the general formula (1), and the additional monomers having ethylenically unsaturated bonds. Herein, the copolymer may include one kind or two or more kinds of the specific monomers according to the present invention, and may include one kind or two or more kinds of the additional monomers having ethylenically unsaturated bonds.

The additional monomers having ethylenically unsaturated bonds are not particularly limited as long as they are compounds having at least ethylenically unsaturated bonds at the terminals, and are the monomers having structures different from those of the colorant monomers capable of forming the constitutional units represented by the general formula (A), the general formula (B), and the general formula (C), and the colorant monomer represented by the general formula (1).

The radiation-sensitive colored composition of the present invention is preferably a monomer in which the additional monomers having ethylenically unsaturated bonds which the colorant structure may further have alkali-soluble groups in addition to the terminal ethylenically unsaturated bond, from the viewpoint of improving the formability of the color pattern.

Examples of the additional monomer having an alkali-soluble group together with an ethylenically unsaturated bond include a vinyl monomer having a carboxyl group, a vinyl monomer having a sulfonic acid group, a monomer having a phosphoric acid group, and the like.

Examples of the vinyl monomer having a carboxy group include (meth)acrylic acid, vinyl benzoic acid, maleic acid, monoalkyl maleate, fumaric acid, itaconic acid, crotonic acid, cinnamic acid, an acrylic acid dimer, and the like. Examples further include a vinyl monomer having a phosphoric acid group, an addition reaction products of a monomer having a hydroxyl group such as 2-hydroxyethyl (meth)acrylate and the like with a cyclic anhydride such as maleic anhydride, phthalic anhydride or cyclohexane dicarboxylic anhydride; and ω-carboxy-polycaprolactone mono(meth)acrylate. As a precursor of a carboxy group, an anhydride-containing monomer such as maleic anhydride, itaconic acid anhydride, citraconic anhydride, and the like may be used. Among these, a (meth)acrylic acid is preferable from the viewpoint of copolymerization property, cost, solubility, and the like.

Examples of the vinyl monomer having a sulfonic acid group include 2-acrylamide-2-methylpropanesulfonic acid and the like. Examples of the vinyl monomer having a phosphoric acid group include mono(2-acryloyloxyethyl)phosphate, mono(1-methyl-2-acryloyloxyethyl)phosphate and the like.

The colorant multimer in the present invention preferably includes the repeating unit derived from the vinyl monomer having alkali-soluble group as described above. When including the repeating unit, the radiation-sensitive colored composition of the present invention has excellent removability of a non-exposed area.

In the colorant multimer in the present invention, the content of the repeating unit derived from the vinyl monomer having an alkali-soluble group is preferably 50 mg KOH/g or more, and particularly preferably from 50 mg KOH/g to 200 mg KOH/g. Within these range, the generation of the precipitates in the developing liquid is suppressed.

Furthermore, when the acid value is within the above-described ranges and a radiation-sensitive colored composition is formed using both of the colorant multimer of the present invention and a pigment, the formation of aggregates of the primary particles of the pigment, that is, secondary aggregates can be effectively suppressed, or the cohesive force of the secondary aggregates can be effectively weakened.

The vinyl monomer that can be used for the copolymerization with the colorant monomer in the present invention is not particularly limited, but preferable examples thereof include (meth)acrylic acid esters, crotonic acid esters, vinyl esters, maleic acid diesters, fumaric acid diesters, itaconic acid diesters, (meth)acrylamides, vinyl ethers, vinyl alcohol esters, styrenes and (meth)acrylonitriles. Specific examples of the vinyl monomer include the following compounds. Further, in the present specification, the "(meth)acryl" may be defined in some cases to represent any one or both of "acryl and methacryl".

Examples of the (meth)acrylic acid esters include methyl (meth)acrylate, ethyl (meth)acrylate, n-propyl (meth)acrylate, isopropyl (meth)acrylate, n-butyl (meth)acrylate, isobutyl (meth)acrylate, t-butyl (meth)acrylate, n-hexyl (meth) acrylate, cyclohexyl (meth)acrylate, t-butyl cyclohexyl (meth)acrylate, 2-ethylhexyl (meth)acrylate, t-octyl (meth) acrylate, dodecyl (meth)acrylate, octadecyl (meth)acrylate, acetoxyethyl (meth)acrylate, phenyl (meth)acrylate, 2-hydroxyethyl (meth)acrylate, 2-methoxyethyl (meth)acrylate, 2-ethoxyethyl (meth)acrylate, 2-(2-methoxyethoxy)ethyl (meth)acrylate, 3-phenoxy-2-hydroxypropyl (meth)acrylate, benzyl (meth)acrylate, diethylene glycol monomethyl ether (meth)acrylate, diethylene glycol monoethyl ether (meth) acrylate, triethylene glycol monomethyl ether (meth)acrylate, triethylene glycol monoethyl ether (meth)acrylate, polyethylene glycol monomethyl ether (meth)acrylate, polyethylene glycol monoethyl ether (meth)acrylate, β-phenoxyethoxyethyl (meth)acrylate, nonylphenoxypolyethylene glycol (meth)acrylate, dicyclopentenyl (meth)acrylate, dicyclopentenyloxyethyl (meth)acrylate, trifluoroethyl (meth) acrylate, octafluoropentyl (meth)acrylate, perfluorooctylethyl (meth)acrylate, dicyclopentanyl (meth)acrylate, tribromophenyl (meth)acrylate, tribromophenyloxyethyl (meth)acrylate, and the like.

Examples of the crotonic acid esters include butyl crotonate, hexyl crotonate, and the like.

Examples of the vinyl esters include vinyl acetate, vinyl propionate, vinyl butyrate, vinyl methoxy acetate, vinyl benzoate, and the like.

Examples of the maleic acid diesters include dimethyl maleate, diethyl maleate, dibutyl maleate, and the like.

Examples of the fumaric acid diesters include dimethyl fumarate, diethyl fumarate, dibutyl fumarate, and the like.

Examples of the itaconic acid diesters include dimethyl itaconate, diethyl itaconate, dibutyl itaconate, and the like.

Examples of the (meth)acrylamide include (meth)acrylamide, N-methyl (meth)acrylamide, N-ethyl (meth)acrylamide, N-propyl (meth)acrylamide, N-isopropyl (meth)acrylamide, N-n-butyl (meth)acrylamide, N-t-butyl (meth) acrylamide, N-cyclohexyl (meth)acrylamide, N-(2-methoxyethyl) (meth)acrylamide, N,N-dimethyl (meth) acrylamide, N,N-diethyl (meth)acrylamide, N-phenyl (meth) acrylamide, N-benzyl (meth)acrylamide, (meth)acryloyl morpholine, diacetone acrylamide, and the like.

Examples of the vinyl ethers include methyl vinyl ether, butyl vinyl ether, hexyl vinyl ether and methoxyethyl vinyl ether.

Examples of the styrenes include styrene, methylstyrene, dimethylstyrene, trimethylstyrene, ethylstyrene, isopropylstyrene, butylstyrene, hydroxystyrene, methoxystyrene, butoxystyrene, acetoxystyrene, chlorostyrene, dichlorostyrene, bromostyrene, chloromethylstyrene, hydroxystyrene protected by a group deprotectable with an acidic substance (such as t-Boc and the like), methyl vinyl benzoate, α-methylstyrene, and the like.

Specific examples of the other monomer having an ethylenically unsaturated bond that can be used in the present invention are shown below, but the present invention is not limited thereto.

(b-1)

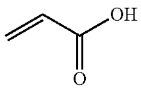

(b-2)

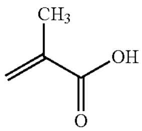

(b-3)

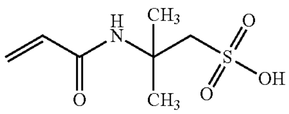

(b-4)

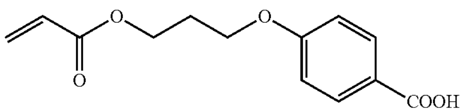

(b-5)

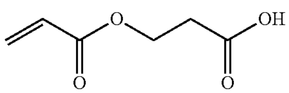

(b-6)

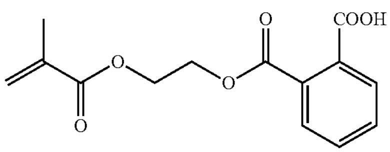

(b-7)

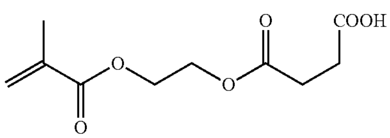

(b-8)

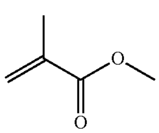

(b-9)

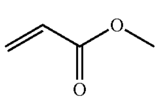

(b-10)

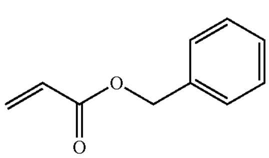

(b-11)

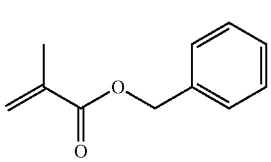

-continued (b-12)

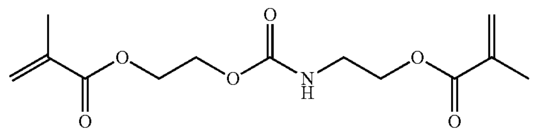

(b-13)

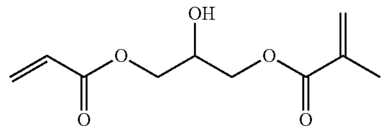

(b-14)

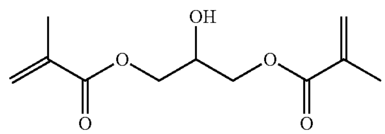

(Specific Examples of Colorant Multimer)

Specific examples and synthesis methods of the colorant multimer in the present invention are shown below, but the present invention is not limited thereto. Further, in Tables, the number of the monomer corresponds to that of the specific examples of the above-described colorant monomers, and the number of the monomer b corresponds to that of the specific examples of the above-described monomer having an ethylenically unsaturated bond.

TABLE 3

| Exemplary | Monomer a | | Monomer b | | Molecular weight | |
|---|---|---|---|---|---|---|
| Compound | Type | Mass | Type | Mass | (Mw) | Mw/Mn |
| P46 | M-53 | 100 | — | 0 | 9000 | 1.8 |
| P47 | M-53 | 100 | — | 0 | 11000 | 2.2 |
| P48 | M-53 | 100 | — | 0 | 7000 | 2.2 |
| P49 | M-53 | 100 | — | 0 | 8000 | 2.1 |
| P50 | M-53 | 94 | b-2 | 6 | 10000 | 1.9 |
| P51 | M-53 | 94 | b-2 | 6 | 7000 | 1.7 |
| P52 | M-53 | 94 | b-2 | 6 | 8000 | 1.8 |
| P53 | M-53 | 94 | b-2 | 6 | 12000 | 2.8 |
| P54 | M-53 | 88.6 | b-2 | 11.4 | 8000 | 2.4 |
| P55 | M-53 | 88.6 | b-2 | 11.4 | 15000 | 2.7 |
| P56 | M-53 | 88.6 | b-2 | 11.4 | 11000 | 1.6 |
| P57 | M-53 | 88.6 | b-2 | 11.4 | 9000 | 1.7 |
| P58 | M-53 | 83.8 | b-2 | 16.2 | 12000 | 2 |
| P59 | M-53 | 83.8 | b-2 | 16.2 | 7000 | 1.9 |
| P60 | M-53 | 83.8 | b-2 | 16.2 | 8000 | 2.4 |

TABLE 4

| | Monomer a | | Monomer b | | Molecular | |
|---|---|---|---|---|---|---|
| Exemplary Compound | Type | % by mass | Type | % by mass | weight (Mw) | Mw/Mn |
| P61 | M-53 | 83.8 | b-2 | 16.2 | 10000 | 2.4 |
| P62 | M-53 | 79.5 | b-2 | 20.5 | 7000 | 2.1 |
| P63 | M-53 | 79.5 | b-2 | 20.5 | 8000 | 2.5 |
| P64 | M-53 | 79.5 | b-2 | 20.5 | 9000 | 1.5 |
| P65 | M-53 | 79.5 | b-2 | 20.5 | 7000 | 1.9 |
| P66 | M-53 | 75.7 | b-2 | 24.3 | 7000 | 1.7 |
| P67 | M-53 | 75.7 | b-2 | 24.3 | 20000 | 2 |
| P68 | M-53 | 75.7 | b-2 | 24.3 | 18000 | 2.4 |
| P69 | M-53 | 75.7 | b-2 | 24.3 | 9000 | 2.5 |
| P70 | M-53 | 94 | b-1 | 6 | 7000 | 2.3 |
| P71 | M-53 | 88.6 | b-1 | 11.4 | 17000 | 1.9 |
| P72 | M-53 | 83.8 | b-1 | 16.2 | 9000 | 2.7 |

TABLE 4-continued

| Exemplary Compound | Monomer a Type | Monomer a % by mass | Monomer b Type | Monomer b % by mass | Molecular weight (Mw) | Mw/Mn |
|---|---|---|---|---|---|---|
| P73 | M-53 | 79.5 | b-1 | 20.5 | 8000 | 1.9 |
| P74 | M-53 | 75.7 | b-1 | 24.3 | 10000 | 1.5 |
| P75 | M-53 | 88.6 | b-3 | 11.4 | 8000 | 1.3 |
| P76 | M-53 | 83.8 | b-4 | 16.2 | 7000 | 1.2 |
| P77 | M-53 | 94 | b-5 | 6 | 12000 | 1.9 |
| P78 | M-53 | 75.7 | b-6 | 24.3 | 9000 | 2.7 |
| P79 | M-53 | 88.6 | b-7 | 11.4 | 9000 | 1.7 |
| P80 | M-53 | 75.7 | b-8 | 24.3 | 7000 | 1.9 |
| P81 | M-53 | 83.8 | b-9 | 16.2 | 10000 | 1.5 |
| P82 | M-53 | 94 | b-10 | 6 | 8000 | 1.7 |
| P83 | M-53 | 79.5 | b-11 | 20.5 | 13000 | 1.8 |
| P84 | M-53 | 83.8 | b-12 | 16.2 | 11000 | 1.9 |
| P85 | M-53 | 75.7 | b-13 | 24.3 | 9000 | 1.8 |
| P86 | M-53 | 79.5 | b-14 | 20.5 | 8000 | 2.1 |
| P87 | M-53 | 94 | b-15 | 6 | 7000 | 2.3 |
| P88 | M-53 | 79.5 | b-16 | 20.5 | 11000 | 1.8 |
| P89 | M-53 | 75.7 | b-17 | 24.3 | 8000 | 2 |
| P90 | M-53 | 88.6 | b-18 | 11.4 | 9000 | 1.9 |

Furthermore, specific examples of the colorant multimer include Compound P91 formed by adding glycidyl methacrylate to Exemplary Compound P51. For the Exemplary Compound P91, mention is made to the section of synthesis of the Exemplary Compound P91.

<Synthesis of Exemplary Compound P51>

To 5.21 g of propylene glycol monomethyl ether acetate (which is hereinafter referred to as PGMEA) was added dropwise a solution in which Exemplary Compound M-53 (7.0 g), methacrylic acid (0.45 g), dodecane thiol (0.17 g), and dimethyl 2,2'-azobis(2-methylpropionate) (0.096 g) were dissolved in 12.2 g of PGMEA over 4 hours while stirring at 80° C. At 2 hours after completion of dropwise addition, a solution in which dimethyl 2,2'-azobis(2-methylpropionate) (0.029 g) and dodecane thiol (0.051 g) were dissolved in 0.35 g of PGMEA was added, and the solution was stirred at 80° C. over 2 hours. To the reaction solution were added 175 ml of PGMEA and 200 ml of methanol. Further, the reaction solution was added to 800 ml of acetonitrile dropwise while stirring. The precipitated crystals were filtered, and the obtained crystals were dried under reduced pressure to obtain 3.99 g of Exemplary Compound P51. The weight average molecular weight (Mw) and the acid value of the obtained Exemplary Compound P51 were 7000 and 185 mgKOH/g, respectively.

<Synthesis of Exemplary Compound P54>

Exemplary Compound M-53 (1.67 g), methacrylic acid (0.21 g), and dodecane thiol (0.076 g) were dissolved in 10.7 g of PGMEA, and a solution in which Exemplary Compound M-53 (3.33 g), methacrylic acid (0.43 g), dodecane thiol (0.15 g), and dimethyl 2,2'-azobis(2-methylpropionate) (0.52 g) were dissolved in 21.3 g of PGMEA was added dropwise over 3 hours while stirring at 85° C. At 4 hours after the initiation of addition dropwise, dimethyl 2,2'-azobis(2-methylpropionate) (0.047 g) was added thereto, and the mixture was stirred at 85° C. for 2 hours. To the reaction solution were added 115 ml of PGMEA and 153 ml of methanol. Further, the reaction liquid was added to 614 ml of acetonitrile dropwise while stirring. The precipitated crystals were filtered and the obtained crystals were dried under reduced pressure to obtain 1.75 g of Exemplary Compound P54. The weight average molecular weight (Mw) and the acid value of the obtained Exemplary Compound P54 were 8000 and 112 mgKOH/g, respectively.

<Synthesis of Exemplary Compound P91>

A solution in which Exemplary Compound P51 (5.0 g), glycidyl methacrylate (0.47 g), and p-methoxyphenol (5.5 mg) were dissolved in 31.0 g of PGMEA was heated and stirred at 100° C. for 5 hours. Next, the obtained reaction liquid was added dropwise to 350 ml of acetonitrile while stirring. The precipitated crystals were filtered and the obtained crystals were dried under reduced pressure to obtain 3.59 g of Exemplary Compound P91. The weight average molecular weight (Mw) and the acid value of the obtained Exemplary Compound P91 were 8000 and 110 mgKOH/g, respectively.

The structure of the Exemplary Compound P91 was confirmed by $^{1}$H-NMR, and by the loss of the epoxy moiety of glycidyl methacrylate and the reduction in the glycidyl methacrylate portion obtained from the measurement of acid values.

P-91

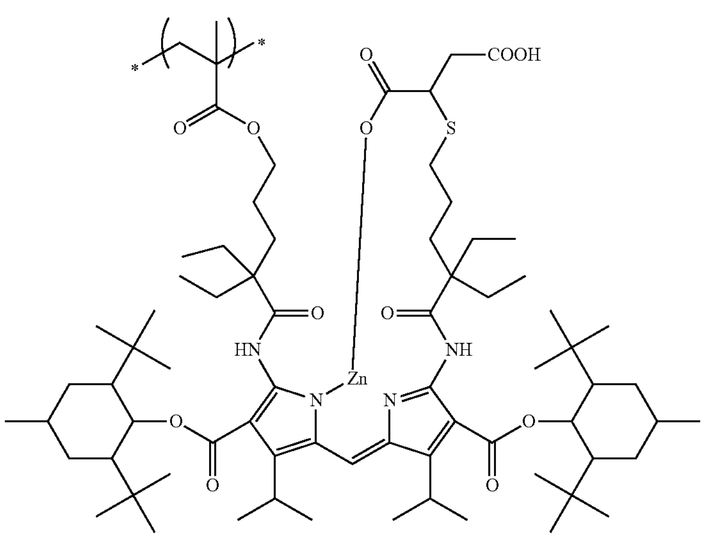

-continued
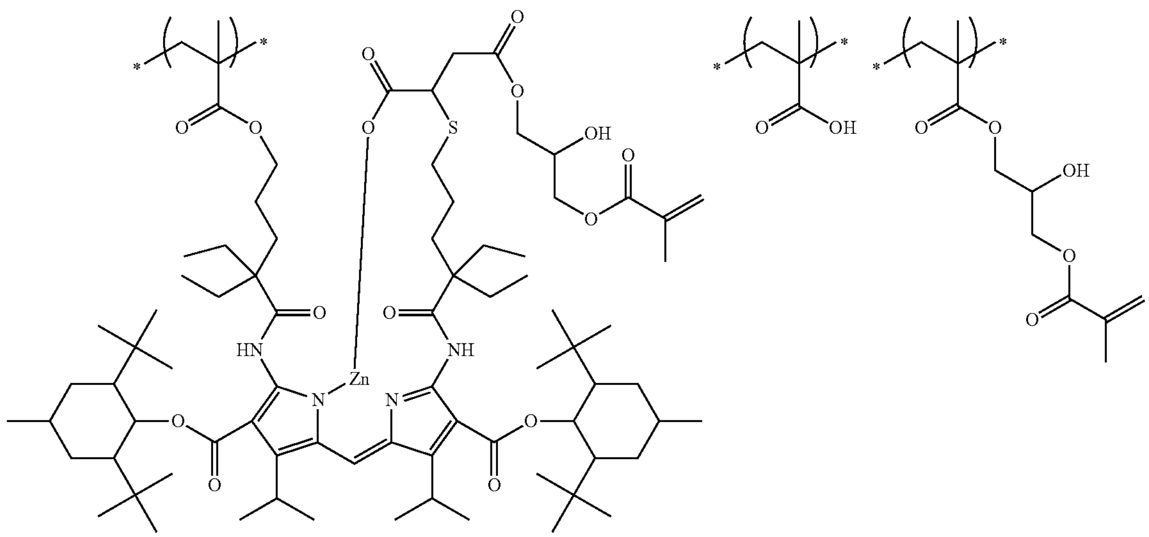
<Synthesis of Q-3 from Exemplary Compound Q-1>
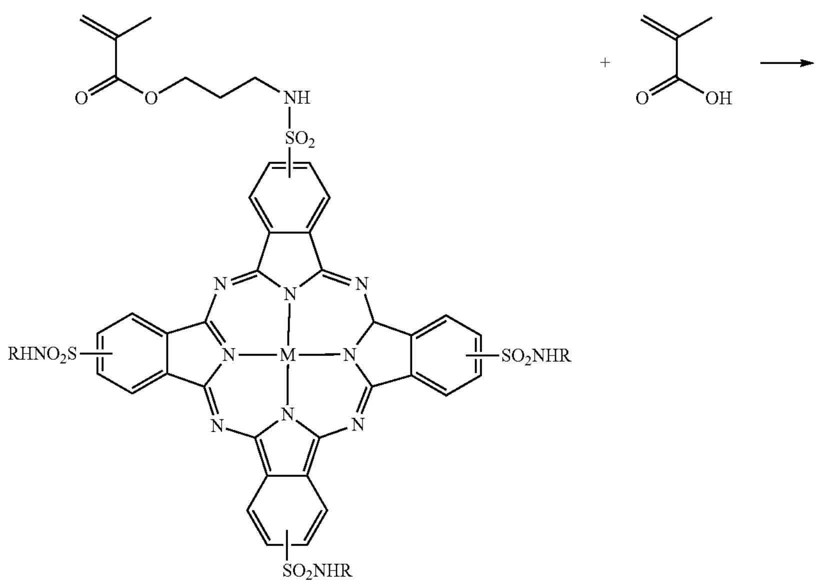
R = CH2CH2CH2OH M = Cu
(q-1)

-continued

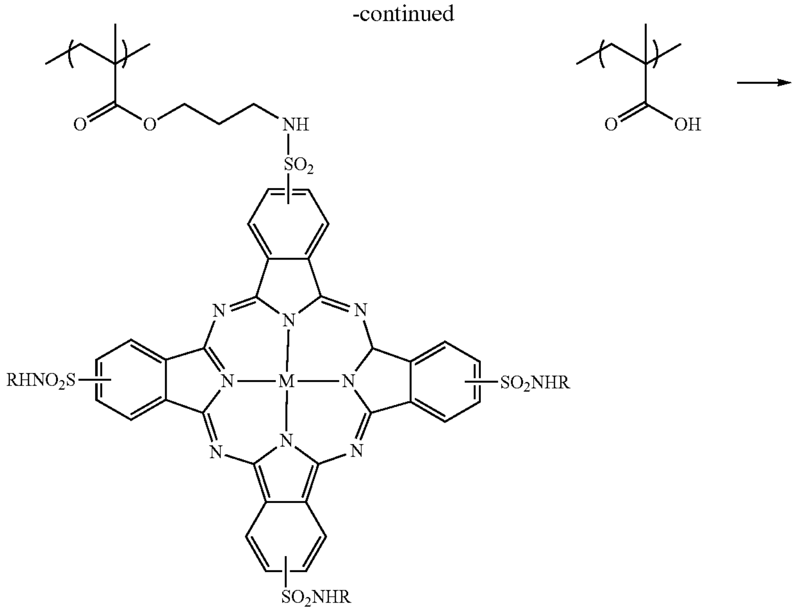

R = CH2CH2CH2OH M = Cu
(Q-1)

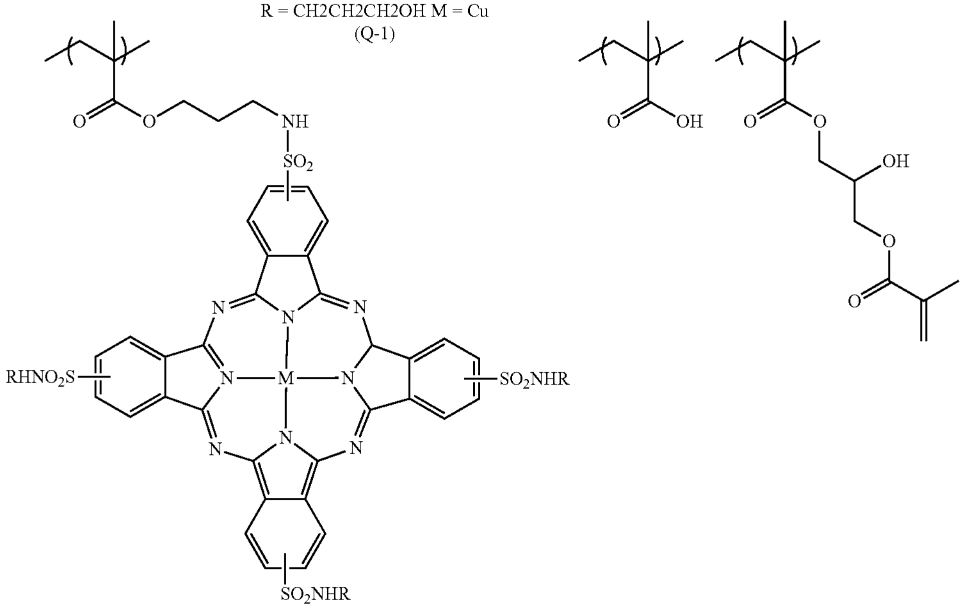

R = CH2CH2CH2OH M = Cu
(Q-1)

Into a 100-mL three-necked flask, a monomer (q-1) (15.5 g), methacrylic acid (2.61 g), dodecyl mercaptan (0.51 g), and propylene glycol 1-monomethyl ether 2-acetate (which will be hereinafter also referred to as "PGMEA") (46.6 g) were added, and the mixture was heated at 80° C. under a nitrogen atmosphere. To this solution was added dropwise a mixed solution of a monomer (q-1) (15.5 g), methacrylic acid (2.61 g), dodecyl mercaptan (0.51 g), dimethyl 2,2'-azobis(isobutyrate) [trade name: V601, manufactured by Wako Pure Chemical Industries, Ltd.] (0.58 g), and PGMEA (46.6 g) over 2 hours. Thereafter, after stirring for 3 hours, the mixture was warmed to 90° C., heated under stirring for 2 hours, and left to be cooled to obtain a solution of (Q'-1) in PGMEA. Next, glycidyl methacrylate (1.85 g), tetrabutylammonium bromide (80 mg), and p-methoxyphenol (20 mg) were added thereto, and the mixture was heated at 100° C. for 15 hours under an air atmosphere to confirm the loss of glycidyl methacrylate. After cooling, the mixture was added dropwise to a mixed solvent of methanol/ion exchange water=100 mL/10 mL and reprecipitated to form 37.8 g of a colorant multimer (Q-1).

The weight average molecular weight (Mw) of the colorant multimer (Q-1) as measured by GPC was 6,000, and the ratio of the weight average molecular weight/number average molecular weight (Mw/Mn) was 1.9.

Furthermore, the acid value by means of titration using a 0.1 N aqueous sodium hydroxide solution was 0.90 mmol/g and the amount of the polymerizable group as measured by NMR was confirmed to be 0.60 mmol for 1 g of the colorant multimer (Q-1).

The resin (Q-2) and the resin (Q-3) were synthesized in the same manner except that the resins were changed to a resin (Q-2) (resin (Q-1) with M=Zn) and the resin (Q-3) (the resin (Q-1) with M=Mg) and the amount of the monomers charged was changed to one described in Table 5.

<Synthesis of Exemplary Compounds Q-4 and Q-5>

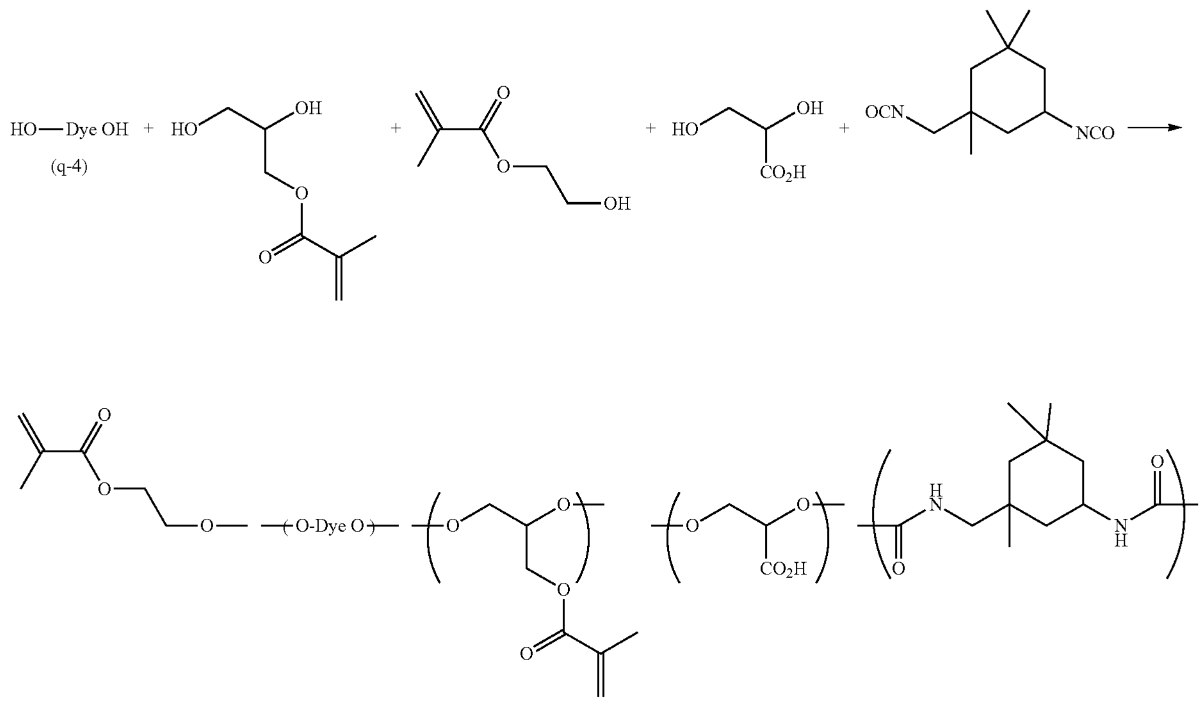

(Q-4)

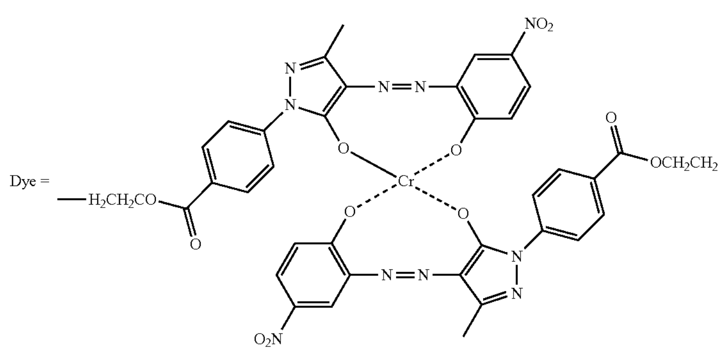

2-Hydroxyethyl methacrylate (1.29 g), a monomer (q-4) (9.40 g), 2,3-dihydroxyethyl methacrylate (0.53 g), 1,2-dihydroxypropionic acid (1.41 g), and isophoronic acid diisocyanate (7.37 g) were added to PGMEA (46.7 g), and the mixture was heated at 80° C. under a nitrogen atmosphere. Next, NEOSTANN U-600 (manufactured by Nitto Kasei Co., Ltd.) (20 mg) was added thereto, and the mixture was heated for 10 hours and cooled to obtain a 30%-by-mass solution of the colorant multimer (Q-4) in PGMEA.

The weight average molecular weight (Mw) of the colorant multimer (Q-4) as measured by GPC was 7,500, and the ratio of the weight average molecular weight/number average molecular weight (Mw/Mn) was 2.9.

Furthermore, the acid value by means of titration using a 0.1 N aqueous sodium hydroxide solution was 0.58 mmol/g and the amount of the polymerizable group as measured by NMR was confirmed to be 0.35 mmol for 1 g of the colorant multimer (Q-4). In the same manner as for the Exemplary Compound Q-4, an Exemplary Compound Q-5 was obtained.

TABLE 5

| Resin | M | a (mol %) | b (mol %) | c (mol %) | Acid value (m/mol %) | Mw | Metal ion amount (%) |
|---|---|---|---|---|---|---|---|
| Q-1 | Cu | 30 | 40 | 30 | 0.90 | 6000 | 0.08 |
| Q-2 | Zn | 30 | 40 | 30 | 0.91 | 6200 | 0.07 |
| Q-3 | Mg | 30 | 40 | 30 | 0.93 | 6100 | 0.08 |

TABLE 5-continued

| Resin | M | a (mol %) | b (mol %) | c (mol %) | Acid value (m/mol %) | Mw | Metal ion amount (%) |
|---|---|---|---|---|---|---|---|
| Q-4 | — | — | — | — | 0.58 | 7500 | 0.08 |
| Q-5 | — | — | — | — | 0.62 | 7400 | 0.06 |

a:

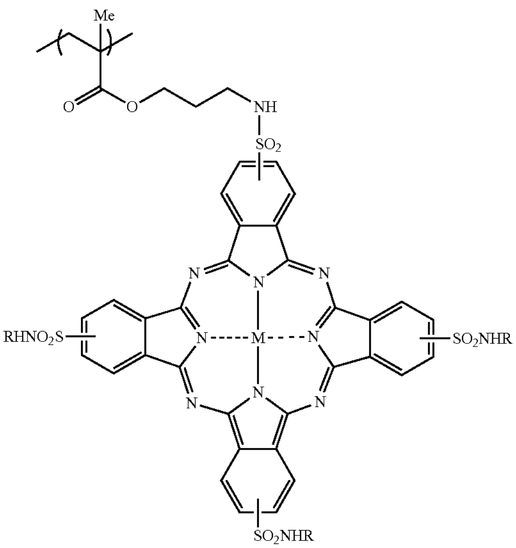

R = $CH_2CH_2CH_2OH$ b:

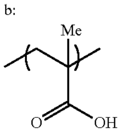

c:

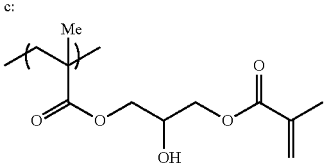

With regard to the molecular weight of the colorant multimer in the present invention, it is preferable that the weight average molecular weight (Mw) be in the range of 3000 to 30000 and the number average molecular weight (Mn) be in the range of 2000 to 20000, and it is more preferable that the weight average molecular weight (Mw) be in the range of 4000 to 25000 and the number average molecular weight (Mn) be in the range of 2500 to 17000. It is particularly preferable that the weight average molecular weight (Mw) be in the range of 5000 to 20000 and the number average molecular weight (Mn) be in the range of 3000 to 15000.

For the colorant multimer used for the radiation-sensitive colored composition of the present invention, the weight average molecular weight (Mw) is preferably 20000 or less from the viewpoint of developability during the production of the color filter.

The radiation-sensitive colored composition of the present invention can be used for color filters, ink materials (particularly UV ink materials), sublimation heat-sensitive transfer materials, or the like.

The colorant multimer in the present invention depends on the characteristics of the colorant structure having a specific structure included its structure, and the radiation-sensitive colored composition of the present invention can form a pixel pattern in the form of a thin film (such as at a thickness of 1 μm or less). Accordingly, the radiation-sensitive colored composition of the present invention is particularly suitable for the preparation of a color filter for a solid state image device, in which high definition with a minute size of 2 μm or less (such as a side length of the pixel pattern viewed from the direction normal to the substrate is from 0.5 to 2.0 μm) is required and a favorable rectangular cross-sectional profile is thus required.

For the radiation-sensitive colored composition of the present invention, the colorant multimer may be used singly or in combination of two or more kinds thereof.

The content of the colorant multimer in the radiation-sensitive colored composition of the present invention depends on the molecular weight and the molar extinction coefficient of the colorant multimer, but is preferably 10% by mass to 70% by mass, preferably 10% by mass to 50% by mass, and most preferably 15% by mass to 30% by mass, with respect to the total content of the radiation-sensitive colored composition.

It is preferable that the colorant multimer of the present invention is soluble in an organic solvent. Examples of the organic solvent include esters (such as methyl 3-ethoxypropionate, ethyl 3-ethoxypropionate, ethyl lactate, butyl acetate, methyl 3-methoxypropionate, and the like); ethers (such as methyl cellosolve acetate, ethyl cellosolve acetate, propylene glycol monomethyl ether, propylene glycol monomethyl ether acetate, and the like); ketones (such as methyl ethyl ketone, cyclohexanone, 2-heptanone, 3-heptanone, and the like); and aromatic hydrocarbons (such as toluene, xylene, and the like). The colorant multimer is preferably soluble in the organic solvent at 1% by mass to 50% by mass, more preferably at 5% by mass to 40% by mass, and still more preferably at 10% by mass to 30% by mass. Within the above-described range, the radiation-sensitive colored composition of the present invention can provide a favorable coated surface and can suppress reduction in the concentration due to elution after coating a coating liquid for the other color.

The Tg of the colorant multimer used for the radiation-sensitive colored composition of the present invention is preferably 50° C. or higher, and more preferably 100° C. or higher. A temperature determined by thermogravimetric analysis (TGA measurement) at which 5% of weight of the colorant multimer is lost is preferably 120° C. or higher, more preferably 150° C. or higher, and still more preferably 200° C. or higher. When the temperature is within the above-described range, the radiation-sensitive colored composition of the present invention can reduce the change in the concentration caused by a heating process.

It is preferable that the molar absorption coefficient of the colorant multimer used for the radiation-sensitive colored composition of the present invention is as high as possible from the viewpoint of coloring power. Further, the maximum absorption wavelength λmax is preferably from 520 nm to 580 nm, and more preferably from 530 nm to 570 nm in order to improve color purity. Within the above-described range, the radiation-sensitive colored composition of the present invention can provide a color filter with favorable color reproducibility. In addition, the absorbance of the radiation-sensitive colored composition of the present invention at the maximal absorption wavelength (Xmax) is preferably 1,000 times or more the absorbance at 450 nm, more preferably 10,000 or more times the absorbance at 450 nm, and still more preferably 100,000 or more times the absorbance at 450 nm of the colorant multimer. When the absorbance is within the above-described range, the radiation-sensitive colored composition of the present invention can provide a color filter with higher transmittance, particularly in the case of the preparation of a blue color filter. Further, the maximum absorption wavelength and the molar extinction coefficient is measured by means of Varian spectrophotometer Carry-5 manufactured by Varian Inc.

Furthermore, it is more preferable that the colorant multimer used for the radiation-sensitive colored composition of the present invention simultaneously satisfy both the preferable range of the maximum absorption wavelength (Xmax) and the preferable range of the absorption coefficient per unit weight.

The radiation-sensitive colored composition of the present invention and the color filter using the radiation-sensitive colored composition of the present invention may contain a colorant other than the colorant multimer of the present invention in addition to the colorant multimer, as long as the effect of the present invention is not impaired. Examples of the colorant other than the colorant multimer of the present invention include triarylmethane colorants having an absorption maximum in the wavelength region of 550 nm to 650 nm (such as C. I. Acid Blue 7, C. I. Acid Blue 83, C. I. Acid Blue 90, C. I. Solvent Blue 38, C. I. Acid Violet 17, C. I. Acid Violet 49 or C. I. Acid Green 3), and xanthene colorants having an absorption maximum in the wavelength range of 500 nm to 600 nm such as C. I. Acid Red 289 and the like.

The content of the triarylmethane-based colorant is not particularly limited as long as the effect of the present invention is not impaired, and preferably from 0.5% by mass to 50% by mass, with respect to the total solid contents in the radiation-sensitive colored composition of the present invention.

Furthermore, in order to prepare a blue filter array, it is preferable to use a mixture of at least one of the colorant multimers and a phthalocyanine-based pigment.

(Phthalocyanine-Based Pigment)

The phthalocyanine-based pigment used in the present invention is not particularly limited so long as it is a colorant having a phthalocyanine skeleton. The center metal included in the phthalocyanine-based pigment is not particularly limited, and may be any metal capable of constituting a phthalocyanine skeleton. In particular, magnesium, titanium, iron, cobalt, nickel, copper, zinc and aluminum are preferably used as the center metal.

Specific examples thereof include C. I. Pigment Blue 15, C. I. Pigment Blue 15:1, C. I. Pigment Blue 15:2, C. I. Pigment Blue 15:3, C. I. Pigment Blue 15:4, C. I. Pigment Blue 15:5, C. I. Pigment Blue 15:6, C. I. Pigment Blue 16, C. I. Pigment Blue 17:1, C. I. Pigment Blue 75, C. I. Pigment Blue 79, C. I. Pigment Green 7, C. I. Pigment Green 36, C. I. Pigment Green 37, chloroaluminum phthalocyanine, hydroxyaluminum phthalocyanine, aluminum phthalocyanine oxide and zinc phthalocyanine. Among these, C. I. Pigment Blue 15, C. I. Pigment Blue 15:6, C. I. Pigment Blue 15:1 and C. I. Pigment Blue 15:2 are preferable, and C. I. Pigment Blue 15:6 is more preferable in view of light resistance and coloring power.

The content of the phthalocyanine-based pigment in the radiation-sensitive colored composition is preferably from 10% by mass to 70% by mass, more preferably from 20% by mass to 60% by mass, and still more preferably from 35% by mass to 50% by mass, with respect to the total solid contents of the radiation-sensitive colored composition.

With regard to the content ratio of the colorant structure and the phthalocyanine-based pigment, for example, in terms of a ratio with the dipyrromethene metal complex compound, that is, the ratio of the phthalocyanine-based pigment:the phthalocyanine-based pigment is preferably from 100:5 to 100:100, more preferably from 100:15 to 100:75, and still more preferably from 100:25 to 100:50.

—Dispersant—

When the radiation-sensitive colored composition of the present invention contains a pigment, it may further contain a dispersant.

The pigment dispersant which can be used in the present invention includes a polymer dispersant (such as polyamidoamine and a salt thereof, polycarboxylic acid and a salt thereof, a high-molecular-weight unsaturated acid ester, a modified polyurethane, a modified polyester, a modified poly(meth)acrylate, a (meth)acrylic copolymer, and a naphthalenesulfonic acid-formalin condensate), a surfactant such as polyoxyethylene alkyl phosphate ester, polyoxyethylene alkylamine, alkanolamine, and the like, pigment derivative, and the like.

The polymer dispersants can be classified into a linear polymer, a terminal-modified polymer, a graft type polymer, and a block type polymer according to their structure.

Examples of the terminal-modified polymer having an anchor moiety to the pigment surface include polymers having a phosphoric acid group at the terminal described in JP3-112992A, JP2003-533455T, and the like; polymers having a sulfonic acid group at the terminal described in JP2002-273191A and the like; polymers having an organic colorant partial structure or a heterocyclic ring described in JP9-77994A and the like; etc. Further, a polymer in which two or more anchor moieties (such as acid groups, basic groups, organic dye partial structures, heterocyclic rings, and the like) to the pigment surface are introduced into the polymer terminal, described in JP2007-277514A, is excellent in the dispersion stability and is also preferable.

Examples of the graft polymer having an anchor moiety to the pigment surface include polyester-based dispersants and the like, and specifically, a reaction product of a poly(lower alkylene imine) and a polyester described in JP54-37082A, JP8-507960T, JP2009-258668A, and the like; the reaction products of a polyallylamine and a polyester described in JP9-169821A and the like; a copolymer of a macromonomer and a nitrogen atom monomer described in JP10-339949A, JP2004-37986A, and the like; a graft polymer having an organic dye partial structure or a heterocyclic ring described in JP2003-238837A, JP2008-9426A, JP2008-81732A, and the like; a copolymer of a macromonomer and an acid group-containing monomer described in JP2010-106268A and the like; etc. Particularly, the amphoteric dispersant resin having a basic group and an acidic group described in JP2009-203462A and the like is particularly preferable from the viewpoints of the pigment, dispersibility and dispersion stability, and the developability exhibited by the radiation-sensitive colored composition using the pigment.

As for the macromonomer used when producing a graft polymer having an anchor moiety to the surface by radical polymerization, a known macromonomer may be used, and examples thereof include MACROMONOMER AA-6 (a polymethyl methacrylate with the terminal group being a methacryloyl group), AS-6 (a polystyrene with the terminal group being a methacryloyl group), AN-6S (a copolymer of an acrylonitrile and a styrene with the terminal group being a methacryloyl group) and AB-6 (a polybutyl acrylate with the terminal group being a methacryloyl group), all produced by Toagosei Ltd.; PLACCEL FM5 (a 5 molar equivalent adduct of ϵ-caprolactone with 2-hydroxyethyl methacrylate) and FA10L (a 10 molar equivalent adduct of ϵ-caprolactone with 2-hydroxyethyl acrylate), both produced by Daicel Chemical Industries, Ltd.; a polyester-based macromonomer described in JP2-272009A; and the like. Among these, a polyester-based macromonomer which is flexible and excellent in solvent affinity is preferable in view of the pigment dispersibility and dispersion stability, and the developability exhibited by the radiation-sensitive colored composition using the pigment, and a polyester-based macromonomer represented by the polyester-based macromonomer described in JP2-272009A is most preferable.

As for the block type polymer having an anchor moiety to the pigment surface, the block type polymers described, for example, in JP2003-49110A, JP2009-52010A, and the like are preferable.

The pigment dispersant which can be used in the present invention may be a commercially available product, and specific examples thereof include polymer dispersants such as "DA-7301" manufactured by Kusumoto Chemicals Ltd., "Disperbyk-101 (polyamidoamine phosphate), 107 (carboxylic acid ester), 110 (copolymer containing acid group), 130 (polyamide), 161, 162, 163, 164, 165, 166, and 170 (high-molecular-weight copolymers)", and "BYK-P104 and P105 (high-molecular-weight unsaturated polycarboxylic acids)", all manufactured by Byk-Chemie, "EFKA 4047, 4050 to 4010 to 4165 (polyurethane-based), EFKA 4330 to 4340 (block copolymers), 4400 to 4402 (modified polyacrylates), 5010 (polyester amide), 5765 (high-molecular-weight polycarboxylate), 6220 (fatty acid polyester), 6745 (phthalocyanine derivative), and 6750 (azo pigment derivative)", all manufactured by EFKA, "Ajispur PB821, PB822, PB880, and PB881" manufactured by Ajinomoto Fine Techno Co., Inc., "Flowlen TG-710 (urethane oligomer)" and "Polyflow No. 50E, and No. 300 (acrylic copolymers)", all manufactured by Kyoeisha Chemical Co., Ltd., "Disperon KS-860, 873SN, 874, #2150 (aliphatic polyvalent carboxylic acid), #7004 (polyetherester), DA-703-50, DA-705, and DA-725" manufactured by Kusumoto Chemicals Ltd., "Demol RN, N (naphthalenesulfonic acid-formalin polycondensate), MS, C, SN-B (aromatic sulfonic acid-formalin polycondensate)", "Homogenol L-18 (high-molecular-weight polycarboxylic acid)", "Emulgen 920, 930, 935, and 985 (polyoxyethylene nonylphenyl ethers)", and "Acetamine 86 (stearylamine acetate), all manufactured by Kao Corporation, "Solsperse 5000 (phthalocyanine derivative), 22000 (azo pigment derivative), 13240 (polyester amine), 3000, 17000, 27000 (polymer having a functional moiety in the end part), 24000, 28000, 32000, and 38500 (graft polymers)", all manufactured by Lubrizol Japan Ltd., "Nikkol T106 (polyoxyethylene sorbitan monooleate), MYS-IEX (polyoxyethylene monostearate)", both manufactured by Nikko Chemicals Co., Ltd., Hinoact T-8000E and the like, manufactured by Kawaken Fine Chemicals Co., Ltd., Organosiloxane Polymer KP341, manufactured by Shin-Etsu Chemical Co., Ltd., "cationic surfactants such as WO01 and the like", a nonionic surfactant such as polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate and sorbitan fatty acid esters, and an anionic surfactant such as "WO04, WO05, WO17, and the like", all manufactured by Yusho Co., Ltd.), "EFA-46, EFKA-47, EFKA-47EA, EFKA Polymer 100, EFKA Polymer 400, EFKA Polymer 401, and EFKA Polymer 450", all manufactured by Morishita & Co., Ltd., a polymer dispersant such as "Disperse Aid 6, Disperse Aid 8, Disperse Aid 15 and Disperse Aid 9100", all manufactured by San Nopco Ltd., and the like; "Adeka Pluronic L31, F38, L42, L44, L61, L64, F68, L72, P95, F77, P84, F87, P94, L101, P103, F108, L121 and P-123" all manufactured by ADEKA Corporation; "IONET (trade name) S-20", manufactured by Sanyo Chemical Industries, Co., Ltd.; and the like.

These pigment dispersants may be used singly or in combination of two or more kinds thereof. In the present invention, a pigment derivative and a polymer dispersant are preferably used in combination. Further, the pigment dispersant of the present invention may be used in combination with a terminal-modified polymer having an anchor moiety to the surface of the pigment, and an alkali-soluble resin. Examples of the alkali-soluble resin include a (meth)acrylic acid copolymer, an itaconic acid copolymer, a crotonic acid copolymer, a maleic acid copolymer, a partially esterified maleic acid copolymer, and the like, and an acidic cellulose derivative having a carboxylic acid in the side chain and a resin obtained by modifying a hydroxyl group-containing polymer with an acid anhydride. Among these, a (meth) acrylic acid copolymer is preferable. Also, an N-position substituted maleimide monomer copolymer described in JP10-300922A, an ether dimer copolymer described in JP2004-300204A, and a polymerizable group-containing alkali-soluble resin described in JP7-319161A are also preferable.

The content of the pigment dispersant in the radiation-sensitive colored composition is preferably from 1 part by mass to 80 parts by mass, more preferably 5 parts by mass to 70 parts by mass, and still more preferably 10 parts by mass to 60 parts by mass, with respect to 100 parts by mass of the pigment.

Specifically, in the case of using a polymer dispersant, the use amount thereof is preferably in the range of 5 parts to 100 parts, and more preferably in the range of 10 parts to 80 parts, in terms of mass, with respect to 100 parts by mass of the pigment.

Furthermore, in the case of using the pigment derivative in combination, the use amount of the pigment derivative is preferably in the range of 1 part to 30 parts, more preferably in the range of 3 parts to 20 parts, and particularly preferably in the range of 5 parts to 15 parts, in terms of mass, with respect to 100 parts by mass of the pigment.

In the radiation-sensitive colored composition, in the case of further using a pigment dispersant using a pigment as a colorant, the total content of the colorant and the dispersant is preferably from 50% by mass to 90% by mass, more preferably from 55% by mass to 85% by mass, and still more preferably from 60% by mass to 80% by mass, with respect to the total solid contents constituting the radiation-sensitive colored composition, from the viewpoints of the curing sensitivity and the color density.

<Polymerizable Compound (B)>

The radiation-sensitive colored composition according to the present invention contains a polymerizable compound.

Specifically, the polymerizable compound is selected from compounds having at least one, preferably two or more terminal ethylenically unsaturated bonds. Among these, a polyfunctional polymerizable compound which is tetrafunctional or higher is preferable; and a polyfunctional polymerizable compound which is pentafunctional or higher is more preferable.

Such compounds are widely known in this industrial field, and may be used in the present invention without specific limitation. These compounds may have any chemical form of, for example, a monomer, a prepolymer, i.e., a dimer, trimer, and an oligomer, or a mixture thereof, a multimer thereof, and the like. The polymerizable compound in the present invention may be used singly or in combination of two or more kinds thereof.

More specifically, examples of the monomer or the prepolymer thereof include unsaturated carboxylic acids (such as acrylic acid, methacrylic acid, itaconic acid, crotonic acid, isocrotonic acid, maleic acid, and the like), esters and amides thereof, and multimers thereof. Preferable examples thereof include an ester of an unsaturated carboxylic acid and an aliphatic polyvalent alcohol compound, an amide of an unsaturated carboxylic acid and an aliphatic polyvalent amine compound, and multimers thereof. Furthermore, an adduct of an unsaturated carboxylic acid ester or an amide having a nucleophilic substituent such as a hydroxyl group, an amino group, a mercapto group, and the like with a monofunctional or multifunctional isocyanate or epoxy; a dehydration condensate of an unsaturated carboxylic acid ester or an amide with a monofunctional or multifunctional carboxylic acid and the like are preferably used. Moreover, an adduct of an unsaturated carboxylic acid ester or amide having an electrophilic substituent such as an isocyanate group, an epoxy group, and the like with a monofunctional or multifunctional alcohol, amine or thiol; and a substituted reaction product of an unsaturated carboxylic acid ester or amide having a detachable substituent such as a halogen group or a tosyloxy group with a monofunctional or multifunctional alcohol, amine or thiol are also preferable. In addition, as another example thereof, any of the compound groups in which the unsaturated carboxylic acid is replaced with a vinyl benzene derivative such as unsaturated phosphonic acid, styrene, and the like, vinyl ether, allyl ether, or the like can also be used.

Specific examples which can be preferably used in the present invention include the compounds described in paragraph Nos. [0095] to [0108] of JP2009-288705A.

Furthermore, the polymerizable monomer is preferably a compound which has at least one addition-polymerizable ethylenically unsaturated group and which has a boiling point of 100° C. or higher at atmospheric pressure. Examples thereof include monofunctional acrylates or methacrylates such as polyethylene glycol mono(meth)acrylate, polypropylene glycol mono(meth)acrylate, phenoxyethyl (meth)acrylate, and the like; polyethylene glycol di(meth)acrylate, trimethylolethane tri(meth)acrylate, neopentyl glycol di(meth) acrylate, pentaerythritol tri(meth)acrylate, pentaerythritol tetra(meth)acrylate, dipentaerythritol penta(meth)acrylate, dipentaerythritol hexa(meth)acrylate, hexanediol (meth) acrylate, trimethylolpropane tri(acryloyloxypropyl)ether, tri (acryloyloxyethyl) isocyanurate, and the like; compounds formed by adding ethyleneoxide or propyleneoxide to a polyfunctional alcohol such as glycerin, trimethylolethane, and the like, and then (meth)acrylating the resultant adduct; urethane acrylates described in JP48-41708B, JP50-6034B, and JP51-37193A; polyester acrylates described in JP48-64183B, JP49-43191B, and JP52-30490B; and polyfunctional acrylates or methacrylates such as epoxy (meth)acrylates formed by reaction of an epoxy resin and (meth)acrylic acid, and the like; and mixtures thereof.

Other examples include polyfunctional (meth)acrylates obtained by reacting a polyfunctional carboxylic acid with a compound having an ethylenic unsaturated group and a cyclic ether group such as glycidyl (meth)acrylate and the like; etc.

Furthermore, preferable examples of the polymerizable compounds include compounds having a fluorene ring and having 2 to more ethylenic polymerizable groups, and cardo resins, as disclosed in JP2010-160418A, JP2010-129825A, JP4364216B, or the like.

Moreover, as the compound which has at least one addition-polymerizable ethylenically unsaturated group and which has a boiling point of 100° C. or higher at atmospheric pressure, the compounds described in paragraph Nos. [0254] to [0257] of JP2008-292970A is also suitable.

In addition to the above, radical polymerizable monomers represented by the following general formulae (MO-1) to (MO-5) can be suitably used. In the general formulae (MO-1) to (MO-5), when T represents an oxyalkylene group, the carbon terminal (rather than the oxygen terminal) of the oxyalkylene group combines with R.

(MO-1)

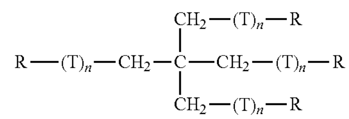

(MO-2)

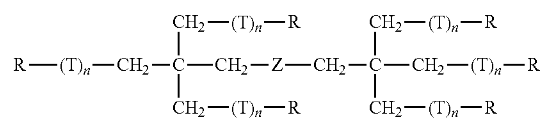

(MO-3)

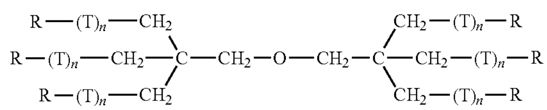

(MO-4)

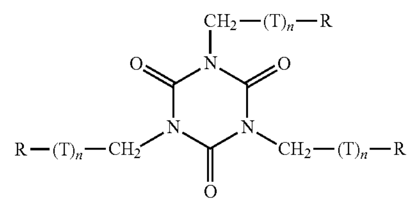

(MO-5)

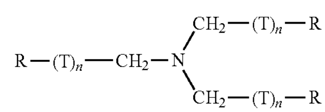

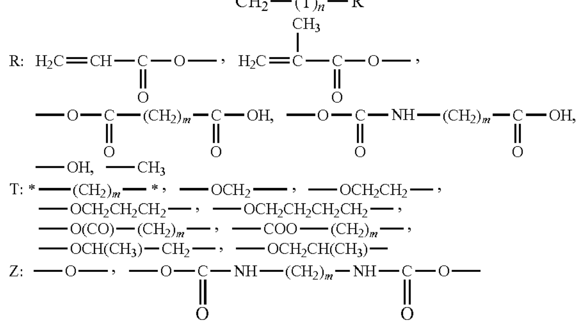

In the general formulae (MO-1) to (MO-5), n represents 0 to 14; m represents 1 to 8; and when plural R's and T's are present in the molecule, the plural R's and T's may be the same as or different from each other, respectively.

In each of the radical polymerizable monomers represented by the general formulae (MO-1) to (MO-5), at least one of plural R's represents a group represented by —OC(=O)CH=CH$_2$ or —OC(=O)C(CH$_3$)=CH$_2$.

Specific examples of the polymerizable monomers represented by the general formulae (MO-1) to (MO-5) include the compounds as disclosed in paragraph Nos. [0248] to [0251] of JP2007-269779A, which are preferably used in the present invention.

Moreover, a compound which is disclosed as a compound of the general formula (1) or (2), together with specific examples thereof, in JP10-62986A and which is obtained by (meth)acrylation of the polyfunctional alcohol to which ethylene oxide or propylene oxide has been added, may be used as the polymerizable compound.

In particular, as the polymerizable compound, dipentaerythritol triacrylate (examples of commercially-available products thereof including KAYARAD D-330, manufactured by Nippon Kayaku Co., Ltd.); dipentaerythritol tetraacrylate (examples of commercially-available products thereof including KAYARAD D-320, manufactured by Nippon Kayaku Co., Ltd.); dipentaerythritol penta(meth)acrylate (examples of commercially-available products thereof including KAYARAD D-310, manufactured by Nippon Kayaku Co., Ltd.); and dipentaerythritol hexa(meth)acrylate (examples of commercially-available products thereof including KAYARAD DPFIA, manufactured by Nippon Kayaku Co., Ltd.), or a structure thereof in which the (meth)acryloyl group has an ethylene glycol or propylene glycol reside therethrough is preferable. The oligomer types thereof can also be used. The embodiments of the preferable polymerizable compounds are shown below.

As the polymerizable compound, the polyfunctional monomer may have an acid group such as a carboxyl group, a sulfonic acid group, a phosphoric acid group, and the like. When the ethylenic compound has an unreacted carboxyl group as in the case of the mixture above, it may be used as it is, but if necessary, a non-aromatic carboxylic acid anhydride can be reacted with the above-described ethylenic compound to introduce the acid group. In this case, specific examples of the non-aromatic carboxylic acid anhydride used include tetrahydrophthalic anhydride, alkylated tetrahydrophthalic anhydride, hexahydrophthalic anhydride, alkylated hexahydrophthalic anhydride, succinic anhydride, and maleic anhydride.

In the present invention, the monomer having an acid group is an ester of an aliphatic polyhydroxy compound with an unsaturated carboxylic acid, and a polyfunctional monomer in which a non-aromatic carboxylic acid anhydride is reacted with an unreacted hydroxyl group of the aliphatic polyhydroxy compound to introduce an acid group is preferable, and particularly preferably, in this ester, the aliphatic polyhydroxy compound is pentaerythritol and/or dipentaerythritol. Examples of the commercial product thereof include M-510, M-520, and the like as the polybasic acid-modified acrylic oligomer manufactured by Toagosei Co., Ltd.

The monomer may be used singly, but since it is difficult to use a single compound in terms of production, it may be used in a mixture of two or more kinds. Further, if necessary, a combination of a polyfunctional monomer having no acid group as a monomer and a polyfunctional monomer having an acid group as a monomer may be used.

The acid value of the polyfunctional monomer having an acid group is preferably 0.1 mgKOH/g to 40 mgKOH/g, and particularly preferably 5 mgKOH/g to 30 mgKOH/g. If the acid value of the polyfunctional monomer is too low, the developing characteristics are poor, whereas the acid value is too high, the handling becomes difficult. Thus, the photopolymerization performance is deteriorated, and correspondingly, curing properties such as the surface flattening of the pixel, and the like become lower. Accordingly, when two or more kinds of other polyfunctional monomers having an acid group or other polyfunctional monomers having no acid group are used in combination, it is preferable to adjust the acid group as the entire polyfunctional monomer to be within the above-described ranges.

Moreover, in a preferable embodiment, a polyfunctional monomer having a caprolactone structure is contained as a polymerizable monomer.

The polyfunctional monomer having a caprolactone structure is not particularly limited, as long as it has a caprolactone structure in a molecule thereof. Examples thereof include ϵ-caprolactone-modified polyfunctional (meth)acrylates which are obtained by esterification of a (meth)acrylic acid, ϵ-caprolactone, and polyhydric alcohols such as trimethylolethane, ditrimethylolethane, trimethylolpropane, ditrimethylolpropane, pentaerythritol, dipentaerythritol, tripentaerythritol, glycerin, diglycerol, trimethylolmelamine, and the like. In particular, polyfunctional compounds having a caprolactone structure represented by the following general formula (Z-1) is preferable.

(Z-1)

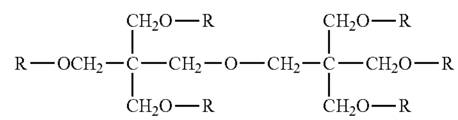

In the general formula (Z-1), all of six R's represent a group represented by the following general formula (Z-2), or 1 to 5 of six R's represent(s) a group represented by the following general formula (Z-2) and the remainder thereof represents a group represented by the following general formula (Z-3).

(Z-2)

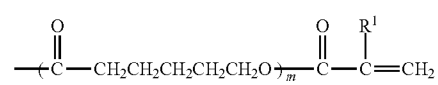

(in the general formula (Z-2), $R^1$ represents a hydrogen atom or a methyl group; m represents 1 or 2; and "*" indicates a biding position.)

(Z-3)

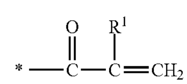

(in the general formula (Z-3), $R^1$ represents a hydrogen atom or a methyl group; and "*" indicates a binding position.)

The polyfunctional monomers having such a caprolactone structure may be commercially available as KAYARAD DPCA series from Nippon Kayaku Co., Ltd., and examples thereof include KAYARAD DPCA-20 (in the general formulae (1) to (3), m=1; the number of groups represented by the general formula (2)=2; and all $R^1$'s represent a hydrogen atom), KAYARAD DPCA-30 (in the general formulae (1) to (3), m=1; the number of groups represented by the general formula (2)=3; and all $R^1$'s represent a hydrogen atom), KAYARAD DPCA-60 (in the general formulae (1) to (3), m=1; the number of groups represented by the general formula (2)=6; and all $R^1$'s represent a hydrogen atom), KAYARAD DPCA-120 (in the general formulae (1) to (3), m=2; the number of groups represented by the general formula (2)=6; and all $R^1$'s represent a hydrogen atom), and the like.

In the present invention, the polyfunctional monomers having a caprolactone structure may be used singly or in combination of two or more kinds thereof.

Furthermore, the specific monomer in the present invention is preferably at least one selected from the group consisting of compounds represented by the following general formula (Z-4) or (Z-5).

(Z-4)

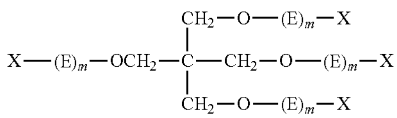

(Z-5)

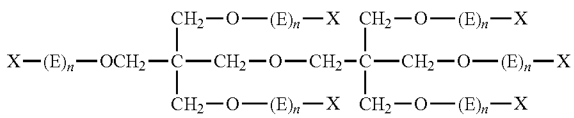

In the general formulae (Z-4) and (Z-5), E's each independently represent —$((CH_2)_yCH_2O)$— or —$((CH_2)_yCH(CH_3)O)$—; y's each independently represent an integer from 0 to 10; and X's each independently represent an acryloyl group, a methacryloyl group, a hydrogen atom, or a carboxyl group.

In the general formula (Z-4), the sum of the acryloyl groups and the methacryloyl groups is 3 or 4; and m's each independently represent an integer from 0 to 10, while the sum of respective m's is an integer from 0 to 40. However, when the sum of respective m's is 0, any one of X's is a carboxyl group.

In the general formula (Z-5), the sum of the acryloyl groups and the methacryloyl groups is 5 or 6; and n's each independently represent an integer from 0 to 10, while the sum of respective n's is an integer from 0 to 60. However, when the sum of respective n's is 0, any one of X's is a carboxyl group.

In the general formula (Z-4), m is preferably an integer from 0 to 6, and more preferably an integer from 0 to 4.

Furthermore, the sum of respective m's is preferably an integer from 2 to 40, more preferably an integer from 2 to 16, and particularly preferably an integer from 4 to 8.

In the general formula (Z-5), n is preferably an integer from 0 to 6, and more preferably an integer from 0 to 4.

Furthermore, n's is preferably an integer from 3 to 60, more preferably an integer from 3 to 24, and particularly preferably an integer from 6 to 12.

Furthermore, —$((CH_2)_yCH_2O)$— or —$((CH_2)_yCH(CH_3)O)$— in the general formula (Z-4) or the general formula (Z-5) is preferably in the form in which the terminal on the oxygen atom side is linked to X.

The compound represented by the general formula (Z-4) or the general formula (Z-5) may be used singly or in combination of two or more kinds thereof. Particularly, in the general formula (Z-5), it is preferable that all of six X's be acryloyl groups.

Furthermore, the total content of the compound represented by the general formula (Z-4) or the general formula (Z-5) in the polymerizable compound is preferably 20% by mass or more, and more preferably 50% by mass or more.

The compounds represented by the general formula (Z-4) or the general formula (Z-5) may be synthesized from a step of linking a ring-opened skeleton such as ethylene oxide or propylene oxide to pentaerythritol or dipentaerythritol by a ring-opening addition reaction, and a step of introducing a (meth)acryloyl group to a terminal hydroxyl group of the ring-opened skeleton through, for example, a reaction with (meth)acryloyl chloride, which are conventionally known processes. The respective processes are well known processes, and a person ordinarily skilled in the art will be able to easily synthesize a compound represented by the general formula (Z-4) or (Z-5).

Among the compounds represented by the general formula (Z-4) or the general formula (Z-5), pentaerythritol derivatives and/or dipentaerythritol derivatives are more preferable.

Specifically, there may be mentioned compounds represented by the following formulas (a) to (f) (which will be hereinafter also referred to as "Exemplary Compounds (a) to (f)"), and among them, Exemplary Compound (a), (b), (e), and (f) are preferable.

(a)

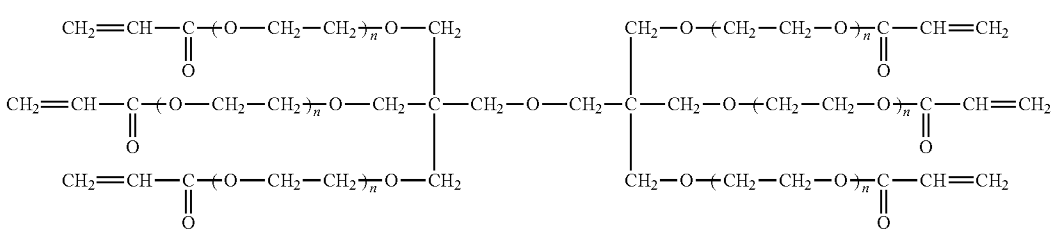

(um of respective n's is 6)

(b)

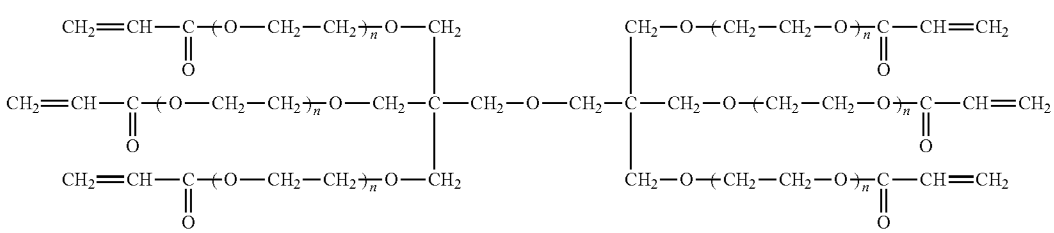

(um of respective n's is 12)

-continued (c)

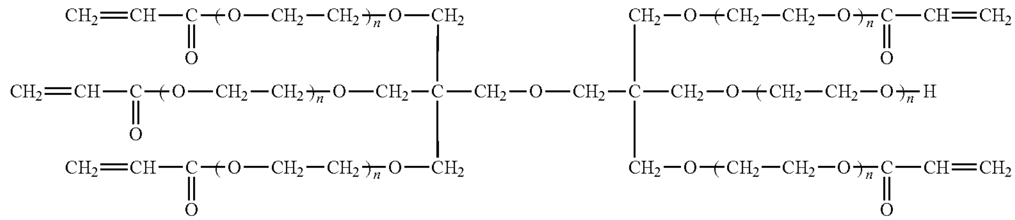

(um of respective n's is 12)

(d)

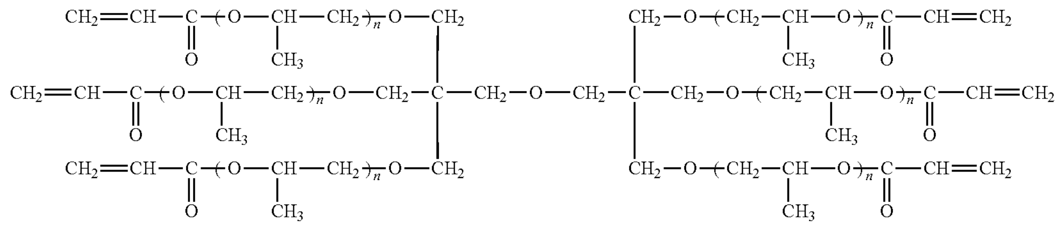

(um of respective n's is 6)

(e)

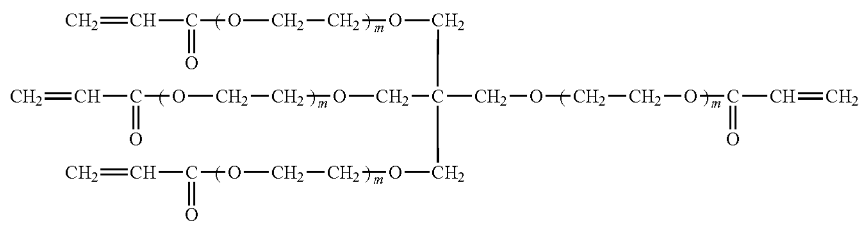

(um of respective n's is 4)

(f)

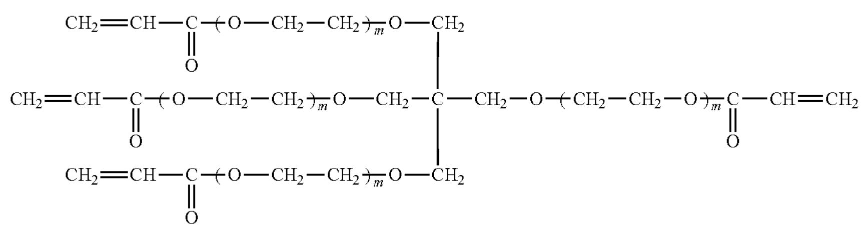

(um of respective n's is 12)

Examples of commercially available products of the compounds represented by the general formula (Z-4) or the general formula (Z-5) include SR-494 manufactured by Sartomer, LLC, which is a tetrafunctional acrylate having 4 ethyleneoxy chains, DPCA-60, which is a hexafunctional acrylate having 6 pentyleneoxy chains, TPA-330 manufactured by Nippon Kayaku Co., Ltd., which is a trifunctional acrylate having 3 isobutyleneoxy chains, and the like.

In addition, urethane acrylates described in JP48-41708B, JP51-37193A, and JP2-32293B and JP2-16765B, and urethane compounds having an ethylene oxide-based skeleton described in JP58-49860B, JP56-17654B, JP62-39417B, and JP62-39418B are also preferable. Furthermore, by using addition-polymerization compounds having an amino structure or a sulfide structure in the molecule, as described in JP63-277653A, JP63-260909A, and JP1-105238A, a photopolymerizable composition, which is excellent in terms of a photosensitive speed, can be obtained.

Examples of the commercially available product include urethane oligomers UAS-10 and UAB-140 (manufactured by Nippon Paper Industries Co., Ltd.), UA-7200 (manufactured by Shin-Nakamura Chemical Co., Ltd., DPHA-40H (manufactured by Nippon Kayaku Co., Ltd.), and UA-306H, UA-306T, UA-306I, AH-600, T-600, and AI-600 (manufactured by Kyoeisha Chemical Co., Ltd.).

For the polymerizable compound, the details regarding its use method involving the structure, singular or combinational use, addition amount, or the like can be arbitrarily adjusted according to a final performance design of the radiation-sensitive colored composition. From the viewpoint of sensitivity, a structure having a large unsaturated group content per molecule is preferable, and in many cases di- or higher-functionality is preferable. Furthermore, in order to increase the film strength of the radiation-sensitive colored composition, tri- or higher-functionality is better, and it is also effective to adjust both sensitivity and strength by using in combination different functionality/different polymerizable groups (for example an acrylic acid ester, a methacrylic acid ester, a styrene-based compound, and a vinyl ether-based compound). Further, the use of the above in combination with other trifunctional or higher polymerizable compounds in the form of ethylene oxide chains can control the developability of the radiation-sensitive colored composition, thereby obtaining an excellent pattern type performance, which is thus preferable.

Furthermore, selection and application methods of the polymerizable compound are important factors for compatibility and dispersibility with other components (for example, a material to be dispersed, an alkali-soluble resin, and the like) contained in the radiation-sensitive colored composition and, for example, the compatibility can be improved by the use of a low-purity compound or the use of two or more kinds of the polymerizable compounds in combination. Moreover, in order to improve adhesion to a hard surface such as a substrate and the like, a specific structure can also be selected in some cases.

The content of the polymerizable compound in the radiation-sensitive colored composition of the present invention is preferably 0.1% by mass to 90% by mass, more preferably 1.0% by mass to 50% by mass, and particularly preferably 2.0% by mass to 30% by mass, with respect to the solid contents of the radiation-sensitive colored composition.

<Inorganic Metal Salt (X)>

Next, an inorganic metal salt (X) (which may be hereinafter referred to as an "inorganic metal salt" in some cases) that is different from the organic solvent-soluble dye (A), which is characterized by the present invention, will be explained. In the present invention, the expression "inorganic metal salt (X) including no colorant skeleton" means an inorganic metal salt that does not include a color-developing atomic group, and specifically, has a definition encompassing inorganic metal salts or free metallic ions, in addition to the compounds having a colorant skeleton.

When the radiation-sensitive colored composition of the present invention is adjusted to have a content of the inorganic metal salt of 0.1% by mass or less with respect to the dye solid content, the color unevenness of the colored cured film formed by using the radiation-sensitive colored composition of the present invention can be reduced. When the content of the inorganic metal salt exceeds 0.1% by mass, it causes the color unevenness to increase.

The content of the inorganic metal salt in the radiation-sensitive colored composition of the present invention may be calculated by a method described in JP2004-315729A.

Specifically, the content may be measured by an on-column derivatization method through a reversed-phase partition chromatography of a metal-sarcosine complex.

As the sarcosine derivatives, for example, sodium N-(dithiocarboxy)-sarcosine (DTCSNa) manufactured by DOJIN DO LABORATORIES may be used. Further, as a high performance liquid chromatography instrument, 10 Avp series (manufactured by Shimadzu Corporation) with a column "Octadecyl-2PW" (manufactured by TOSOH CORPORATION) of 6.0×150 mm may be used. When measuring the concentration of copper ion ($Cu^{2+}$) by the on-column derivatization method, the concentration of copper ion may be calculated by calibration curve prepared separately from the detected area.

Moreover, formation of a complex of sarcosine derivatives and copper salts is disclosed in detail in "Analytical Chemistry" by Yukio SAKAI and Kazuko KUROKI, 28, 1979, pp 429 to 431. Further, confirmation of the metallic complex by a high performance liquid chromatography is described specifically in "Analytical Chemistry" by Seiza, Norimitus TAKAHASHI, Sadanobu INOUE, and Mutsuya MATSUBARA, 35, 1986, pp 819 to 822; "Analytical Chemistry" by Shukuro IGARASHI, Akira OBARA, Hiroaki ADACHI, and Takao YOTSUYANAGI, 35, 1986, pp 829 to 831; and "Analytical Chemistry" by Eisaburo WATANABE, Hidemitsu NAKAJIMA, Takeshi EBINA, Hitoshi HOSHINO, and Takao YOTSUYANAGI, 32, 1983, pp 469 to 474.

As described above, the inorganic metal salt is an inorganic metal salt or a free metallic ion which has no colorant skeleton.

The inorganic metal salt having no colorant skeleton is not particularly limited, and examples thereof include chloride salts, acetate salts, sulfate salts, nitrate salts, hydroxide salts, and the like of the following metallic ions. The metallic ions are not particularly limited, and examples thereof include zinc, magnesium, silicon, tin, rhodium, platinum, palladium, molybdenum, manganese, lead, copper, nickel, cobalt, iron, titan oxy, vanadium oxy, barium, calcium, sodium, strontium, and the like. As counter ions of these metallic ions, anions derived from synthesis of the respective starting materials, and the like.

The inorganic metal salts of the metallic ions and the like are generally derived from their starting materials. In particular, these metallic ions and the like are components produced by reaction catalyst at the time of synthesis of the starting materials, excess at the time of forming a metallic complex, or excess or release at the time of preparing a metallic complex dye.

For the color unevenness of the colored cured film radiation-sensitive composition of the present invention, calcium and sodium used for the synthesis, or metallic salts that are impurities from the metal containing dyes become a problem. Also, when copper phthalocyanine, zinc phthalocyanine, cobalt phthalocyanine, and the like are used, free copper, zinc, and cobalt ions become respectively problem for the properties mentioned above.

In the radiation-sensitive colored composition of the present invention, the upper limit in the content of the inorganic metal salt is 0.1% by mass, and preferably 0.01% by mass or less, with respect to the dye solid contents. Further, the lower limit in the content of the inorganic metal salt in the present invention is preferably 0, and substantially 0.0001% by mass to 0.1% by mass, and preferably 0.0001% by mass to 0.01% by mass.

In order to set the content of the inorganic metal salt in the radiation-sensitive colored composition of the present invention within the above-described ranges, it is preferable to strengthen the purification of the respective components constituting the composition at the time of synthesis thereof. The methods for strengthening the purification include a method for removing calcium salt or sodium salt by reinforcement of water washing; a method for removing free copper, zinc, and cobalt with acid treatment (such as a hydrochloric acid treatment and the like) in a process of the after-treatment at the time of synthesis of copper phthalocyanine, zinc phthalocyanine, or cobalt phthalocyanine; and the like.

<Photopolymerization Initiator (C)>

It is necessary for the radiation-sensitive colored composition of the present invention to further contain a photopolymerization initiator in order to improving more sensitivity.

The photopolymerization initiator is not particularly limited and may be suitably selected from among those known in the art as long as the photopolymerization initiator has an ability to initiate polymerization of the polymerizable compound. The photopolymerization initiator may be an activator which exerts some effects with a photoexcited photosensitizer and generates an active radical or may be an initiator capable of initiating cation polymerization depending on the type of monomer.

Furthermore, the photopolymerization initiator preferably contains at least one compound having a molecule extinction coefficient of at least about 50 in the range from about 300 nm to 800 nm (more preferably from 330 nm to 500 nm).

Examples of the photopolymerization initiator include halogenated hydrocarbon derivatives (such as halogenated hydrocarbon derivative having a triazine skeleton having a triazine skeleton, halogenated hydrocarbon derivative having an oxadiazole skeleton, and the like), acylphosphine compounds such as acylphosphine oxide and the like, hexaaryl biimidazole, oxime compounds such as oxime derivatives and the like, organic peroxides, thio compounds, ketone compounds, aromatic onium salts, ketoxime ethers, aminoacetophenone compounds, hydroxyacetophenone, and the like.

Furthermore, from the viewpoint of exposure sensitivity, the photopolymerization initiator is preferably a compound selected from the group consisting of a trihalomethyltriazine compound, a benzyldimethyl ketal compound, an α-hydroxyketone compound, an α-aminoketone compound, an acyl phosphine compound, a phosphine oxide compound, a metallocene compound, an oxime compound, a biimidazole compound, an onium compound, a benzothiazole compound, a benzophenone compound, an acetophenone compounds and derivatives thereof, a cyclopentadiene-benzene-iron complex and a salt thereof, a halomethyloxadiazole compound, and a 3-aryl substituted coumarin compound.

Among them, a trihalomethyltriazine compound, an α-aminoketone compound, an acylphosphine compound, a phosphine oxide compound, an oxime compound, a biimidazole compound, an onium compound, a benzophenone compound, and an acetophenone compound are more preferable, and at least one compound selected from the group consisting of a trihalomethyltriazine compound, an α-aminoketone compound, an oxime compound, a biimidazole compound, and a benzophenone compound is most preferable. Oxime compounds are most preferable.

In particular, when the radiation-sensitive colored composition of the present invention is used for the preparation of a color filter for a solid state image device, it is necessary to form a fine pattern in the shape form, and thus, it is important that there is no residue in the unexposed area while exhibiting curability. From this perspective, it is particularly preferable to use an oxime compound as the polymerization initiator. In particular, when forming a fine pattern in the solid state image device, a stepper exposure device is used for curing exposure, but this exposure device may be damaged by halogen in some cases. Therefore, it is also necessary to suppress the amount of the polymerization initiator to be added to be low. In view of these points, it is most preferable to use an oxime compound as the photopolymerization initiator (C) in order to form a fine pattern as in a solid state image device.

Examples of the halogenated hydrocarbon compound having a triazine skeleton include the compounds described in Bulletin of the Chemical Society of Japan, 42, 2924 (1969) reported by Wakabayashi et at.; compounds described in Great Britain Patent No. 1388492; compounds described in JP53-133428A; compounds described in Germany Patent No. 3337024; compounds described in the Journal of Organic Chemistry reported by F. C. Schaefer et al., 29, 1527 (1964); compounds described in JP62-58241A; compounds described in JP5-281728A; compounds described in JP5-34920A; compounds described in U.S. Pat. No. 4,212,976; and the like.

Examples of the compounds described in U.S. Pat. No. 4,212,976 include compounds each having an oxadiazole skeleton (such as 2-trichloromethyl-5-phenyl-1,3,4-oxadiazole, 2-trichloromethyl-5-(4-chlorophenyl)-1,3,4-oxadiazole, 2-trichloromethyl-5-(1-naphthyl)-1,3,4-oxadiazoke, 2-trichloromethyl-5-(2-naphthyl)-1,3,4-oxadiazole, 2-tribromomethyl-5-phenyl-1,3,4-oxadiazole, 2-tribromomethyl-5-(2-naphthyl)-1,3,4-oxadiazole; 2-trichloromethyl-5-styryl-1,3,4-oxadiazole, 2-trichloromethyl-5-(4-chlorstyryl)-1,3,4-oxadiazole, 2-trichloromethyl-5-(4-methoxystyryl)-1,3,4-oxadiazole, 2-trichloromethyl-5-(1-naphthyl)-1,3,4-oxadiazole, 2-trichloromethyl-5-(4-n-buthoxystyryl)-1,3,4-oxadiazole, 2-tripromemethyl-5-styryl-1,3,4-oxadiazole), and the like.

Examples of photopolymerization initiators other than those described above include acridine derivatives (such as 9-phenylacidine, 1,7-bis(9,9'-acridinyl)heptanes, and the like), and N-phenylglycine; polyhalogen compounds (such as carbon tetrabromide, phenyltribromomethylsulfone, phenyltrichloromethylketone, and the like); coumarins (such as 3-(2-benzofuroyl)-7-diethylaminocoumarin, 3-(2-benzofuroyl)-7-(1-pyrrolydinyl) coumarin, 3-benzoyl-7-diethylaminocoumarin, 3-(2-methoxybenzoyl)-7-diethylaminocoumarin, 3-(4-dimethylaminobenzoyl)-7-diethylaminocoumarin, 3,3'-carbonylbis(5,7-di-n-propoxycoumarin), 3,3'-carbonylbis(7-diethylaminocoumarin), 3-benzoyl-7-methoxycoumarin, 3-(2-furoyl)-7-diethylaminocoumarin, 3-(4-diethylamino-cinnamoyl)-7-diethylaminocoumarin, 7-methoxy-3-(3-pyrizylcarbonyl) coumarin, 3-benzoyl-5,7-dipropoxycoumarin, 7-benzotriazole-2-ylcoumarin; coumarin compounds described in JP5-19475AA, JP7-271028A, JP2002-363206A, JP2002-363207A, JP2002-363208A, JP2002-363209A, or the like); acylphosphine oxides (such as bis(2,4,6-trimethylbenzoyl)-phenylphosphine oxide, bis(2,6-dimethoxybenzoyl)-2,4,4-trimethyl-pentylphenylphosphine oxide, LucirinTPO, and the like); metallocenes (such as bis (η5-2,4-chyclopentadiene-1-yl)-bis(2,6-diphloro-3-(1H-pyrrol-1-yl)-phenyl) titanium, ?η5-cyclopentadiethyl-η6-chromenyl-iron (1+)-hexafluorophosphate (1−)), and the like); compounds described in JP53-133428A, JP57-1819B, and JP57-6096B; the compounds described in U.S. Pat. No. 3,615,455; etc.

Examples of the ketone compound include benzophenone, 2-methylbenzophenone, 3-methylbenzophenone, 4-methylbenzophenone, 4-methoxybenzophenone, 2-chlorobenzophenone, 4-chlorobenzophenone, 4-bromobenzophenone, 2-carboxybenzophenone, 2-ethoxy carbonylbenzophenone, benzophenone tetracarboxylic acids or tetramethyl esters thereof; 4,4'-bis(dialkylamino)benzophenones (such as 4,4'-bis(dimethylamine)benzophenone and 4,4'-bisdicyclohexylamine)benzophenone, 4,4'-bis(diethylamine)benzophenone, 4,4'-bis(dihydroxyethylamine)benzophenone, 4-methoxy-4'-dimethylaminobenzophenone, 4,4'-dimethoxybenzophenone, 4-dimethylaminobenzophenone, 4-dimethylaminoacetophenone, benzyl, anthraquinone, 2-t-butylanthraquinone, 2-methylanthraquinone, phenanthraquinone, xanthone, thioxanthone, 2-chlor-thioxanthone, 2,4-diethylthioxanthone, fluorenone, 2-benzyl-dimethylamino-1-(4-morphorinophenyl)-1-butanone, 2-methyl-1-[4-(methylthio)phenyl]-2-morphorino-1-propanone, 2-hydroxy-2-methyl-[4-(1-methylvinyl)phenyl]propanol oligomer, benzoin, benzoin ethers (such as benzoin methyl ether, benzoin ethyl ether, benzoin propyl ether, benzoin isopropyl ether, benzoin phenyl ether, and benzyldimethyl ketal), acridone, chloroacridone, N-methylacridone, N-butylacridone, N-butylchloroacridone, and the like.

As the photopolymerization initiator, a hydroxyacetophenone compound, an aminacetophenone compound, and an acylphosphine compound can be suitably used. More specifically, for example, aminoacetophenone-based initiators described in JP10-291969A or acylphosphine oxide-based initiators described in Japanese Patent No. 4,225,898 can also be used.

As the hydroxyacetophenone-based initiator, IRGACURE-184, DAROCUR-1173, IRGACURE-500, IRGACURE-2959, and IRGACURE-127 (trade names: all manufactured by BASF Japan). As the aminoacetophenone-based initiator, commercial products, IRGACURE-907, IRGACURE-369, and IRGACURE-379 (trade names: all manufactured by BASF Japan) can be used. As the aminoacetophenone-based initiator, the compound described in JP2009-191179A, in which the absorption wavelength matches the long-wave light source such as 365 nm, 405 nm, or the like can also be used. In addition, as the acyl phosphine-based initiator, a commercial product, IRGACURE-819 and DAROCUR-TPO (trade names: all manufactured by BASF Japan) can be used.

Preferable examples of the photopolymerization initiator include oxime compounds. As the specific examples of the oxime initiator, the compounds described in JP2001-233842A, the compounds described in JP2000-80068A, and the compounds described in JP2006-342166A can be used.

Examples of the oxime compounds such as oxime derivatives and the like, that are preferably used as the photopolymerization initiator in the present invention include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy) iminobutan-2-one, and 2-ethoxycarbonyloxyimino-1-phenyl propan-1-one, and the like.

Examples of the oxime ester compounds include the compounds described in J. C. S. Perkin II (1979) 1653-1660, J. C. S. Perkin II (1979) 156-162, Journal of Photopolymer Science and Technology (1995) 202-232, and JP2000-66385A; and the compounds described in JP2000-80068A, JP2004-534797T, and JP2006-342166A; and the like.

As the commercial product, IRGACURE OXE01 (manufactured by BASF Japan) and IRGACURE OXE02 (manufactured by BASF Japan) are preferably used.

In addition, as an oxime ester compound other than those described above, compounds described in JP2009-519904T in which an oxime is linked to the N-position of carbazole, compounds described in U.S. Pat. No. 7,626,957, in which a hetero substituent is introduced into a benzophenone moiety, compounds described in JP2010-15025A and U.S. Patent Unexamined Application No. 2009-292039, in which a nitro group is introduced into a colorant moiety, ketoxime compounds described in International Publication Patent No. 2009-131189, compounds described in U.S. Pat. No. 7,556,910, which contains a triazine skeleton and an oxime skeleton in the same molecule, compounds described in JP2009-221114A, which has a maximum absorption at 405 nm and has good sensitivity for g-ray light source, and the like may be used.

Furthermore, the cyclic oxime compounds described in JP2007-231000A and JP2007-322744A may be also preferably used. Among the cyclic oxime compounds, the cyclic oxime compounds described in JP2010-32985A and JP2010-185072A are particularly preferable since cyclic oxime compounds fused with a carbazole colorant has high light absorbance, and thus promotes the increase in the sensitivity.

Furthermore, the compound described in JP2009-242469A, which has an unsaturated bond in a specific moiety of an oxime compound can also be preferably used, since it is capable of providing higher sensitivity by reproduction of active radicals from polymerization-inactive radicals.

Most preferable examples thereof include an oxime compound having a specific substituent described in JP2007-269779A and an oxime compound having a thioaryl group described in JP2009-191061A.

Specifically, the oxime compound is preferably a compound represented by the following general formula (OX-1). Incidentally, the oxime compound may be an oxime compound where the N—O bond of the oxime is an (E) form, an oxime compound where the bond is a (Z) form, or an oxime compound where the bond is a mixture of the (E) form and the (Z) form.

(OX-1)

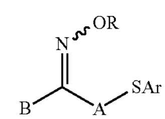

(in the formula (OX-1), R and B each independently represent a monovalent substituent; A represents a divalent organic group; and Ar represents an aryl group.)

In the formula (OX-1), the monovalent substituent represented by R is preferably a monovalent nonmetallic atom group.

Examples of the monovalent nonmetallic atom group include an alkyl group, an aryl group, an acyl group, an alkoxycarbonyl group, an aryloxycarbonyl group, a heterocyclic group, an alkylthiocarbonyl group, an arylthiocarbonyl group, and the like. Further, these groups may have one or more substituents. The substituent as described above may be further substituted with another substituent.

Examples of the substituent include a halogen atom, aryloxy group, an alkoxycarbonyl group, an aryloxycarbonyl group, an acyloxy group, an acyl group, an alkyl group, an aryl group, and the like.

The alkyl group is preferably an alkyl group having 1 to 30 carbon atoms, and specific examples thereof include a methyl group, an ethyl group, a propyl group, a butyl group, a hexyl group, an octyl group, a decyl group, a dodecyl group, an octadecyl group, an isopropyl group, an isobutyl group, a sec-butyl group, a tert-butyl group, a 1-ethylpentyl group, a cyclopentyl group, a cyclohexyl group, a trifluoromethyl group, a 2-ethylhexyl group, a phenacyl group, a 1-naphthoylmethyl group, a 2-naphthoylmethyl group, a 4-methylsulfanylphenacyl group, a 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group, a 3-nitrophenacyl group, and the like.

The aryl group is preferably an aryl group having 6 to 30 carbon atoms, and specific examples thereof include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quaterphenyl group, an o-tolyl group, an m-tolyl group, a p-tolyl group, a xylyl group, an o-cumenyl group, an m-cumenyl group, a p-cumenyl group, a mesityl group, a pentalenyl group, a binaphthalenyl group, a ternaphthalenyl group, a quatemaphthalenyl group, a heptalenyl group, a biphenylenyl group, an indacenyl group, a fluorantenyl group, an acenaphthylenyl group, an aceanthrylenyl group, a phenalenyl group, a fluorenyl group, an anthryl group, a bianthracenyl group, a teranthracenyl group, a quateranthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, an ovalenyl group, and the like.

The acyl group is preferably an acyl group having 2 to 20 carbon atoms, and specific examples thereof include an acetyl group, a propanoyl group, a butanoyl group, a trifluoroacetyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diefhylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, a 4-methoxybenzoyl group, and the like.

The alkoxycarbonyl group is preferably an alkoxycarbonyl group having 2 to 20 carbon atoms, and specific examples thereof include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, a trifluoromethyloxycarbonyl group, and the like.

Specific examples of the aryloxycarbonyl group include a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, a 4-methoxyphenyloxycarbonyl group, and the like.

The heterocyclic group is preferably an aromatic or aliphatic heterocyclic ring containing a nitrogen atom, an oxygen atom, a sulfur atom, or a phosphorus atom.

Specific examples thereof include a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolizinyl group, an isoquinolyl group, a quinolyl group, a phthalazinyl group, a naphthyridinyl group, a quinoxanilyl group, a quinazolinyl group, a cinnolinyl group, a pteridinyl group, a 4aH-carbazolyl group, a carbazolyl group, a β-carbolinyl group, a phenanthridinyl group, an acridinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl group, a thioxanthonyl group, and the like.

Specific examples of the alkylthiocarbonyl group include a methylthiocarbonyl group, a propylthiocarbonyl group, a butylthiocarbonyl group, a hexylthiocarbonyl group, an octylthiocarbonyl group, a decylthiocarbonyl group, an octadecylthiocarbonyl group, and a trifluoromethylthiocarbonyl group.

Specific examples of the arylthiocarbonyl group include a 1-naphthylthiocarbonyl group, a 2-naphthylthiocarbonyl group, a 4-methylsulfanylphenylthiocarbonyl group, a 4-phenylsulfanylphenylthiocarbonyl group, a 4-dimethylaminophenylthiocarbonyl group, a 4-diethylaminophenylthiocarbonyl group, a 2-chlorophenylthiocarbonyl group, a 2-methylphenylthiocarbonyl group, a 2-methoxyphenylthiocarbonyl group, a 2-butoxyphenylthiocarbonyl group, a 3-chlorophenylthiocarbonyl group, a 3-trifluoromethylphenylthiocarbonyl group, a 3-cyanophenylthiocarbonyl group, a 3-n itrophenylthiocarbonyl group, a 4-fluorophenylthiocarbonyl group, a 4-cyanophenylthiocarbonyl group, and a 4-methoxyphenylthiocarbonyl group.

The monovalent substituent represented by B in the formula (ω-1), represents an aryl group, a heterocyclic group, an arylcarbonyl group, or a heterocyclic carbonyl group. Further, these groups may have one or more substituent. Examples of the substituent include the substituents described above. Also, each of the substituents described above may be further substituted with another substituent.

Among these, the particularly preferable structures are shown below.

In the following structures, Y, X, and n have the same meanings as Y, X, and n in the formula (ω-2) as described later, respectively, and preferable examples thereof are also the same.

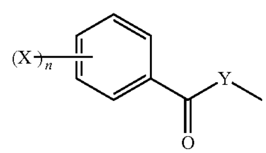

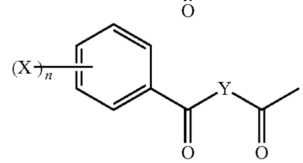

The divalent organic group represented by A in the formula (OX-1) includes an alkylene group having a carbon number of 1 to 12, a cyclohexylene group, and an alkynylene group. These groups may have one or more substituents. Examples of the substituent include the substituents described above. Also, each of the substituents described above may be further substituted with another substituent.

Among these, from the standpoint of increasing the sensitivity and suppressing the coloration due to heating or aging, A in the formula (OX-1) is preferably an unsubstituted alkylene group, an alkylene group substituted with an alkyl group (such as a methyl group, an ethyl group, a tert-butyl group, and a dodecyl group), an alkylene group substituted with an alkenyl group (such as a vinyl group and an allyl group), or an alkylene group substituted with an aryl group (such as a phenyl group, a p-tolyl group, a xylyl group, a cumenyl group, a naphthyl group, an anthryl group, a phenanthryl group, and a styryl group.

The aryl group represented by Ar in the formula (OX-1) is preferably an aryl group having 6 to 30 carbon atoms and may have a substituent. Examples of the substituent are the same as those of the substituent introduced into the substituted aryl group that is described above as specific examples of the aryl group which may have a substituent.

Among these, from the standpoint of increasing the sensitivity and suppressing the coloration due to heating or aging, a substituted or unsubstituted phenyl group is preferable.

In the formula (OX-1), in view of sensitivity, the structure "SAr" formed by Ar and S in the formula (OX-1) adjacent thereto is preferably a structure shown below. Further, Me represents a methyl group, and Et represents an ethyl group.

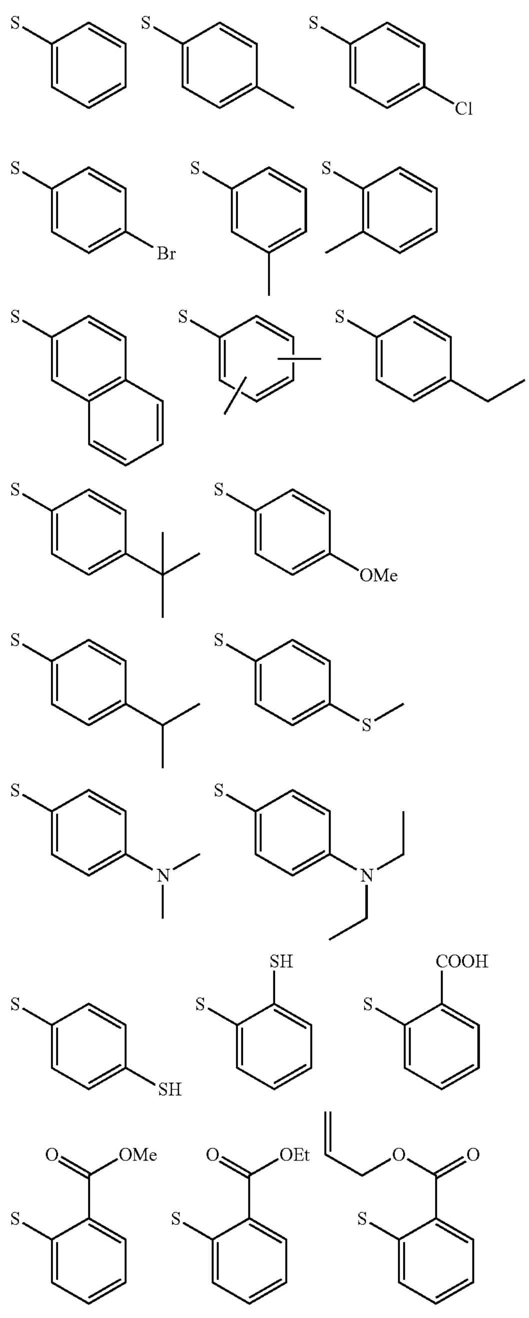

The oxime compound is preferably a compound represented by the following formula (OX-2).

(OX-2)

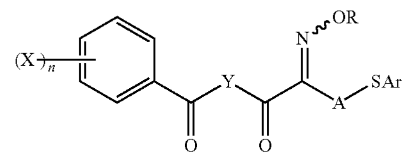

(In the formula (Ox-2), R and X each independently represent a monovalent substituent; A and Y each independently represent a divalent organic group; Ar represents an aryl group; and n is an integer of 0 to 5.) R, A and Ar in the formula (OX-2) have the same meanings as R, A and Ar in the formula (OX-1), and preferable examples thereof are also the same.

Examples of the monovalent substituent represented by the formula (ω-2) include an alkyl group, an aryl group, an alkoxy group, an aryloxy group, an acyloxy group, an acyl group, an alkoxycarbonyl group, an amino group, a heterocyclic group, and a halogen group. These groups may have one or more substituents. Examples of the substituent include the substituents described above. Also, each of the substituents described above may be further substituted with another substituent.

Among these, from the standpoint of enhancing the solvent solubility and absorption efficiency in the long wavelength region, X in the formula (ω-2) is preferably an alkyl group.

Furthermore, in the formula (ω-2), n represents an integer of 0 to 5, and preferably an integer of 0 to 2.

The divalent organic group represented by Y in the formula (ω-2) includes structures shown below. In the structures shown below, "*" indicates a bonding position to the carbon atom adjacent to Y in the formula (ω-2)

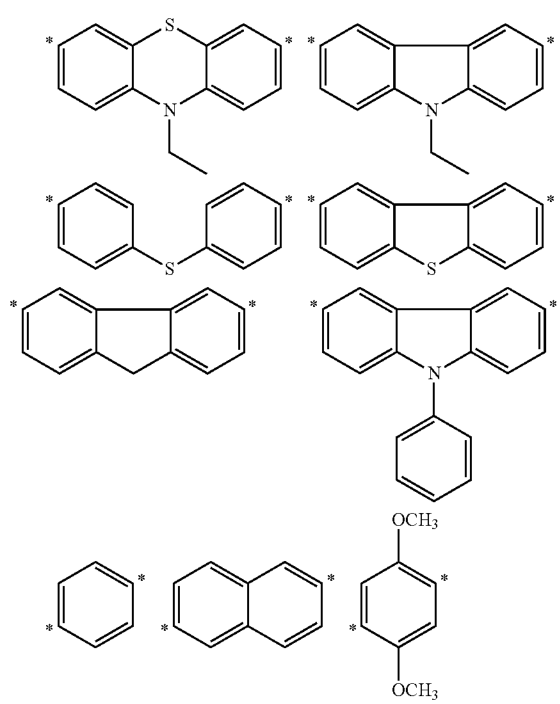

-continued

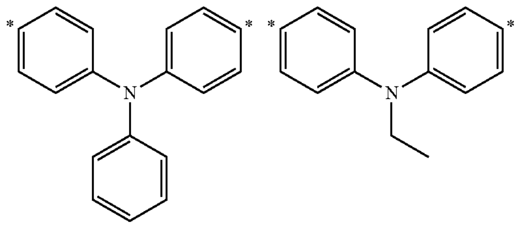

Among these, in view of achieving high sensitivity, structures shown below are preferable.

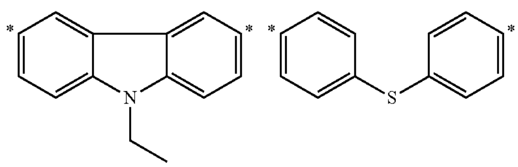

The oxime compound is also preferably a compound represented by the following formula (ω-3):

(OX-3)

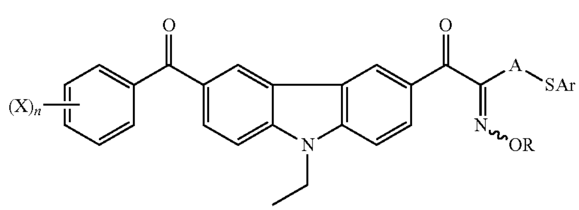

(in the formula (Ox-3), R and X each independently represent a monovalent substituent; A and Y each independently represent a divalent organic group; Ar represents an aryl group; and n is an integer of 0 to 5.).

R, X, A, Ar, and n in the formula (OX-3) have the same meanings as R, X, A, Ar, and n in the formula (OX-2), and preferable examples thereof are also the same.

Specific examples (C-4) to (C-13) of the oxime compound which is suitably used are shown below, but the present invention is not limited thereto.

(C-4)

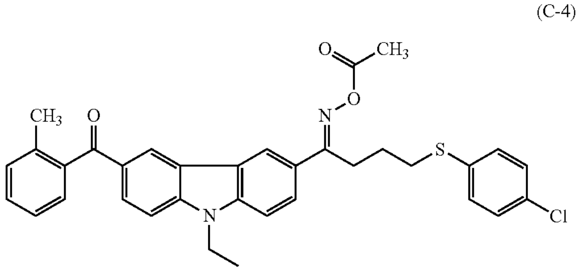

-continued (C-5)

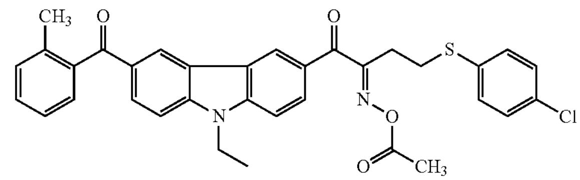

(C-6)

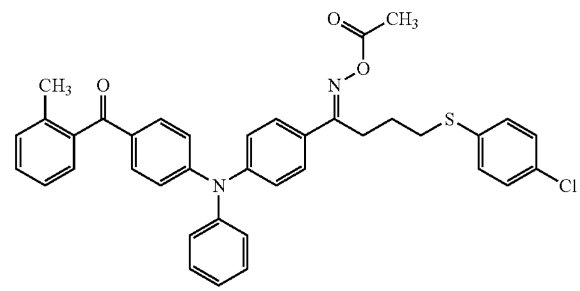

(C-7)

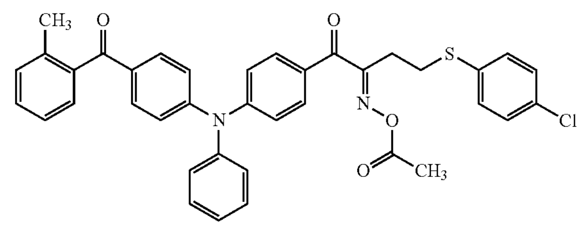

(C-8)

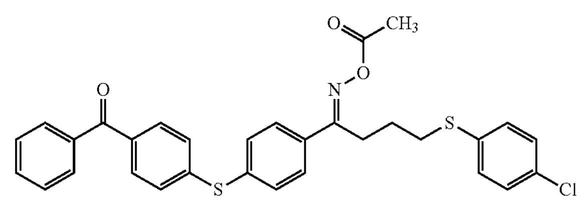

(C-9)

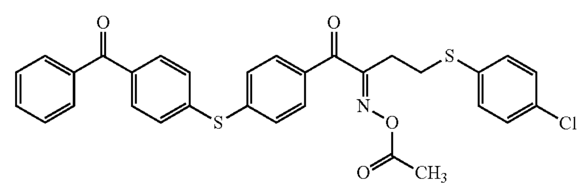

(C-10)

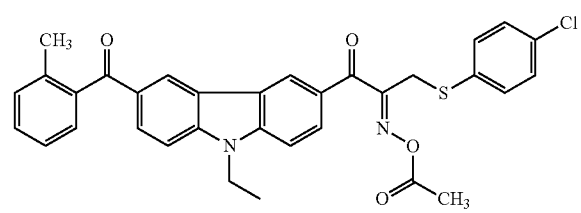

(C-11)

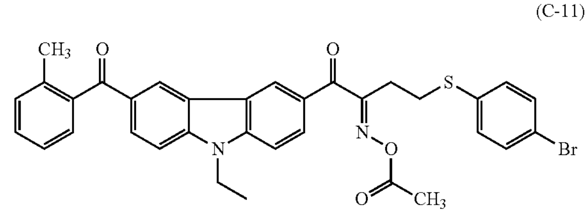

-continued (C-12)

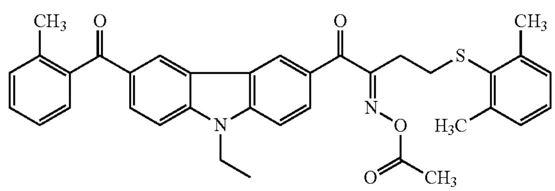

(C-13)

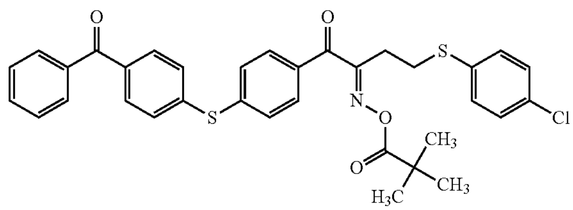

As the photopolymerization initiator (C), (C-5), (C-9), (C-10), (C-11), and (C-12) are preferable, and (C-5) and (C-9) are most preferable among the oxime compounds, from the viewpoints of heat resistance, solvent resistance, and color unevenness.

The oxime compound has a maximum absorption wavelength in the wavelength region of 350 to 500 nm. An oxime compound having an absorption wavelength in the wavelength region of 360 to 480 nm is preferable, and an oxime compound having high absorbance in 365 or 455 nm is particularly preferable., In view of sensitivity, the molar extinction coefficient at 365 nm or 405 nm of the oxime compound is preferably from 1,000 to 300,000, more preferably from 2,000 to 300,000, and particularly preferably from 5,000 to 200,000.

The molar extinction coefficient of the compounds can be measured by a known method but is preferably measured, for example, at a concentration of 0.01 g/L by using an ethyl acetate solvent by means of an ultraviolet-visible spectrophotometer (Carry-5 spectrophotometer, manufactured by Varian Inc.).

The photopolymerization initiator that is used in the present invention may be used in combination of two or more kinds thereof, if necessary.

The content of the photopolymerization initiator (C) contained in the included in the radiation-sensitive colored composition of the present invention is preferably from 0.1% by mass to 50% by mass, more preferably from 0.5% by mass to 30% by mass, and still more preferably from 1% by mass to 20% by mass, with respect to the total solid contents of the radiation-sensitive colored composition. Within these ranges, good sensitivity and pattern forming properties can be obtained.

<Organic Solvent (D)>

The radiation-sensitive colored composition of the present invention contains an organic solvent.

The organic solvent is fundamentally not particularly limited as long as it satisfies the solubility of each component and the coating ability of the radiation-sensitive colored composition. However, it is particularly preferably selected taking into consideration the solubility of an ultraviolet absorbent, an alkali-soluble resin, a dispersant, or the like, coating properties, and safety. In addition, in order to prepare the radiation-sensitive colored composition of the present invention, at least two or more kinds of the organic solvents are preferably contained.

Preferred examples of the organic solvent include esters such as ethyl acetate, n-butyl acetate, isobutyl acetate, amyl formate, isoamyl acetate, butyl propionate, isopropyl butyrate, ethyl butyrate, butyl butyrate, methyl lactate, ethyl lactate, alkyl oxyacetates (for example, methyl oxyacetate, ethyl oxyacetate, butyl oxyacetate (such as methyl methoxyacetate, ethyl methoxyacetate, butyl methoxyacetate, methyl ethoxyacetate, ethyl ethoxyacetate, and the like)); 3-oxypropionic acid alkyl esters (for example, methyl 3-oxypropionate, ethyl 3-oxypropionate, and the like (such as methyl 3-methoxypropionate, ethyl 3-methoxypropionate, methyl 3-ethoxypropionate, ethyl 3-ethoxypropionate, and the like)); 2-oxypropionic acid alkyl esters (for example, methyl 2-oxypropionate, ethyl 2-oxypropionate, propyl 2-oxypropionate, and the like (such as methyl 2-methoxypropionate, ethyl 2-methoxypropionate, propyl 2-methoxypropionate, methyl 2-ethoxypropionate, and ethyl 2-ethoxypropionate)); methyl 2-oxy-2-methylpropionate and ethyl 2-oxy-2-methylpropionate (such as methyl 2-methoxy-2-methylpropionate, ethyl 2-ethoxy-2-methylpropionate, and the like); methyl pyruvate, ethyl pyruvate, propyl pyruvate, methyl acetoacetate, ethyl acetoacetate, methyl 2-oxobutanoate, ethyl 2-oxobutanoate, and the like;

ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, propylene glycol monopropyl ether acetate, and the like;

ketones such as methyl ethyl ketone, cyclohexanone, 2-heptanone, 3-heptanone, and the like; and aromatic hydrocarbons such as toluene, xylene, and the like.

It is also preferable to use a mixture of two or more kinds of these organic solvents in view of the solubility of the ultraviolet absorbent and the alkali-soluble resin, improvement of the state of the surface to be coated, and the like. In this case, it is particularly preferable to use a mixed solution of two or more kinds selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate.

The content of the organic solvent in the radiation-sensitive colored composition is adjusted such that the concentration of the total solid contents of the composition is preferably from 5% by mass to 80% by mass, more preferably from 5% by mass to 60% by mass, and particularly preferably from 10% by mass to 50% by mass, from the viewpoint of coating properties.

<Other Components>

In addition to the above-mentioned components, the radiation-sensitive colored composition according to the present invention may further include other components such as a binder resin, a crosslinking agent, and the like to the extent that the effect of the present invention is not impaired. Further, the sum of the content ratio of the respective components in the composition does not exceed 100% by mass.

(Binder Resin (E))

The radiation-sensitive colored composition of the present invention preferably further contains a binder resin (E). Further, the binder resin (E) is not particularly limited, but an alkali-soluble binder is preferably contained from the viewpoints of improving the developability or pattern forming properties.

—Alkali-Soluble Binder—

As the alkali-soluble binder, a linear organic high-molecular-weight polymer can be suitably selected from alkali-soluble binders having at least one group which promotes alkali-solubility in a molecule (preferably a molecule having an acryl-based copolymer or a styrene-based copolymer as a main chain). From the viewpoint of heat resistance, a polyhydroxy styrene-based resin, a polysiloxane-based resin, an acryl-based resin, an acrylamide-based resin, and an acryl/acrylamide copolymer resin are preferable, and from the viewpoint of the control of the developability, an acryl-based resin, an acrylamide-based resin, and an acryl/acrylamide copolymer resin are preferable.

Examples of the group which promotes alkali-solubility (which will be hereinafter also referred to as an acid group) include a carboxyl group, a phosphoric acid group, a sulfonic acid group, a phenolic hydroxyl group, and the like, but those having developability by an aqueous weakly alkaline solution that is soluble in an organic solvent are preferable, and an (meth)acrylic acid is particularly preferable. These acid groups may be used singly or in combination of two or more kinds thereof.

Examples of the monomer that can provide an acid group after polymerization include a monomer having a hydroxyl group, such as 2-hydroxyethyl (meth)acrylate and the like, a monomer having an epoxy group such as glycidyl (meth) acrylate and the like, and a monomer having an isocyanate group such as a 2-isocyanatoethyl (meth)acrylate and the like. The monomer for introducing the acid group may be used singly or in combination of two or more kinds thereof. In order to introduce the acid group into the alkali-soluble binder, for example, a monomer having an acid group and/or a monomer that can provide an acid group after polymerization (which may be hereinafter referred to as a "monomer for introducing an acid group" in some cases) as a monomer component can be polymerized.

Furthermore, when the monomer that can provide an acid group after polymerization is used as the monomer component to introduce the acid group, for example, the following treatment is required after polymerization to provide an acid group.

For the production of the alkali-soluble binder, for example, a method according to a known radical polymerization method may be employed. The polymerization conditions for the production of an alkali-soluble binder by a radical polymerization method, such as the temperature, the pressure, the kind and amount of the radical initiator, the kind of the solvent, and the like may be easily set by a person skilled in the art, and the conditions may also be experimentally determined.

As the linear organic high-molecular-weight polymer that is used as the alkali-soluble binder, a polymer having a carboxylic acid group in a side chain is preferable, and examples thereof include alkali-soluble phenol resins such as a methacrylic acid copolymer, an acrylic acid copolymer, an itaconic acid copolymer, a crotonic acid copolymer, a maleic acid copolymer, a partially esterified maleic acid copolymer, a novolac resin, and the like; an acidic cellulose derivative having a carboxylic acid group in a side chain; and a polymer obtained by adding an acid anhydride to a polymer having a hydroxyl group. A copolymer of (meth)acrylic acid and another monomer copolymerizable with (meth)acrylic acid is particularly preferable as the alkali-soluble binder. Examples of another monomer copolymerizable with (meth)acrylic acid include an alkyl (meth)acrylate, an aryl (meth)acrylate, a vinyl compound, and the like. Examples of the alkyl (meth) acrylate and the aryl (meth)acrylate include methyl (meth) acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, cyclohexyl (meth)acrylate, and the like. Examples of the vinyl compound include styrene, α-methyl styrene, vinyltoluene, glycidyl methacrylate, acrylonitrile, vinyl acetate, N-vinylpyrrolidone, tetrahydrofurfuryl methacrylate, a polystyrene macromonomer, a polymethyl methacrylate macromonomer, and the like, and further include N-position substituted maleimide monomers described in JP10-300922A, such as N-phenylmaleimide, N-cyclohexylmaleimide, and the like. In addition, other monomers capable of copolymerizing with the (meth)acrylic acid may be used singly or in combination of two or more kinds thereof.

The alkali-soluble binder also preferably includes a polymer (a) formed by polymerization of a monomer component necessarily having a compound represented by the following general formula (ED) (which may be hereinafter referred to as an "ether dimer" in some cases) as a polymer component (A) which is an essential component.

General Formula (ED)

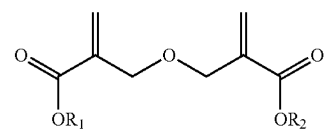

(in the formula (ED), $R^1$ and $R^2$ each independently represent a hydrogen atom or a hydrocarbon group having 1 to 25 carbon atoms, which may have a substituent.)

By including the polymer (a), the radiation-sensitive colored composition of the present invention can form a cured coating film having excellent heat resistance and transparency. In the general formula (ED) representing the ether dimer, a hydrocarbon group having 1 to 25 carbon atoms which may have a substituent, represented by $R^1$ and $R^2$, is not particularly limited, but examples thereof include linear or branched alkyl groups such as a methyl group, an ethyl group, a n-propyl group, an isopropyl group, a n-butyl group, an isobutyl group, a t-butyl group, a t-amyl group, a stearyl group, a lauryl group, a 2-ethylhexyl group, and the like; aryl groups such as a phenyl group and the like; alicyclic groups such as a cyclohexyl group, a t-butyl cyclohexyl group, a dicyclopentadienyl group, a tricyclodecanyl group, an isobornyl group, an adamantyl group, a 2-methyl-2-adamantyl group, and the like; alkoxy-substituted alkyl groups such as a 1-methoxyethyl group, a 1-ethoxyethyl group, and the like; aryl group-substituted alkyl groups such as a benzyl group and the like; etc. Among these, a primary or secondary hydrocarbon group which is hardly eliminated by acid or heat, such as a methyl group, an ethyl group, a cyclohexyl group, a benzyl group, and the like is particularly preferable. Further, $R^1$ and $R^2$ may be the same as, or may be different from each other.

Specific examples of the ether dimer include dimethyl-2,2'-[oxybis(methylene)]bis-2-propenoate, diethyl-2,2'-[oxybis(methylene)]bis-2-propenoate, di(n-propyl)-2,2'-[oxybis(methylene)]bis-2-propenoate, di(isopropyl)-2,2'-[oxybis(methylene)]bis-2-propenoate, di(n-butyl)-2,2'-[oxybis(methylene)] bis-2-propenoate, di(isobutyl)-2,2'-[oxybis (methylene)]bis-2-propenoate, di(t-butyl)-2,2'-[oxybis(methylene)]bis-2-propenoate, di(t-amyl)-2,2'-[oxybis(methylene)] bis-2-propenoate, di(stearyl)-2,2'-[oxybis(methylene)] bis-2-propenoate, di(lauryl)-2,2'-[oxybis(methylene)]bis-2-propenoate, di(2-ethylhexyl)-2,2'-[oxybis(methylene)] bis-2-propenoate, di(1-methoxy ethyl)-2,2'-[oxybis(methylene)]bis-2-propenoate, di(1-ethoxy ethyl)-2,2'-[oxybis(methylene)]bis-2-propenoate, dibenzyl-2,2'-[oxybis(methylene)]bis-2-propenoate, diphenyl-2,2'-[oxybis(methylene)] bis-2-propenoate, dicyclohexyl-2,2'-[oxybis(methylene)]bis-2-propenoate, di(t-butyl cyclohexyl)-2,2'-[oxybis(methylene)]bis-2-propenoate, di(dicyclopentadienyl)-2,2'-[oxybis(methylene)]bis-2-propenoate, di(tricyclodecanyl)-2,2'-[oxybis(methylene)]bis-2-propenoate, di(isobornyl)-2,2'-[oxybis(methylene)]bis-2-propenoate, diadamantyl 2,2'-[oxybis(methylene)] bis-2-propenoate, di(2-methyl-2-adamantyl)-2,2'-[oxybis(methylene)]bis-2-propenoate, and the like. Among these, dimethyl-2,2'-[oxybis(methylene)]bis-2-propenoate, diethyl-2,2'-[oxybis(methylene)]bis-2-propenoate, dicyclohexyl-2,2'-[oxybis(methylene)] bis-2-propenoate, and dibenzyl-2,2'-[oxybis(methylene)]bis-2-propenoate are particularly preferable. These ether dimers may be used singly or in combination of two or more kinds thereof. For a structure derived from a compound represented by the general formula (ED), other monomers may also be copolymerized.

Furthermore, an alkali-soluble binder having a polymerizable group may be used order to improve the crosslinking efficiency of the radiation-sensitive colored composition of the present invention. As an example of the alkali-soluble binder having a polymerizable group, alkali-soluble binders such as a polymer having an allyl group, a (ineth)acryl group, an allyloxyalkyl group, or the like at a side chain thereof are useful. Examples of the polymer having a polymerizable group include commercial products including Dianal NR series (manufactured by Mitsubishi Rayon Co., Ltd.), PHOTOMER 6173 (polyurethane acrylic oligomer containing a COOH group, manufactured by Diamond Shamrock Co., Ltd.), VISCOAT R-264 and KS RESIST-106 (both manufactured by Osaka Organic Chemistry Industry, Ltd.), CYCLOMER P series and PLACCEL $CF_{200}$ series (both manufactured by Daicel Chemical Industries, Ltd.), EBECRYL 3800 (manufactured by Daicel-Cytec Co., Ltd.) and the like. Preferable examples of the alkali-soluble binder having a polymerizable group include an urethane-modified and polymerizable double bond-containing acryl resin obtained by the reaction of a carboxyl group-containing acryl resin and a (meth)acryloyl group-containing compound in which one unreacted isocyanate group has been left by the preliminary reaction of the isocyanate groups and OH groups, an unsaturated group-containing acryl resin obtained by the reaction of a carboxyl group-containing acryl resin and a compound containing an epoxy group and a polymerizable double bond in the molecule, an acid pendant type epoxy acrylate resin, a polymerizable double bond-containing acryl resin obtained by the reaction of an OH group-containing acryl resin and a dibasic acid anhydride having a polymerizable double bond, a resin obtained by the reaction of an OH group-containing acryl resin and a compound having an isocyanate group and a polymerizable group, and a resin obtained by a basic treatment of a resin having in a side chain thereof an ester group having at the α- or β-position thereof an elimination group such as a halogen atom or a sulfonate group as described in JP2002-229207A and JP2003-335814A, and the like.

As the alkali-soluble binder, a benzyl (meth)acrylate/(meth)acrylic acid copolymer and a multi-component copolymer of benzyl (meth)acrylate/(meth)acrylic acid/another monomer are particularly preferable. Other examples include a copolymer of 2-hydroxyethyl methacrylate, and copolymers described in JP7-140654A, such as a 2-hydroxy propyl (meth)acrylate/polystyrene macromonomer/benzyl methacrylate/methacrylic acid copolymer, a 2-hydroxy-3-phenoxy propyl acrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer, a 2-hydroxyethyl methacrylate/polystyrene macromonomer/benzyl methacrylate/methacrylic acid copolymer, and the like, and particularly preferably a methacrylic acid benzyl/methacrylic acid copolymer, and the like.

Specific examples that are preferably used in the present invention are shown below.

[Chem. 121]

(J1)

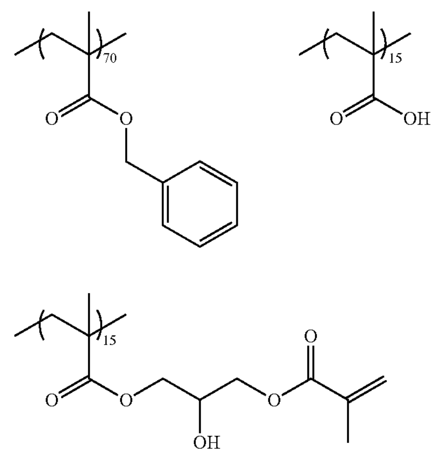

Mw 15,000

(J2)

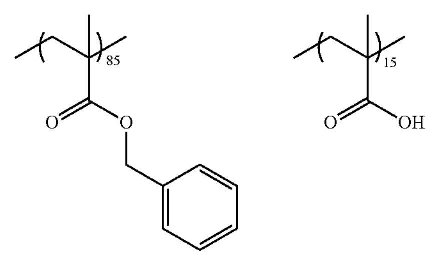

Mw 15,000

(J3)

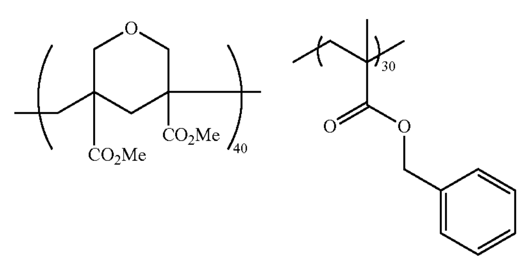

-continued

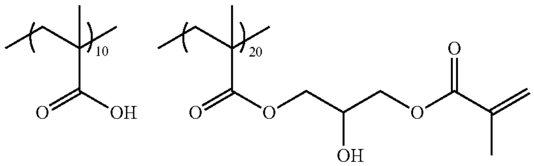

Mw 10,000

(J4)

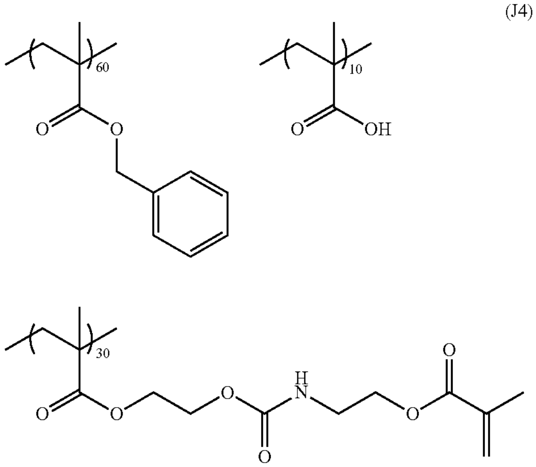

Mw 8,000

(J5)

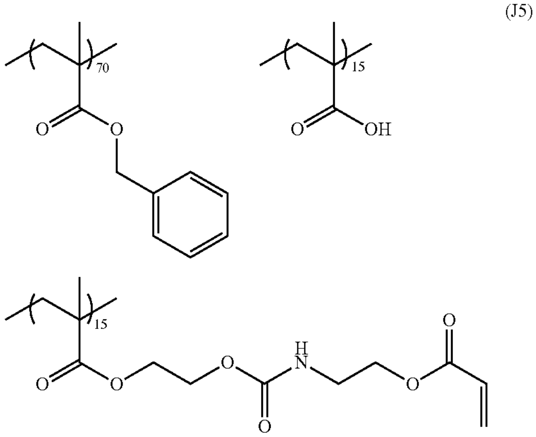

Mw 20,000

(J6)

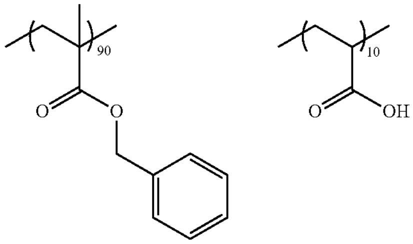

Mw 10,000

(J7)

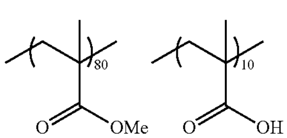

-continued

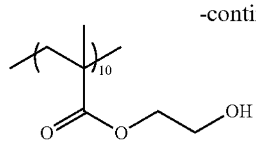

Mw 8,000

(J8)

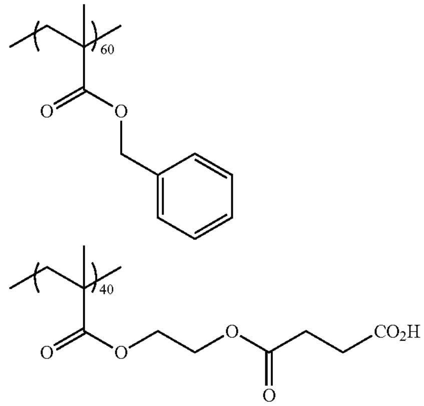

Mw 12,000

(J9)

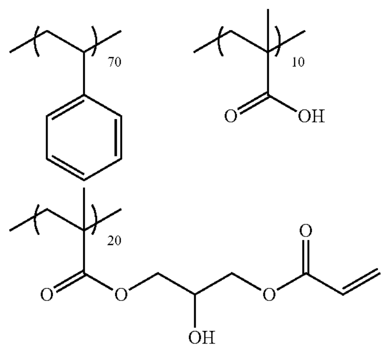

Mw 10,000

Among the specific examples above, (J1), (J3), (J4), (J5), and (J9) are preferable, and (J1), (J3), and (J4) are more preferable, from the viewpoints of heat resistance, solvent resistance, color transfer, and color unevenness.

The acid value of the alkali-soluble binder is preferably from 30 mgKOH/g to 200 mgKOH/g, more preferably from 50 mgKOH/g to 150 mgKOH/g, and most preferably from 70 mgKOH/g to 120 mgKOH/g.

Furthermore, the weight average molecular weight Mw of the alkali-soluble binder is preferably from 2,000 to 50,000, more preferably from 5,000 to 30,000, and most preferably from 7,000 to 20,000.

The content of the alkali-soluble binder in the radiation-sensitive colored composition is preferably from 1% by mass to 15% by mass, more preferably from 2 to 12% by mass, and particularly preferably from 3% by mass to 10% by mass, with respect to the total composition.

(Crosslinking Agent)

The hardness of the colored cured film formed by curing the radiation-sensitive colored composition may further be improved by supplementarily using a crosslinking agent in the radiation-sensitive colored composition according to the present invention.

The crosslinking agent is not particularly limited so long as it may cure a film by crosslinking reaction, and examples thereof include (a) an epoxy resin, (b) a melamine compound, a guanamine compound, a glycoluril compound or an urea compound substituted with at least one substituent selected from a methylol group, an alkoxymethyl group and an acyloxymethyl group, and (c) a phenol compound, a naphthol compound or a hydroxyanthracene compound substituted with at least one substituent selected from a methylol group, an alkoxymethyl group and an acyloxymethyl group. Among these, multifunctional epoxy resins are preferable.

With respect to the details of the specific examples or the like of the crosslinking agent, the description on paragraph Nos. [0134] to [0147] of JP2004-295116A may be referred.

(Polymerization Inhibitor)

It is preferable that the radiation-sensitive colored composition of the present invention includes a small amount of a heat polymerization inhibitor in order to prevent unnecessary heat polymerization of the polymerizable compound during manufacture or storage of the radiation-sensitive colored composition.

Examples of the polymerization inhibitor that can be used in the present invention include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), a N-nitrosophenylhydroxyamine primary cerium salt, and the like.

The addition amount of the polymerization inhibitor is preferably from about 0.01% by mass to about 5% by mass with respect to the total mass of the radiation-sensitive colored composition.

(Surfactant)

The radiation-sensitive colored composition of the present invention may contain any of various surfactants in order to improve the coatability. As the surfactant, various surfactants such as a fluorine-based surfactant, a nonionic surfactant, a cationic surfactant, an anionic surfactant, a silicone surfactant, and the like may be used.

In particular, when the radiation-sensitive colored composition of the present invention contains a fluorine-based surfactant, the liquid properties (in particular, fluidity) of the composition prepared as a coating liquid are improved, whereby the uniformity of the coating thickness and the liquid saving can be improved.

That is, when a radiation-sensitive colored composition including a fluorine-based surfactant is used as a coating liquid to form a film, the wettability on the surface to be coated is improved due to the decrease in the surface tension between the surface to be coated and the coating liquid, thereby improving the coatability on the surface to be coated. As a result, even when a thin film of several to several micrometers is formed with a small amount of the liquid, a film with uniform thickness may be suitably formed, which is thus effective.

The fluorine content in the fluorine-based surfactant is preferably from 3% by mass to 40% by mass, more preferably from 5% by mass to 30% by mass, and particularly preferably from 7% by mass to 25% by mass. When the fluorine content of the fluorine-based surfactant is within the above-described range, it is effective in terms of the uniformity of the coating film thickness and the liquid saving, and the solubility in the radiation-sensitive colored composition is also excellent.

Examples of the fluorine-based surfactant include MEGAFAC F171, F172, F173, F176, F177, F141, F142, F143, F144, R30, F437, F475, F479, F482, F554, F780, and F781 (all manufactured by DIC Corporation), FLUORAD FC430, FC431 and FC171 (all manufactured by Sumitomo 3M Limited), SURFLON S-382, SC-101, SC-103, SC-104, SC-105, SC1068, SC-381, SC-383, S393, and KH-40 (all manufactured by Asahi Glass Co., Ltd.), and the like.

Examples of the nonionic surfactant include glycerol, trimethylol propane, trimethylol ethane, and ethoxylate and propoxylate thereof (such as glycerol propoxylate, glycerin ethoxy late, and the like), polyoxy ethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, sorbitan fatty acid ester (PLURONIC L10, L31, L61, L62, 10R5, 17R2 and 25R2, and TETRONIC 304, 701, 704, 901, 904 and 150R1 (trade names, manufactured by BASF Japan Ltd.), SOLSPERSE 20000 (manufactured by Lubrizol Japan Ltd.), and the like.

Examples of the cationic surfactant include a phthalocyanine derivative such as EFKA-745 (trade name: manufactured by Morishita & Co., Ltd.), an organosiloxane polymer such as KP341 (manufactured by Shin-Etsu Chemical Co., Ltd.), a (meth)acrylic acid based (co)polymer such as POLYFLOW No. 75, No. 90, and No. 95 (manufactured by Kyoeisha Chemical Co., Ltd.), WO01 (manufactured by Yusho Co., Ltd.), and the like.

Specific examples of the anionic surfactant include WO04, WO05, and WO17 (manufactured by Yusho Co., Ltd.), and the like.

Examples of the silicone-based surfactant include "TORAY SILICONE DC3PA", "TORAY SILICONE SH7PA", "TORAY SILICONE DC11PA", "TORAY SILICONE SH21PA", "TORAY SILICONE SH28PA", "TORAY SILICONE SH29PA", "TORAY SILICONE SH30PA", and "TORAY SILICONE SH8400" (manufactured by Dow Corning Toray Co., Ltd.), "TSF-4440", "TSF-4300", "TSF-4445", "TSF-4460", and "TSF-4452" (manufactured by Momentive Performance Materials Inc.), "KP341", "KF6001", and "KF6002" (manufactured by Shin-Etsu Chemical Co., Ltd.), "BYK307", "BYK323", and "BYK330" (manufactured by BYK Chemie), and the like.

The surfactant may be used singly or in combination of two or more kinds thereof.

The additive amount of the surfactant is preferably form 0.001% by mass to 2.0% by mass, and more preferably from 0.005% by mass to 1.0% by mass, with respect to the total mass of the radiation-sensitive colored composition.

(Other Additives)

As necessary, various additives such as a filler, an adhesion accelerating agent, an antioxidant, an ultraviolet absorber, an aggregation preventing agent, and the like may be blended into the radiation-sensitive colored composition. Examples of these additives include those described in paragraph Nos. [0155] to [0156] of JP2004-295116A may be exemplified.

The radiation-sensitive colored composition of the present invention may include a sensitizer or a light stabilizer described in paragraph No. [0078] of JP2004-295116A or a heat polymerization inhibitor described in paragraph No. [0081] of JP2004-295116A.

(Organic Carboxylic Acid and Organic Carboxylic Acid Anhydride)

The radiation-sensitive colored composition may contain an organic carboxylic acid and/or an organic carboxylic acid anhydride having a molecular weight of 1000 or less.

Specific examples of the organic carboxylic acid compound include aliphatic carboxylic acids and aromatic carboxylic acids. Examples of the aliphatic carboxylic acids include monocarboxylic acids such as formic acid, acetic acid, propionic acid, butyric acid, valeric acid, pivalic acid, caproic acid, glycolic acid, acrylic acid, methacrylic acid, and the like; dicarboxylic acids such as oxalic acid, malonic acid, succinic acid, glutaric acid, adipic acid, pimelic acid, cyclohexane dicarboxylic acid, cyclohexene dicarboxylic acid, itaconic acid, citraconic acid, maleic acid, fumaric aid, and the like; tricarboxylic acids such as tricarballylic acid, aconitic acid, and the like; etc. Examples of the aromatic carboxylic acids include carboxylic acids include carboxylic acids in which a carboxyl group is directed bonded to a phenyl group of benzoic acid, phthalic acid, or the like, and carboxylic acids in which a carboxyl group is bonded to a phenyl group via a carbon bond. Among these, organic carboxylic acid compounds having a molecular weight of 600 or less, and particularly a molecular weight of 50 to 500, specifically, for example, maleic acid, malonic acid, succinic acid, and itaconic acid are particularly preferable.

Examples of the organic carboxylic acid anhydride include aliphatic carboxylic acid anhydrides and aromatic carboxylic acid anhydrides, and specifically, aliphatic carboxylic acid anhydrides such as anhydrous acetic acid, anhydrous trichloroacetic acid, anhydrous trifluoroacetic acid, anhydrous tetrahydrophthalic acid, anhydrous succinic acid, anhydrous maleic acid, anhydrous citraconic acid, anhydrous itaconic acid, anhydrous glutaric acid, 1,2-cyclohexenedicarboxylic acid anhydride, n-octadecylsuccinic acid anhydride, anhydrous 5-norborene-2,3-dicarboxylic acid, and the like. Examples of the aromatic carboxylic acid anhydride include anhydrous phthalic acid, trimellitic acid anhydride, pyromellitic acid anhydride, anhydrous naphthalic acid, and the like. Among these, organic carboxylic acid anhydrides having a molecular weight of 600 or less, and particularly a molecular weight of 50 to 500, specifically, anhydrous maleic acid, anhydrous succinic acid, anhydrous citraconic acid, and anhydrous itaconic acid are preferable.

The addition amount of the organic carboxylic acid and/or organic carboxylic acid anhydride is usually in the range of 0.01 to 10% by weight, preferably 0.03 to 5% by weight, and more preferably 0.05 to 3% by weight, with respect to the total solid contents.

By adding the organic carboxylic acid and/or organic carboxylic acid anhydride having a molecular weight of 1000 or less, it is possible to further reduce the amount of the residual undissolved materials of the radiation-sensitive colored composition while maintaining high pattern adhesion.

[Method for Preparing Radiation-Sensitive Colored Composition]

The radiation-sensitive colored composition according to the present invention is prepared by mixing the above-mentioned components.

Furthermore, during the preparation of the radiation-sensitive colored composition, the components for the radiation-sensitive colored composition may be mixed at one time, or each of the components may be dissolved or dispersed in a solvent and then mixed successively. The order of addition during mixing and the operation condition are not particularly limited. For example, the composition may be prepared by simultaneously dissolving or dispersing all components in a solvent, or when needed, the components may be suitably prepared into two or more solutions or dispersion liquids that are mixed before use (at the time of coating) to prepare a composition.

The radiation-sensitive colored composition of the present invention is preferably filtered through a filter for the purpose of, for example, removing foreign materials or reducing defects. The filter may be used without particular limitation as long as it has been conventionally used for filtering applications or the like. Examples of the filter include ones fluorine resins such as using PTFE (polytetrafluoroethylene), and the like, polyamide-based resins such as nylon-6, nylon-6,6, and the like, polyolefin resins such as polyethylene, polypropylene (PP), and the like (including high-density ones and ultra-high-molecular-weight ones), or the like. Among these materials, polypropylene (including high-density polypropylene) is preferable.

The pore diameter of the filter is preferably about 0.01 to 7.0 μm, preferably about 0.01 to 3.0 μm, and more preferably about 0.05 to 0.5 μm. Within these ranges, it is possible to remove the fine foreign materials clearly, which interfere with the uniform and smooth preparation of the radiation-sensitive colored composition.

When using the filter, another filter may be used in combination therewith. Herein, the filtering with a first filter may be carried out once or twice or more times.

Furthermore, a first filter having a different pore diameter from those within the above-described ranges may be combined. Herein, as the pore diameter, it is possible to apply nominal values of filter manufacturers. As a commercially available filter, it is possible to select one from various filters provided by Nihon Pall Ltd., Advantec Toyo Kaisha, Ltd., Nihon Entegris K. K. (former Nihon Mykrolis K. K), Kitz Microfilter Corporation, and the like.

A second filter which is formed of the same materials as the first filter may be used.

For example, filtration with the first filter may be carried out only with dispersion, or the second filtration may be carried out after mixing other components.

Since the radiation-sensitive colored composition of the present invention has excellent storage stability, and may form colored cured films having excellent light resistance, it may be used for forming colored pixels for color filters used for liquid crystal display apparatuss (LCD) or solid state image devices (such as a CCD, a CMOS, and the like), etc., and for use in preparation of a print ink, an ink jet ink, a paint, and the like. Particularly, it may be used for forming colored pixels for solid state image devices including a CCD, a CMOS, and the like.

<<Color Filter and Method for Producing the Same>>

Next, the color filter in the present invention will be described in detail with reference to the method for producing the same.

Furthermore, the color filter in the present invention has a colored cured film formed by using the radiation-sensitive colored composition of the present invention, and the film thickness of the colored cured film is preferably 1.0 μm or less, more preferably from 0.1 μm to 0.9 μm, and still more preferably from 0.2 μm to 0.8 μm.

When the film thickness is 1.0 μm or less, high precision and high adhesion can be obtained, which is thus preferable.

For the method for producing a color filter in the present invention, the above-described radiation-sensitive colored composition of the present invention is used.

By using the radiation-sensitive colored composition of the present invention, the developability is excellent, and a high degree of hardness is obtained with good sensitivity. Thus, it is possible to prepare a color filter in a good shape constituted with fine patterns having good resolution in a simple manner.

The method for producing a color filter in the present invention include the steps of coating the radiation-sensitive colored composition of the present invention on a support, and then exposed in pattern, and developed to form a pattern. Specifically, the color filter can be preferably prepared by coating the radiation-sensitive colored composition of the present invention on a support by a coating method, such as spin coating, cast coating, roll coating, and the like to form a radiation-sensitive colored composition layer, which is then exposed through a prescribed mask pattern, followed by being developed with a developing liquid to form a negative colored pattern (an image-forming step). The method may further include, if necessary, a step of curing the colored pattern thus formed pattern by heating and/or exposing.

For the preparation of a color filter, the color filter including desired hues may be produced by repeating the above-described image-forming steps (and a curing step, if necessary) according to the number of the colors. As for light or radiation to be used, ultraviolet light, such as, particularly, g rays, h rays, i rays, and the like is preferably used.

Examples of the support include non-alkaline glass, soda glass, PYREX (registered trademark) glass, and quartz glass, and supports having a transparent electroconductive film adhered, which are used in a liquid crystal display apparatus or the like, and a photoelectric conversion element substrate which is used in a solid state image device (a CCD or a CMOS), and the like. There are some cases where black stripes for separating pixels are formed on the substrate.

Furthermore, an undercoating layer may be provided, if necessary, on the substrate for improvement of adhesion to the upper layer, prevention of diffusion of substances, and the flattening of the surface of the substrate.

As the developing liquid, any one having the composition that dissolves the radiation-sensitive colored composition of the present invention (an uncured part) but does not dissolve a cured part that has been irradiated may be used. Specifically, a combination of various organic solvents and an alkaline aqueous solution may be used. Examples of the organic solvent include those described above for preparation of the radiation-sensitive colored composition of the present invention.

Preferred examples of the alkaline aqueous solution include alkaline aqueous solutions obtained by dissolving an alkaline compound to a concentration of 0.001 to 10% by mass, and preferably from 0.01 to 1% by mass, and examples of the alkaline compound include sodium hydroxide, potassium hydroxide, sodium carbonate, sodium silicate, sodium metasilicate, aqueous ammonia, ethylamine, diethylamine, dimethylethanolamine, tetramethylammonium hydroxide, tetraethylammonium hydroxide, choline, pyrrole, piperidine 1,8-diazabicyclo-(5.4.0)-7-undecene, and the like.

Furthermore, in the case where a developer containing the alkaline aqueous solution is used, the layer after the development is generally washed with water.

The color filter in the present invention may be used in a liquid crystal display, or a solid state image device such as a CCD, a CMOS, and the like. The color filter is suitable for a high precision CCD element, CMOS, or the like having 1,000,000 or more pixels. The color filter of the present invention may be used as a color filter that is interposed between a light-receiving portion of the respective pixels constituting, for example, a CCD and a CMOS and a microlens for collecting light.

<<Solid State Image Device>>

—Color Filter for Solid State Image Device and Method for Producing the Same—

The method for producing a color filter for a solid state image device of the present invention includes a step of coating the above-described radiation-sensitive colored composition of the present invention on a support to form a radiation-sensitive colored composition layer (which is also referred to as a "radiation-sensitive colored composition layer-forming step"); a step of exposing the radiation-sensitive colored composition layer through a mask (which is also referred to as an "exposure step"); and a step of developing the radiation-sensitive colored composition layer after the exposure to form a colored pattern (which is also referred to as a "colored pixel") (which is also referred to as a "developing step").

Furthermore, the color filter for a solid state image device of the present invention is produced by the method for producing a color filter for a solid state image device of the present invention.

The color filter for a solid state image device of the present invention may have at least red patterns (red pixels) produced according to the method for producing the color filter for a solid state image device of the present invention. As a specific form of the color filter for a solid state image device of the present invention, a multicolor color filter form having a combination of the red pattern with colored patterns (such as a color filter having 3 or more colors, including at least a red pattern, a blue pattern, and a green pattern) is suitable.

Hereinafter, the color filter for a solid state image device may be simply referred to as a "color filter" in some cases.

<Radiation-Sensitive Colored Composition Layer-Forming Step>

In the radiation-sensitive colored composition layer-forming step, the radiation-sensitive colored composition of the present invention is applied onto a support to form a radiation-sensitive colored composition layer.

As the support that can be used in the present step, for example, a substrate for a solid state image device, in which an image device (light-receiving element) such as a CCD (Charge Coupled Device), a CMOS (Complementary Metal-Oxide Semiconductor), and the like is installed on a substrate (such as silicone substrate) can be used.

The colored pattern in the present invention may be formed on the face side on which the image device is formed (front side) or may be formed on the face side on which the image device is not formed (back side) in a substrate for a solid state image device.

A light-shielding film may be installed between the colored pixels or on the back side of the substrate for a solid state image device in the solid state image device.

Moreover, on the support, an undercoating layer may be provided, if necessary, for improvement of adhesion with an upper layer, prevention of diffusion of material, or flattening of the surface of the substrate.

Examples of a method of applying the radiation-sensitive colored composition of the present invention on the support include various coating methods such as a slit coating method, a spray coating method, an ink jet method, a spin coating method, a cast coating method, a roll coating method, a screen printing method, and the like.

The drying (prebaking) of the radiation-sensitive colored composition applied on the support may be performed using, for example, a hot plate or an oven at a temperature of 50° C. to 140° C. for 10 seconds to 300 seconds.

<Exposure Step>

In the exposure step, the radiation-sensitive colored composition layer formed in the radiation-sensitive colored composition layer-forming step is exposed in pattern using, for example, an exposure device such as a stepper exposure device and the like through a mask having a predetermined mask pattern.

As the radiation (light) that can be used for exposure, particularly, ultraviolet rays such as g rays, i rays, and the like (particularly preferably i rays) are preferably used. The irradiation dose (exposure dose) is preferably from 30 mJ/cm$^2$ to 1500 mJ/cm$^2$, more preferably from 50 mJ/cm$^2$ to 1000 mJ/cm$^2$, and most preferably from 80 mJ/cm$^2$ to 500 mJ/cm$^2$.

<Developing Step>

Subsequently, an alkali development processing is carried out to dissolve out the radiation-sensitive colored composition layer in the area not irradiated with light in the exposure step, whereby only the photocured area is allowed to remain.

As the developing liquid, an organic alkali developing liquid causing no damage on the underlying image device or circuit is preferable. The development temperature is usually from 20° C. to 30° C., and the development time is from 20 seconds to 90 seconds. In order to remove the residue, the development may be carried out for 120 seconds to 180 seconds. In addition, in order to improve the residue removing properties, a step in which the developing liquid is discharged every 60 seconds and a fresh developing liquid is supplied may be repeated several times in some cases.

As the alkali agent used for the developing liquid, an aqueous alkaline solution obtained by diluting an organic alkaline compound such as aqueous ammonia, ethylamine, diethylamine, dimethylethanolamine, tetramethyl ammonium hydroxide, tetraethylammonium hydroxide, choline, pyrrole, piperidine, 1,8-diazabicyclo-[5,4,0]-7-undecene, and the like, with pure water to have a concentration of generally from 0.001% by mass to 10% by mass, and preferably from 0.01% by mass to 1% by mass, is used.

In addition, an inorganic alkali may be used in a developing liquid. Preferable examples of the inorganic alkali include sodium hydroxide, potassium hydroxide, sodium carbonate, sodium hydrogen carbonate, sodium silicate, sodium metasilicate, and the like.

Incidentally, when a developing liquid composed of such an aqueous alkaline solution is used, washing (rinsing) with pure water is generally performed after the development.

Then, it is preferable to carry out a heating treatment after drying. When forming a multicolor colored pattern, a cured film can be produced by repeating the respective steps sequentially, thereby obtaining a color filter.

The post-baking is a heat treatment performed after development so as to complete curing, and a heat curing treatment at usually 100° C. to 240° C., preferably 200° C. to 240° C. is carried out.

This post-baking treatment may be carried out continuously or batchwise by using a heating unit such as a hot plate, a convection oven (hot air circulating dryer), a high-frequency heater, and the like so that the coating film after development can satisfy the above-described conditions.

Furthermore, the production method of the present invention may include, as another step other than the above-described steps, a step known as a method for producing a color filter for a solid state image device, if necessary. For example, after the above-described radiation-sensitive colored composition layer-forming step, the exposure step, and the developing step are carried out, a step in which the colored pattern thus formed is cured, if necessary, by heating and/or exposure may be included.

Furthermore, when the radiation-sensitive colored composition according to the present invention is used, for example, contamination or the like, which is caused by clogging of the nozzle of the ejection portion of a coating apparatus or a piping portion of the coating apparatus, or adherence and sediment of the radiation-sensitive colored composition to the inside of the coating apparatus, or drying, may occur in some cases. Thus, in order to perform cleaning and removing the contaminating materials caused by the radiation-sensitive colored composition of the present invention efficiently, it is preferable to use the solvent described above as a solvent contained in the radiation-sensitive colored composition according to the present invention as a cleaning liquid. In addition, the cleaning liquids described in JP7-128867A, JP7-146562A, JP8-278637A, JP2000-273370A, JP2006-85140A, JP2006-291191A, JP2007-2101A, JP2007-2102A, JP2007-281523A, and the like can also be suitably used as a cleaning liquid for cleaning and removing the radiation-sensitive colored composition according to the present invention.

Among them, an alkylene glycol monoalkyl ether carboxylate or an alkylene glycol monoalkyl ether is preferable.

These solvents may be used singly or two or more kinds thereof may be used in combination. When two or more kinds of the solvents are used in combination, it is preferable to use a mixed solution of a solvent that has a hydroxyl group and a solvent that does not have a hydroxyl group. The mass ratio of the solvent that has a hydroxyl group and the solvent that does not have a hydroxyl group (the solvent that has a hydroxyl group/the solvent that does not have a hydroxyl group) is from 1/99 to 99/1, preferably from 10/90 to 90/10, and more preferably from 20/80 to 80/20. For a mixed solvent of propylene glycol monomethyl ether acetate (PGMEA) and propylene glycol monomethyl ether (PGME), the mixing ratio is particularly preferably 60/40. Further, in order to improve the penetrating properties of the washing liquid into the contaminating materials, the above-described surfactant that can be used in the present composition may be added to the washing liquid.

Since the radiation-sensitive colored composition of the present invention is used in the color filter for a solid state image device of the present invention, the peeling defects and the residue defects are less, and the heat resistance of the colored pattern is excellent. Further, since the radiation-sensitive colored composition is formed using the azo pigment represented by the general formula (1), the spectral characteristics for red color are excellent.

The color filter for a solid state image, device of the present invention can be suitably used for a solid state image device such as a CCD, a CMOS, and the like, and particularly suitable for a high precision CCD, CMOS, or the like, having 1,000,000 or more pixels. The color filter of the present invention may be used as a color filter that is interposed between a light-receiving portion of the respective pixels constituting, for example, a CCD and a CMOS and a microlens for collecting light.

The film thickness of the colored pattern (colored pixel) in the color filter for a solid state image device is preferably 2.0 μm or less, and more preferably 1.0 μm or less.

Furthermore, the size (pattern width) of the colored pattern (colored pixel) is preferably 2.5 μm or less, more preferably 2.0 μm or less, and particularly preferably 1.7 μm or less.

—Solid State Image Device—

The solid state image device in the present invention includes the above-described color filter for a solid state image device of the present invention. The configuration of the solid state image device in the present invention is not particularly limited as long as the solid state image device includes the color filter for a solid state image device of the present invention and acts as a solid state image device, but examples thereof may the following configuration.

The solid state image device may have a configuration including plural photodiodes that constitute a light-receiving area for a solid state image device (a CCD image sensor, a CMOS image sensor, and the like) and transfer electrodes including polysilicone or the like on the support; has a light-shielding film formed of tungsten and the like having an opening only in the light-receiving area of the photodiodes on the photodiodes and the transfer electrodes, has a device-protecting film formed of silicon nitride and the like for covering the front side of the light-shielding film and the light-receiving area of the photodiodes on the light-shielding film, and has the color filter for a solid state image device of the present invention on the device-protecting film.

In addition, on the device-protecting layer, the solid state image device may have a configuration in which a light-receiving unit (such as a microlens and the like. This shall apply hereinafter) under the color filter (in the portion close to the support); a configuration in which a light-receiving unit is included over the color filter; or the like.

<<Liquid Crystal Display Apparatus>>

The color filter in the present invention can be used for liquid crystal display apparatuss as well as solid state image devices, and is particularly suitably used for liquid crystal display apparatuss. In the case where the color filter in the present invention is used for the liquid crystal display apparatus, even when it contains a metal complex pigment having excellent spectral characteristics and heat resistance as a colorant, the orientation defect due to the reduction in specific resistance is suppressed, and the images to be displayed have excellent color and the display properties are excellent.

Therefore, the liquid crystal display apparatus including the color filter of the present invention can display high quality images having excellent color and excellent display properties.

Definitions of display apparatuss and details of the respective display apparatuss are given, for example, in "Electronic Display apparatus (Akio Sasaki, Kogyo Chosakai Publishing Co., Ltd., published in 1990)", "Display apparatus (Sumiaki Ibuki, Sangyo Tosho Publishing Co., Ltd., published in 1989)" and the like. Further, liquid crystal display apparatuss are described, for example, in "Next Generation Liquid Crystal Display Techniques (Tatsuo Uchida, Kogyo Chosakai Publishing Co., Ltd., published in 1994)". Liquid crystal display apparatuss which can be applied in the present invention are not particularly limited, and may be applied for various liquid crystal display apparatuss such as those described, for example, in "Next Generation Liquid Crystal Display Techniques".

The color filter in the present invention can suitably be used in a color TFT liquid crystal display apparatus. Details of liquid crystal display apparatuss in color TFT modes are described, for example, in "Color TFT Liquid Crystal Display (Kyoritsu Shuppan Co., Ltd., published in 1996)". Further, the color filter of the present invention may be applied to a liquid crystal display apparatus with a wider view angle, such as a lateral electric field driving system such as IPS and the like, and a pixel division system such as MVA and the like, etc., STN, TN, VA, OCS, FFS, R—OCB, or the like.

Moreover, the color filter of the present invention may also be applied to a COA (Color-filter On Array) system, which has high brightness and high definition. In the COA system liquid crystal display apparatus, the color filter layer should satisfy the normal requirements mentioned above, that is, requirements for an interlayer dielectric film such as low dielectric constant and resistance to a removal liquid. The color filter of the present invention, which is formed using a colorant multimer having exhibits excellent hue, exhibits excellent color purity and light transmittance and has a color pattern (pixels) with excellent color. Therefore, the color filter of the present invention is useful for the COA system liquid crystal display apparatus with high definition and durability. Further, in order to satisfy the required properties of the low dielectric constant, a resin film may be provided on the color filter layer.

These image display systems are described, for example, on page 43 of "EL, PDP, LCD Display—Recent Trends in Techniques and Markets (Research Study Division of Toray Research Center, Inc., published in 2001)", and the like.

The liquid crystal display apparatus of the present invention includes not only the color filter of the present invention but also various members such as an electrode substrate, a polarization film, a phase difference film, a back light, a spacer, and a view angle compensation film. The color filter of the present invention may be applied to a liquid crystal display apparatus including these various known members. These members are described, for example, in "94 Market for Liquid Crystal Display Related Materials and Chemicals (Kentaro Shima, CMC Publishing CO., LTD., published in 1994)" and "2003 Current State and Outlook for Liquid Crystal Related Markets (Ryokichi Omote, Fuji Chimera Research Institute, Inc., published in 2003)".

Back lights are described, for example, in SID meeting Digest 1380 (2005) (A. Konno et.al) and Monthly Display, 2005 December, pages 18-24 (Hiroyasu Shima) and pages 25-30 (Takaaki Yagi).

When the color filter in the present invention is used in a liquid crystal display apparatus, high-contrast display may be achieved in combination with a conventionally known three-wavelength cold-cathode tubes, but by using red, green and blue LED light sources (RGB-LED) as a back light, a liquid crystal display apparatus having high brightness, high color purity, and good color reproducibility can be provided.

As described above, according to the present invention, a red to purple colorant for chromatic compensation having excellent spectral characteristics, heat resistance, and light resistance, which contains a colorant multimer that includes, as a partial structure of a colorant moiety, a dipyrromethene metal complex compound or tautomer thereof obtained from a dipyrromethene-based compound and a metal or a metal compound, can be obtained. Furthermore, the radiation-sensitive colored composition, in which color mixing during the color filter manufacturing process is suppressed, that is, the colored cured film thus formed has excellent solvent resistance and excellent resistance against color transfer in the thermocuring process, can be obtained. As a result, problems that have not been solved with a color resist using the conventional dye for chromatic compensation may be solved, and therefore, the colorant multimer is particularly useful for a color filter used in solid state image devices or display apparatuss (such as a liquid crystal display apparatus, an organic EL display apparatuss, and the like).

EXAMPLES

Hereinbelow, the present invention will be described in more detail with reference to Examples, but the resent invention is not limited to these Examples unless departing from the scope of the present invention. Unless otherwise specified, "part(s)" and "%" are based on mass.

<Formation of Colored Pattern Using Radiation-Sensitive Colored Composition>

Example 1

(1) Preparation of Resist Solution A (Negative Type)

The following components were mixed, and dissolved to prepare a resist solution A.

| |
|---|
| Propylene glycol monomethyl ether acetate which will be hereinafter referred to as PGMEA) 5.20 parts |
| Cyclohexanone (which will be hereinafter referred to as CyH) 52.60 parts |
| Binder (41% cyclohexanone solution of benzyl methacrylate/methacrylic acid /2-hydroxyethyl methacrylate copolymer, molar ratio of 60:20:20, average molecular weight in terms of the equivalent polystyrene molecular weight: 30200) 30.50 parts |
| Dipentaerythritol hexaacrylate 10.20 parts |
| Polymerization inhibitor (p-methoxyphenol) 0.006 part |
| Fluorine-based surfactant (F-475, manufactured by DIC Corporation) 0.80 parts |
| Photopolymerization initiator: 4-benzoxolane-2,6-bis(trichloromethyl)-s-triazine (TAZ-107, manufactured by Midori Kagaku Co., Ltd.) 0.58 parts |

(2) Preparation of Glass Substrate with Undercoating Layer

A glass substrate (Corning 1737, manufactured by Corning Inc.) was subjected to ultrasonic-cleaning using a 0.5% aqueous NaOH solution, washed with water, and subjected to a dehydration baking treatment (200° C./20 minute). Subsequently, the resist solution A obtained in item (1) above was coated on the cleaned glass substrate using a spin coater such that the obtained film after drying had a thickness of 2 and then the glass substrate was heated and dried at 220° C. for 1 hour to obtain a glass substrate with an undercoating layer.

(3) Preparation of Radiation-Sensitive Colored Composition

First, a dispersion of C. I. Pigment Blue 15:6 was prepared as follows.

A mixed liquid containing 11.5 parts by mass of C. I. Pigment Blue 15:6 (average primary particle diameter of 55 nm), 3.5 parts by mass of a pigment dispersant BYK-161 (manufactured by BYK Chemie GmbH), and 85 parts by mass of PGMEA was mixed and dispersed using a beads mill (using zirconia beads having a diameter of 0.3 mm) for 3 hours to prepare a pigment dispersion. Then, the pigment dispersion was subjected to a dispersion treatment under a pressure of 2,000 Kg/cm$^3$ at a flow rate of 500 g/minute using a high pressure dispersing machine equipped with a pressure-reducing system NANO-3000-10 (manufactured by Beryu Co., Ltd.). This dispersion treatment was repeated 10 times to obtain a pigment dispersion. The average primary particle diameter of the pigment in the pigment dispersion measured by a dynamic light scattering method using (Microtrac Nanotrac UPA-EX150 (manufactured by Nikkiso Co., Ltd.)) was 25 nm.

Subsequently, the following components were mixed and dispersed to obtain a radiation-sensitive colored composition.

| | |
|---|---|
| Organic solvent (D): cyclohexanone | 1.133 parts |
| Binder resin (E): J1 | 1.009 parts |
| Fluorine-based surfactant (manufactured by DIC. F475, 1% CyH solution) | 0.125 parts |
| Photopolymerization initiator (C): IRUGACURE OXE01 | 0.087 parts |
| Colorant multimer (A): Exemplary Compound P-51 | 0.183 parts |
| Pigment Blue 15:6 dispersion (solid concentration 17.70%, pigment concentration 11.80%) | 2.418 parts |
| Surfactant: glycerol propoxylate (1% CyH solution) | 0.048 parts |
| Polymerizable compound (B): dipentaerythritol hexaacrylate (KAYARAD DPHA; manufactured by Nippon Kayaku Co., Ltd.) | 0.225 parts |

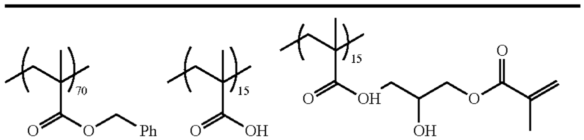

(J1)
Mw 15,000

-continued

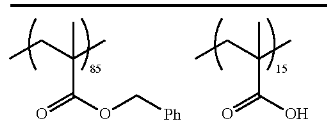

(J2)
Mw 15,000

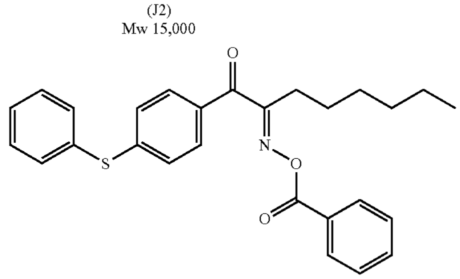

(I-1)
IRUGACURE OXE01 (manufactured by BASF Japan)

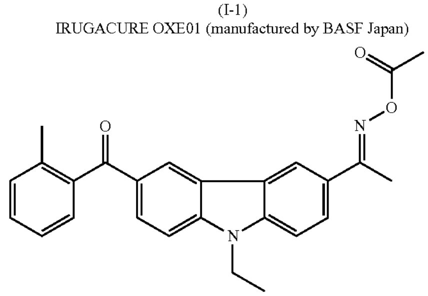

(I-2)
IRUGACURE OXE02 (manufactured by BASF Japan)

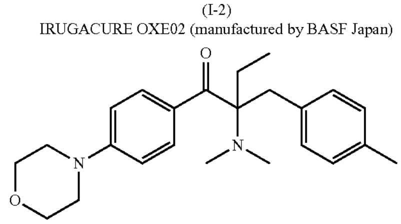

(I-3)
IRUGACURE 379 (manufactured by BASF Japan)

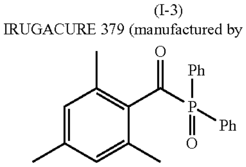

(I-4)
DAROCUR TPO (manufactured by BASF Japan)

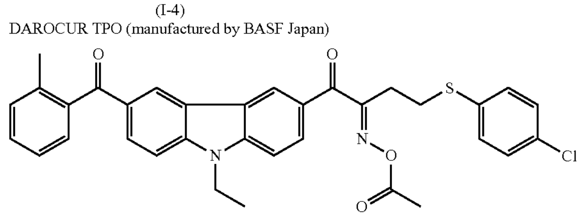

(I-5)

-continued

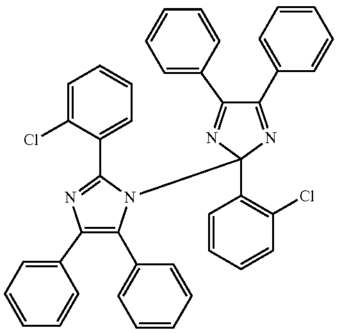

(I-6a)

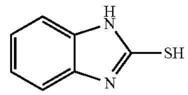

(I-6b)

(I-6): (I-6a)/(I-6b) = 20/10 (mass ratio)

Above (1-5) is (C-5) as mentioned in the section of the photopolymerization initiator (C).

(4) Exposure and Development (Image Formation) of Radiation-Sensitive Colored Composition The radiation-sensitive colored composition obtained in item (3) above was coated on the undercoating layer of the glass substrate obtained in item (2) above using a spin coater such that the obtained film after drying had a thickness of 0.6 μm, and then the film was pre-baked at 100° C. for 120 seconds.

Subsequently, the coating film was irradiated with light having a wavelength of 365 nm through a mask having a pattern with a line width of 2 μm at an exposure dose of 200 $mJ/cm^2$ using an exposure machine UX3100-SR (manufactured by Ushio Inc.). After the exposure, the film was developed with a developer CD-2000 (manufactured by Fujifilm Electronic Materials Co., Ltd.) under the conditions of 25° C. for 40 seconds. Thereafter, the film was rinsed with running water for 30 seconds, spray-dried, and then post-baked at 200° C. for 15 minutes.

(5) Preparation of Monochromatic Color Filter

Each of the radiation-sensitive colored composition obtained in item (3) above was coated on the undercoating layer of a glass substrate with the undercoating layer obtained in item (2) above using a spin coater such that the film had a film thickness of 1 μm after drying, and pre-baked at 100° C. for 120 seconds to form a colored cured film. The colored cured film was exposed through a mask having a 7.0 μm-square pattern arrayed over a 4 mm×3 mm area on a substrate at an exposure dose of 200 [$mJ/cm^2$] and an illuminance of 1200 $mW/cm^2$ (integrated irradiation illuminance), using an i-ray stepper exposure device (FPA-3000i5+, manufactured by Canon Inc.). After the exposure, the film was subjected to paddle development at 23° C. for 60 seconds using a developer CD-2000 (60% solution, manufactured by Fujifilm Electronic Materials Co., Ltd.) to form a pattern. The pattern was then rinsed with running water for 20 seconds, and was spray dried. Thereafter, an ultraviolet irradiation treatment after exposure was conducted, in which the entire glass substrate on which the pattern has been formed was irradiated with ultraviolet rays at an exposure dose of 10000 $mJ/cm^2$ using a high pressure mercury lamp (trade name: UMA-802-HC552FFAL; manufactured by Ushio Inc.). After the irradiation, the substrate on which the pattern has been formed was post-baked at 220° C. for 300 seconds on a hot plate, thereby forming a colored pattern on the glass plate. Hereon, the irradiation illuminance [$mW/cm^2$] of the light at a wavelength of 275 nm or less is 10% with respect to the integral irradiation illuminance of the light over the whole wavelength range of the ultraviolet light.

(6) Evaluation

The heat resistance, the solvent resistance, the color unevenness, and the color transfer of the coating film obtained by applying the radiation-sensitive colored composition on the glass substrate were evaluated in the following manner. The evaluation results are shown in the following Table 1.

[Heat Resistance]

The glass substrate on which the radiation-sensitive colored composition obtained in item (4) above was coated was placed on a hot plate at 200° C. such that the bottom surface of the glass substrate came into contact with the hot plate and was heated for 1 hour. The color difference (ΔE*ab value) of the radiation-sensitive colored composition before and after the heating was measured using a colorimeter MCPD-1000 (manufactured by Otsuka Electronics Co., Ltd.), and an index of the heat resistance was evaluated in accordance with the following evaluation criteria. A smaller ΔE*ab value indicates a better heat resistance. Herein, the ΔE*ab value is a value calculated from the following color-difference formula according to CIE 1976 (L*, a*, b*) color space (Color Science Handbook (New edition in 1985) p. 266, edited by the Color Science Association of Japan).

$$\Delta E^*ab=\{(\Delta L^*)^2+(\Delta a^*)^2+(\Delta b^*)^2\}^{1/2}$$

Furthermore, a case where the ΔE*ab value is less than 3 is preferable (more preferably 2.7 or less, still more preferably 2.1 or less, and particularly preferably 1.5 or less); and a case where the ΔE*ab value is more than 5 indicates indicates difficulty in practical use.

[Solvent Resistance]

The spectrum of the coating film after the post-baking obtained in item (4) above was measured (spectrum A). On this edited by the Color Science coating film, the resist solution A obtained in item (1) above was coated such that the obtained film had a thickness of 1 μm, and then the film was pre-baked. Thereafter, the film was developed with a developer CD-2000 (manufactured by Fujifilm Electronic Materials Co., Ltd.) under the conditions of 23° C. for 120 seconds, and the spectrum was measured again (spectrum B). As an index of solvent resistance, the colorant remaining ratio was calculated with respect to a difference between the spectrum A and the spectrum B. A numerical value closer to 100% indicates higher solvent resistance.

Furthermore, a case where the residual amount of the colorant is more than 90% (more preferably 92% or more, still more 95% or more, and particularly preferably 97% or more) is preferable; and a case where the residual amount of the colorant is 90% or less; and a case where the residual amount of the colorant is more than 90% indicates difficulty in practical use.

[Unevenness]

The color unevenness was evaluated in following manner according to the method described in JP2005-17716A. The surface of the coating film on which the radiation-sensitive colored composition had been coated, as obtained in item (4) above, was separated out in the grid shape to form a 2-μm square section. A treatment for imparting numerical values in 256 stages ranging 0 to 255 in terms of luminescence was carried out. When the section having 5 or more of the difference between the luminescence value of an arbitrary section provided by the method for imparting numerical values above and the average luminescence value of all of sections adjacent to the arbitrary section was taken as a section with a significant difference, the ratio of the total number of the sections with a significant difference with respect to the entire number of the sections was calculated and taken as an index for evaluating the color unevenness. With a smaller numerical value, an image having less color unevenness and having even and smooth color with less roughness was obtained.

Furthermore, a case where the ratio of the sections with a significant difference with respect to the entire number of the sections is less than 5% (more preferably 4.0% or less, still more 3.5% or less, and particularly preferably 3.0% or less) is preferable; and a case where the ratio of the sections with a significant difference with respect to the entire number of the sections is 5% or more indicates difficulty in practical use.

[Color Transfer]

On the surface of the obtained color filter as formed in item (5) above on which a colored pattern had been formed, a CT-2000L solution (transparent undercoating agent, manufactured by Fujifilm Electronic Materials Co., Ltd.) was coated such that the obtained film had a dry film thickness of 1 μm, and the film was dried to form a transparent film. Then, the transparent film was subjected to a heating treatment at 200° C. for 5 minutes. After finishing the heating treatment, the absorbance of the transparent film adjacent to the colored pattern was measured with a microspectrophotometer (LCF-1500M manufactured by Otsuka Electronics Co., Ltd.). The ratio (%) of the value of the absorbance of the obtained transparent film to that of the colored pattern measured before the heating was calculated, and taken as an index of color transfer.

Furthermore, a case where the ratio (%) of color transfer to adjacent pixel is less than 1% (more preferably 0.8% or less, still more 0.6% or less, and particularly preferably 0.4% or less) is preferable; and a case where the ratio (%) of transfer to adjacent pixel is 10% or more indicates difficulty in practical use.

[Examples 2 to 20 and Comparative Examples 1 to 4] In the preparation of the (3) radiation-sensitive colored composition in Example 1, patterns were formed in the same manner as in Example 1 except that the colorant compound, the binder resin, and the photopolymerization initiator were changed (The amount of each components was the same mass as Example 1) to the compounds in Table 6, respectively, and evaluation was carried as described above. The evaluation criteria are shown in Table 6.

TABLE 6

| | Colorant | Binder resin | Photo-polymerization initiator | Amount % by mass of metal ions ($Zn^{2+}$) | Heat resistance | Solvent resistance | Color uneven-ness | Color transfer |
|---|---|---|---|---|---|---|---|---|
| Example 1 | P-51 | J1 | I-1 | 0.08 | 1.1 | 96 | 3.8 | 0.3 |
| Example 2 | P-51 | J2 | I-4 | 0.08 | 2.9 | 90 | 4.8 | 0.9 |
| Example 3 | P-54 | J1 | I-2 | 0.07 | 1.1 | 95 | 3.9 | 0.6 |
| Example 4 | P-54 | J2 | I-6 | 0.07 | 2.1 | 93 | 4.9 | 0.8 |
| Example 5 | P-91 | None | I-1 | 0.009 | 2.5 | 92 | 4.8 | 0.9 |
| Example 6 | P-91 | J1 | I-1 | 0.009 | 0.3 | 99 | 1.2 | 0.2 |
| Example 7 | P-91 | J2 | I-1 | 0.009 | 0.9 | 97 | 3.1 | 0.4 |
| Example 8 | P-91 | J2 | I-2 | 0.009 | 0.8 | 97 | 3.2 | 0.4 |
| Example 9 | P-91 | J2 | I-3 | 0.009 | 2.2 | 91 | 4.8 | 0.9 |
| Example 10 | P-91 | J2 | I-4 | 0.009 | 2.7 | 90 | 4.7 | 0.8 |
| Example 11 | P-91 | J2 | I-5 | 0.009 | 0.3 | 99 | 1.1 | 0.1 |
| Example 12 | P-91 | J2 | I-6 | 0.009 | 0.8 | 97 | 3.2 | 0.5 |
| Example 13 | Q-1 | J1 | I-1 | 0.08 | 1.1 | 95 | 3.2 | 0.5 |
| Example 14 | Q-2 | J1 | I-1 | 0.07 | 1.2 | 96 | 3.6 | 0.6 |
| Example 15 | Q-3 | J1 | I-1 | 0.08 | 1.4 | 95 | 3.9 | 0.7 |
| Example 16 | Q-4 | J1 | I-1 | 0.08 | 2.3 | 92 | 4.7 | 0.9 |
| Example 17 | Q-5 | J1 | I-1 | 0.06 | 2.1 | 91 | 4.6 | 0.8 |
| Example 18 | Q-54 | J1 | I-1 | 0.07 | 1.0 | 95 | 3.6 | 0.4 |
| Example 19 | Q-51 | J1 | I-1 | 0.008 | 0.5 | 98 | 1.2 | 0.1 |
| Example 20 | Q-54 | J1 | I-1 | 0.007 | 0.6 | 98 | 1.3 | 0.1 |
| Comparative Example 1 | M-53 | J2 | I-1 | 0.8 | 13 | 70 | 4.8 | 32 |
| Comparative Example 2 | P-51 | J2 | I-1 | 1.1 | 4.8 | 91 | 16.2 | 0.9 |
| Comparative Example 3 | P-54 | J2 | I-1 | 0.9 | 4.9 | 90 | 15.2 | 0.9 |
| Comparative Example 4 | P-91 | J2 | I-1 | 0.5 | 4.8 | 91 | 19.8 | 0.9 |

As shown in Table 6, it could be confirmed that in any of Examples 1 to 20, each using the colorant multimer of the present invention, exhibited excellent heat resistance and solvent resistance and suppressed the color unevenness and the color transfer.

Example 21

Preparation of Solid State Image Device (1) Preparation of Radiation-Sensitive Colored Composition Each of a red (R) pigment dispersion R-1 and a green (G) pigment dispersion G-1 were prepared in the same manner as in the C. I. Pigment Blue 15:6 dispersion prepared in Example 1 except that the pigment was changed to the following colored pigment.

~Colored Pigments for Forming each of RGB Colored Pixels~

Red (R) Pigment; C. I. Pigment Red 254

Green (G) Pigment; Mixture of 70/30 [mass ratio] of C. I. Pigment Green 36 and C. I. Pigment Yellow 139

(2) Preparation of Color Filter for Solid State Image Device

The same procedure as in Example 1 except that the pigment dispersions were changed to a red (R) pigment dispersion R-1 and a green (G) pigment dispersion G-1, and the colorant multimer (A) was not added was carried out to prepare a red (R) colored curable composition R-2 and a green (G) colored curable composition G-2.

(3) Preparation of Silicone Substrate with Undercoating Layer

A 6-inch silicon wafer was subjected to a heat treatment at 200° C. for 30 minutes in an oven. Subsequently, on this silicon wafer, the resist liquid was coated such that the obtained film had a dry film thickness of 1.5 μm. The film was dried at 220° C. for 1 hour in an oven to form an undercoating layer, thereby obtaining a silicon wafer substrate with an undercoating layer.

(4) Pattern Formation

The green curable composition G-2 was coated on the undercoating layer of the silicon wafer with an undercoating layer such that the obtained film had a dry film thickness of 0.5 μm to form a photocurable coating film. The silicon wafer was then pre-baked at 100° C. for 120 seconds on a hot plate.

Subsequently, the layer was exposed through a Bayer pattern mask for a 1.2-μm square pattern at a wavelength of 365 nm using an i-ray stepper exposure device, FPA-3000i5+ (manufactured by Canon Inc.).

Thereafter, the silicon wafer, on which the irradiated coating film had been formed, was placed on a horizontal rotary table of a spin-shower developing apparatus (DW-30 type, manufactured by Chemitronics Co., Ltd.), and subjected to paddle development at 23° C. for 60 seconds using a developer CD-2000 (manufactured by Fujifilm Electronic Materials Co., Ltd.), thereby forming a green (G) colored pattern with a size of 1.2 μm×1.2 μm on the silicon wafer substrate.

Subsequently, a red (R) colored pattern with a size of 1.2 μm×1.2 μm was formed using the red (R) radiation-sensitive colored composition R-2.

Furthermore, a blue (B) colored pattern with a size of 1.2 μm×1.2 μm was formed using the blue (B) radiation-sensitive colored composition prepared in Example 6, thereby preparing a color filter for a solid state image device.

(5) Evaluation

The color filter with full color was installed in a solid state image device, and thus, it was confirmed that the solid state image device had high precision and excellent color separation.

Example 22

Preparation of Liquid Crystal Display Apparatus (1) Preparation of Color Filter for Liquid Crystal Display Apparatus The green curable composition G-2 was slit-coated on a 550 mm×650 mm glass substrate under the following conditions, followed by vacuum drying and pre-baking (100° C., 80 seconds), thereby forming a coating film of the radiation-sensitive colored composition (colored curable composition layer) on the glass substrate.

(2) (Slit-Coating Conditions)

Space of an opening at the top of a coating head: 50 μm

Coating speed: 100 mm/sec

Clearance between the substrate and the coating head: 150 μm

Thickness of Dried Film: 1.75 μm

Coating temperature: 23° C.

Thereafter, the coating film of the radiation-sensitive colored composition was subjected to pattern-wise exposure at 100 mJ/cm$^2$ using an LE4000A manufactured by Hitachi High-Technologies Corporation using a 2.5 kW ultrahigh pressure mercury lamp and a photomask with a line width of 20 μm. After the exposure, the entire surface of the coating film was coated with a 1% aqueous solution of an inorganic developer (trade name: CDK-1, manufactured by Fujifilm Electronic Materials. Co.), and left to stand for 60 seconds.

(3) Heat Treatment

Then, the coating film was sprayed with a shower of pure water to wash the colored curable composition away. The coating film that had been subjected to a photocuring treatment and a developing treatment was then heated in an oven at 220° C. for 1 hour (post-baking), thereby obtaining a color filter having a pattern (colored layer) of the colored curable composition formed on the glass substrate.

Next, a red (R) colored pattern in the line shape with a line width of 20 μm was formed in the same manner using the red (R) colored curable composition R-2. Further, a blue (B) colored pattern in the line shape with a line width of 20 μm was formed in the same manner using the radiation-sensitive colored composition of Example 6, thereby preparing a color filter including black matrix for a liquid crystal display apparatus.

(4) Evaluation

Processing of an ITO transparent electrode, an alignment film, or the like was performed in the color filter with full color to provide a liquid crystal display apparatus. The polymerizable composition of the present invention had good uniformity with respect to the coated face, and the liquid crystal display apparatus had no display color unevenness and the image quality was good.

What is claimed is:

1. A radiation-sensitive colored composition comprising:

a colorant multimer (A), a polymerizable compound (B), a photopolymerization initiator (C), and an organic solvent (D), wherein the content of an inorganic metal salt (X) including no colorant skeleton is 0.1% by mass or less with respect to a dye solid contents in said composition wherein the colorant multimer is selected from any of the following groups consisting of:

general formula (C):

$$*\!-\!\!\left[\text{DyeIV}-(L^{C1})_{m3}\right]\!\!-\!*; \tag{C}$$

where $L^{C1}$ represents a single bond or divalent linking group, DyeIV represents a colorant structure, and m3 represents an integer of 1 to 4, and general formula (D):

$$(L^{D1})\!\!-\!\!\left(\text{DyeV}\right)_{m4}; \tag{D}$$

where $L^{D1}$ represents a m4-valent linking group, DyeV represents a colorant structure, and m4 represents an integer of 2 to 100, and the weight average molecular weight of the colorant multimer is in the range of 4000 to 25000.

2. The radiation-sensitive colored composition according to claim 1, wherein the colorant multimer (A) is a colorant multimer having a partial structure derived from a colorant selected from a dipyrromethene colorant, an azo colorant, a xanthene colorant, a squalirium colorant, and a phthalocyanine colorant.

3. The radiation-sensitive colored composition according to claim 1, wherein the colorant multimer (A) is a colorant multimer having a partial structure derived from a colorant selected from a dipyrromethene colorant, an azo colorant, and a phthalocyanine colorant.

4. The radiation-sensitive colored composition according to claim 3, wherein the dipyrromethene colorant has Zn atoms, the azo colorant has at least one kind of Cu atoms, Zn atoms, and Mg atoms, and the phthalocyanine colorant has Cr atoms.

5. The radiation-sensitive colored composition according to claim 1, wherein the colorant multimer (A) is a colorant multimer having an alkali-soluble group.

6. The radiation-sensitive colored composition according to claim 1, wherein the colorant multimer (A) is a colorant multimer having a polymerizable group.

7. The radiation-sensitive colored composition according to claim 1, wherein the colorant multimer (A) is a dipyrromethene colorant represented by the following general formula (8):

(8)

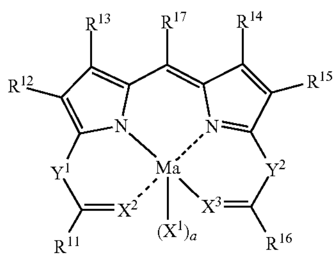

wherein the general formula (8), $R^{12}$ to $R^{15}$ each independently represents a hydrogen atom or a monovalent substituent; $R^{17}$ represents a hydrogen atom, a halogen atom, an alkyl group, an aryl group, or a heterocyclic group; Ma represents a metal or a metal compound; $X^2$ and $X^3$ each independently represents NR (wherein R represents a hydrogen atom, an alkyl group, an alkenyl group, an aryl group, a heterocyclic group, an acyl group, an alkylsulfonyl group, or an arylsulfonyl group), a nitrogen atom, an oxygen atom, or a sulfur atom; $Y^1$ and $Y^2$ each independently represents $NR^c$ (wherein $R^c$ represents a hydrogen atom, an alkyl group, an alkenyl group, an aryl group, a heterocyclic group, an acyl group, an alkylsulfonyl group, or an arylsulfonyl group), a nitrogen atom or a carbon atom; $R^{11}$ and $R^{16}$ each independently represents an alkyl group, an alkenyl group, an aryl group, a heterocyclic group, an alkoxy group, an aryloxy group, an alkylamino group, an arylamino group, or a heterocyclic amino group; $R^{11}$ and $Y^1$ may be bonded to each other to form a 5-, 6-, or 7-membered ring; $R^{16}$ and $Y^2$ may be bonded to each other to form a 5-, 6-, or 7-membered ring; $X^1$ represents a group that can be bonded to Ma; and a represents 0, 1, or 2.

8. The radiation-sensitive colored composition according to claim 1, wherein the content of the inorganic metal salt (X) is less than or equal to 0.01% and greater than or equal to 0.0001% by mass with respect to the dye solid contents in said composition.

9. The radiation-sensitive colored composition according to claim 1, further comprising a binder resin (E) which is an alkali-soluble binder.

10. The radiation-sensitive colored composition according to claim 9, further comprising a polyfunctional polymerizable compound which is tetrafunctional or higher and an oxime photopolymerization initiator.

11. The radiation-sensitive colored composition according to claim 1, further comprising a colorant other than the colorant multimer (A) which is C. I. Pigment Blue 15:6.

12. A colored cured film obtained by curing the radiation-sensitive colored composition according to claim 1.

13. A color filter comprising the colored cured film according to claim 12.

14. A solid state image device comprising the color filter according to claim 13.

15. A liquid crystal display apparatus comprising the color filter according to claim 13.

16. A method for producing a color filter, comprising:

a radiation-sensitive colored composition layer-forming step, in which the radiation-sensitive colored composition according to claim 1 is applied onto a substrate to form a radiation-sensitive colored composition layer;

an exposure step, in which the radiation-sensitive colored composition layer is exposed in pattern; and a colored pattern-forming step, in which the radiation-sensitive colored composition layer after the exposure is developed to form a colored pattern.

17. The radiation-sensitive colored composition according to claim 1, wherein the colorant multimer (A) has metal atoms.

18. The radiation-sensitive colored composition according to claim 17, further comprising a colorant other than the colorant multimer (A) which is C. I. Pigment Blue 15:6.

19. The radiation-sensitive colored composition according to claim 1, wherein the colorant multimer (A) is a colorant multimer having a partial structure derived from a colorant selected from an azo colorant, a xanthene colorant, and a squalirium colorant.

20. The radiation-sensitive colored composition according to claim 1, wherein the weight average molecular weight of the colorant multimer is in the range of 5000 to 20000.

21. A radiation-sensitive colored composition comprising:

a colorant multimer (A), a polymerizable compound (B), a photopolymerization initiator (C), and an organic solvent (D), wherein the content of an inorganic metal salt (X) including no colorant skeleton is 0.1% by mass or less with respect to a dye solid contents in said composition wherein the colorant multimer is selected from any of the following groups consisting of:

general formula (A):

(A)

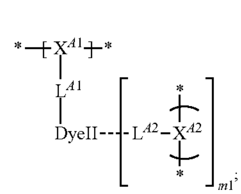

where $X^{A1}$ and $X^{A2}$ each represents a linking group formed by polymerization, $L^{A1}$ and $L^{A2}$ each represents a single bond or divalent linking group, DyeII represents a color structure, and m1 represents an integer of 0 to 3, general formula (B):

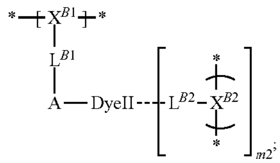

(B)

where $X^{B1}$ and $X^{B2}$ each represents a linking group formed by polymerization, $L^{B1}$ and $L^{B2}$ each represents a single bond or divalent linking group, DyeIII represents a color structure, A represents a group which is capable of forming an ionic bond or coordinate bond, and m2 represents an integer of 0 to 3, general formula (C):

$$*\!-\!\!\left[\text{DyeIV}-(L^{C1})_{m3}\right]\!\!-\!*; \qquad \text{(C)}$$

where $L^{C1}$ represents a single bond or divalent linking group, DyeIV represents a colorant structure, and m3 represents an integer of 1 to 4, and general formula (D):

$$(L^{D1})\!-\!\!(\text{DyeV})_{m4}; \qquad \text{(D)}$$

where $L^{D1}$ represents a m4-valent linking group, DyeV represents a colorant structure, and m4 represents an integer of 2 to 100, and, the colorant multimer (A) is a colorant multimer having a partial structure derived from a colorant selected from an azo colorant, a xanthene colorant, and a squalirium colorant.

22. The radiation-sensitive colored composition according to claim 21, wherein the colorant multimer (A) is a colorant multimer having an alkali-soluble group.

23. The radiation-sensitive colored composition according to claim 21, wherein the colorant multimer (A) is a colorant multimer having a polymerizable group.

24. The radiation-sensitive colored composition according to claim 21, further comprising a binder resin (E) which is an alkali-soluble binder.

25. A colored cured film obtained by curing the radiation-sensitive colored composition according to claim 21.

26. A color filter comprising the colored cured film according to claim 25.

27. A solid state image device comprising the color filter according to claim 26.

28. A method for producing a color filter, comprising:

a radiation-sensitive colored composition layer-forming step, in which the radiation-sensitive colored composition according to claim 21 is applied onto a substrate to form a radiation-sensitive colored composition layer;

an exposure step, in which the radiation-sensitive colored composition layer is exposed in pattern; and a colored pattern-forming step, in which the radiation-sensitive colored composition layer after the exposure is developed to form a colored pattern.

29. The radiation-sensitive colored composition according to claim 21, wherein the colorant multimer (A) is represented by the general formula (A).

* * * * *